(12) United States Patent
Akaogi et al.

(10) Patent No.: US 11,817,171 B2
(45) Date of Patent: Nov. 14, 2023

(54) DEVICES FOR PROVIDING NEUTRAL VOLTAGE CONDITIONS FOR RESISTIVE CHANGE ELEMENTS IN RESISTIVE CHANGE ELEMENT ARRAYS

(71) Applicant: Nantero, Inc., Woburn, MA (US)

(72) Inventors: Takao Akaogi, Cupertino, CA (US); Jia Luo, Fremont, CA (US); Nancy See Loiu Leong, Cupertino, CA (US)

(73) Assignee: Nantero, Inc., Woburn, MA (US)

( * ) Notice: Subject to any disclaimer, the term of this patent is extended or adjusted under 35 U.S.C. 154(b) by 10 days.

(21) Appl. No.: 17/497,569

(22) Filed: Oct. 8, 2021

(65) Prior Publication Data

US 2022/0028435 A1 Jan. 27, 2022

Related U.S. Application Data

(63) Continuation of application No. 16/847,570, filed on Apr. 13, 2020, now Pat. No. 11,145,337.

(51) Int. Cl.
| | |
|---|---|
| *G11C 7/06* | (2006.01) |
| *G11C 7/20* | (2006.01) |
| *G11C 7/10* | (2006.01) |
| *G11C 16/12* | (2006.01) |
| *G11C 16/04* | (2006.01) |

(52) U.S. Cl.
CPC ............ *G11C 7/065* (2013.01); *G11C 7/1057* (2013.01); *G11C 7/1084* (2013.01); *G11C 7/20* (2013.01); *G11C 16/0441* (2013.01); *G11C 16/12* (2013.01)

(58) Field of Classification Search
CPC ......... G11C 7/065; G11C 7/20; G11C 7/1084; G11C 7/1057; G11C 16/12; G11C 16/0441
See application file for complete search history.

(56) References Cited

U.S. PATENT DOCUMENTS

| | | | |
|---|---|---|---|
| 6,504,753 | B1 | 1/2003 | Scheuerlein et al. |
| 6,937,505 | B2 | 8/2005 | Morikawa |
| 6,970,375 | B2 | 11/2005 | Rinerson et al. |
| 7,920,408 | B2 | 4/2011 | Azuma et al. |
| 7,995,371 | B2 | 8/2011 | Rinerson et al. |

(Continued)

OTHER PUBLICATIONS

Ou, Elaine. Array Architecture fora Nonvolatile 3-Dimensional Cross-Point Memory, [online], Ph.D. dissertation, Stanford U., 2010 [retrieved on May 23, 2023], pages i-xiv, 1-105, Retrieved from the Internet <URL: https://stacks.stanford.edu/file/druid:dg048ny4241/main-augmented.pdf>.

*Primary Examiner* — Ajay Ojha
(74) *Attorney, Agent, or Firm* — Nantero, Inc.

(57) ABSTRACT

The present disclosure generally relates to circuit architectures for programming and accessing resistive change elements. The circuit architectures can program and access resistive change elements using neutral voltage conditions. The present disclosure also relates to methods for programming and accessing resistive change elements using neutral voltage conditions. The present disclosure additionally relates to sense amplifiers configurable into initializing configurations for initializing the sense amplifiers and comparing configurations for comparing voltages received by the sense amplifiers. The sense amplifiers can be included in the circuit architectures of the present disclosure.

36 Claims, 46 Drawing Sheets

(56) References Cited

U.S. PATENT DOCUMENTS

| | | |
|---|---|---|
| 8,467,228 B2 | 6/2013 | Ikeda et al. |
| 8,854,873 B1 | 10/2014 | Hollmer et al. |
| 8,923,050 B2 | 12/2014 | Cernea et al. |
| 9,112,145 B1 | 8/2015 | Lu et al. |
| 9,245,629 B2 | 1/2016 | Samachisa et al. |
| 9,576,616 B2 | 2/2017 | Nazarian et al. |
| 9,721,653 B2 | 8/2017 | Yan et al. |
| 10,134,469 B1* | 11/2018 | Liu .................... G11C 13/0007 |
| 10,229,739 B2 | 3/2019 | Siau et al. |
| 10,460,800 B2 | 10/2019 | Lesartre et al. |
| 2007/0285967 A1 | 12/2007 | Toda et al. |
| 2010/0014345 A1* | 1/2010 | Choi ...................... G11C 5/025 |
| | | 365/163 |
| 2010/0046272 A1 | 2/2010 | Inoue |
| 2011/0280095 A1* | 11/2011 | Lum ..................... G11C 11/413 |
| | | 365/51 |
| 2013/0070534 A1 | 3/2013 | Carter et al. |
| 2014/0241075 A1 | 8/2014 | Jeon |
| 2016/0247563 A1 | 8/2016 | Pemer |
| 2017/0309334 A1* | 10/2017 | Viviani ............. G11C 13/0069 |
| 2019/0189212 A1* | 6/2019 | Widjaja ............... G11C 13/003 |
| 2019/0341107 A1 | 11/2019 | Bertin |
| 2021/0174869 A1* | 6/2021 | Hirano .................... G11C 8/12 |

\* cited by examiner

300

┌─────────────────────────────────────────────────────┐
│ Providing neutral voltage conditions for at least one plurality of resistive change elements in a resistive change element array in an electrical device, where each resistive change element of the at least one plurality of resistive change elements is in electrical communication with a bit line and a word line, and where each resistive change element of the at least one plurality of resistive change elements is adjustable between at least two resistive states │ ~ 302
└─────────────────────────────────────────────────────┘
                              ↓
┌─────────────────────────────────────────────────────┐
│ Biasing a plurality of global bit lines             │ ~ 304
└─────────────────────────────────────────────────────┘
                              ↓
┌─────────────────────────────────────────────────────┐
│ Selecting at least one resistive change element from the at least one plurality of resistive change elements │ ~ 306
└─────────────────────────────────────────────────────┘
                              ↓
┌─────────────────────────────────────────────────────┐
│ Preparing the electrical device for applying an electrical stimulus to each of the at least one resistive change element │ ~ 308
└─────────────────────────────────────────────────────┘
                              ↓
┌─────────────────────────────────────────────────────┐
│ Applying an electrical stimulus to each of the at least one resistive change element to adjust a resistive state of each of the at least one resistive change element │ ~ 310
└─────────────────────────────────────────────────────┘
                              ↓
┌─────────────────────────────────────────────────────┐
│ Restoring neutral voltage conditions for resistive change elements impacted by applying an electrical stimulus to each of the at least one resistive change element │ ~ 312
└─────────────────────────────────────────────────────┘
                              ↓
┌─────────────────────────────────────────────────────┐
│ Biasing global bit lines impacted by applying an electrical stimulus to each of the at least one resistive change element │ ~ 314
└─────────────────────────────────────────────────────┘

```
402 — Providing neutral voltage conditions for at least one plurality of resistive change elements in a resistive change element array in an electrical device, where each resistive change element of the at least one plurality of resistive change elements is in electrical communication with a bit line and a word line, and where each resistive change element of the at least one plurality of resistive change elements is adjustable between at least two resistive states 404 — Biasing a plurality of global bit lines 406 — Selecting at least one resistive change element from the at least one plurality of resistive change elements 408 — Preparing the electrical device for determining a resistive state of each of the at least one resistive change element 410 — Generating a voltage indicative of a resistive state for each of the at least one resistive change element 412 — Determining a resistive state based on a voltage indicative of a resistive state for that resistive change element for each of the at least one resistive change element 414 — Restoring neutral voltage conditions for resistive change elements impacted by generating a voltage indicative of a resistive state for each of the at least one resistive change element 416 — Biasing global bit lines impacted by generating a voltage indicative of a resistive state for each of the at least one resistive change element
```

FIG. 4

DEVICES FOR PROVIDING NEUTRAL VOLTAGE CONDITIONS FOR RESISTIVE CHANGE ELEMENTS IN RESISTIVE CHANGE ELEMENT ARRAYS

CROSS-REFERENCE OF RELATED CASES

This application is related to the following U.S. patents, which are assigned to the assignee of the present application, and are hereby incorporated by reference in their entirety:
U.S. Pat. No. 9,406,349, filed on May 2, 2014, entitled Memory Elements and Cross Point Switches and Arrays for Same Using Nonvolatile Nanotube Blocks;
U.S. Pat. No. 9,947,400, filed on Apr. 22, 2016, entitled Methods for Enhanced State Retention Within a Resistive Change Cell;
U.S. Pat. No. 9,917,139, filed on Dec. 20, 2016, entitled Resistive Change Element Array Using Vertically Oriented Bit Lines;
U.S. Pat. No. 10,096,601, filed on Jan. 30, 2018, entitled Stacked Three-Dimensional Arrays of Two Terminal Nanotube Switching Devices;
U.S. Pat. No. 10,204,682, filed on Sep. 18, 2017, entitled Nonvolatile Nanotube Switches and Systems Using Same; and
U.S. Pat. No. 10,290,327, filed on Oct. 13, 2017, entitled Devices and Methods for Accessing Resistive Change Elements in Resistive Change Element Arrays.
This application is related to the following U.S. patent Application Publication, which is assigned to the assignee of the present application, and is hereby incorporated by reference in its entirety:
U.S. Patent Application Publication No. 2019/0267081, filed on Feb. 27, 2018, entitled Resistive Change Element Cells Sharing Selection Devices.

BACKGROUND

Technical Field

The present disclosure generally relates to resistive change element arrays and devices for resistive change element arrays, and in particular relates to programming and accessing resistive change elements in resistive change element arrays.

DISCUSSION OF RELATED ART

Any discussion of the related art throughout this specification should in no way be considered as an admission that such art is widely known or forms part of the common general knowledge in the field.

Resistive change devices and arrays, often referred to as resistance RAMs by those skilled in the art, are well known in the semiconductor industry. Such devices and arrays, for example, include, but are not limited to, phase change memory, solid electrolyte memory, metal oxide resistance memory, and carbon nanotube memory such as NRAM®.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a low resistive state (which might correspond to a binary number 0) and a high resistive state (which might correspond to a binary number 1). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store three bits of data. Or a resistive change element might be arranged to switch between $2^n$ resistive states, so as to store n bits of data.

SUMMARY

The present disclosure provides a sense amplifier comprising a first load device comprising a first plurality of field effect transistors, a second load device comprising a second plurality of field effect transistors where the second load device is in electrical communication with the first load device, a current source in electrical communication with the first load device and the second load device, a latch device, a power control device in electrical communication with the first load device, the second load device, and the latch device, and the sense amplifier being configurable in an initializing configuration and a comparing configuration, where the first load device is configurable to generate a first bias voltage in the initializing configuration and to set an operating point of a field effect transistor of the first plurality of field effect transistors based on the first bias voltage in the comparing configuration, and where the second load device is configurable to generate a second bias voltage in the initializing configuration and to set an operating point of a field effect transistor of the second plurality of field effect transistors based on the second bias voltage in the comparing configuration.

According to another aspect of the present disclosure, the first plurality of field effect transistors comprises a first plurality of capacitor connected PMOS transistors and the second plurality of field effect transistors comprises a second plurality of capacitor connected PMOS transistors.

According to another aspect of the present disclosure, the first plurality of capacitor connected PMOS transistors are chargeable to the first bias voltage in the initializing configuration and the second plurality of capacitor connected PMOS transistors are chargeable to the second bias voltage in the initializing configuration.

According to another aspect of the present disclosure, a capacitor connected PMOS transistor of the first plurality of capacitor connected PMOS transistors is in electrical communication with the second load device and a capacitor connected PMOS transistor of the second plurality of capacitor connected PMOS transistors is in electrical communication with the first load device.

According to another aspect of the present disclosure, the first load device is configured to receive a first signal and a second signal, the second load device is configured to receive the first signal and the second signal, and the sense amplifier is configurable in the initializing configuration and the comparing configuration based on the first signal and the second signal.

According to another aspect of the present disclosure, the sense amplifier further comprises a first input device in electrical communication with the first load device, where the first input device is configured to receive a first voltage, a second voltage, the first signal, and the second signal, where the first input device is configured to provide one of the first voltage and the second voltage to the first load device based on the first signal and the second signal, and a second input device in electrical communication with the second load device, where the second input device is configured to receive a third input voltage, the first signal, and the second signal, where the second input device is configured to provide the third voltage to the second load device based on the first signal and the second signal.

According to another aspect of the present disclosure, the first load device is configured to receive a first voltage and the second load device is configured to receive a second voltage.

According to another aspect of the present disclosure, the sense amplifier further comprises a first coupling canceller in electrical communication with the first load device and the second load device, and a second coupling canceller in electrical communication with the first load device and the second load device.

According to another aspect of the present disclosure, the first coupling canceller comprises a capacitor connected NMOS transistor in electrical communication with the first load device and the second load device, and the second coupling canceller comprises a capacitor connected NMOS transistor in electrical communication with the first load device and the second load device.

According to another aspect of the present disclosure, the sense amplifier further comprises a first voltage swing limiter in electrical communication with the first load device and the second load device, a second voltage swing limiter in electrical communication with the first load device and the second load device, and the first voltage swing limiter and the second voltage swing limiter are operable together to limit a voltage difference between a voltage generated by the first load device and a voltage generated by the second load device.

According to another aspect of the present disclosure, the first voltage swing limiter comprises a NMOS transistor having a drain terminal, a gate terminal, and a source terminal, a PMOS transistor having a drain terminal, a gate terminal, and a source terminal, and where the gate terminal of the NMOS transistor is in electrical communication with the first load device and the gate terminal of the PMOS transistor, the source terminal of the NMOS transistor is in electrical communication with the second load device and the source terminal of the PMOS transistor, and where the gate terminal of the PMOS transistor is in electrical communication with the first load device and the gate terminal of the NMOS transistor, and the source terminal of the PMOS transistor is in electrical communication with the second load device and the source terminal of the NMOS transistor.

According to another aspect of the present disclosure, the second voltage swing limiter comprises a NMOS transistor having a drain terminal, a gate terminal, and a source terminal, a PMOS transistor having a drain terminal, a gate terminal, and a source terminal, and where the gate terminal of the NMOS transistor is in electrical communication with the second load device and the gate terminal of the PMOS transistor, the source terminal of the NMOS transistor is in electrical communication with the first load device and the source terminal of the PMOS transistor, and where the gate terminal of the PMOS transistor is in electrical communication with the second load device and the gate terminal of the NMOS transistor, and the source terminal of the PMOS transistor is in electrical communication with the first load device and the source terminal of the NMOS transistor.

According to another aspect of the present disclosure, the current source is configured to sink current.

The present disclosure provides a sense amplifier comprising a first load device comprising a first plurality of field effect transistors, a second load device comprising a second plurality of field effect transistors where the second load device is in electrical communication with the first load device, a current source in electrical communication with the first load device and the second load device, a latch device, a power control device in electrical communication with the first load device, the second load device, and the latch device, and the sense amplifier being configurable in an initializing configuration and a comparing configuration, where the first load device is configurable to create a current path through the first load device in the initializing configuration and to create a current path through the first load device in the comparing configuration, where a first field effect transistor of the first plurality of field effect transistors is in the current path through the first load device in the initializing configuration and is in the current path through the first load device in the comparing configuration, where the first field effect transistor of the first plurality of field effect transistors is configured to function as a diode in the initializing configuration and is configured to function as a resistor in the comparing configuration, where the second load device is configurable to create a current path through the second load device in the initializing configuration and to create a current path through the second load device in the comparing configuration, where a first field effect transistor of the second plurality of field effect transistors is in the current path through the second load device in the initializing configuration and is in the current path through the second load device in the comparing configuration, and where the first field effect transistor of the second plurality of field effect transistors is configured to function as a diode in the initializing configuration and is configured to function as a resistor in the comparing configuration.

According to another aspect of the present disclosure, the first field effect transistor of the first plurality of field effect transistors is a PMOS transistor and the first field effect transistor of the second plurality of field effect transistors is a PMOS transistor.

According to another aspect of the present disclosure, a second field effect transistor of the first plurality of field effect transistors is in the current path through the first load device in the initializing configuration and is in the current path through the first load device in the comparing configuration and a second field effect transistor of the second plurality of field effect transistors is in the current path through the second load device in the initializing configuration and is in the current path through the second load device in the comparing configuration.

According to another aspect of the present disclosure, the second field effect transistor of the first plurality of field effect transistors is a NMOS transistor and the second field effect transistor of the second plurality of field effect transistors is a NMOS transistor.

According to another aspect of the present disclosure, the second field effect transistor of the first plurality of field effect transistors is configured to function as a diode in the initializing configuration and the second field effect transistor of the second plurality of field effect transistors is configured to function as a diode in the initializing configuration.

According to another aspect of the present disclosure, the first plurality of field effect transistors comprises a capacitor connected NMOS transistor, where the capacitor connected NMOS transistor of said first plurality of field effect transistors is in electrical communication with the second field effect transistor of the first plurality of field effect transistors, the second plurality of field effect transistors comprises a capacitor connected NMOS transistor, and where the capacitor connected NMOS transistor of the second plurality of field effect transistors is in electrical communication with the second field effect transistor of the second plurality of field effect transistors.

According to another aspect of the present disclosure, the first plurality of field effect transistors comprises a first plurality of capacitor connected PMOS transistors and the second plurality of field effect transistors comprises a second plurality of capacitor connected PMOS transistors.

According to another aspect of the present disclosure, a capacitor connected PMOS transistor of the first plurality of capacitor connected PMOS transistors is in electrical communication with the second load device and a capacitor connected PMOS transistor of the second plurality of capacitor connected PMOS transistors is in electrical communication with the first load device.

According to another aspect of the present disclosure, the first load device is configured to receive a first signal and a second signal, the second load device is configured to receive the first signal and the second signal, and the sense amplifier is configurable in the initializing configuration and the comparing configuration based on the first signal and the second signal.

According to another aspect of the present disclosure, the sense amplifier further comprises a first input device in electrical communication with the first load device, where the first input device is configured to receive a first voltage, a second voltage, the first signal, and the second signal, where the first input device is configured to provide one of the first voltage and the second voltage to the first load device based on the first signal and the second signal, and a second input device in electrical communication with the second load device, where the second input device is configured to receive a third input voltage, the first signal, and the second signal, where the second input device is configured to provide the third voltage to the second load device based on the first signal and the second signal.

According to another aspect of the present disclosure, the first load device is configured to receive a first voltage and the second load device is configured to receive a second voltage.

According to another aspect of the present disclosure, the sense amplifier further comprises a first coupling canceller in electrical communication with the first load device and the second load device, and a second coupling canceller in electrical communication with the first load device and the second load device.

According to another aspect of the present disclosure, the first coupling canceller comprises a capacitor connected NMOS transistor in electrical communication with the first load device and the second load device, and the second coupling canceller comprises a capacitor connected NMOS transistor in electrical communication with the first load device and the second load device.

According to another aspect of the present disclosure, the sense amplifier further comprises a first voltage swing limiter in electrical communication with the first load device and the second load device, a second voltage swing limiter in electrical communication with the first load device and the second load device, and the first voltage swing limiter and the second voltage swing limiter are operable together to limit a voltage difference between a voltage generated by the first load device and a voltage generated by the second load device.

According to another aspect of the present disclosure, the first voltage swing limiter comprises a NMOS transistor having a drain terminal, a gate terminal, and a source terminal, a PMOS transistor having a drain terminal, a gate terminal, and a source terminal, and where the gate terminal of the NMOS transistor is in electrical communication with the first load device and the gate terminal of the PMOS transistor, the source terminal of the NMOS transistor is in electrical communication with the second load device and the source terminal of the PMOS transistor, and where the gate terminal of the PMOS transistor is in electrical communication with the first load device and the gate terminal of the NMOS transistor and the source terminal of the PMOS transistor is in electrical communication with the second load device and the source terminal of the NMOS transistor.

According to another aspect of the present disclosure, the second voltage swing limiter comprises a NMOS transistor having a drain terminal, a gate terminal, and a source terminal, a PMOS transistor having a drain terminal, a gate terminal, and a source terminal, and where the gate terminal of the NMOS transistor is in electrical communication with the second load device and the gate terminal of the PMOS transistor, the source terminal of the NMOS transistor is in electrical communication with the first load device and the source terminal of the PMOS transistor, and where the gate terminal of the PMOS transistor is in electrical communication with the second load device and the gate terminal of the NMOS transistor, and the source terminal of the PMOS transistor is in electrical communication with the first load device and the source terminal of the NMOS transistor.

According to another aspect of the present disclosure, the current source is configured to sink current.

The present disclosure provides an electrical device comprising a resistive change element array comprising a plurality of resistive change elements, a plurality of global bit lines for the resistive change element array, a plurality of even bit lines for the resistive change element array, a plurality of odd bit lines for the resistive change element array, a plurality of word lines for the resistive change element array, a plurality of first selection devices where each first selection device is in electrical communication with an even bit line of the plurality of even bit lines and a global bit line of the plurality of global bit lines, a plurality of second selection devices where each second selection device is in electrical communication with an odd bit line of the plurality of odd bit lines and a global bit line of the plurality of global bit lines, driver circuitry in electrical communication with the resistive change element array, and where multiple resistive change elements of the plurality of resistive change elements are in electrical communication with the plurality of even bit lines and the plurality of word lines, and where plural resistive change elements of the plurality of resistive change elements are in electrical communication with the plurality of odd bit lines and the plurality of word lines.

According to another aspect of the present disclosure, the plurality of first selection devices, the plurality of second selection devices, and the driver circuitry are operable together to provide neutral voltage conditions for the plurality of resistive change elements.

According to another aspect of the present disclosure, the driver circuitry is in electrical communication with the plurality of word lines.

According to another aspect of the present disclosure, the plurality of first selection devices are field effect transistors and the plurality of second selection devices are field effect transistors.

According to another aspect of the present disclosure, the plurality of first selection devices are NMOS transistors and the plurality of second selection devices are NMOS transistors.

According to another aspect of the present disclosure, each resistive change element of the plurality of resistive change elements has a first electrode, a second electrode, and a resistive change material between the first electrode and the second electrode.

According to another aspect of the present disclosure, the resistive change material comprises a nanotube fabric.

According to another aspect of the present disclosure, the electrical device further comprises a reference line, a reference line connection circuit in electrical communication with the reference line where the reference line connection circuit is configured to drive a voltage on the reference line, a keeper circuit in electrical communication with a global bit line of the plurality of global bit lines where the keeper circuit is configured drive a voltage on the global bit line, at least one bus line, a global bit line connection circuit in electrical communication with a global bit line of the plurality of global bit lines and a bus line of the at least one bus line where the global bit line connection circuit is configured to electrically connect the global bit line and the bus line, at least one write buffer circuit in electrical communication with the at least one bus line, at least one current source in electrical communication with the at least one bus line, and at least one sense device where each sense device of the at least one sense device is in electrical communication with the reference line and a bus line of the at least one bus line.

According to another aspect of the present disclosure, the reference line connection circuit comprises a plurality of NMOS transistors and where each NMOS transistor of the plurality of NMOS transistors is in electrical communication with the reference line.

According to another aspect of the present disclosure, the keeper circuit comprises a plurality of NMOS transistors and where each NMOS transistor of the plurality of NMOS transistors is in electrical communication with a global bit line of the plurality of global bit lines.

According to another aspect of the present disclosure, the global bit line connection circuit comprises a plurality of PMOS transistors and where each PMOS transistor of the plurality of PMOS transistors is in electrical communication with a global bit line of the plurality of global bit lines and a bus line of the at least one bus line.

According to another aspect of the present disclosure, each current source of the at least one current source is configurable to sink an amount of current for an operation of a resistive change element of the plurality of resistive change elements.

According to another aspect of the present disclosure, each sense device of the at least one sense device is a sense amplifier configurable into an initializing configuration and a comparing configuration.

According to another aspect of the present disclosure, the electrical device further comprises a reference line, a reference line connection circuit in electrical communication with the reference line wherein the reference line connection circuit is configured to drive a voltage on the reference line, a keeper circuit in electrical communication with a global bit line of the plurality of global bit lines where the keeper circuit is configured drive a voltage on the global bit line, at least one bus line, at least one first input device in electrical communication with the at least one bus line, a second input device in electrical communication with the reference line, a global bit line connection circuit in electrical communication with the reference line, a global bit line of the plurality of global bit lines, the second input device, and a bus line of the at least one bus line where the global bit line connection circuit is configured to electrically connect the reference line and the second input device and where the global bit line connection circuit is configured to electrically connect the global bit line and the bus line, at least one write buffer circuit in electrical communication with the at least one bus line, at least one current source in electrical communication with the at least one bus line, and at least one sense device where each sense device of the at least one sense device is in electrical communication with a first input device of the at least one first input device and the second input device.

According to another aspect of the present disclosure, the global bit line connection circuit comprises a PMOS transistor in electrical communication with the reference line and the second input device, a plurality of PMOS transistors, and where each PMOS transistor of the plurality of PMOS transistors is in electrical communication with a global bit line of the plurality of global bit lines and a bus line the at least one bus line.

According to another aspect of the present disclosure, each sense device of the at least one sense device is a sense amplifier configurable into an initializing configuration and a comparing configuration.

The present disclosure provides an electrical device comprising a plurality of global bit lines, a resistive change element array having at least one section, driver circuitry for each section of the resistive change element array where each section is in electrical communication with driver circuitry for that section, wherein each section comprises a plurality of even bit lines, a plurality of odd bit lines, a plurality of word lines, a plurality of first selection devices where each first selection device is in electrical communication with an even bit line of the plurality of even bit lines and a global bit line of the plurality of global bit lines, a plurality of second selection devices where each second selection device is in electrical communication with an odd bit line of the plurality odd bit lines and a global bit line of the plurality of global bit lines, and a plurality of resistive change elements, where multiple resistive change elements of the plurality of resistive change elements are in electrical communication with the plurality of even bit lines and the plurality of word lines, and wherein plural resistive change elements of the plurality of resistive change elements are in electrical communication with the plurality of odd bit lines and the plurality of word lines.

According to another aspect of the present disclosure, the resistive change element array and the driver circuitry for each section are operable together to provide neutral voltage conditions.

According to another aspect of the present disclosure, the resistive change element array has two sections.

According to another aspect of the present disclosure, the two sections of the resistive change element array have a same number of resistive change elements.

According to another aspect of the present disclosure, the two sections of the resistive change element array have different numbers of resistive change elements.

According to another aspect of the present disclosure, the resistive change element array has three sections.

According to another aspect of the present disclosure, the plurality of word lines of each section are in electrical communication with driver circuitry for that section.

According to another aspect of the present disclosure, the plurality of first selection devices are field effect transistors and the plurality of second selection devices are field effect transistors.

According to another aspect of the present disclosure, the plurality of first selection devices are NMOS transistors and the plurality of second selection devices are NMOS transistors.

According to another aspect of the present disclosure, each resistive change element of the plurality of resistive change elements has a first electrode, a second electrode, and a resistive change material between the first electrode and the second electrode.

According to another aspect of the present disclosure, the resistive change material comprises a nanotube fabric.

According to another aspect of the present disclosure, the electrical device further comprises a reference line, a reference line connection circuit for each section of the resistive change element array where each reference line connection circuit is in electrical communication the reference line and where each reference line connection circuit is configured to drive a voltage on the reference line, a keeper circuit in electrical communication with a global bit line of the plurality of global bit lines where the keeper circuit is configured drive a voltage on the global bit line, at least one bus line, a global bit line connection circuit in electrical communication with a global bit line of the plurality of global bit lines and a bus line of the at least one bus line where the global bit line connection circuit is configured to electrically connect the global bit line and the bus line, at least one write buffer circuit in electrical communication with the at least one bus line, at least one current source in electrical communication with the at least one bus line, and at least one sense device where each sense device of the at least one sense device is in electrical communication with the reference line and a bus line of the at least one bus line.

According to another aspect of the present disclosure, each reference line connection circuit comprises a plurality of NMOS transistors and where each NMOS transistor of the plurality of NMOS transistors is in electrical communication with the reference line.

According to another aspect of the present disclosure, the keeper circuit comprises a plurality of NMOS transistors and where each NMOS transistor of plurality of NMOS transistors is in electrical communication with a global bit line of the plurality of global bit lines.

According to another aspect of the present disclosure, the global bit line connection circuit comprises a plurality of PMOS transistors and where each PMOS transistor of the plurality of PMOS transistors is in electrical communication with a global bit line of the plurality of global bit lines and a bus line of the at least one bus line.

According to another aspect of the present disclosure, each current source of the at least one current source is configurable to sink an amount of current for an operation of a resistive change element of the plurality of resistive change elements.

According to another aspect of the present disclosure, each sense device of the at least one sense device is a sense amplifier configurable into an initializing configuration and a comparing configuration.

According to another aspect of the present disclosure, the electrical device further comprises a reference line, a reference line connection circuit for each section of the resistive change element array wherein each reference line connection circuit is in electrical communication with the reference line and where each reference line connection circuit is configured to drive a voltage on the reference line, a keeper circuit in electrical communication with a global bit line of the plurality of global bit lines, at least one bus line, at least one first input device in electrical communication with the at least one bus line, a second input device in electrical communication with the reference line, a global bit line connection circuit in electrical communication with the reference line, a global bit line of the plurality of global bit lines, the second input device, and a bus line of the at least one bus line where the global bit line connection circuit is configured to electrically connect the reference line and the second input device and where the global bit line connection circuit is configured to electrically connect the global bit line and the bus line, at least one write buffer circuit in electrical communication with the at least one bus line, at least one current source in electrical communication with the at least one bus line, and at least one sense device where each sense device of the at least one sense device is in electrical communication with a first input device of the at least one first input device and the second input device.

According to another aspect of the present disclosure, the global bit line connection circuit comprises a PMOS transistor in electrical communication with the reference line and the second input device, a plurality of PMOS transistors, and where each PMOS transistor of the plurality of PMOS transistors is in electrical communication with a global bit line of the plurality of global bit lines and a bus line the at least one bus line.

According to another aspect of the present disclosure, each sense device of the at least one sense device is a sense amplifier configurable into an initializing configuration and a comparing configuration.

Other features and advantages of the present disclosure will become apparent from the following description, which is provided below in relation to the accompanying drawings.

BRIEF DESCRIPTION OF DRAWINGS

FIG. 1D-2 illustrates a second part of a simplified schematic diagram of an exemplary implementation of the first exemplary architecture for programming and accessing resistive change elements.

FIG. 1E-1 illustrates a first part of a simplified schematic diagram of the exemplary implementation of the first exemplary architecture showing current flow through a resistive change element array during a PROGRAMMING operation to adjust a resistive state of resistive change element O01 to a low resistive state.

FIG. 1E-2 illustrates a second part of a simplified schematic diagram of the exemplary implementation of the first exemplary architecture showing current flow through a resistive change element array during a PROGRAMMING operation to adjust a resistive state of resistive change element O01 to a low resistive state.

FIG. 1F-1 illustrates a first part of a simplified schematic diagram of the exemplary implementation of the first exemplary architecture showing current flow through a resistive change element array during a PROGRAMMING operation to adjust a resistive state of resistive change element O01 to a high resistive state.

FIG. 1F-2 illustrates a second part of a simplified schematic diagram of the exemplary implementation of the first exemplary architecture showing current flow through a resistive change element array during a PROGRAMMING operation to adjust a resistive state of resistive change element O01 to a high resistive state.

FIG. 1G-1 illustrates a first part of a simplified schematic diagram of the exemplary implementation of the first exemplary architecture showing current flow through a resistive change element array during a READ operation of resistive change element O01 when resistive change element O01 has a low resistive state.

FIG. 1G-2 illustrates a second part of a simplified schematic diagram of the exemplary implementation of the first exemplary architecture showing current flow through a resistive change element array during a READ operation of resistive change element O01 when resistive change element O01 has a low resistive state.

FIG. 1H-1 illustrates a first part of a simplified schematic diagram of the exemplary implementation of the first exemplary architecture showing current flow through a resistive change element array during a READ operation of resistive change element O01 when resistive change element O01 has a high resistive state.

FIG. 1H-2 illustrates a second part of a simplified schematic diagram of the exemplary implementation of the first exemplary architecture showing current flow through a resistive change element array during a READ operation of resistive change element O01 when resistive change element O01 has a high resistive state.

FIG. 1I-1 illustrates a first part of a simplified schematic diagram of an exemplary DDR compatible implementation of the first exemplary architecture for programming and accessing resistive change elements.

FIG. 1I-2 illustrates a second part of a simplified schematic diagram of an exemplary DDR compatible implementation of the first exemplary architecture for programming and accessing resistive change elements.

FIG. 1I-3 illustrates a third part of a simplified schematic diagram of an exemplary DDR compatible implementation of the first exemplary architecture for programming and accessing resistive change elements.

FIG. 1J-1 illustrates a first part of a simplified schematic diagram of the exemplary DDR compatible implementation of the first exemplary architecture showing current flow through a resistive change element array during a PROGRAMMING operation to adjust resistive states of odd resistive change elements in electrical communication with word line Wa(1) in Section A to low resistive states.

FIG. 1J-2 illustrates a second part of a simplified schematic diagram of the exemplary DDR compatible implementation of the first exemplary architecture showing current flow through a resistive change element array during a PROGRAMMING operation to adjust resistive states of odd resistive change elements in electrical communication with word line Wa(1) in Section A to low resistive states.

FIG. 1J-3 illustrates a third part of a simplified schematic diagram of the exemplary DDR compatible implementation of the first exemplary architecture showing current flow through a resistive change element array during a PROGRAMMING operation to adjust resistive states of odd resistive change elements in electrical communication with word line Wa(1) in Section A to low resistive states.

FIG. 1K-1 illustrates a first part of a simplified schematic diagram of the exemplary DDR compatible implementation of the first exemplary architecture showing current flow through a resistive change element array during a PROGRAMMING operation to adjust resistive states of odd resistive change elements in electrical communication with word line Wa(1) in Section A to high resistive states.

FIG. 1K-2 illustrates a second part of a simplified schematic diagram of the exemplary DDR compatible implementation of the first exemplary architecture showing current flow through a resistive change element array during a PROGRAMMING operation to adjust resistive states of odd resistive change elements in electrical communication with word line Wa(1) in Section A to high resistive states.

FIG. 1K-3 illustrates a third part of a simplified schematic diagram of the exemplary DDR compatible implementation of the first exemplary architecture showing current flow through a resistive change element array during a PROGRAMMING operation to adjust resistive states of odd resistive change elements in electrical communication with word line Wa(1) in Section A to high resistive states.

FIG. 1L-1 illustrates a first part of a simplified schematic diagram of the exemplary DDR compatible implementation of the first exemplary architecture showing current flow through a resistive change element array during a READ operation of odd resistive change elements in electrical communication with word line Wa(1) in Section A.

FIG. 1L-2 illustrates a second part of a simplified schematic diagram of the exemplary DDR compatible implementation of the first exemplary architecture showing current flow through a resistive change element array during a READ operation of odd resistive change elements in electrical communication with word line Wa(1) in Section A.

FIG. 1L-3 illustrates a third part of a simplified schematic diagram of the exemplary DDR compatible implementation of the first exemplary architecture showing current flow through a resistive change element array during a READ operation of odd resistive change elements in electrical communication with word line Wa(1) in Section A.

FIG. 3 illustrates a flow chart showing a method for programming a resistive change element using neutral voltage conditions.

FIG. 4 illustrates a flow chart showing a method for accessing a resistive change element using neutral voltage conditions.

FIG. 5B-1 illustrates a first part of a simplified schematic diagram of an exemplary implementation of the second exemplary architecture for programming and accessing resistive change elements.

FIG. 5B-2 illustrates a second part of a simplified schematic diagram of an exemplary implementation of the second exemplary architecture for programming and accessing resistive change elements.

FIG. 5D-1 illustrates a first part of a simplified schematic diagram of the exemplary implementation of FIGS. 5B-1 and 5B-2 showing current flow through a resistive change element array during a READ operation of resistive change element O01 when resistive change element O01 has a low resistive state.

FIG. 5D-2 illustrates a second part of a simplified schematic diagram of the exemplary implementation of FIGS. 5B-1 and 5B-2 showing current flow through a resistive change element array during a READ operation of resistive change element O01 when resistive change element O01 has a low resistive state.

FIG. 5E-1 illustrates a first part of a simplified schematic diagram of the exemplary implementation of FIGS. 5B-1 and 5B-2 showing current flow through a resistive change element array during a READ operation of resistive change element O01 when resistive change element O01 has a high resistive state.

FIG. 5E-2 illustrates a second part of a simplified schematic diagram of the exemplary implementation of FIGS. 5B-1 and 5B-2 showing current flow through a resistive change element array during a READ operation of resistive change element O01 when resistive change element O01 has a high resistive state.

FIG. 5F-1 illustrates a first part of a simplified schematic diagram of an exemplary DDR compatible implementation of the second exemplary architecture for programming and accessing resistive change elements.

FIG. 5F-2 illustrates a second part of a simplified schematic diagram of an exemplary DDR compatible implementation of the second exemplary architecture for programming and accessing resistive change elements.

FIG. 5F-3 illustrates a third part of a simplified schematic diagram of an exemplary DDR compatible implementation of the second exemplary architecture for programming and accessing resistive change elements.

FIG. 5F-4 illustrates a fourth part of a simplified schematic diagram of an exemplary DDR compatible implementation of the second exemplary architecture for programming and accessing resistive change elements.

FIG. 5G-1 illustrates a first part of a simplified schematic diagram of the exemplary DDR compatible implementation of the second exemplary architecture showing current flow through a resistive change element array during a READ operation of odd resistive change elements in electrical communication with word line Wa(1) in Section A.

FIG. 5G-2 illustrates a second part of a simplified schematic diagram of the exemplary DDR compatible implementation of the second exemplary architecture showing current flow through a resistive change element array during a READ operation of odd resistive change elements in electrical communication with word line Wa(1) in Section A.

FIG. 5G-3 illustrates a third part of a simplified schematic diagram of the exemplary DDR compatible implementation of the second exemplary architecture showing current flow through a resistive change element array during a READ operation of odd resistive change elements in electrical communication with word line Wa(1) in Section A.

FIG. 5G-4 illustrates a fourth part of a simplified schematic diagram of the exemplary DDR compatible implementation of the second exemplary architecture showing current flow through a resistive change element array during a READ operation of odd resistive change elements in electrical communication with word line Wa(1) in Section A.

DETAILED DESCRIPTION

Figure 1A:
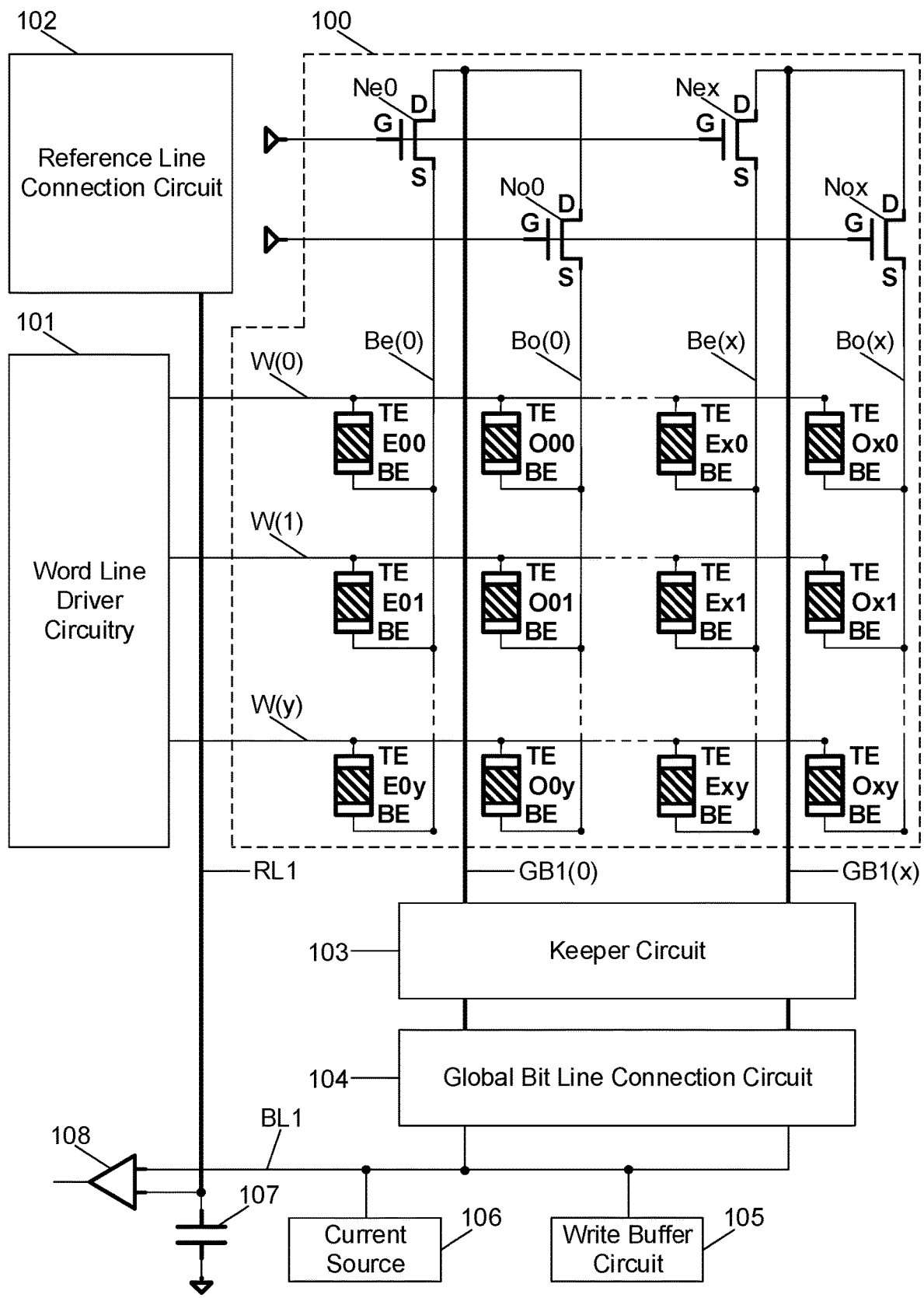
FIG. 1A illustrates a simplified schematic diagram of a first exemplary architecture for programming and accessing resistive change elements.

The present disclosure provides circuit architectures for programming and accessing resistive change elements. The circuit architectures of the present disclosure can program and access resistive change elements using neutral voltage conditions. The present disclosure also provides methods for programming and accessing resistive change elements using neutral voltage conditions. A neutral voltage condition is provided for a resistive change element in a resistive change element array by applying a voltage to a top of the resistive change element and a voltage to a bottom of the resistive change element such that those voltages can reduce the magnitude and/or the number of voltage transitions required for programming operations and accessing operations. The voltages applied to the top and bottom of a resistive change element to provide a neutral voltage condition may be the same voltage or different voltages sufficient to provide a neutral voltage condition. Suitable voltages for providing a neutral voltage condition may depend on voltages that are required for programming operations and accessing operations, such as READ operations, SET VERIFY operations, and RESET VERIFY operations, and a voltage limit for disturbing a resistive state of a resistive change element.

For example, where a voltage of VDD (system voltage) is required to be applied across a resistive change element for programming operations, a voltage of VDD is required to be applied to a top of a resistive change element for accessing operations, and a voltage limit for disturbing a resistive state of a resistive change element is greater than VDD/2 (half the system voltage VDD), a neutral voltage condition can be provided for the resistive change element by applying a voltage of VDD/2 to a top of the resistive change element and a voltage of VDD/2 to a bottom of the resistive change element. In the above example, providing neutral voltage conditions for resistive change elements in a resistive change element array prior to applying voltages for programming operations reduces the magnitude of voltage transitions required for programming operations because a voltage transition of only VDD/2 is required to place a top of a resistive change element at a voltage of VDD, and because a voltage transition of only negative VDD/2 is required to place a bottom of a resistive change element at a voltage of 0 volts or ground. Also, in the above example, providing neutral voltage conditions prior to applying voltages for accessing operations reduces the magnitude of voltage transitions required for accessing operations because a voltage transition of only VDD/2 is required to place a top of a resistive change element at a voltage of VDD. Additionally, in the above example, providing neutral voltage conditions for resistive change elements in a resistive change element array prior to applying voltages for programming operations and accessing operations reduces the number of voltage transitions for programming operations and accessing operations because only voltages on array lines in electrical communication with a resistive change element being programmed or accessed are adjusted for programming and accessing operations, the voltages on other array lines are not required to be adjusted so that resistive states of other resistive change elements are not disturbed. It is noted that the terms bit line and word line are not limited to the lines designated below, but rather, the terms bit line and word line can be used to refer to lines that differ from the designations below.

Voltages applied to a resistive change element to provide a neutral voltage condition are design variables that can be selected by a circuit designer such that those voltages can reduce the magnitude and/or the number of voltage transitions required for programming operations and accessing operations. It is noted that when voltages at the exact midpoint between the system voltage VDD and 0 volts or ground are applied to a resistive change element for a providing neutral voltage condition, the voltage on a top of a resistive change element and the voltage on a bottom of a resistive change element are adjusted by the same voltage increment of VDD/2 to apply the system voltage VDD or to apply 0 volts or ground. It is further noted that although voltages at the exact midpoint between the system voltage VDD and 0 volts or ground are discussed below as the exemplary voltages being applied to resistive change elements for providing neutral voltage conditions, voltages applied to resistive change elements for providing neutral voltage conditions are not limited to being VDD/2 and a circuit designer can select other voltages that may deviate somewhat from VDD/2 for providing neutral voltage conditions.

The present disclosure additionally provides sense amplifiers configurable into initializing configurations for initializing the sense amplifiers and comparing configurations for comparing voltages received by the sense amplifiers. The sense amplifiers can be initialized to compensate for performance differences between parts of the sense amplifiers. For example, performance differences between parts of the sense amplifiers may be caused by manufacturing variations, fabrication variations, temperature variations, and environment. Compensating for performance differences between parts of the sense amplifiers can increase accuracy of comparing voltages received by the sense amplifiers. Additionally, the sense amplifiers can be included in the circuit architectures of the present disclosure and the sense amplifiers can increase accuracy of accessing operations, such as READ operations, SET VERIFY operations, and RESET VERIFY operations, by reducing errors in determining resistive states of resistive change elements.

A PROGRAMMING operation of a resistive change element that is programmable into two non-volatile resistive states, a low resistive state (corresponding, typically, to a logic 1, a SET state) and a high resistive state (corresponding, typically, to a logic 0, a RESET state), is an operation to adjust a resistive state of the resistive change element to a low resistive state or a high resistive state. A READ operation of a resistive change element that is programmable into two non-volatile resistive states, a low resistive state (corresponding, typically, to a logic 1, a SET state) and a high resistive state (corresponding, typically, to a logic 0, a RESET state), is an operation to determine whether the resistive change element has a low resistive state or a high resistive state. Additionally, a READ operation is used to describe an operation where a resistive state of at least one resistive change element is determined without significantly altering the resistive state. A SET VERIFY operation of a resistive change element that is programmable into two non-volatile resistive states, a low resistive state (corresponding, typically, to a logic 1, a SET state) and a high resistive state (corresponding, typically, to a logic 0, a RESET state), is an operation to determine whether the resistive change element has a low resistive state or a resistive state other than a low resistive state. A SET VERIFY operation requires a correspondence between a resistance of a resistive change element and a model resistance for a low resistive state to determine the resistive change element has a low resistive state closer than a correspondence between a resistance of a resistive change element and a model resistance for a low resistive state to determine the resistive change element has a low resistive state for a READ operation. Additionally, a SET VERFIY operation is used to describe an operation where it is determined whether a resistive state of at least one resistive change element is a low resistive state without significantly altering the resistive state. A RESET VERIFY operation of a resistive change element that is programmable into two non-volatile resistive states, a low resistive state (corresponding, typically, to a logic 1, a SET state) and a high resistive state (corresponding, typically, to a logic 0, a RESET state), is an operation to determine whether the resistive change element has a high resistive state or a resistive state other than a high resistive state. A RESET VERIFY operation requires a correspondence between a resistance of a resistive change element and a model resistance for a high resistive state to determine the resistive change element has a high resistive state closer than a correspondence between a resistance of a resistive change element and a model resistance for a high resistive state to determine the resistive change element has a high resistive state for a READ operation. Additionally, a RESET VERFIY operation is used to describe an operation where it is determined whether a resistive state of at least one resistive change element is a high resistive state without significantly altering the resistive state.

Referring now to FIG. 1A, a first exemplary architecture for programming and accessing resistive change elements is illustrated in a simplified schematic diagram. The first exemplary architecture includes a resistive change element array 100, a plurality of global bit lines GB1(0)-GB1($x$), word line driver circuitry 101, a reference line RL1, a reference line connection circuit 102, a keeper circuit 103, a global bit line connection circuit 104, a bus line BL1, a write buffer circuit 105, a current source 106, a capacitor 107, and a sense device 108. It is noted that although the first exemplary architecture is shown in FIG. 1A including one bus line, one write buffer circuit, one current source, and one sense device, the first exemplary architecture can include multiple bus lines, multiple write buffer circuits, multiple current sources, and multiple sense devices. For example, the first exemplary architecture can include multiple bus lines, multiple write buffer circuits, multiple current sources, and multiple sense devices so that multiple resistive change elements can be programmed to the same resistive state at the same time and so that multiple resistive change elements can be accessed at the same time. For example, to facilitate compatibility with memory functionality where programming operations program multiple bits of data at the same time and accessing operations access multiple bits of data at the same time, such as double data rate (DDR) memory functionality, the first exemplary architecture can include one bus line, one write buffer circuit, one current source, and one sense device for each global bit line in the plurality of global bit lines GB1(0)-GB1($x$). In the above example where the first exemplary architecture includes one bus line, one write buffer circuit, one current source, one first input device, and one sense device for each global bit line in the plurality of global bit lines GB1(0)-GB1($x$), a circuit designer may select the number of global bit lines based on the number of bits of data to be accessed at the same time, such as 32 global bit lines so that 32 bits of data can be accessed at the same time and 64 global bit lines so that 64 bits of data can be accessed at the same time.

Further, although the first exemplary architecture is shown in FIG. 1A including a resistive change element array 100 having one section in electrical communication with the plurality of global bit lines GB1(0)-GB1(x), the first exemplary architecture can include a resistive change element array having multiple sections in electrical communication with the plurality of global bit lines GB1(0)-GB1(x) along with word line driver circuitry for each of the multiple sections and a reference line connection circuit for each of the multiple sections. For example, the first exemplary architecture can include a resistive change element array having two sections in electrical communication with the plurality of global bit lines GB1(0)-GB1(x), word line driver circuitry for each section and a reference line connection circuit for each section. In the above example, when the resistive change element array includes two sections having the same number of resistive change elements, the amount of data storage may be doubled as compared to a resistive change element array including one section having the same number of resistive change elements as one of the two sections without doubling the chip area consumed by the first exemplary architecture because the keeper circuit 103, the global bit line connection circuit 104, the bus line BL1, the write buffer circuit 105, the current source 106, the capacitor 107, and the sense device 108 can be shared by the two sections. It is additionally noted that the chip area consumed by the first exemplary architecture also can be reduced by locating word line driver circuitry for each section and a reference line connection circuit for each section below the resistive change element array. It is further noted that the first exemplary architecture can include multiple bus lines, multiple write buffer circuits, multiple current sources, multiple sense devices, and a resistive change element array having multiple sections in electrical communication with the plurality of global bit lines GB1(0)-GB1(x) and that the multiple bus lines, multiple write buffer circuits, multiple current sources, and multiple sense devices can be shared by the multiple sections.

The resistive change element array 100 includes a plurality of resistive change elements E00-Oxy, a plurality of even bit lines Be(0)-Be(x), a plurality of odd bit lines Bo(0)-Bo(x), a plurality of word lines W(0)-W(y), a plurality of even selection devices Ne0-Nex, and a plurality of odd selection devices No0-Nox. Each resistive change element in the plurality of resistive change elements E00-Oxy includes a bottom electrode BE, a resistive change material, and a top electrode TE. A nanotube fabric serves as the resistive change material. The resistive change material is shown in FIG. 1A using diagonal lines between the bottom electrode BE and the top electrode TE. The bottom electrode BE is in contact with the resistive change material and the top electrode TE is in contact with the resistive change material. Alternatively, each resistive change element in the plurality of resistive change elements E00-Oxy can include at least one intervening layer located between the bottom electrode BE and the resistive change material, at least one intervening layer located between the resistive change material and the top electrode TE, or at least one intervening layer located between the bottom electrode BE and the resistive change material and at least one intervening layer located between the resistive change material and the top electrode TE. Alternatively, the bottom electrode BE can be omitted from each resistive change element in the plurality of resistive change elements E00-Oxy, the top electrode TE can be omitted from the each resistive change element in the plurality of resistive change elements E00-Oxy, or the bottom electrode BE and the top electrode TE can be omitted from each resistive change element in the plurality of resistive change elements E00-Oxy. Alternatively, the resistive change material can comprise another resistive change material such as other carbon allotropes such as Buckyballs, graphene flakes, nanocapsules, and nanohorns. It is noted that while the present disclosure provides some examples of resistive change elements including nanotube fabrics or other carbon allotropes as resistive change materials the present disclosure is not limited to resistive change elements including nanotube fabrics or other carbon allotropes as resistive change materials and that the present disclosure is applicable to other types of resistive change elements such as phase change, metal oxide, and solid electrolyte.

Each resistive change element of the plurality of resistive change elements E00-Oxy can be adjusted (programmed) between two non-volatile resistive states, a low resistive state, for example a resistance on the order of 1 MΩ (corresponding, typically, to a logic '1,' a SET state), and a high resistive state, for example a resistance on the order of 1040 (corresponding, typically, to a logic '0,' a RESET state), by applying electrical stimuli to the resistive change element. When the resistive change elements are adjusted (programmed) between resistive states in a bidirectional manner, the resistive change elements are adjusted (programmed) between resistive states by electrical stimuli that cause current flow in different directions relative to the top electrodes TE and the bottom electrodes BE. When the resistive change elements are adjusted (programmed) between resistive states in a bidirectional manner, the resistive change elements can be adjusted to the low resistive state by an electrical stimulus that causes current flow from the bottom electrode BE to the top electrode TE and can be adjusted to the high resistive state by an electrical stimulus that causes current flow from the top electrode TE to the bottom electrode BE. When the resistive change elements are adjusted (programmed) between resistive states in a unidirectional manner, the resistive change elements are adjusted (programmed) between resistive states by electrical stimuli that cause current flow in the same direction relative to the top electrodes TE and the bottom electrodes BE. When the resistive change elements are adjusted (programmed) between resistive states in a unidirectional manner, the resistive change elements can be adjusted between the low resistive state and the high resistive state by electrical stimuli that cause current flow in the same direction relative to the top electrode TE and the bottom electrode BE. Alternatively, each resistive change element of the plurality of resistive change elements E00-Oxy can be adjusted (programmed) between more than two non-volatile resistive states, where each non-volatile resistive state corresponds with a different resistance value, by applying electrical stimuli to the resistive change elements.

As shown in FIG. 1A, the even bit lines of the plurality of even bit lines Be(0)-Be(x) may be arranged generally along the Y-axis and generally in parallel with respect to each other, the odd bit lines of the plurality of odd bit lines Bo(0)-Bo(x) may be arranged generally along the Y-axis and generally in parallel with respect to each other, and the global bit lines of the plurality of global bit lines GB1(0)-GB1(x) may be arranged generally along the Y-axis and generally in parallel with respect to each other. Also, as shown in FIG. 1A, the even bit lines of the plurality of even bit lines Be(0)-Be(x), the odd bit lines of the plurality of odd bit lines Bo(0)-Bo(x), and the global bit lines of the plurality of global bit lines GB1(0)-GB1(x) may be arranged generally in parallel with respect to each other. Additionally, as shown in FIG. 1A, the word lines of the plurality of word lines W(0)-W(y) may be arranged generally along the X-axis and generally in parallel with respect to each other. It is noted that the even bit lines Be(0)-Be(x) are described as being generally in parallel with respect to each other, the odd bit lines Bo(0)-Bo(x) are described as being generally in parallel with respect to each other, the global bit lines GB1(0)-GB1(x) are described as being generally in parallel with respect to each other, and the word lines W(0)-W(y) are described as being generally in parallel with respect to each other to allow for variations from exactly parallel due to the fabrication process. It is also noted that the even bit lines Be(0)-Be(x), the odd bit lines Bo(0)-Bo(x), and the global bit lines GB1(0)-GB1(x) are described as being generally in parallel with respect to each other to allow for variations from exactly parallel due to the fabrication process.

The resistive change element array 100 has one even bit line and one odd bit line per column and one word line per row. The numbering convention for the plurality of even bit lines Be(0)-Be(x) and the plurality of odd bit lines Bo(0)-Bo(x) reflects that the resistive change element array 100 has one even bit line and one odd bit line per column. The numbering convention for the plurality of even bit lines Be(0)-Be(x) begins with the letter B indicating the array line is a bit line followed by the letter e indicating the bit line is an even bit line followed by a column number in parentheses. The numbering convention for the plurality of odd bit lines Bo(0)-Bo(x) begins with the letter B indicating the array line is a bit line followed by the letter o indicating the bit line is an odd bit line followed by a column number in parentheses. The numbering convention for the plurality of word lines W(0)-W(y) begins with the letter W indicating the array line is a word line followed by a row number in parentheses. The numbering convention for the plurality of global bit lines GB1(0)-GB1(x) begins with letters and number GB1 indicating the line is a global bit line followed by a column number in parentheses. Alternatively, the resistive change element array 100 may have at least one column with one even bit line and at least one column with one even bit line and one odd bit line, at least one column with one odd bit line and at least one column with one even bit line and one odd bit line, or at least one column with one even bit line, at least one column with one odd bit line, and at least one column with one even bit line and one odd bit line. It is noted that for discussion purposes the number 0 is considered to be an even number. Also, references to "even" and "odd" herein are for convenience of description and ease of distinction between groups of features and are not intended to be rigid characterizations, insofar as a same architecture could relabel the "even" structures as "odd" structures and vice versa.

As shown in FIG. 1A, the word lines of the plurality of word lines W(0)-W(y) may be generally orthogonal to the even bit lines of the plurality of even bit lines Be(0)-Be(x), the odd bit lines of the plurality of odd bit lines Bo(0)-Bo(x), and the global bit lines of the plurality of global bit lines GB1(0)-GB1(x). Additionally, as shown in FIG. 1A, the resistive change elements of the plurality of resistive change elements E00-Oxy may be located where a word line of the plurality of word lines W(0)-W(y) crosses an even bit line of the plurality of even bit lines Be(0)-Be(x) and where a word line of the plurality of word lines W(0)-W(y) crosses an odd bit line of the plurality of odd bit lines Bo(0)-Bo(x). Resistive change elements located where a word line of the plurality of word lines W(0)-W(y) crosses an even bit line of the plurality of even bit lines Be(0)-Be(x) have top electrodes TE in electrical communication with word lines of the plurality of word lines W(0)-W(y) and bottom electrodes BE in electrical communication with even bit lines of the plurality of even bit lines Be(0)-Be(x). Resistive change elements located where a word line of the plurality of word lines W(0)-W(y) crosses an odd bit line of the plurality of odd bit lines Bo(0)-Bo(x) have top electrodes TE in electrical communication with word lines of the plurality of word lines W(0)-W(y) and bottom electrodes BE in electrical communication with odd bit lines of the plurality of odd bit lines Bo(0)-Bo(x).

The arrangement of the plurality of resistive change elements E00-Oxy reflects the resistive change element array 100 having one even bit line and one odd bit line per column and one word line per row. As shown in FIG. 1A, the plurality of resistive change elements E00-Oxy is arranged in a N×M matrix, where N is a positive integer that is a multiple of 2 and M is a positive integer. The numbering convention for the plurality of resistive change elements E00-Oxy includes the letter E indicating the resistive change element is in electrical communication with an even bit line or the letter O indicating the resistive change element is in electrical communication with an odd bit line followed by a column number followed by a row number. It is noted that although FIG. 1A shows the plurality of resistive change elements E00-Oxy arranged in a rectangular matrix, the plurality of resistive change elements E00-Oxy can be arranged in other layouts such as a square matrix.

As shown in FIG. 1A, even bit lines of the plurality of even bit lines Be(0)-Be(x) and global bit lines of the plurality of global bit lines GB1(0)-GB1(x) having the same column number are in electrical communication with the same even selection device of the plurality of even selection devices Ne0-Nex. The plurality of even selection devices Ne0-Nex are n-channel metal oxide semiconductor field effect transistors, also referred to as NMOS transistors, having drain terminals, gate terminals, and source terminals. The drain terminals of the plurality of even selection devices Ne0-Nex are in electrical communication with the plurality of global bit lines GB1(0)-GB1(x). The gate terminals of the plurality of even selection devices Ne0-Nex are in electrical communication with control logic, such as a processor, a controller, and a microcontroller. The source terminals of the plurality of even selection devices Ne0-Nex are in electrical communication with the plurality of even bit lines Be(0)-Be(x). The numbering convention for the plurality of even selection devices Ne0-Nex includes the letter e indicating the even selection device is in electrical communication with an even bit line followed by a column number. Alternatively, the even selection devices Ne0-Nex can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the plurality of even selection devices Ne0-Nex.

Also, as shown in FIG. 1A, odd bit lines of the plurality of odd bit lines Bo(0)-Bo(x) and global bit lines of the plurality of global bit lines GB1(0)-GB1(x) having the same column number are in electrical communication with the same odd selection device of the plurality of odd selection devices No0-Nox. The plurality of odd selection devices No0-Nox are n-channel metal oxide semiconductor field effect transistors, also referred to as NMOS transistors, having drain terminals, gate terminals, and source terminals. The drain terminals of the plurality of odd selection devices No0-Nox are in electrical communication with the plurality of global bit lines GB1(0)-GB1($x$). The gate terminals of the plurality of odd selection devices No0-Nox are in electrical communication with control logic, such as a processor, a controller, and a microcontroller. The source terminals of the plurality of odd selection devices No0-Nox are in electrical communication with the plurality of odd bit lines Bo(0)-Bo($x$). The numbering convention for the plurality of odd selection devices No0-Nox includes the letter o indicating the odd selection device is in electrical communication with an odd bit line followed by a column number. Alternatively, the odd selection devices No0-Nox can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the plurality of odd selection devices No0-Nox.

The word line driver circuitry 101 is in electrical communication with the plurality of word lines W(0)-W(y) and the word line driver circuitry 101 is configured to drive voltages on the plurality of word lines W(0)-W(y) for programming operations, accessing operations, and providing neutral voltage conditions. The word line driver circuitry 101 can include a plurality of driver circuits with each driver circuit being a driver circuit such as the exemplary driver circuits discussed below with respect to FIGS. 1B-1C. Additionally, the word line driver circuitry 101 can include word line driver circuitry such as the exemplary word line driver circuitry discussed below with respect to FIG. 1D-1. However, the word line driver circuitry 101 is not limited to the driver circuits discussed below with respect to FIGS. 1B-1C and the word line driver circuitry discussed below with respect to FIG. 1D-1. For example, the word line driver circuitry 101 can include a plurality of driver circuits with each driver circuit configured to drive a voltage on a word line of the plurality of word lines W(0)-W(y) for programming operations, accessing operations, and providing neutral voltage conditions and each driver circuit being a driver circuit other than the exemplary driver circuits shown in FIGS. 1B-1C.

The reference line connection circuit 102 is in electrical communication with the reference line RL1 and the reference line connection circuit 102 is configured to drive a voltage on the reference line RL1. An exemplary circuit for the reference line connection circuit 102 is discussed below with respect to FIG. 1D-1. However, the reference line connection circuit 102 is not limited to the reference line connection circuit discussed below with respect to FIG. 1D-1. For example, the reference line connection circuit 102 can be other circuits configured to drive the voltage on the reference line RL1.

The keeper circuit 103 is in electrical communication with the plurality of global bit lines GB1(0)-GB1($x$) and keeper circuit 103 is configured to drive voltages on the plurality of global bit lines GB1(0)-GB1($x$). An exemplary circuit for the keeper circuit 103 is discussed below with respect to FIG. 1D-2. However, the keeper circuit 103 is not limited to the keeper circuit discussed below with respect to FIG. 1D-2. For example, the keeper circuit 103 can be other circuits configured to drive voltages on the plurality of global bit lines GB1(0)-GB1($x$).

The global bit line connection circuit 104 is in electrical communication with the plurality of global bit lines GB1(0)-GB1($x$) and the bus line BL1 and the global bit line connection circuit 104 is configured to electrically connect the plurality of global bit lines GB1(0)-GB1($x$) and the bus line BL1. An exemplary circuit for the global bit line connection circuit 104 is discussed below with respect to FIG. 1D-2. However, the global bit line connection circuit 104 is not limited to the global bit line connection circuit discussed below with respect to FIG. 1D-2. For example, the global bit line connection circuit 104 can be other circuits configured to electrically connect the plurality of global bit lines GB1(0)-GB1($x$) and the bus line BL1.

The write buffer circuit 105 is in electrical communication with the bus line BL1 and the write buffer circuit 105 is configured to drive voltages on the bus line BL1 and lines in electrical communication with the bus line BL1 for programming operations. An exemplary circuit for the write buffer circuit 105 is discussed below with respect to FIG. 1D-2. However, the write buffer circuit 105 is not limited to the write buffer circuit discussed below with respect to FIG. 1D-2. For example, the write buffer circuit 105 can be a circuit such as the exemplary driver circuits discussed below with respect to FIG. 1B-1C or other driver circuit.

The current source 106 is in electrical communication with the bus line BL1. The current source 106 is configured to sink an amount of current for an operation of a resistive change element. The current source 106 may be set to sink different amounts of current for different operations of a resistive change element. For example, the current source 106 may be set to sink an amount of current for a READ operation, an amount of current for a SET VERIFY operation, and an amount of current for a RESET VERIFY operation. Additionally, the current source 106 may be in electrical communication with control logic, such as a processor, a controller, and a microcontroller, and the current source 106 may be set to sink an amount of current based on at least one signal from the control logic. Alternatively, the current source 106 may be hardwired to sink an amount of current.

The capacitor 107 has a first terminal and a second terminal. The first terminal of the capacitor 107 is in electrical communication with the reference line RL1 and the second terminal of the capacitor 107 is in electrical communication with a power supply, a voltage source, a driver circuit, or other device that supplies 0 volts or ground. The capacitor 107 can reduce noise on the reference line RL1 by providing a path for noise to flow to 0 volts or ground. Alternatively, the capacitor 107 can be replaced with a plurality of capacitors, with each capacitor having a first terminal in electrical communication with the reference line RL1 and a second terminal in electrical communication with a power supply, a voltage source, a driver circuit, or other device that supplies 0 volts or ground. Alternatively, the capacitor 107 can be omitted.

The sense device 108 is in electrical communication with the reference line RL1 and the bus line BL1 and the sense device 108 is configured to generate at least one output voltage based on a voltage on the reference line RL1 and a voltage on the bus line BL1. An exemplary sense amplifier for the sense device 108 is discussed below with respect to FIGS. 1D-2 and 2A. However, the sense device 108 is not limited to the sense amplifier discussed below with respect to FIGS. 1D-2 and 2A. For example, the sense device 108 can be a component that generates at least one output voltage based on at least two input voltages, such as a differential amplifier and a sense amplifiers other than the sense amplifier discussed below with respect to FIGS. 1D-2 and 2A.

Figure 1B:
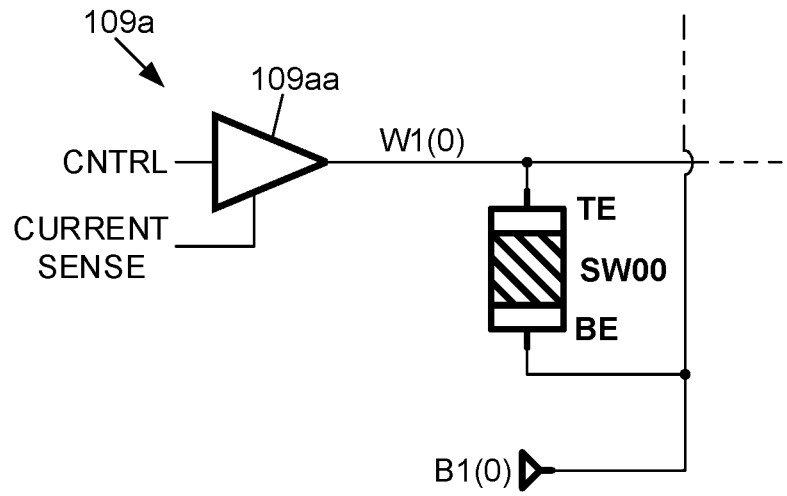
FIG. 1B illustrates a simplified schematic diagram of an exemplary first driver circuit.

FIG. 1B shows a simplified schematic diagram of an exemplary first driver circuit 109a in electrical communication with a word line W1(0) of a resistive change element array represented by the word line W1(0), a bit line B1(0), and a resistive change element SW00 having a top electrode TE in electrical communication with the word line W1(0), a bottom electrode BE in electrical communication with the bit line B1(0), and a resistive change material between the top electrode TE and the bottom electrode BE. The first driver circuit 109a includes a programmable voltage source 109aa responsive to a control signal CNTRL supplied by control logic such as a processor, a controller, and a microcontroller. The control signal CNTRL can be based on a software algorithm executed by the control logic. The programmable voltage source 109aa also provides a feedback signal CURRENT SENSE indicating the current the programmable voltage source 109aa is supplying during operation. The first driver circuit 109a can also include additional components not shown in FIG. 1B, such a resistor for limiting current flow from the programmable voltage source 109aa. It is noted that although the first driver circuit 109a is shown in FIG. 1B in electrical communication with the word line W1(0), the first driver circuit 109a can be in electrical communication with other lines, such as bit lines, global bit lines, and bus lines, and can be used for driving other lines, such as bit lines, global bit lines, and bus lines.

Figure 1C:
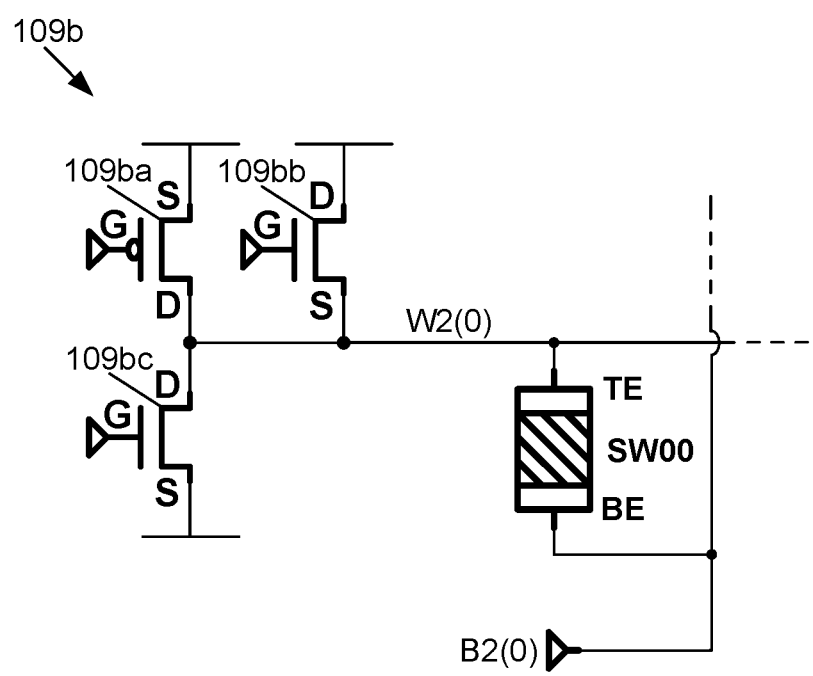
FIG. 1C illustrates a simplified schematic diagram of an exemplary second driver circuit.

FIG. 1C shows a simplified schematic diagram of an exemplary second driver circuit 109b in electrical communication with a word line W2(0) of a resistive change element array represented by the word line W2(0), a bit line B2(0), and a resistive change element SW00 having a top electrode TE in electrical communication with the word line W2(0), a bottom electrode BE in electrical communication with the bit line B2(0), and a resistive change material between the top electrode TE and the bottom electrode BE. The second driver circuit 109b includes a p-channel metal oxide semiconductor field effect transistor 109ba, also referred to as a PMOS transistor, having a drain terminal, a gate terminal, and a source terminal, a first NMOS transistor 109bb having a drain terminal, a gate terminal, and a source terminal, and a second NMOS transistor 109bc having a drain terminal, a gate terminal, and a source terminal. It is noted that although the second driver circuit 109b is shown in FIG. 1C in electrical communication with the word line W2(0), the second driver circuit 109b can be in electrical communication with other lines, such as bit lines, global bit lines, and bus lines, and can be used for driving other lines, such as bit lines, global bit lines, and bus lines. It is also noted that depending on voltage levels being used, an NMOS transistor can be included in place of the PMOS transistor 109ba, a PMOS transistor can be included in place of the first NMOS transistor 109bb, and/or a PMOS transistor can be included in place of the second NMOS transistor 109bc. It is further noted that second driver circuit 109b can include other types of field effect transistors, such as carbon nanotube field effect transistors (CNTFETs), SiGe FETs, fully-depleted silicon-on-insulator FETs, or multiple gate field effect transistors such as FinFETs, in place of the PMOS transistor 109ba, the first NMOS transistor 109bb, and/or the second NMOS transistor 109bc.

The drain terminal of the PMOS transistor 109ba is in electrical communication with the word line W2(0), the gate terminal of the PMOS transistor 109ba is in electrical communication with a circuit, such as a control circuit, a decoder, a buffer, or a latch, that supplies a signal for controlling current flow through the PMOS transistor 109ba, and the source terminal of the PMOS transistor 109ba is in electrical communication with a power supply, a voltage source, a driver circuit, or other device that supplies a desired voltage. The drain terminal of the first NMOS transistor 109bb is in electrical communication with a power supply, a voltage source, a driver circuit, or other device that supplies a desired voltage, the gate terminal of the first NMOS transistor 109bb is in electrical communication with a circuit, such as a control circuit, a decoder, a buffer, or a latch, that supplies a signal for controlling current flow through the first NMOS transistor 109bb, and the source terminal of the first NMOS transistor 109bb is in electrical communication with the word line W2(0). The drain terminal of the second NMOS transistor 109bc is in electrical communication with the word line W2(0), the gate terminal of the second NMOS transistor 109bc is in electrical communication with a circuit, such as a control circuit, a decoder, a buffer, or a latch, that supplies a signal for controlling current flow through the second NMOS transistor 109bc, and the source terminal of the second NMOS transistor 109bc is in electrical communication with a power supply, a voltage source, a driver circuit, or other device that supplies 0 volts or ground. It is noted that the second driver circuit 109b can include additional components not shown in FIG. 1C, such as at least one resistor for limiting current flow and at least one additional field effect transistor in electrical communication with a power supply, a voltage source, a driver circuit, or other device that supplies a desired voltage and the word line W2(0), and can omit components shown in FIG. 1C, such as the PMOS transistor 109ba, the first NMOS transistor 109bb, and/or the second NMOS transistor 109bc.

Figures 1, 1D:
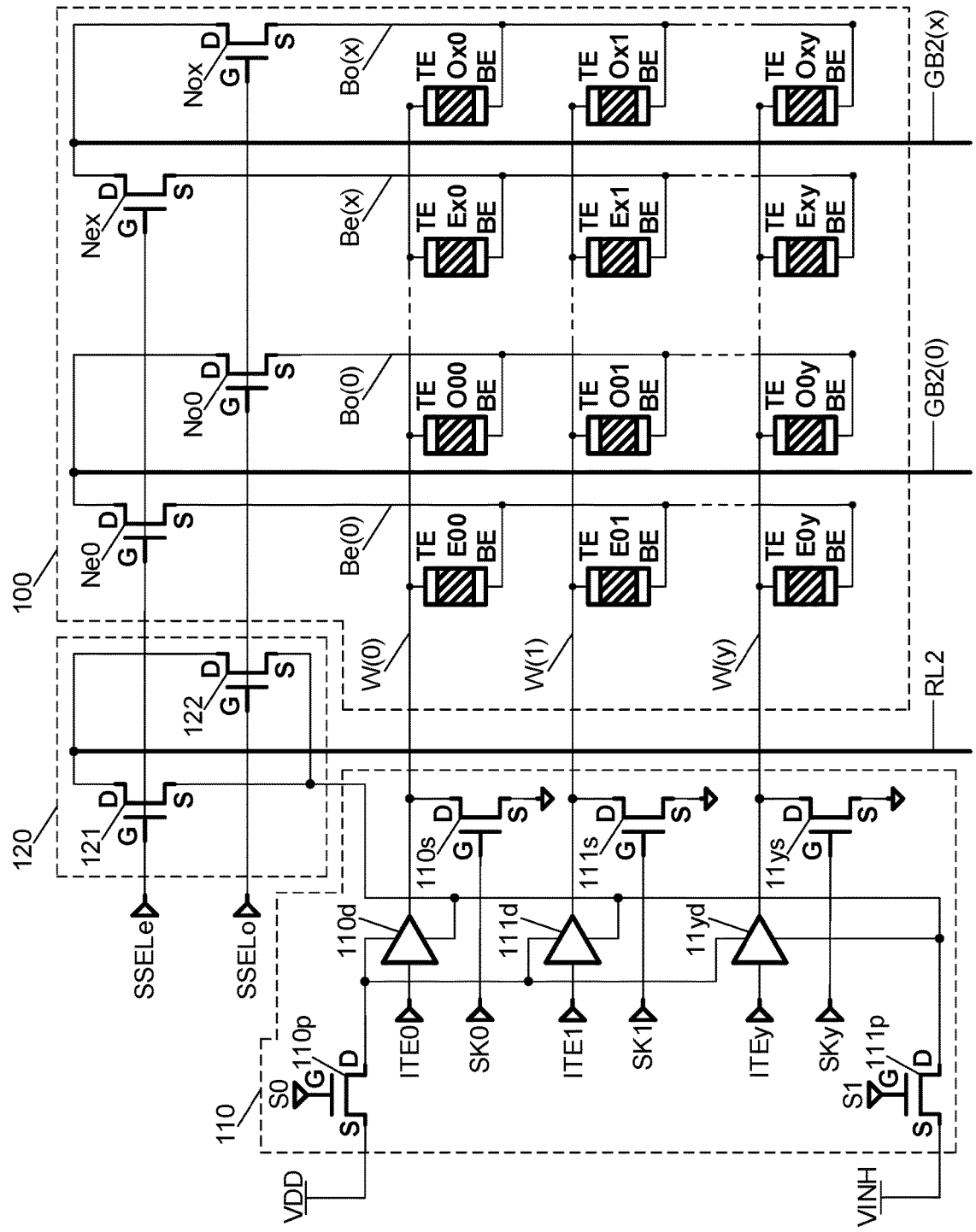
FIG. 1D-1 illustrates a first part of a simplified schematic diagram of an exemplary implementation of the first exemplary architecture for programming and accessing resistive change elements.
Figures 1, 1D, 2:
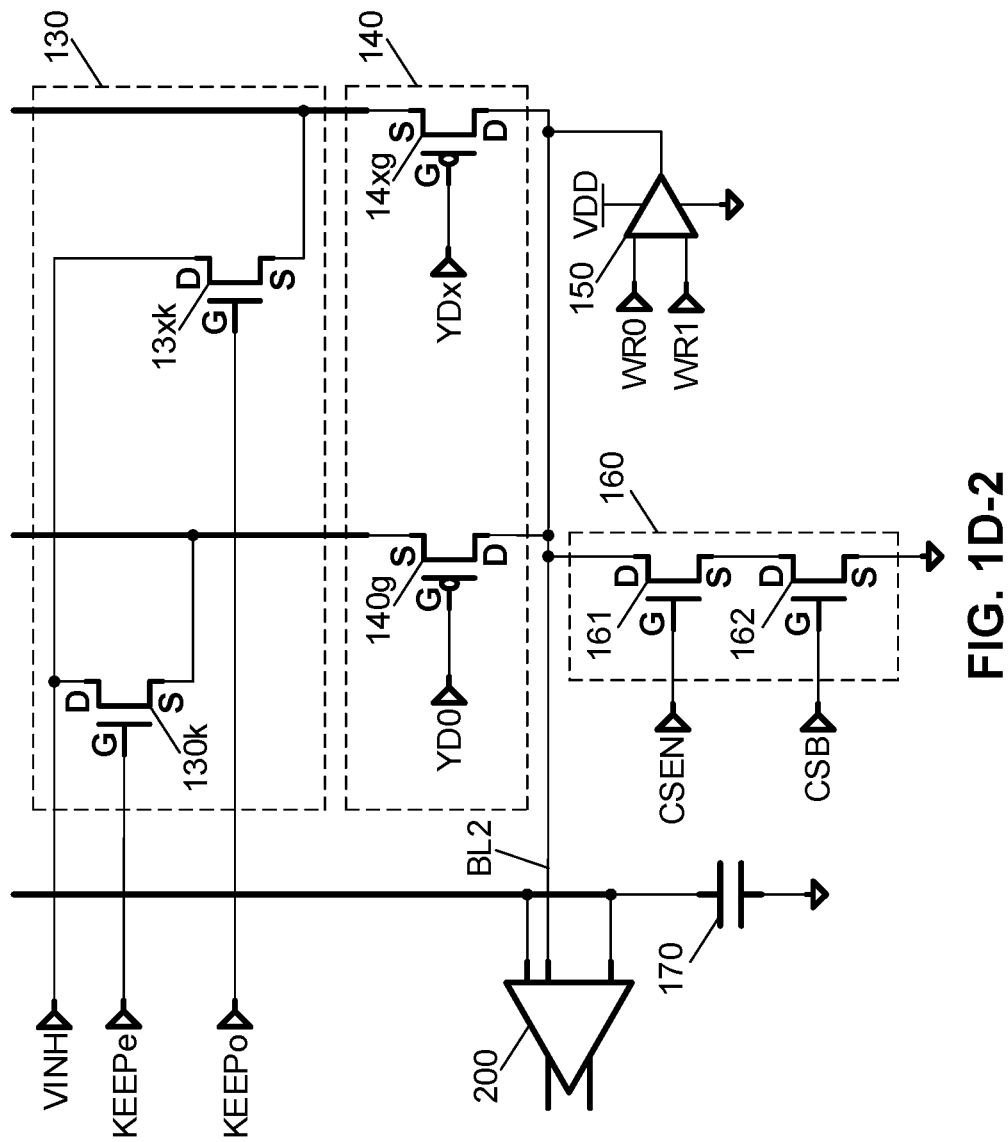

An exemplary implementation of the first exemplary architecture for programming and accessing resistive change elements is illustrated in a simplified schematic diagram in FIGS. 1D-1 and 1D-2. The exemplary implementation of the first exemplary architecture includes a plurality of global bit lines GB2(0)-GB2(x), a resistive change element array 100, word line driver circuitry 110, a reference line RL2, a reference line connection circuit 120, a bus line BL2, a keeper circuit 130, a global bit line connection circuit 140, a write buffer circuit 150, a current source 160, a capacitor 170, and a first sense amplifier 200. The resistive change element array 100 and the plurality of global bit lines GB2(0)-GB2(x) have a similar structure to the resistive change element array 100 and the plurality of global bit lines GB1(0)-GB1(x) discussed above with respect to the first exemplary architecture for programming and accessing resistive change elements. Therefore, the resistive change element array 100 and the plurality of global bit lines GB2(0)-GB2(x) are not discussed in detail with respect to the exemplary implementation of the first exemplary architecture.

The word line driver circuitry 110 includes a first NMOS transistor 110p, a second NMOS transistor 111p, a plurality of word line driver circuits 110d-11yd, and a plurality of sink transistors 110s-11ys. The first NMOS transistor 110p has a drain terminal, a gate terminal, and a source terminal, and the second NMOS transistor 111p has a drain terminal, a gate terminal, and a source terminal. The drain terminal of the first NMOS transistor 110p is in electrical communication with the plurality of word line driver circuits 110d-11yd, the gate terminal of the first NMOS transistor 110p is in electrical communication with control logic, such as a processor, a controller, and a microcontroller, to receive a signal S0 for controlling current flow through the first NMOS transistor 110p, and the source terminal of the first NMOS transistor 110p is in electrical communication with a power supply, a voltage source, a driver circuit, or other device that supplies the system voltage VDD. The drain terminal of the second NMOS transistor 111p is in electrical communication with the plurality of word line driver circuits 110d-11yd and the reference line connection circuit 120, the gate terminal of the second NMOS transistor 111p is in electrical communication with control logic, such as a processor, a controller, and a microcontroller, to receive a signal S1 for controlling current flow through the second NMOS transistor 111p, and the source terminal of the second NMOS transistor 111p is in electrical communication with a power supply, a voltage source, a driver circuit, or other device that supplies the inhibit voltage VINH.

Each word line driver circuit in the plurality of word line driver circuits 110d-11yd has an input terminal, an output terminal, a first power terminal, and a second power terminal. The input terminals of the word line driver circuits in the plurality of word line driver circuits 110d-11yd are in electrical communication with control logic, such as a processor, a controller, and a microcontroller. The output terminals of the word line driver circuits in the plurality of word line driver circuits 110d-11yd are in electrical communication with word lines in the plurality of word lines W(0)-W(y) with the next to last reference character for each word line driver circuit indicating the word line that word line driver circuit is in electrical communication with because the next to last reference character for each word line driver circuit refers to a row number. The first power terminals of the word line driver circuits in the plurality of word line driver circuits 110d-11yd are in electrical communication with the drain terminal of the first NMOS transistor 110p. The second power terminals of the word line driver circuits in the plurality of word line driver circuits 110d-11yd are in electrical communication with the drain terminal of the second NMOS transistor 111p.

The plurality of word line driver circuits 110d-11yd receive a plurality of signals ITE0-ITEy for operating the plurality of word line driver circuits 110d-11yd. The control logic supplies the plurality of signals ITE0-ITEy. The plurality of word line driver circuits 110d-11yd receive the system voltage VDD on the first power terminals when the first NMOS transistor 110p is turned on and do not receive a voltage on the first power terminals when the first NMOS transistor 110p is turned off. The plurality of word line driver circuits 110d-11yd receive the inhibit voltage VINH on the second power terminals when the second NMOS transistor 111p is turned on and do not receive a voltage on the second power terminals when the second NMOS transistor 111p is turned off. When the first NMOS transistor 110p and the second NMOS transistor 111p are turned on each word line driver circuit in the plurality of word line driver circuits 110d-11yd supplies a voltage based on the signal in the plurality of signals ITE0-ITEy received by that word line driver circuit. For example, when the first NMOS transistor 110p and the second NMOS transistor 111p are turned on and the word line driver circuit 110d receives a signal ITE0 having a low level the word line driver circuit 110d supplies the system voltage VDD and when the first NMOS transistor 110p and the second NMOS transistor 111p are turned on and the word line driver circuit 110d receives a signal ITE0 having a high level the word line driver circuit 110d supplies the inhibit voltage VINH. When one of the first NMOS transistor 110p and the second NMOS transistor 111p is turned on and one of the first NMOS transistor 110p and the second NMOS transistor 111p is turned off each word line driver circuit in the plurality of word line driver circuits 110d-11yd supplies a voltage or does not supply a voltage based on the signal in the plurality of signals ITE0-ITEy received by that word line driver circuit. For example, when the first NMOS transistor 110p is turned off and the second NMOS transistor 111p is turned on and the word line driver circuit 110d receives a signal ITE0 having a low level the word line driver circuit 110d does not supply a voltage and when the first NMOS transistor 110p is turned off and the second NMOS transistor 111p is turned on and the word line driver circuit 110d receives a signal ITE0 having a high level the word line driver circuit 110d supplies the inhibit voltage VINH. It is noted that, as discussed below, the inhibit voltage VINH is applied to a top of a resistive change element and the inhibit voltage VINH is applied to a bottom of the resistive change element to provide a neutral voltage condition. It is also noted that the inhibit voltage VINH can have a voltage level of VDD/2 (half of the system voltage VDD) for example, however, the inhibit voltage is not limited to a voltage of VDD/2 and that a circuit designer can select other voltages that may deviate somewhat from VDD/2 for the inhibit voltage VINH.

The plurality of sink transistors 110s-11ys are NMOS transistors having drain terminals, gate terminals, and source terminals. The drain terminals of the plurality of sink transistors 110s-11ys are in electrical communication with the plurality of word lines W(0)-W(y) with the next to last reference character for each sink transistor indicating the word line that sink transistor is in electrical communication with because the next to last reference character for each sink transistor refers to a row number. The gate terminals of the plurality of sink transistors 110s-11ys are in electrical communication with control logic, such as a processor, a controller, and a microcontroller. The source terminals of the plurality of sink transistors 110s-11ys are in electrical communication with a power supply, a voltage source, a driver circuit, or other device that supplies 0 volts or ground. The plurality of sink transistors 110s-11ys receive a plurality of signals SK0-SKy for controlling current flow through the plurality of sink transistors 110s-11ys. The control logic supplies the plurality of signals SK0-SKy. Alternatively, the sink transistors 110s-11ys can be other types of field effect transistors, such as carbon nanotube field effect transistors (CNTFETs), SiGE FETs, fully-depleted silicon-on-insulator FETs, or multiple gate field effect transistors such as Fin-FETs. It is noted that when field effect transistors that do not require a semiconductor substrate are used this enables the field effect transistors to be fabricated on insulator material, and additionally, enables the field effect transistors to be stacked to reduce the amount of chip area consumed by the plurality of sink transistors 110s-11ys.

The reference line connection circuit 120 includes a first NMOS transistor 121 having a drain terminal, a gate terminal, and a source terminal and a second NMOS transistor 122 having a drain terminal, a gate terminal, and a source terminal. The drain terminal of the first NMOS transistor 121 is in electrical communication with the reference line RL2, the gate terminal of the first NMOS transistor 121 is in electrical communication with control logic, such as a processor, a controller, and a microcontroller, and the source terminal of the first NMOS transistor 121 is in electrical communication with the word line driver circuitry 110. The drain terminal of the second NMOS transistor 122 is in electrical communication with the reference line RL2, the gate terminal of the second NMOS transistor 122 is in electrical communication with control logic, such as a processor, a controller, and a microcontroller, and the source terminal of the second NMOS transistor 122 is in electrical communication with the word line driver circuitry 110. The first NMOS transistor 121 receives a signal SSELe for controlling current flow through the first NMOS transistor 121 and the plurality of even selection devices Ne0-Nex. The second NMOS transistor 122 receives a signal SSELo for controlling current flow through the second NMOS transistor 122 and the plurality of odd selection devices No0-Nox. The control logic supplies the signal SSELe and the signal SSELo. Alternatively, the source terminal of the first NMOS transistor 121 and the source terminal of the second NMOS transistor 122 may be in electrical communication a power supply, a voltage source, a driver circuit, or other device that supplies the inhibit voltage VINH. Alternatively, the first NMOS transistor 121 and the second NMOS transistor 122 can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the first NMOS transistor 121 and the second NMOS transistor 122.

The keeper circuit 130 includes a plurality of NMOS transistors 130$k$-13$xk$ having drain terminals, gate terminals, and source terminals. The drain terminals of the plurality of NMOS transistors 130$k$-13$xk$ are in electrical communication with a power supply, a voltage source, a driver circuit, or other device that supplies the inhibit voltage VINH. The gate terminals of the plurality of NMOS transistors 130$k$-13$xk$ are in electrical communication with control logic, such as a processor, a controller, and a microcontroller. The source terminals of the plurality of NMOS transistors 130$k$-13$xk$ are in electrical communication with the plurality of global bit lines GB2(0)-GB2($x$) with the next to last reference character for each NMOS transistor indicating the global bit line that NMOS transistor is in electrical communication with because the next to last reference character for each NMOS transistor refers to a column number. The NMOS transistors in electrical communication with global bit lines having even column numbers receive a signal KEEPe for controlling current flow through the NMOS transistors in electrical communication with global bit lines having even column numbers. The NMOS transistors in electrical communication with the global bit lines having odd column number receive a signal KEEPo for controlling current flow through the NMOS transistors in electrical communication with global bit lines having odd column numbers. The control logic supplies the signal KEEPe and the signal KEEPo. Alternatively, the drain terminals of the plurality of NMOS transistors 130$k$-13$xk$ may be in electrical communication with a field effect transistor and the field effect transistor may be in electrical communication with a power supply, a voltage source, a driver circuit, or other device that supplies the inhibit voltage VINH. Alternatively, the plurality of NMOS transistors 130$k$-13$xk$ can be other types of field effect transistors, such as carbon nanotube field effect transistors (CNTFETs), SiGE FETs, fully-depleted silicon-on-insulator FETs, or multiple gate field effect transistors such as FinFETs. It is further noted that when field effect transistors that do not require a semiconductor substrate are used this enables the field effect transistors to be fabricated on insulator material, and additionally, enables the field effect transistors to be stacked to reduce the amount of chip area consumed by the plurality of NMOS transistors 130$k$-13$xk$.

The global bit line connection circuit 140 includes a plurality of PMOS transistors 140$g$-14$xg$ having drain terminals, gate terminals, and source terminals. The drain terminals of the plurality of PMOS transistors 140$g$-14$xg$ are in electrical communication with the bus line BL2. The gate terminals of the plurality of PMOS transistors 140$g$-14$xg$ are in electrical communication with control logic, such as a processor, a controller, and a microcontroller. The source terminals of the plurality of PMOS transistors 140$g$-14$xg$ are in electrical communication with the plurality of global bit lines GB2(0)-GB2($x$) with the next to last reference character for each PMOS transistor indicating the global bit line that PMOS transistor is in electrical communication with because the next to last reference character refers to the column number. The plurality of PMOS transistors 140$g$-14$xg$ receive a plurality of signals YD0-YDx for controlling current flow through the plurality of PMOS transistors 140$g$-14$xg$. The control logic supplies the plurality of signals YD0-YDx. Alternatively, the PMOS transistors 140$g$-14$xg$ can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the plurality of PMOS transistors 140$g$-14$xg$.

The write buffer circuit 150 has a first input terminal, a second input terminal, an output terminal, a first power terminal, and a second power terminal. The first input terminal and the second input terminal of the write buffer circuit 150 are in electrical communication with control logic, such as a processor, a controller, and a microcontroller. The output terminal of the write buffer circuit 150 is in electrical communication with bus line BL2. The first power terminal of the write buffer circuit 150 is in electrical communication with a power supply, a voltage source, a driver circuit, or other device that supplies a system voltage VDD. The second power terminal of the write buffer circuit 150 is in electrical communication with a power supply, a voltage source, a driver circuit, or other device that supplies 0 volts or ground. The write buffer circuit 150 receives a write set signal WR0 on the first input terminal and a write reset signal WR1 on the second input terminal. The control logic supplies the write set signal WR0 and the write reset signal WR1. When the write buffer circuit 150 receives the write set signal WR0 having a low level and the write reset signal WR1 having a low level the write buffer circuit 150 supplies the system voltage VDD. When the write buffer circuit 150 receives the write set signal WR0 having a high level and the write reset signal WR1 having a high level the write buffer circuit 150 supplies 0 volts or ground. When the write buffer circuit 150 receives the write set signal WR0 having a high level and the write reset signal WR1 having a low level the write buffer circuit 150 does not supply a voltage. Although, not shown in FIG. 1D-2, the output terminal of the write buffer circuit 150 may be in electrical communication with the bus line BL2 through a resistor for limiting current flow from the write buffer circuit 150. Alternatively, the first power terminal of the write buffer circuit 150 may be in electrical communication with a field effect transistor and the field effect transistor may be in electrical communication with a power supply, a voltage source, a driver circuit, or other device that supplies the system voltage VDD and/or the second power terminal of the write buffer circuit 150 may be in electrical communication with a field effect transistor and the field effect transistor may be in electrical communication with a power supply, a voltage source, a driver circuit, or other device that supplies 0 volts or ground.

The current source 160 includes a first NMOS transistor 161 have a drain terminal, a gate terminal, and a source terminal and a second NMOS transistor 162 having a drain terminal, a gate terminal, and a source terminal. The drain terminal of the first NMOS transistor 161 is in electrical communication with the bus line BL2. The gate terminal of the first NMOS transistor 161 is in electrical communication with control logic, such as a processor, a controller, and a microcontroller, to receive a current source enable signal CSEN. The source terminal of the first NMOS transistor 161 is in electrical communication with the drain terminal of the second NMOS transistor 162. The drain terminal of the second NMOS transistor 162 is in electrical communication with the source terminal of the first NMOS transistor 161. The gate terminal of the second NMOS transistor 162 is in electrical communication with control logic, such as a processor, a controller, and a microcontroller, to receive a current source bias current signal CSB. The source terminal of the second NMOS transistor 162 is in electrical communication with a power supply, a voltage source, a driver circuit, or other device that supplies 0 volts or ground. The control logic supplies the current source enable signal CSEN to enable and disable the current source 160 and the current source bias current signal CSB to set the amount of current sunk by the current source 160. The current source 160 may be set to sink different amounts of current for different operations of a resistive change element. For example, the current source 160 may be set to sink an amount of current for a READ operation, an amount of current for a SET VERIFY operation, and an amount of current for a RESET VERIFY operation.

The capacitor 170 has a first terminal and a second terminal. The first terminal of the capacitor 170 is in electrical communication with the reference line RL2 and the second terminal of the capacitor 170 is in electrical communication with a power supply, a voltage source, a driver circuit, or other device that supplies 0 volts or ground. The capacitor 170 can reduce noise on the reference line RL2 by providing a path for noise to flow to 0 volts or ground. Alternatively, the capacitor 170 can be replaced with a plurality of capacitors, with each capacitor having a first terminal in electrical communication with the reference line RL2 and a second terminal in electrical communication with a power supply, a voltage source, a driver circuit, or other device that supplies 0 volts or ground. Alternatively, the capacitor 170 can be omitted.

For ease of illustration, FIG. 1D-2 shows a simplified diagram of the first sense amplifier 200 having two input terminals in electrical communication with the reference line RL2, one input terminal in electrical communication with bus line BL2, and two output terminals. The two output terminals can be in electrical communication with a bus, a buffer, a level shift circuit, a test circuit, or control logic such as a processor, a controller, and a microcontroller. The first sense amplifier 200 is configurable into an initializing configuration and a comparing configuration. The first sense amplifier 200 is shown in greater detail in a simplified schematic diagram in FIG. 2A and the first sense amplifier 200 is discussed in greater detail below.

The exemplary implementation of the first exemplary architecture shown in FIGS. 1D-1 and 1D-2 is discussed below with respect to PROGRAMMING operations, READ operations, SET VERIFY operations, and RESET VERIFY operations. PROGRAMMING operations of resistive change elements in the exemplary implementation of FIGS. 1D-1 and 1D-2 are discussed below with respect to FIGS. 1E-1 and 1E-2 that show current flow during a PROGRAMMING operation to adjust a resistive state of resistive change element O01 to a low resistive state and FIGS. 1F-1 and 1F-2 that show current flow during a PROGRAMMING operation to adjust a resistive state of resistive change element O01 to a high resistive state. READ operations, SET VERIFY operations, and RESET VERIFY operations of resistive change elements in the exemplary implementation of the first exemplary architecture shown in FIGS. 1D-1 and 1D-2 are discussed below with to respect FIGS. 1G-1 and 1G-2 that show current flow during a READ operation of resistive change element O01 when resistive change element O01 has a low resistive state and FIGS. 1H-1 and 1H-2 that show current flow during a READ operation of resistive change element O01 when resistive change element O01 has a high resistive state. It is noted that although PROGRAMMING operations, READ operations, SET VERIFY operations, and RESET VERIFY operations of resistive change element O01 in the exemplary implementation of the first exemplary architecture shown in FIGS. 1D-1 and 1D-2 will be explained in detail below, PROGRAMMING operations, READ operations, SET VERIFY operations, and RESET VERIFY operations of each resistive change element in the exemplary implementation of FIGS. 1D-1 and 1D-2 can be performed in a similar manner to resistive change element O01.

Figures 1, 1E:
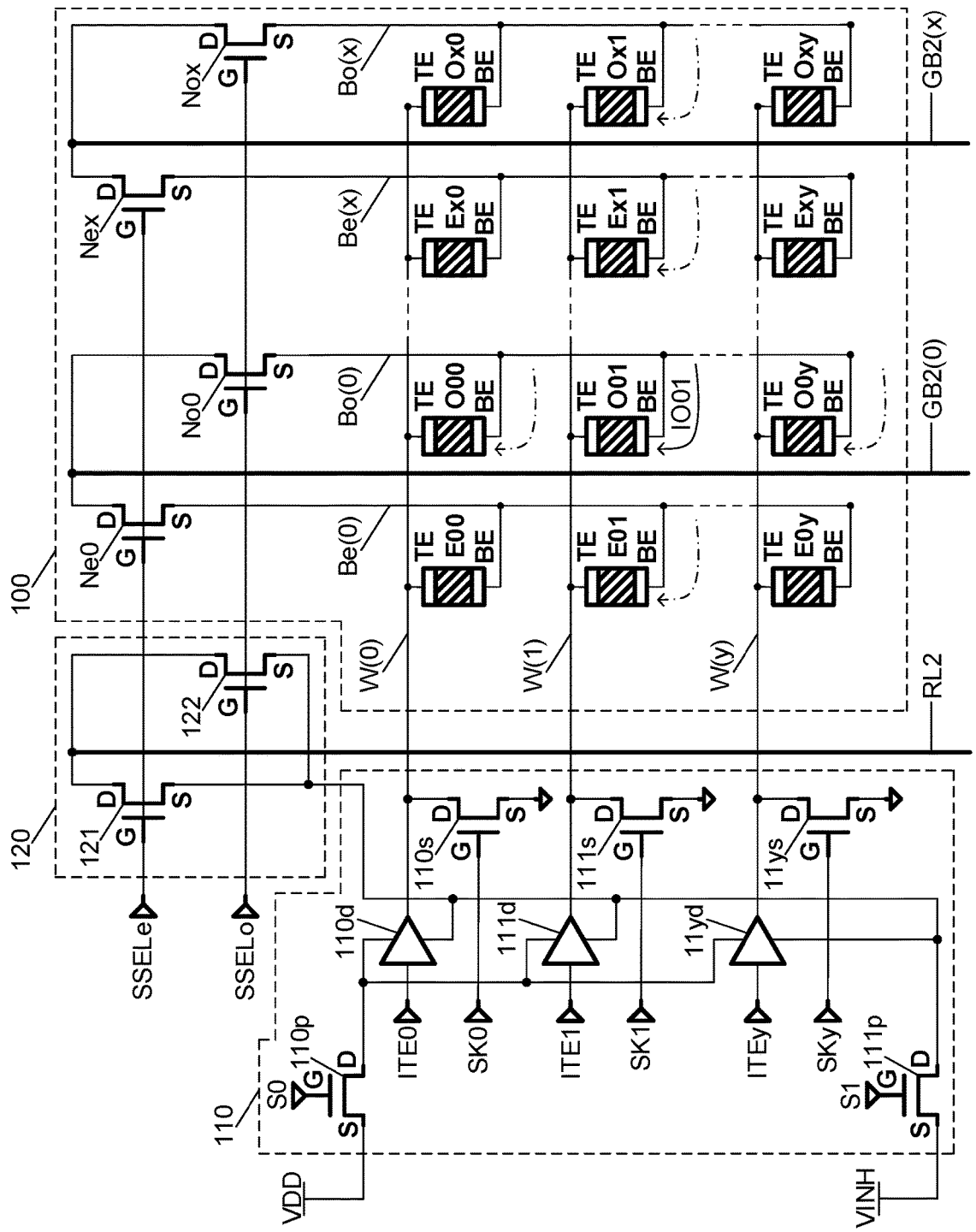
Figures 1, 1E, 2:
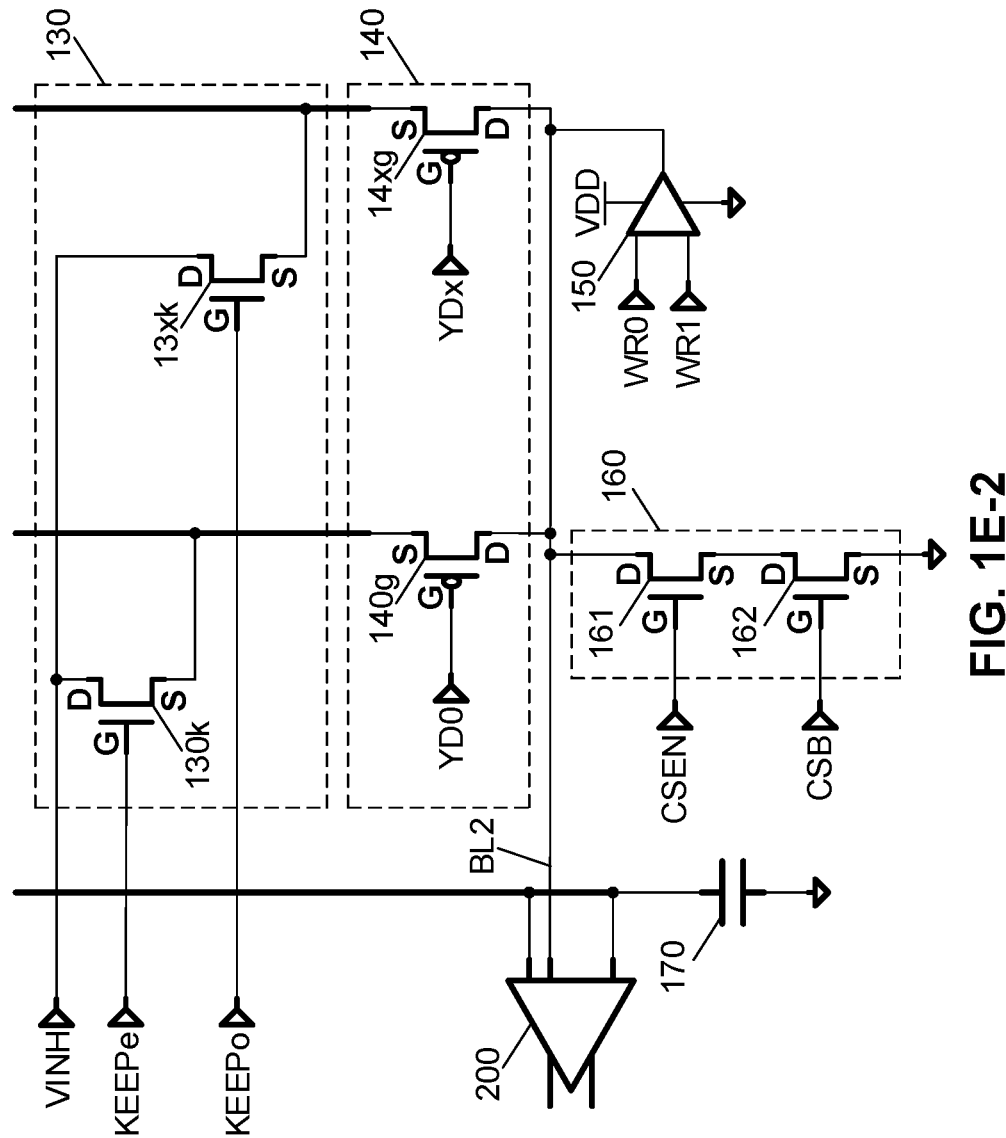
Figures 1, 1F:
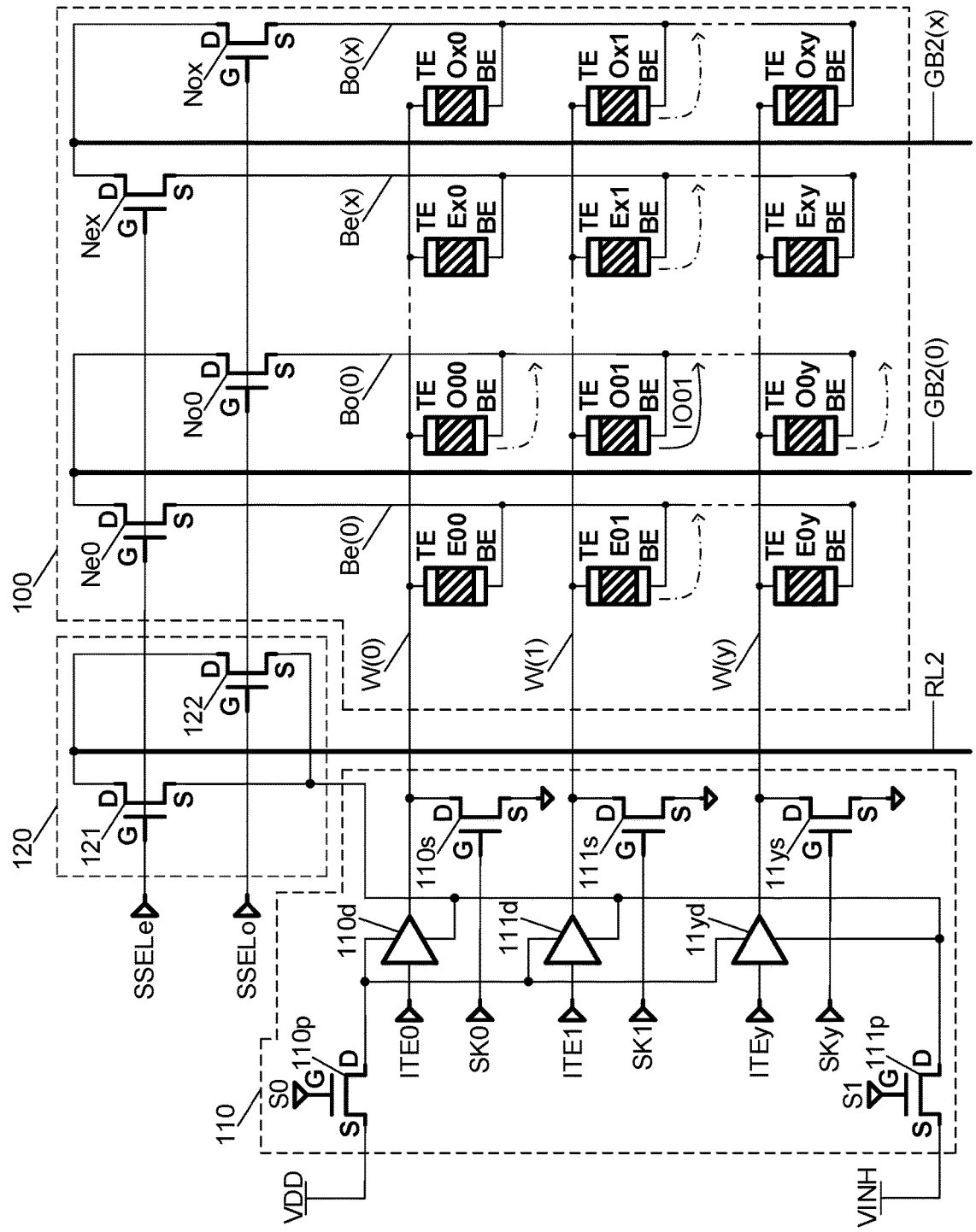
Figures 1, 1F, 2:
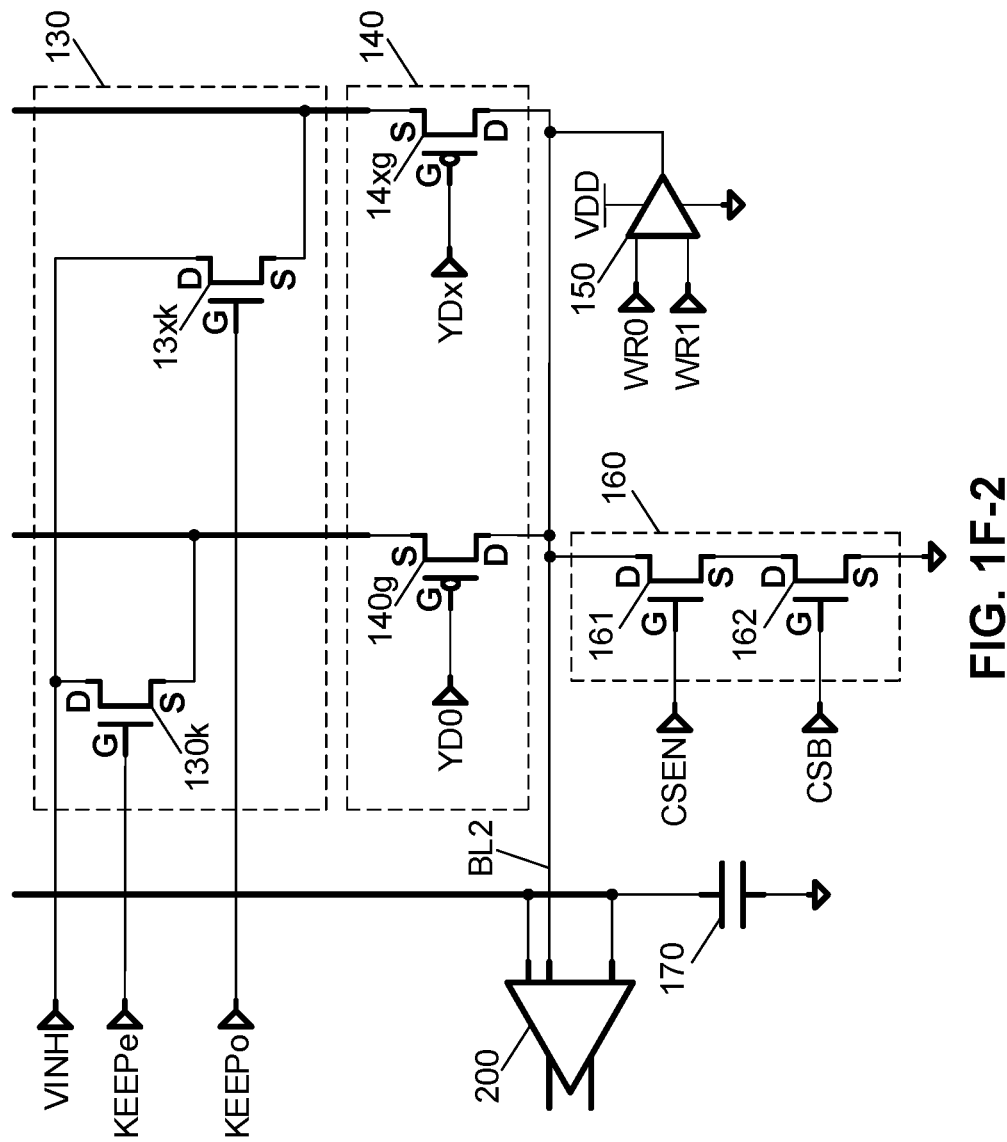
Figures 1, 1G:
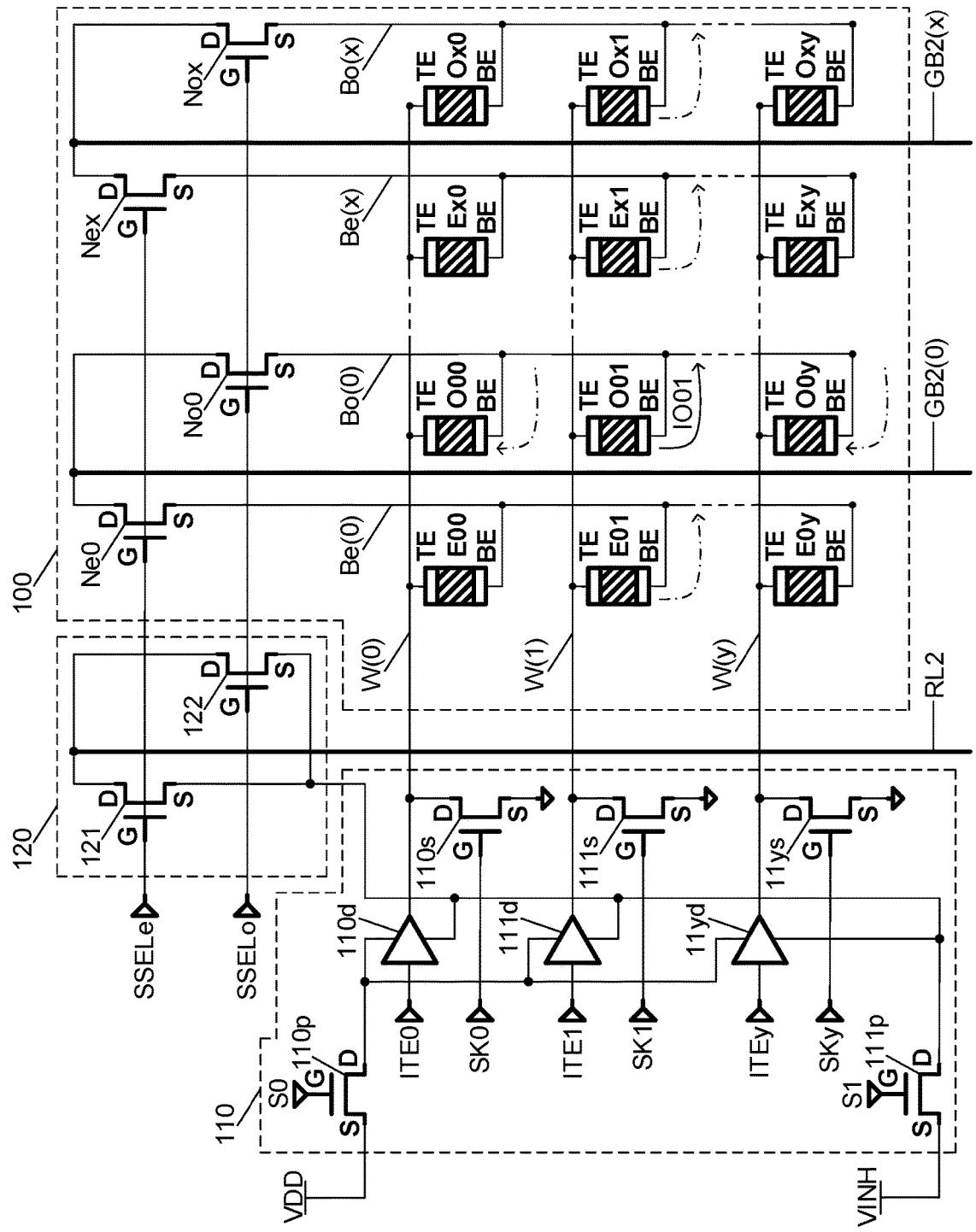
Figures 1, 1G, 2:
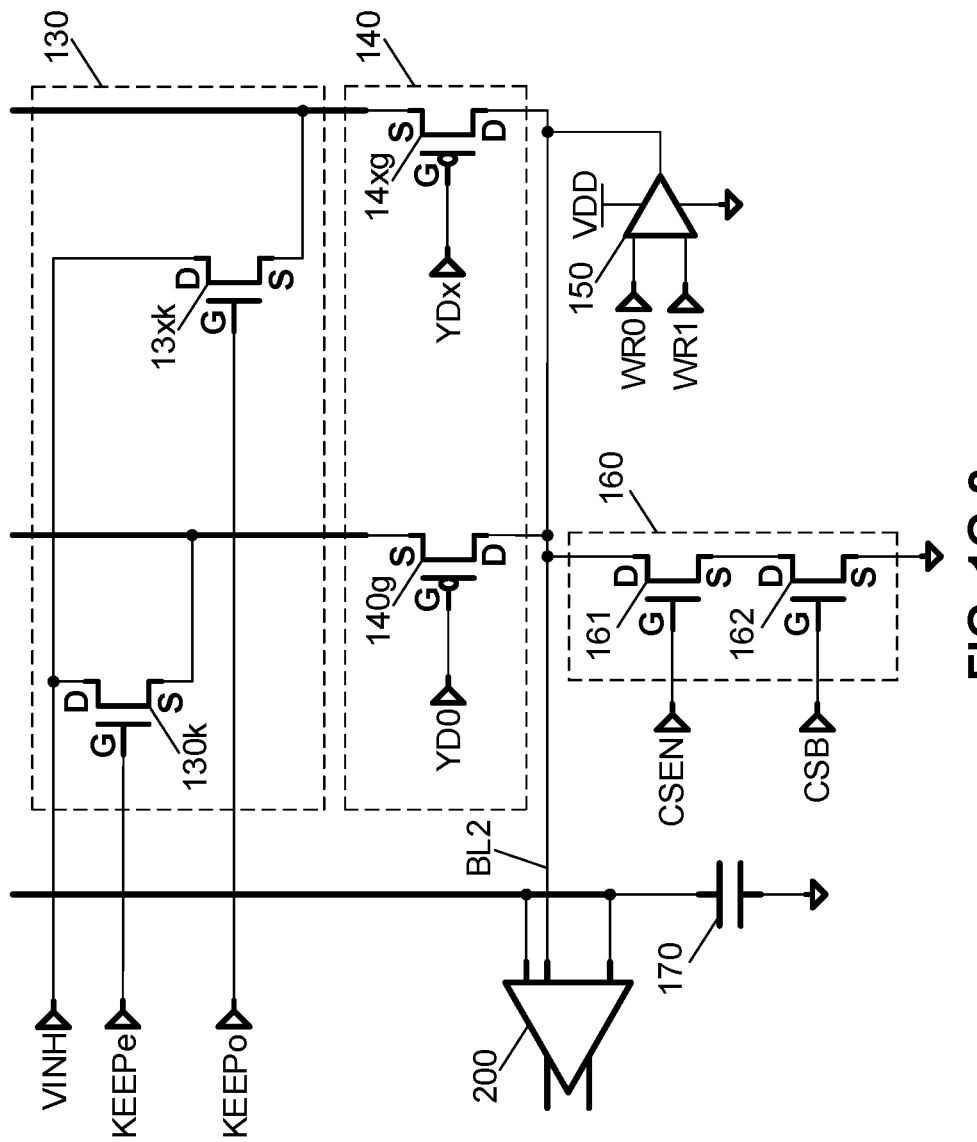
Figures 1, 1H:
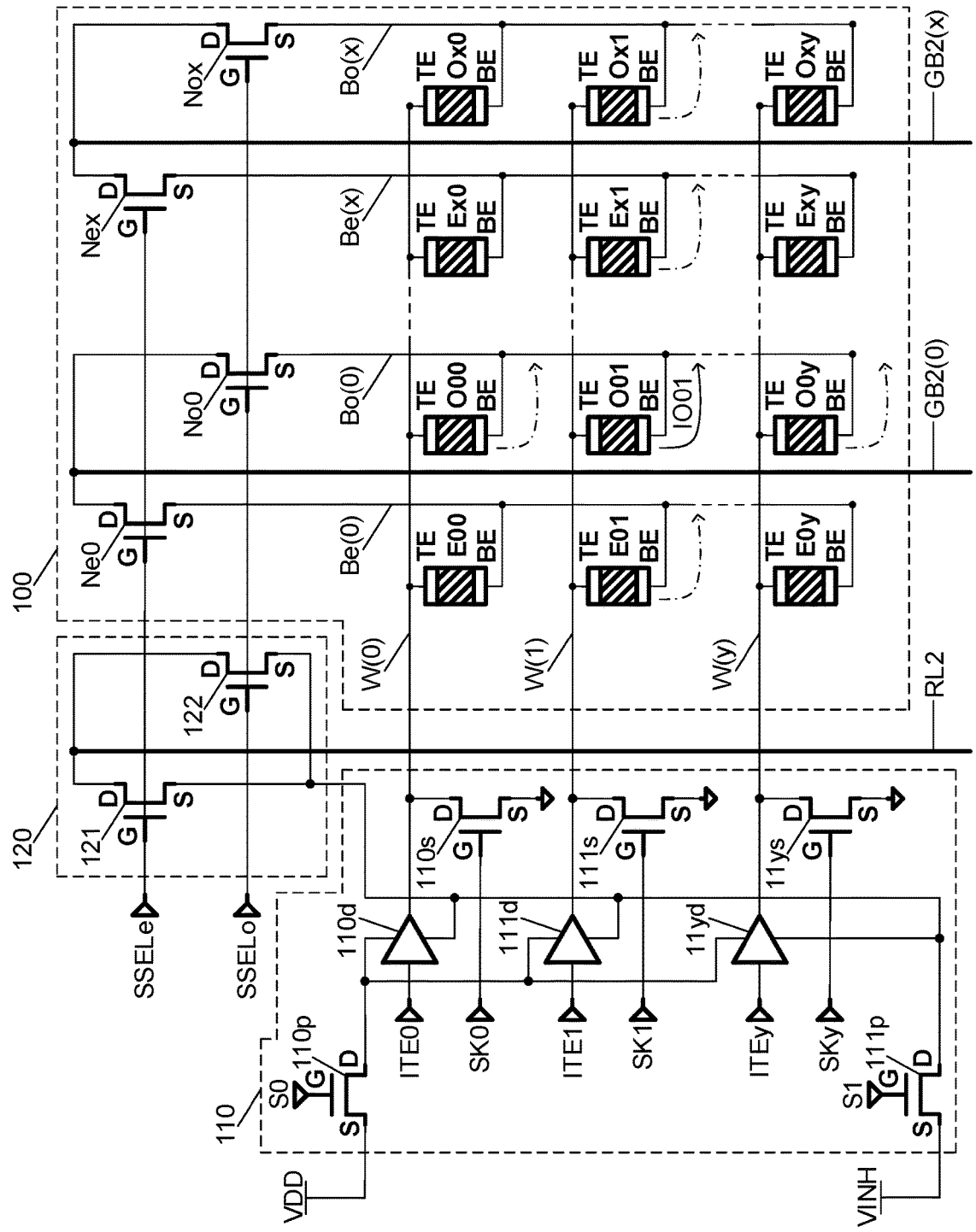
Figures 1, 1H, 2:
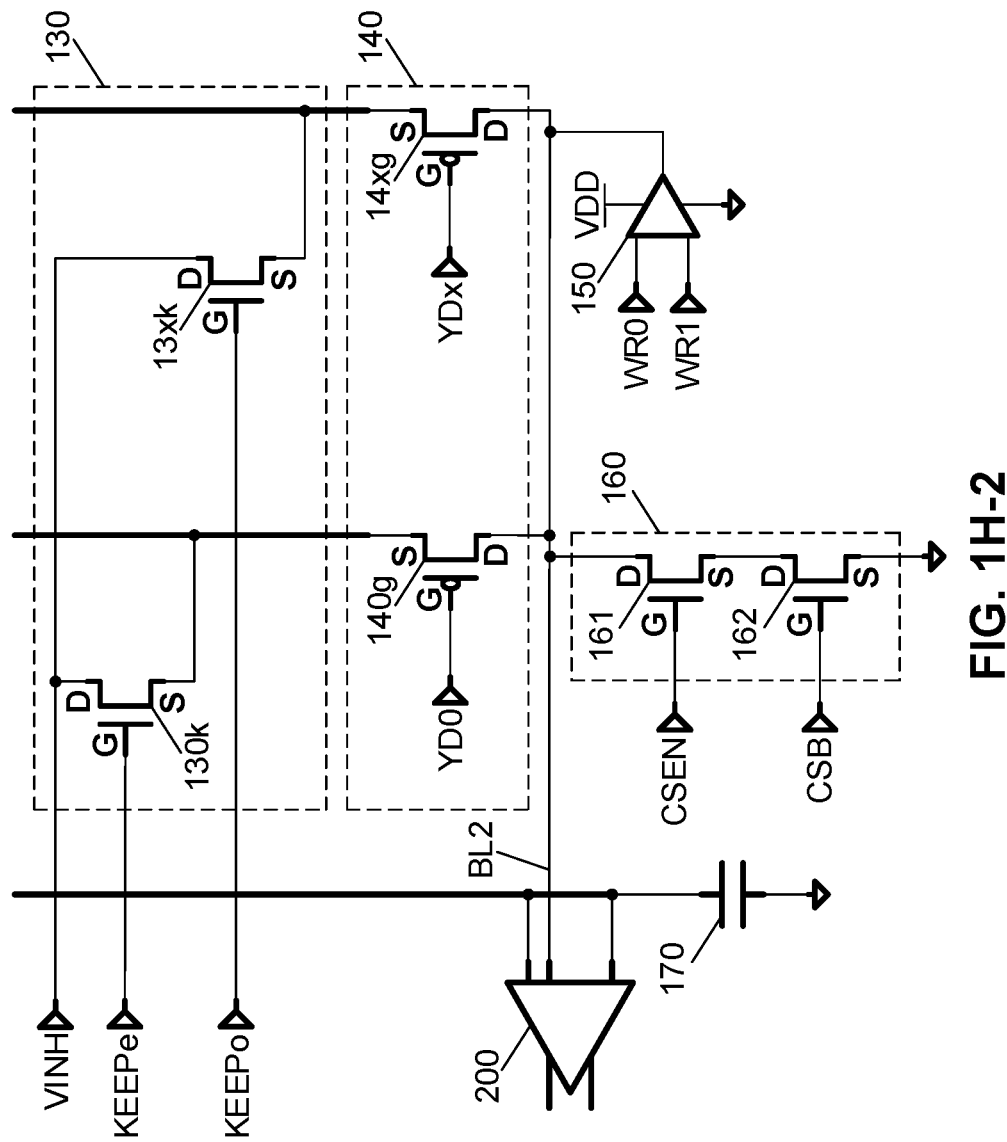
Figures 1, 1I:
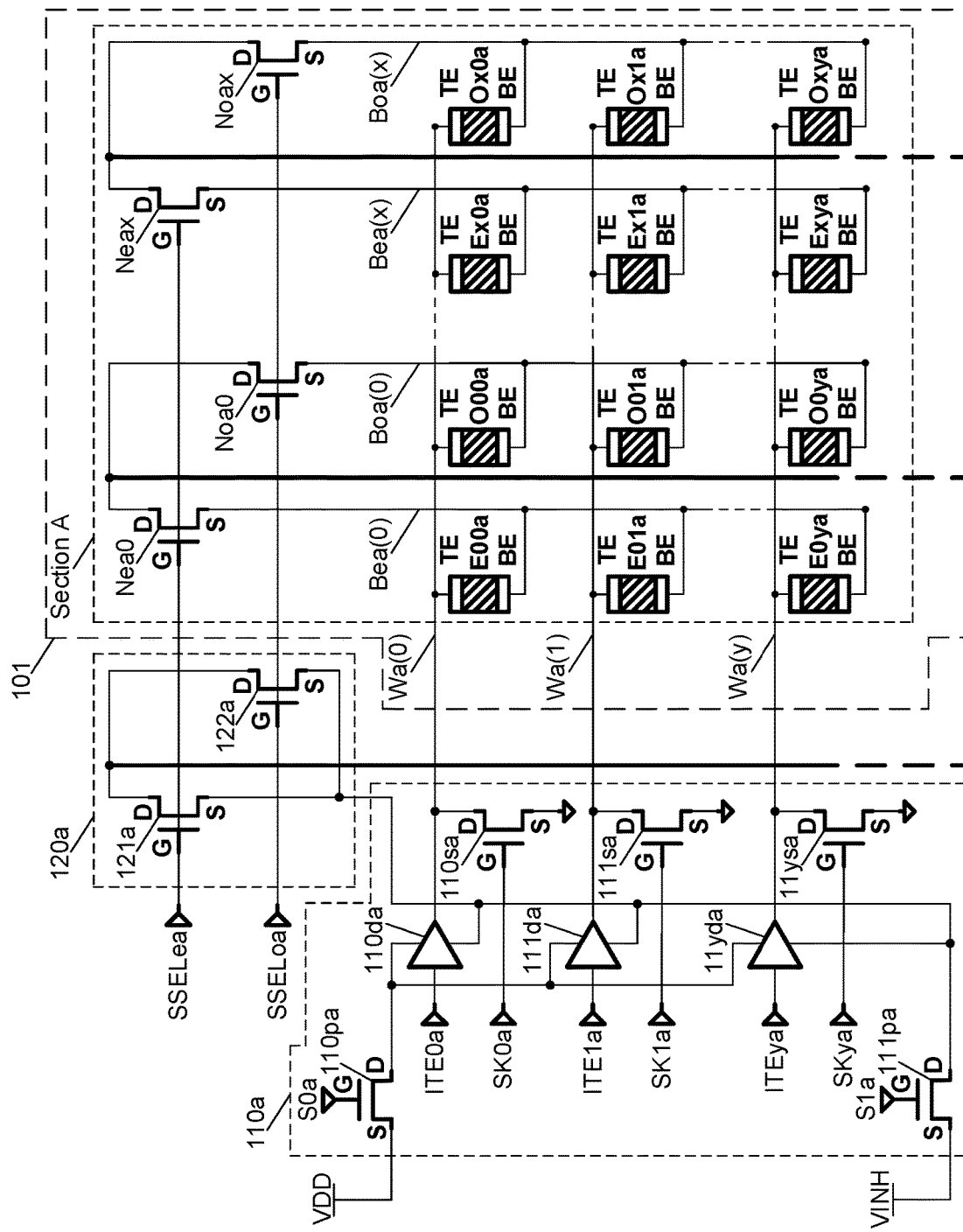
Figures 1, 1I, 2:
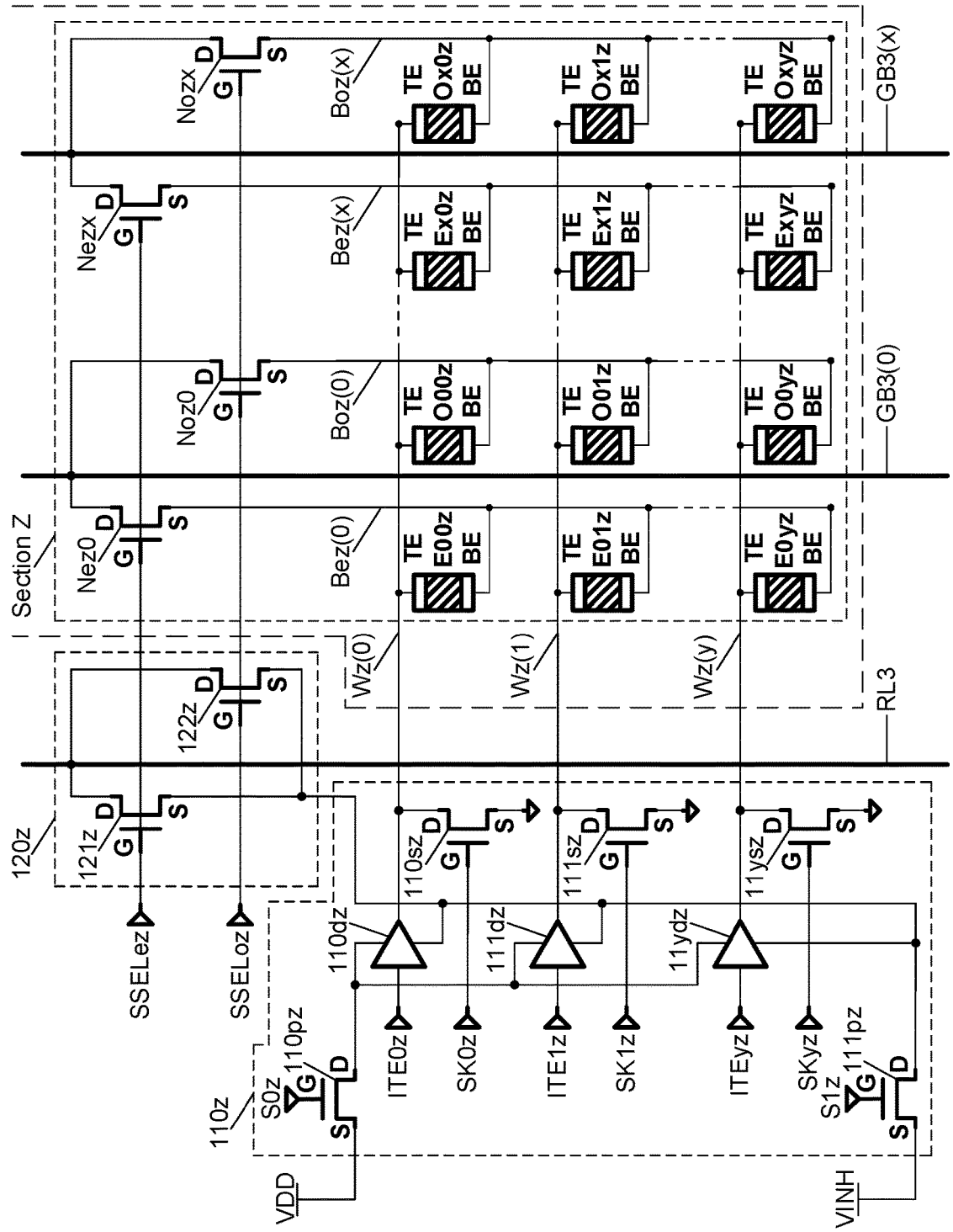
Figures 1, 1I, 2, 3:
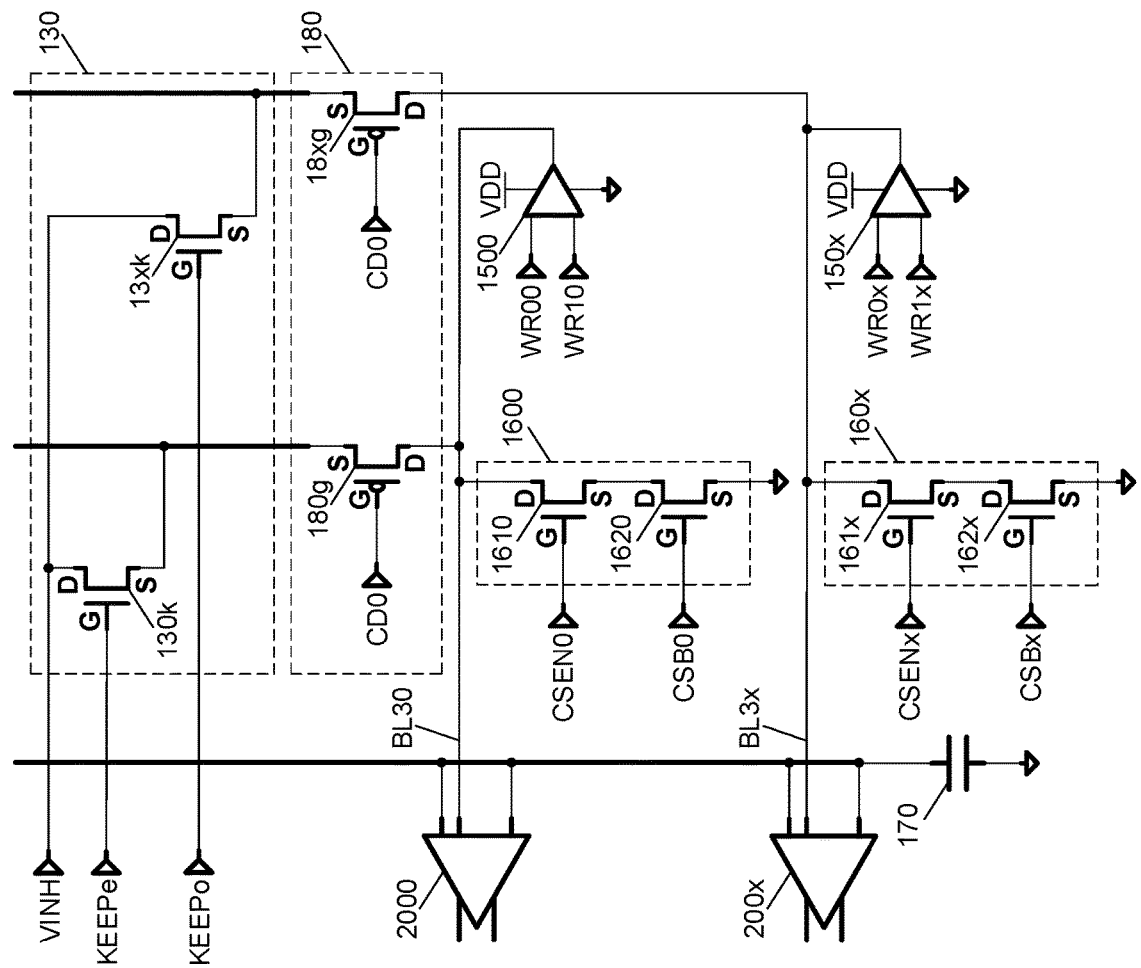

FIG. 3 illustrates a flow chart 300 showing a method for programming a resistive change element using neutral voltage conditions. The method starts in step 302 with providing neutral voltage conditions for at least one plurality of resistive change elements in a resistive change element array in an electrical device, where each resistive change element of the at least one plurality of resistive change elements is in electrical communication with a bit line and a word line, and where each resistive change element of the at least one plurality of resistive change elements is adjustable between at least two resistive states. The method continues in step 304 with biasing a plurality of global bit lines. The method proceeds in step 306 with selecting at least one resistive change element from the at least one plurality of resistive change elements. The method continues in step 308 with preparing the electrical device for applying an electrical stimulus to each of the at least one resistive change element. The method proceeds in step 310 with applying an electrical stimulus to each of the at least one resistive change element to adjust a resistive state of each of the at least one resistive change element. The method continues in step 312 with restoring neutral voltage conditions for resistive change elements impacted by applying an electrical stimulus to each of the at least one resistive change element. The method proceeds in step 314 with biasing global bit lines impacted by applying an electrical stimulus to each of the at least one resistive change element. It is noted that the steps of the method for programming a resistive change element using neutral voltage conditions are not limited to being performed in the order shown in FIG. 3. For example, the steps of providing neutral voltage conditions for at least one plurality of resistive change elements in a resistive change element array in an electrical device and biasing a plurality of global bit lines can be performed at the same time. It is also noted that the method for programming a resistive change element using neutral voltage conditions is not limited to the first exemplary architecture and that the method for programming a resistive change element using neutral voltage conditions can be performed by other architectures and systems. For example, the method for programming a resistive change element using neutral voltage conditions can be performed by the second exemplary architecture shown in FIG. 5A. It is further noted that the method for programming a resistive change element using neutral voltage conditions can include additional steps.

Referring now to FIGS. 1E-1 and 1E-2, a PROGRAMMING operation to adjust a resistive state of the resistive change element O01 to a low resistive state starts, as similarly discussed above in step 302 of the flow chart 300, by providing neutral voltage conditions for the plurality of resistive change elements E00-Oxy in the resistive change element array 100. The neutral voltage conditions are provided for the plurality of resistive change elements E00-Oxy by floating the plurality of even bit lines Be(0)-Be(x) and the plurality of odd bit lines Bo(0)-Bo(x) and applying the inhibit voltage VINH to the plurality of word lines W(0)-W(y) with the plurality of even bit lines Be(0)-Be(x) and the plurality of odd bit lines Bo(0)-Bo(x) floating so that voltages approximately equal to the inhibit voltage VINH are applied to the top electrodes and the bottom electrodes of the resistive change elements in the plurality of resistive change elements E00-Oxy. Floating a line refers to electrically connecting the line such that a voltage on the line exists due to a line capacitance of the line. The plurality of even bit lines Be(0)-Be(x) are floated by disconnecting the plurality of even bit lines Be(0)-Be(x) from the plurality of global bit lines GB2(0)-GB2(x) by turning off the plurality of even selection devices Ne0-Nex. The plurality of even selection devices Ne0-Nex are turned off by control logic, such as a processor, a controller, and a microcontroller, supplying a signal SSELe having a low level. The plurality of odd bit lines Bo(0)-Bo(x) are floated by disconnecting the plurality of odd bit lines Bo(0)-Bo(x) from the plurality of global bit lines GB2(0)-GB2(x) by turning off the plurality of odd selection devices No0-Nox. The plurality of odd selection devices No0-Nox are turned off by control logic, such as a processor, a controller, and a microcontroller, supplying a signal SSELo having a low level. It is noted that control logic, such as a processor, a controller, and a microcontroller, supplying a signal SSELe having a low level and a signal SSELo having a low level also turns off the first NMOS transistor 121 and the second NMOS transistor 122 of the reference line connection circuit 120 and floats the reference line RL2.

The inhibit voltage VINH is applied to the plurality of word lines W(0)-W(y) by the word line driver circuitry 110 driving voltages on the plurality of word lines W(0)-W(y) to the inhibit voltage VINH. The plurality of word line driver circuits 110d-11yd do not receive a voltage on the first power terminals because the first NMOS transistor 110p is turned off by control logic, such as a processor, a controller, and a microcontroller, supplying the signal S0 having a low level and receive the inhibit voltage VINH on the second power terminals because the second NMOS transistor 111p is turned on by the control logic supplying the signal S1 having a high level. The plurality of word line driver circuits 110d-11yd supply the inhibit voltage VINH based on the plurality of signals ITE0-ITEy supplied by control logic, such as a processor, a controller, and a microcontroller. The plurality of sink transistors 110s-11ys are turned off because control logic, such as a processor, a controller, and a microcontroller, supplies the plurality of signals SK0-SKy have low levels.

Driving voltages on the plurality of word lines W(0)-W(y) to the inhibit voltage VINH with the plurality of even bit lines Be(0)-Be(x) and the plurality of odd bit lines Bo(0)-Bo(x) floating causes voltages on the plurality of word lines W(0)-W(y), voltages on the plurality of even bit lines Be(0)-Be(x), and voltages on the plurality of odd bit lines Bo(0)-Bo(x) to be approximately equal to the inhibit voltage VINH. Voltages on the plurality of even bit lines Be(0)-Be(x) and voltages on the plurality of odd bit lines Bo(0)-Bo(x) are approximately equal to the inhibit voltage VINH because currents flow from the plurality of word lines W(0)-W(y) through the plurality of resistive change elements E00-Oxy into the plurality of even bit lines Be(0)-Be(x) and the plurality of odd bit lines Bo(0)-Bo(x). The inhibit voltage VINH exists on the plurality of even bit lines Be(0)-Be(x) and the plurality of odd bit lines Bo(0)-Bo(x) due to line capacitances because the plurality of even bit lines Be(0)-Be(x) and the plurality of odd bit lines Bo(0)-Bo(x) are floating. Thus, driving voltages on the plurality of word lines W(0)-W(y) to the inhibit voltage VINH with the plurality of even bit lines Be(0)-Be(x) and the plurality of odd bit lines Bo(0)-Bo(x) floating results in application of voltages approximately equal to the inhibit voltage VINH to the top electrodes and the bottom electrodes of the resistive change elements in the plurality of resistive change elements E00-Oxy. Additionally, driving voltages on the plurality of word lines W(0)-W(y) to the inhibit voltage VINH with the plurality of even bit lines Be(0)-Be(x) and the plurality of odd bit lines Bo(0)-Bo(x) floating causes the voltages across resistive change elements in the plurality of resistive change elements E00-Oxy to be approximately 0 volts.

The PROGRAMMING operation to adjust a resistive state of the resistive change element O01 to a low resistive state continues, as similarly discussed above in step 304 of the flow chart 300, by biasing the plurality of global bit lines GB2(0)-GB2(x). The plurality of global bit lines GB2(0)-GB2(x) are biased to the inhibit voltage VINH by floating the plurality of global bit lines GB2(0)-GB2(x) and applying the inhibit voltage VINH to the plurality of global bit lines GB2(0)-GB2(x). The plurality of global bit lines GB2(0)-GB2(x) are floated by disconnecting the plurality of global bit lines GB2(0)-GB2(x) from the plurality of even bit lines Be(0)-Be(x), the plurality of odd bit lines Bo(0)-Bo(x), and the bus line BL2. The plurality of global bit lines GB2(0)-GB2(x) may be disconnected from the plurality of even bit lines Be(0)-Be(x) and the plurality of odd bit lines Bo(0)-Bo(x) as part of providing neutral voltage conditions for the plurality of resistive change elements E00-Oxy as discussed above. The plurality of global bit lines GB2(0)-GB2(x) are disconnected from the bus line BL2 by turning off the plurality of PMOS transistors 140g-14xg in the global bit line connection circuit 140. The plurality of PMOS transistors 140g-14xg are turned off by control logic, such as a processor, a controller, and a microcontroller, supplying a plurality of signals YD0-YDx having high levels. The inhibit voltage VINH is applied to the plurality of global bit lines GB2(0)-GB2(x) by electrically connecting the plurality of global bit lines GB2(0)-GB2(x) to a power supply, a voltage source, a driver circuit, or other device that supplies the inhibit voltage VINH by turning on the plurality of NMOS transistors 130k-13xk in the keeper circuit 130. The plurality of NMOS transistors 130k-13xk are turned on by control logic, such as a processor, a controller, and a microcontroller, supplying a signal KEEPe having a high level and a signal KEEPo having a high level.

The PROGRAMMING operation to adjust a resistive state of the resistive change element O01 to a low resistive state proceeds, as similarly discussed above in step 306 of the flow chart 300, by selecting the resistive change element O01 from the plurality of resistive change elements E00-Oxy. The resistive change element O01 is selected from the plurality of resistive change elements E00-Oxy by control logic, such as a processor, a controller, and a microcontroller. The resistive change elements E00-Ox0, E01, Ex1-Ox1 and E0y-Oxy in the plurality of resistive change elements E00-Oxy that are not selected are referred to as unselected resistive change elements.

The PROGRAMMING operation to adjust a resistive state of the resistive change element O01 to a low resistive state continues, as similarly discussed above in step 308 of the flow chart 300, by preparing the exemplary implementation of the first exemplary architecture for applying an electrical stimulus to the resistive change element O01. The exemplary implementation of the first exemplary architecture is prepared for applying an electrical stimulus to the resistive change element O01 by changing electrical connections of the odd bit line Bo(0), changing electrical connections of the global bit line GB2(0), and disconnecting a power supply, a voltage source, a driver circuit, or other device that supplies the inhibit voltage VINH from the global bit line GB2(0). The electrical connections of the odd bit line Bo(0) and the electrical connections of the global bit line GB2(0) are changed and a power supply, a voltage source, a driver circuit, or other device that supplies the inhibit voltage VINH is disconnected from the global bit line GB2(0) so that the voltage on the odd bit line Bo(0) can be driven to a voltage for applying an electrical stimulus to the resistive change element O01. The electrical connections of the odd bit line Bo(0) are changed so that the odd bit line Bo(0) is in electrical communication with the global bit line GB2(0). The odd bit line Bo(0) is electrically connected to the global bit line GB2(0) by turning on the odd selection device No0. The odd selection device No0 is turned on by control logic, such as a processor, a controller, and a microcontroller, supplying a signal SSELo having a high level. It is noted that the plurality of odd selection devices No0-Nox are turned on by the control logic supplying a signal SSELo having a high level, and thus, the plurality of odd bit lines Bo(0)-Bo(x) are electrically connected to the plurality of global bit lines GB2(0)-GB2(x). It is also noted that the control logic supplying a signal SSELo having a high level also turns on the second NMOS transistor 122 of the reference line connection circuit 120 and drives the voltage on the reference line RL2 to the inhibit voltage VINH by electrically connecting the reference line RL2 through the second NMOS transistor 122 of the reference line connection circuit 120 and the second NMOS transistor 111p of the word line driver circuitry 110 to a power supply, a voltage source, a driver circuit, or other device that supplies the inhibit voltage VINH. It is further noted that, as discussed above with respect to providing neutral voltage conditions for the plurality of resistive change elements E00-Oxy in the resistive change element array 100, the second NMOS transistor 111p of the word line driver circuitry 110 is turned on.

The electrical connections of the global bit line GB2(0) are changed so that the global bit line GB2(0) is in electrical communication with the odd bit line Bo(0) and the bus line BL2. The global bit line GB2(0) is electrically connected to the odd bit line Bo(0) by turning on the odd selection device No0 as discussed above. The global bit line GB2(0) is electrically connected to the bus line BL2 by turning on the PMOS transistor 140g. The PMOS transistor 140g is turned on by control logic, such as a processor, a controller, and a microcontroller, supplying a signal YD0 having a low level. A power supply, a voltage source, a driver circuit, or other device that supplies the inhibit voltage VINH is disconnected from the global bit line GB2(0) by turning off the NMOS transistor 130k. The NMOS transistor 130k is turned off by control logic, such as a processor, a controller, and a microcontroller, supplying a signal KEEPe having a low level. It is noted that the control logic supplying a signal KEEPe having a low level also turns off NMOS transistors in the plurality of NMOS transistors 130k-13xk in electrical communication with global bit lines having even column numbers and disconnects global bit lines having even column numbers from a power supply, a voltage source, a driver circuit, or other device that supplies the inhibit voltage VINH.

The PROGRAMMING operation to adjust a resistive state of the resistive change element O01 to a low resistive state proceeds, as similarly discussed above in step 310 of the flow chart 300, by applying an electrical stimulus to the resistive change element O01 to adjust a resistive state of the resistive change element O01 to the low resistive state. The electrical stimulus to adjust a resistive state of the resistive change element O01 to the low resistive state causes current flow from the bottom electrode BE of the resistive change element O01 to the top electrode TE of the resistive change element O01 and the magnitude of the voltage of the electrical stimulus is approximately equal to the system voltage VDD. As discussed above, providing neutral voltage conditions for the plurality of resistive change elements E00-Oxy causes voltages on the plurality of word lines W(0)-W(y), voltages on the plurality of even bit lines Be(0)-Be(x), and voltages on the plurality of odd bit lines Bo(0)-Bo(x) to be approximately equal to the inhibit voltage VINH. Also, as discussed above, the plurality of global bit lines GB2(0)-GB2(x) are biased to the inhibit voltage VINH. Thus, the electrical stimulus to adjust a resistive state of the resistive change element O01 to the low resistive state is applied to the resistive change element O01 by driving the voltage on the word line W(1) from approximately the inhibit voltage VINH to 0 volts or ground and driving the voltage on the global bit line GB2(0) and the voltage on the odd bit line Bo(0) from approximately the inhibit voltage VINH to the system voltage VDD.

The voltage transition of the voltage on the word line W(1) generally corresponds with the voltage transition of the voltage on the top electrode TE of the resistive change element O01 because the voltage on the word line W(1) generally corresponds with the voltage on the top electrode TE of the resistive change element O01. The voltage transition of the voltage on the odd bit line Bo(0) generally corresponds with the voltage transition of the voltage on the bottom electrode BE of the resistive change element O01 because the voltage on the odd bit line Bo(0) generally corresponds with the voltage on the bottom electrode BE of the resistive change element O01. The magnitude of the voltage transitions for applying the electrical stimulus to the resistive change element O01 to adjust a resistive state of the resistive change element O01 to the low resistive state are reduced because the voltage applied to the top electrode TE and the voltage applied to the bottom electrode BE are not required to transition by the magnitude of the system voltage VDD. A voltage transition of 0 volts or ground minus the inhibit voltage VINH is required to place the top electrode at 0 volts or ground and a voltage transition of the system voltage VDD minus the inhibit voltage VINH is required to place the bottom electrode at the system voltage VDD. For example, when the inhibit voltage VINH is VDD/2 (half of the system voltage VDD), a voltage transition of 0 volts–VDD/2=–VDD/2 is required to place the top electrode at 0 volts or ground and a voltage transition of VDD–VDD/2=VDD/2 is required to place the bottom electrode at the system voltage VDD. Further, the number of voltage transitions for applying the electrical stimulus to adjust a resistive state of the resistive change element O01 to the low resistive state is reduced because only voltages on the word line W(1), the global bit line GB2(0), and the odd bit line Bo(0) are adjusted for applying the electrical stimulus to adjust a resistive state of the resistive change element O01 to the low resistive state. It is noted that applying the inhibit voltage VINH to a top electrode, a bottom electrode, or both a top electrode and a bottom electrode of a resistive change element limits a voltage applied across a resistive change element to a voltage less than a voltage limit for disturbing a resistive state of a resistive change element while applying an electrical stimulus to the resistive change element O01 to adjust a resistive state of the resistive change element O01 to the low resistive state.

The voltage on the word line W(1) is driven from the inhibit voltage VINH to 0 volts or ground by the word line driver circuit 111d not supplying a voltage and by electrically connecting the word line W(1) to a power supply, a voltage source, a driver circuit, or other device that supplies 0 volts or ground by turning on the sink transistor 111s. The word line driver circuit 111d does not supply a voltage because the word line driver circuit 111d is set to supply a voltage on the first power terminal based on the signal ITE1 supplied by control logic, such as a processor, a controller, and a microcontroller, and the word line driver circuit 111d does not receive a voltage on the first power terminal because the first NMOS transistor 110p is turned off by the control logic suppling the signal S0 having a low level. The sink transistor 111s is turned on by control logic, such as a processor, a controller, and a microcontroller, supplying a signal SK1 having a high level. The voltage on the global bit line GB2(0) and the voltage on the odd bit line Bo(0) are driven from the inhibit voltage VINH to the system voltage VDD by the write buffer circuit 150 supplying the system voltage VDD. The write buffer circuit 150 supplies the system voltage VDD based on the write set signal WR0 and the write reset signal WR1 supplied by control logic, such as a processor, a controller, and a microcontroller.

As shown in FIG. 1E-1, a current IO01 flows through the resistive change element O01 from the bottom electrode BE to the top electrode TE because the bottom electrode BE is at the system voltage VDD and the top electrode TE is at 0 volts or ground. FIG. 1E-1 also shows leakage currents flowing through the resistive change elements O00, O0y in electrical communication with the odd bit line Bo(0) and leakage currents flowing through the resistive change elements E01, Ex1-Ox1 in electrical communication with the word line W(1). The leakage currents are shown using dashed lines in FIG. 1E-1. Leakage currents flow through the resistive change elements O00, O0y because the bottom electrodes of the resistive change elements O00, O0y are at the system voltage VDD and the top electrodes of the resistive change elements O00, O0y are the inhibit voltage VINH. Leakage currents flow through resistive change elements E01, Ex1-Ox1 because the bottom electrodes of the resistive change elements E01, Ex1-Ox1 are at the inhibit voltage VINH and the top electrodes of the resistive change elements E01, Ex1-Ox1 are at 0 volts or ground. It is noted that leakage currents may flow through resistive change elements other than the resistive change elements in electrical communication with the odd bit line Bo(0) and the resistive change elements in electrical communication with the word line W(1) because voltages on other lines may be impacted by applying the electrical stimulus to adjust a resistive state of the resistive change element O01 to the low resistive state. It is also noted that leakage currents do not prevent the PROGRAMMING operation of the resistive change element O01 when the leakage currents are much less than the amount of the current IO01. It is further noted that the voltage differences across the resistive change elements that cause the leakage currents do not disturb the resistive states of the resistive change elements because the voltage differences are less than a voltage limit for disturbing a resistive state of a resistive change element.

The PROGRAMMING operation to adjust a resistive state of the resistive change element O01 to a low resistive state proceeds, as similarly discussed above in step 312 of the flow chart 300, by restoring neutral voltage conditions for resistive change elements impacted by applying an electrical stimulus to the resistive change element O01. Neutral voltage conditions are restored for resistive change elements impacted by applying the electrical stimulus to the resistive change element O01 by floating the plurality of odd bit lines Bo(0)-Bo(x) and applying the inhibit voltage VINH to the word line W(1). The plurality of even bit lines Be(0)-Be(x) are already floating because the plurality of even selection devices Ne0-Nex are turned off. The inhibit voltage VINH is already applied to the word lines W(0), W(y) because the word line driver circuits 110d, 11yd are already supplying the inhibit voltage VINH. The plurality of odd bit lines Bo(0)-Bo(x) are floated by disconnecting the plurality of odd bit lines Bo(0)-Bo(x) from the plurality of global bit lines GB2(0)-GB2(x) by turning off the plurality of odd selection devices No0-Nox. The plurality of odd selection devices No0-Nox are turned off by control logic, such as a processor, a controller, and a microcontroller, supplying a signal SSELo having a low level. The inhibit voltage VINH is applied to the word line W(1) by turning off the sink transistor 111s and by the word line driver circuit 111d driving the voltage on the word line W(1) to the inhibit voltage VINH. The sink transistor 111s is turned off by control logic, such as a processor, a controller, and a microcontroller, supplying the signal SK1 having a low level. The word line driver circuit 111d supplies the inhibit voltage VINH based on the signal ITE1 supplied by control logic, such as a processor, a controller, and a microcontroller. Thus, the inhibit voltage VINH is applied to the plurality of word lines W(0)-W(y) with the plurality of even bit lines Be(0)-Be(x) and the plurality of odd bit lines Bo(0)-Bo(x) floating so that voltages approximately equal to the inhibit voltage VINH are applied to the top electrodes and the bottom electrodes of the resistive change elements in the plurality of resistive change elements E00-Oxy.

The PROGRAMMING operation to adjust a resistive state of the resistive change element O01 to a low resistive state continues, as similarly discussed above in step 314 of the flow chart 300, by biasing global bit lines impacted by applying an electrical stimulus to the resistive change element O01. Global bit lines impacted by applying an electrical stimulus to the resistive change element O01 are biased to the inhibit voltage VINH by floating the plurality of global bit lines GB2(0)-GB2(x) and applying the inhibit voltage VINH to global bit lines having even column numbers. The plurality of global bit lines GB2(0)-GB2(x)

are floated by disconnecting the plurality of global bit lines GB2(0)-GB2(x) from the plurality of odd bit lines Bo(0)-Bo(x) and disconnecting the global bit line GB2(0) from the bus line BL2. The plurality of global bit lines GB2(0)-GB2(x) are already disconnected from the plurality of even bit lines Be(0)-Be(x) because the plurality of even selection devices Ne0-Nex are turned off. The global bit lines other than global bit line GB2(0) are already disconnected from the bus line BL2 because the PMOS transistors in the global bit line connection circuit 140 other than PMOS transistor 140g are turned off. The plurality of global bit lines GB2(0)-GB2(x) may be disconnected from the plurality of odd bit lines Bo(0)-Bo(x) as part of restoring neutral voltage conditions for resistive change elements impacted by applying the electrical stimulus to the resistive change element O01 as discussed above. The global bit line GB2(0) is disconnected from the bus line BL2 by turning off the PMOS transistor 140g. The PMOS transistor 140g is turned off by control logic, such as a processor, a controller, and a microcontroller, supplying a signal YD0 having a high level. The inhibit voltage VINH is already applied to the global bit lines having odd column numbers because the global bit lines having odd column numbers are in electrical communication with a power supply, a voltage source, a driver circuit, or other device that supplies the inhibit voltage VINH because the NMOS transistors 13xk are turned on. The inhibit voltage VINH is applied to the global bit lines having even column numbers by electrically connecting the global bit lines having even column numbers to a power supply, a voltage source, a driver circuit, or other device that supplies the inhibit voltage VINH by turning on the NMOS transistors 130k. The NMOS transistors 130k in electrical communication with the global bit lines having even column numbers are turned on by control logic, such as a processor, a controller, and a microcontroller, supplying a signal KEEPe having a high level.

Referring now to FIGS. 1F-1 and 1F-2, a PROGRAMMING operation to adjust a resistive state of the resistive change element O01 to a high resistive state starts, as similarly discussed above in step 302 of the flow chart 300, by providing neutral voltage conditions for the plurality of resistive change elements E00-Oxy in the resistive change element array 100. The neutral voltage conditions are provided for the plurality of resistive change elements E00-Oxy by floating the plurality of even bit lines Be(0)-Be(x) and the plurality of odd bit lines Bo(0)-Bo(x) and applying the inhibit voltage VINH to the plurality of word lines W(0)-W(y) with the plurality of even bit lines Be(0)-Be(x) and the plurality of odd bit lines Bo(0)-Bo(x) floating so that voltages approximately equal to the inhibit voltage VINH are applied to the top electrodes and the bottom electrodes of the resistive change elements in the plurality of resistive change elements E00-Oxy. Floating a line refers to electrically connecting the line such that a voltage on the line exists due to a line capacitance of the line. The plurality of even bit lines Be(0)-Be(x) are floated by disconnecting the plurality of even bit lines Be(0)-Be(x) from the plurality of global bit lines GB2(0)-GB2(x) by turning off the plurality of even selection devices Ne0-Nex. The plurality of even selection devices Ne0-Nex are turned off by control logic, such as a processor, a controller, and a microcontroller, supplying a signal SSELe having a low level. The plurality of odd bit lines Bo(0)-Bo(x) are floated by disconnecting the plurality of odd bit lines Bo(0)-Bo(x) from the plurality of global bit lines GB2(0)-GB2(x) by turning off the plurality of odd selection devices No0-Nox. The plurality of odd selection devices No0-Nox are turned off by control logic, such as a processor, a controller, and a microcontroller, supplying a signal SSELo having a low level. It is noted that control logic, such as a processor, a controller, and a microcontroller, supplying a signal SSELe having a low level and a signal SSELo having a low level also turns off the first NMOS transistor 121 and the second NMOS transistor 122 of the reference line connection circuit 120 and floats the reference line RL2.

The inhibit voltage VINH is applied to the plurality of word lines W(0)-W(y) by the word line driver circuitry 110 driving voltages on the plurality of word lines W(0)-W(y) to the inhibit voltage VINH. The plurality of word line driver circuits 110d-11yd receive the system voltage VDD on the first power terminals because the first NMOS transistor 110p is turned on by control logic, such as a processor, a controller, and a microcontroller, supplying the signal S0 having a high level and receive the inhibit voltage VINH on the second power terminals because the second NMOS transistor 111p is turned on by the control logic supplying the signal S1 having a high level. The plurality of word line driver circuits 110d-11yd supply the inhibit voltage VINH based on the plurality of signals ITE0-ITEy supplied by control logic, such as a processor, a controller, and a microcontroller. The plurality of sink transistors 110s-11ys are turned off because control logic, such as a processor, a controller, and a microcontroller, supplies the plurality of signals SK0-Sky having low levels.

Driving voltages on the plurality of word lines W(0)-W(y) to the inhibit voltage VINH with the plurality of even bit lines Be(0)-Be(x) and the plurality of odd bit lines Bo(0)-Bo(x) floating causes voltages on the plurality of word lines W(0)-W(y), voltages on the plurality of even bit lines Be(0)-Be(x), and voltages on the plurality of odd bit lines Bo(0)-Bo(x) to be approximately equal to the inhibit voltage VINH. Voltages on the plurality of even bit lines Be(0)-Be(x) and voltages on the plurality of odd bit lines Bo(0)-Bo(x) are approximately equal to the inhibit voltage VINH because currents flow from the plurality of word lines W(0)-W(y) through the plurality of resistive change elements E00-Oxy into the plurality of even bit lines Be(0)-Be(x) and the plurality of odd bit lines Bo(0)-Bo(x). The inhibit voltage VINH exists on the plurality of even bit lines Be(0)-Be(x) and the plurality of odd bit lines Bo(0)-Bo(x) due to line capacitances because the plurality of even bit lines Be(0)-Be(x) and the plurality of odd bit lines Bo(0)-Bo(x) are floating. Thus, driving voltages on the plurality of word lines W(0)-W(y) to the inhibit voltage VINH with the plurality of even bit lines Be(0)-Be(x) and the plurality of odd bit lines Bo(0)-Bo(x) floating results in application of voltages approximately equal to the inhibit voltage VINH to the top electrodes and the bottom electrodes of the resistive change elements in the plurality of resistive change elements E00-Oxy. Additionally, driving voltages on the plurality of word lines W(0)-W(y) to the inhibit voltage VINH with the plurality of even bit lines Be(0)-Be(x) and the plurality of odd bit lines Bo(0)-Bo(x) floating causes the voltages across resistive change elements in the plurality of resistive change elements E00-Oxy to be approximately 0 volts.

The PROGRAMMING operation to adjust a resistive state of the resistive change element O01 to a high resistive state continues, as similarly discussed above in step 304 of the flow chart 300, by biasing the plurality of global bit lines GB2(0)-GB2(x). The plurality of global bit lines GB2(0)-GB2(x) are biased to the inhibit voltage VINH by floating the plurality of global bit lines GB2(0)-GB2(x) and applying the inhibit voltage VINH to the plurality of global bit lines GB2(0)-GB2(x). The plurality of global bit lines GB2(0)-

GB2(x) are floated by disconnecting the plurality of global bit lines GB2(0)-GB2(x) from the plurality of even bit lines Be(0)-Be(x), the plurality of odd bit lines Bo(0)-Bo(x), and the bus line BL2. The plurality of global bit lines GB2(0)-GB2(x) may be disconnected from the plurality of even bit lines Be(0)-Be(x) and the plurality of odd bit lines Bo(0)-Bo(x) as part of providing neutral voltage conditions for the plurality of resistive change elements E00-Oxy as discussed above. The plurality of global bit lines GB2(0)-GB2(x) are disconnected from the bus line BL2 by turning off the plurality of PMOS transistors 140g-14xg in the global bit line connection circuit 140. The plurality of PMOS transistors 140g-14xg are turned off by control logic, such as a processor, a controller, and a microcontroller, supplying a plurality of signals YD0-YDx having high levels. The inhibit voltage VINH is applied to the plurality of global bit lines GB2(0)-GB2(x) by electrically connecting the plurality of global bit lines GB2(0)-GB2(x) to a power supply, a voltage source, a driver circuit, or other device that supplies the inhibit voltage VINH by turning on the plurality of NMOS transistors 130k-13xk in the keeper circuit 130. The plurality of NMOS transistors 130k-13xk are turned on by control logic, such as a processor, a controller, and a microcontroller, supplying a signal KEEPe having a high level and a signal KEEPo having a high level.

The PROGRAMMING operation to adjust a resistive state of the resistive change element O01 to a high resistive state proceeds, as similarly discussed above in step 306 of the flow chart 300, by selecting the resistive change element O01 from the plurality of resistive change elements E00-Oxy. The resistive change element O01 is selected from the plurality of resistive change elements E00-Oxy by control logic, such as a processor, a controller, and a microcontroller. The resistive change elements E00-Ox0, E01, Ex1-Ox1 and E0y-Oxy in the plurality of resistive change elements E00-Oxy that are not selected are referred to as unselected resistive change elements.

The PROGRAMMING operation to adjust a resistive state of the resistive change element O01 to a high resistive state continues, as similarly discussed above in step 308 of the flow chart 300, by preparing the exemplary implementation of the first exemplary architecture for applying an electrical stimulus to the resistive change element O01. The exemplary implementation of the first exemplary architecture is prepared for applying an electrical stimulus to the resistive change element O01 by changing electrical connections of the odd bit line Bo(0), changing electrical connections of the global bit line GB2(0), and disconnecting a power supply, a voltage source, a driver circuit, or other device that supplies the inhibit voltage VINH from the global bit line GB2(0). The electrical connections of the odd bit line Bo(0) and the electrical connections of the global bit line GB2(0) are changed and a power supply, a voltage source, a driver circuit, or other device that supplies the inhibit voltage VINH is disconnected from the global bit line GB2(0) so that the voltage on the odd bit line Bo(0) can be driven to a voltage for applying an electrical stimulus to the resistive change element O01. The electrical connections of the odd bit line Bo(0) are changed so that the odd bit line Bo(0) is in electrical communication with the global bit line GB2(0). The odd bit line Bo(0) is electrically connected to the global bit line GB2(0) by turning on the odd selection device No0. The odd selection device No0 is turned on by control logic, such as a processor, a controller, and a microcontroller, supplying a signal SSELo having a high level. It is noted that the plurality of odd selection devices No0-Nox are turned on by the control logic supplying a signal SSELo having a high level, and thus, the plurality of odd bit lines Bo(0)-Bo(x) are electrically connected to the plurality of global bit lines GB2(0)-GB2(x). It is also noted that the control logic supplying a signal SSELo having a high level also turns on the second NMOS transistor 122 of the reference line connection circuit 120 and drives the voltage on the reference line RL2 to the inhibit voltage VINH by electrically connecting the reference line RL2 through the second NMOS transistor 122 of the reference line connection circuit 120 and the second NMOS transistor 111p of the word line driver circuitry 110 to a power supply, a voltage source, a driver circuit, or other device that supplies the inhibit voltage VINH. It is further noted that, as discussed above with respect to providing neutral voltage conditions for the plurality of resistive change element E00-Oxy in the resistive change element array 100, the second NMOS transistor 111p of the word line driver circuitry 110 is turned on.

The electrical connections of the global bit line GB2(0) are changed so that the global bit line GB2(0) is in electrical communication with the odd bit line Bo(0) and the bus line BL2. The global bit line GB2(0) is electrically connected to the odd bit line Bo(0) by turning on the odd selection device No0 as discussed above. The global bit line GB2(0) is electrically connected to the bus line BL2 by turning on the PMOS transistor 140g. The PMOS transistor 140g is turned on by control logic, such as a processor, a controller, and a microcontroller, supplying a signal YD0 having a low level. A power supply, a voltage source, a driver circuit, or other device that supplies the inhibit voltage VINH is disconnected from the global bit line GB2(0) by turning off the NMOS transistor 130k. The NMOS transistor 130k is turned off by control logic, such as a processor, a controller, and a microcontroller, supplying a signal KEEPe having a low level. It is noted that the control logic supplying a signal KEEPe having a low level also turns off NMOS transistors in the plurality of NMOS transistors 130k-13xk in electrical communication with global bit lines having even column numbers and disconnects global bit lines having even column numbers from a power supply, a voltage source, a driver circuit, or other device that supplies the inhibit voltage VINH.

The PROGRAMMING operation to adjust a resistive state of the resistive change element O01 to a high resistive state proceeds, as similarly discussed above in step 310 of the flow chart 300, by applying an electrical stimulus to the resistive change element O01 to adjust a resistive state of the resistive change element O01 to the high resistive state. The electrical stimulus to adjust a resistive state of the resistive change element O01 to the high resistive state causes current flow from the top electrode TE of the resistive change element O01 to the bottom electrode BE of the resistive change element O01 and the magnitude of the voltage of the electrical stimulus is approximately equal to the system voltage VDD. As discussed above, providing neutral voltage conditions for the plurality of resistive change elements E00-Oxy causes voltages on the plurality of word lines W(0)-W(y), voltages on the plurality of even bit lines Be(0)-Be(x), and voltages on the plurality of odd bit lines Bo(0)-Bo(x) to be approximately equal to the inhibit voltage VINH. Also, as discussed above, the plurality of global bit lines GB2(0)-GB2(x) are biased to the inhibit voltage VINH. Thus, the electrical stimulus to adjust a resistive state of the resistive change element O01 to the high resistive state is applied to the resistive change element O01 by driving the voltage on the word line W(1) from approximately the inhibit voltage VINH to the system voltage VDD and driving the voltage on the global bit line GB2(0) and the voltage on the odd bit line Bo(0) from approximately the inhibit voltage VINH to 0 volts or ground.

The voltage transition of the voltage on the word line W(1) generally corresponds with the voltage transition of the voltage on the top electrode TE of the resistive change element O01 because the voltage on the word line W(1) generally corresponds with the voltage on the top electrode TE of the resistive change element O01. The voltage transition of the voltage on the odd bit line Bo(0) generally corresponds with the voltage transition of the voltage on the bottom electrode BE of the resistive change element O01 because the voltage on the odd bit line Bo(0) generally corresponds with the voltage on the bottom electrode BE of the resistive change element O01. The magnitude of the voltage transitions for applying the electrical stimulus to the resistive change element O01 to adjust a resistive state of the resistive change element O01 to the high resistive state are reduced because the voltage applied to the top electrode TE and the voltage applied to the bottom electrode BE are not required to transition by the magnitude of the system voltage VDD. A voltage transition of the system voltage VDD minus the inhibit voltage VINH is required to place the top electrode at the system voltage VDD and a voltage transition of 0 volts or ground minus the inhibit voltage VINH is required to place the bottom electrode at 0 volts or ground. For example, when the inhibit voltage VINH is VDD/2 (half of the system voltage VDD), a voltage transition of VDD−VDD/2=VDD/2 is required to place the top electrode at the system voltage VDD and a voltage transition of 0 volts−VDD/2=−VDD/2 is required to place the bottom electrode at 0 volts or ground. Further, the number of voltage transitions for applying the electrical stimulus to adjust a resistive state of the resistive change element O01 to the high resistive state is reduced because only voltages on the word line W(1), the global bit line GB2(0), and the odd bit line Bo(0) are adjusted for applying the electrical stimulus to adjust a resistive state of the resistive change element O01 to the high resistive state. It is noted that applying the inhibit voltage VINH to a top electrode, a bottom electrode, or both a top electrode and a bottom electrode of a resistive change element limits a voltage applied across a resistive change element to a voltage less than a voltage limit for disturbing a resistive state of a resistive change element while applying an electrical stimulus to the resistive change element O01 to adjust a resistive state of the resistive change element O01 to the high resistive state.

The voltage on the word line W(1) is driven from the inhibit voltage VINH to the system voltage VDD by changing the voltage supplied by the word line driver circuit 111d from the inhibit voltage VINH to the system voltage VDD. The word line driver circuit 111d changes from supplying the inhibit voltage VINH to the system voltage VDD based on a signal ITE1 supplied by control logic, such as a processor, a controller, and a microcontroller. The voltage on the global bit line GB2(0) and the voltage on the odd bit line Bo(0) are driven from the inhibit voltage VINH to 0 volts or ground by the write buffer circuit 150 supplying 0 volts or ground. The write buffer circuit 150 supplies the 0 volts or ground based on the write set signal WR0 and the write reset signal WR1 supplied by control logic, such as a processor, a controller, and a microcontroller.

As shown in FIG. 1F-1, a current IO01 flows through the resistive change element O01 from the top electrode TE to the bottom electrode BE because the top electrode TE is at the system voltage VDD and the bottom electrode BE is at 0 volts or ground. FIG. 1F-1 also shows leakage currents flowing through the resistive change elements O00, O0y in electrical communication with the odd bit line Bo(0) and leakage currents flowing through the resistive change elements E01, Ex1-Ox1 in electrical communication with the word line W(1). The leakage currents are shown using dashed lines in FIG. 1F-1. Leakage currents flow through the resistive change elements O00, O0y because the top electrodes of the resistive change elements O00, O0y are at the inhibit voltage and the bottom electrodes of the resistive change elements O00, O0y are 0 volts or ground. Leakage currents flow through resistive change elements E01, Ex1-Ox1 because the top electrodes of the resistive change elements E01, Ex1-Ox1 are at the system voltage VDD and the bottom electrodes of the resistive change elements E01, Ex1-Ox1 are at inhibit voltage VINH. It is noted that leakage currents may flow through resistive change elements other than the resistive change elements in electrical communication with the odd bit line Bo(0) and the resistive change elements in electrical communication with the word line W(1) because voltages on other lines may be impacted by applying the electrical stimulus to adjust a resistive state of the resistive change element O01 to the high resistive state. It is also noted that leakage currents do not prevent the PROGRAMMING operation of the resistive change element O01 when the leakage currents are much less than the amount of the current IO01. It is further noted that the voltage differences across the resistive change elements that cause the leakage currents do not disturb the resistive states of the resistive change elements because the voltage difference are less than a voltage limit for disturbing a resistive state of a resistive change element.

The PROGRAMMING operation to adjust a resistive state of the resistive change element O01 to a high resistive state proceeds, as similarly discussed above in step 312 of the flow chart 300, by restoring neutral voltage conditions for resistive change elements impacted by applying an electrical stimulus to the resistive change element O01. Neutral voltage conditions are restored for resistive change elements impacted by applying the electrical stimulus to the resistive change element O01 by floating the plurality of odd bit lines Bo(0)-Bo(x) and applying the inhibit voltage VINH to the word line W(1). The plurality of even bit lines Be(0)-Be(x) are already floating because the plurality of even selection devices Ne0-Nex are turned off. The inhibit voltage VINH is already applied to the word lines W(0), W(y) because the word line driver circuits 110d, 11yd are already supplying the inhibit voltage VINH. The plurality of odd bit lines Bo(0)-Bo(x) are floated by disconnecting the plurality of odd bit lines Bo(0)-Bo(x) from the plurality of global bit lines GB2(0)-GB2(x) by turning off the plurality of odd selection devices No0-Nox. The plurality of odd selection devices No0-Nox are turned off by control logic, such as a processor, a controller, and a microcontroller, supplying a signal SSELo having a low level. The inhibit voltage VINH is applied to the word line W(1) by changing the voltage supplied by the word line driver circuit 111d from the system voltage VDD to the inhibit voltage VINH. The word line driver circuit 111d changes from supplying the system voltage VDD to the inhibit voltage VINH based on a signal ITE1 supplied by control logic, such as a processor, a controller, and a microcontroller. Thus, the inhibit voltage VINH is applied to the plurality of word lines W(0)-W(y) with the plurality of even bit lines Be(0)-Be(x) and the plurality of odd bit lines Bo(0)-Bo(x) floating so that voltages approximately equal to the inhibit voltage VINH are applied to the top electrodes and the bottom electrodes of the resistive change elements in the plurality of resistive change elements E00-Oxy.

The PROGRAMMING operation to adjust a resistive state of the resistive change element O01 to a high resistive state continues, as similarly discussed above in step 314 of the flow chart 300, by biasing global bit lines impacted by applying an electrical stimulus to the resistive change element O01. Global bit lines impacted by applying an electrical stimulus to the resistive change element O01 are biased to the inhibit voltage VINH by floating the plurality of global bit lines GB2(0)-GB2(x) and applying the inhibit voltage VINH to global bit lines having even column numbers. The plurality of global bit lines GB2(0)-GB2(x) are floated by disconnecting the plurality of global bit lines GB2(0)-GB2(x) from the plurality of odd bit lines Bo(0)-Bo(x) and disconnecting the global bit line GB2(0) from the bus line BL2. The plurality of global bit lines GB2(0)-GB2(x) are already disconnected from the plurality of even bit lines Be(0)-Be(x) because the plurality of even selection devices Ne0-Nex are turned off. The global bit lines other than global bit line GB2(0) are already disconnected from the bus line BL2 because the PMOS transistors in the global bit line connection circuit 140 other than PMOS transistor 140g are turned off. The plurality of global bit lines GB2(0)-GB2(x) may be disconnected from the plurality of odd bit lines Bo(0)-Bo(x) as part of restoring neutral voltage conditions for resistive change elements impacted by applying the electrical stimulus to the resistive change element O01 as discussed above. The global bit line GB2(0) is disconnected from the bus line BL2 by turning off the PMOS transistor 140g. The PMOS transistor 140g is turned off by control logic, such as a processor, a controller, and a microcontroller, supplying a signal YD0 having a high level. The inhibit voltage VINH is already applied to the global bit lines having odd column numbers because the global bit lines having odd column numbers are in electrical communication with a power supply, a voltage source, a driver circuit, or other device that supplies the inhibit voltage VINH because the NMOS transistors 13xk are turned on. The inhibit voltage VINH is applied to the global bit lines having even column numbers by electrically connecting the global bit lines having even column numbers to a power supply, a voltage source, a driver circuit, or other device that supplies the inhibit voltage VINH by turning on the NMOS transistors 130k. The NMOS transistors 130k in electrical communication with the global bit lines having even column numbers are turned on by control logic, such as a processor, a controller, and a microcontroller, supplying a signal KEEPe having a high level.

Figure 5A:
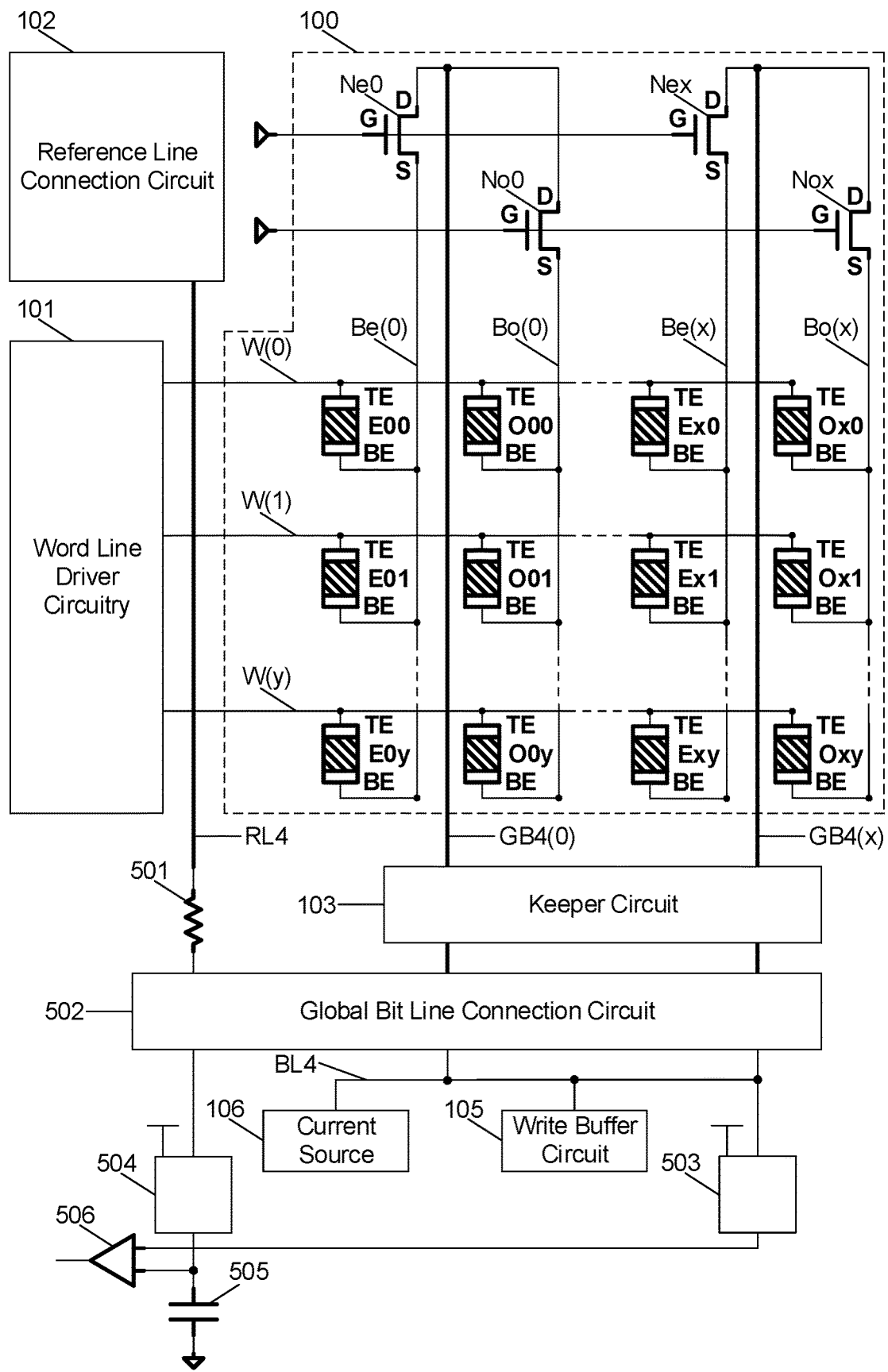
FIG. 5A illustrates a simplified schematic diagram of a second exemplary architecture for programming and accessing resistive change elements.
Figures 1, 5B:
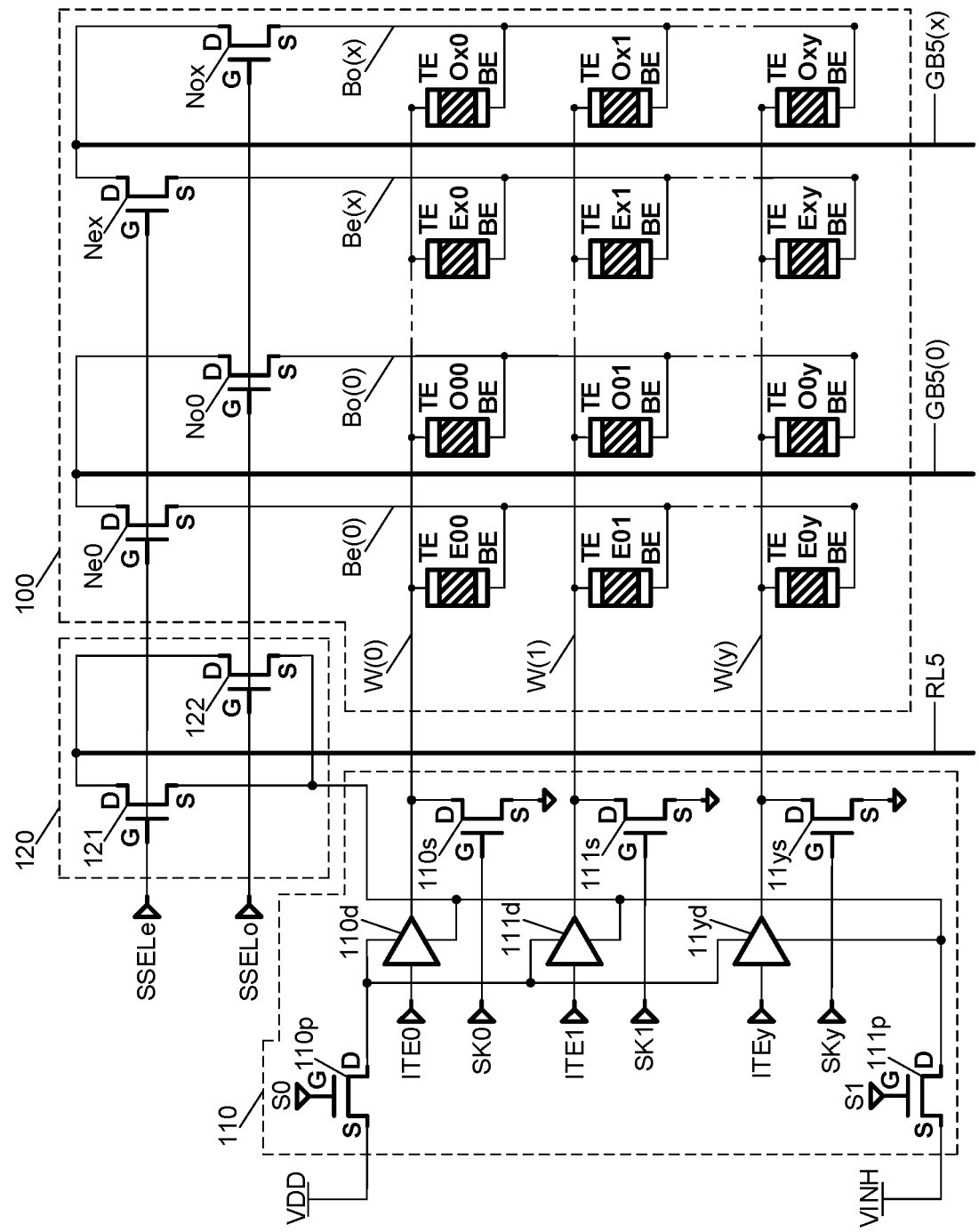
Figures 2, 5B:
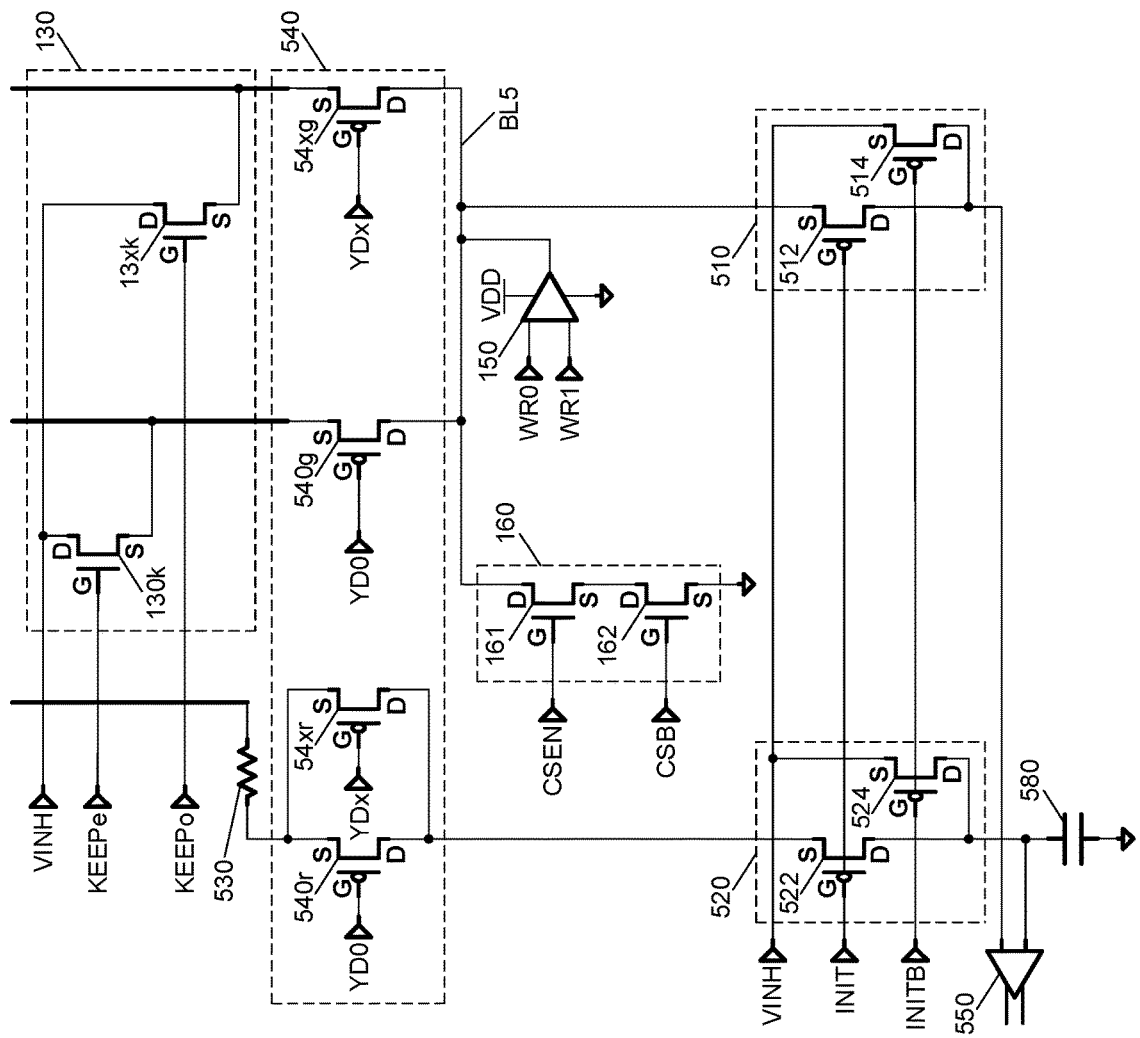
Figure 5C:
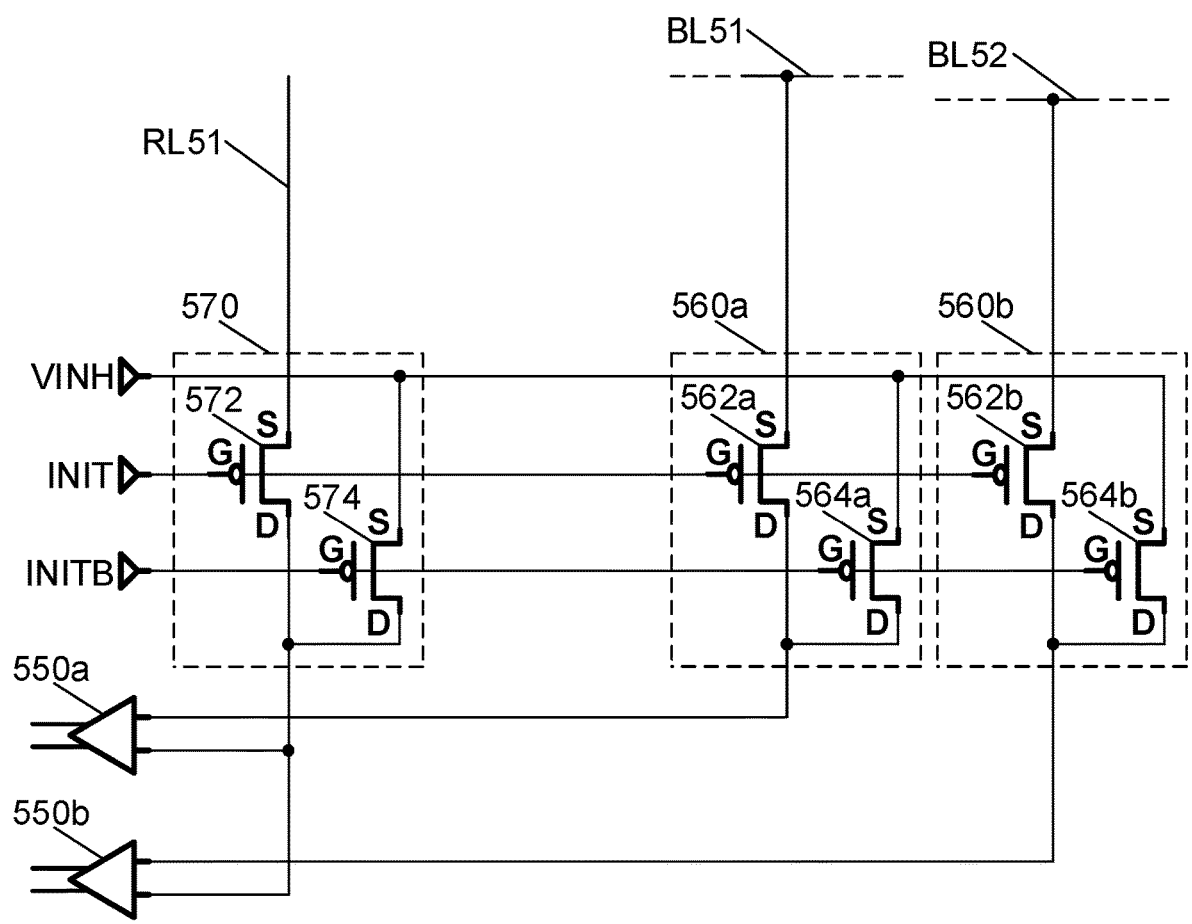
FIG. 5C illustrates a simplified schematic diagram of an exemplary arrangement for two sense amplifiers sharing an input device.
Figures 1, 5D:
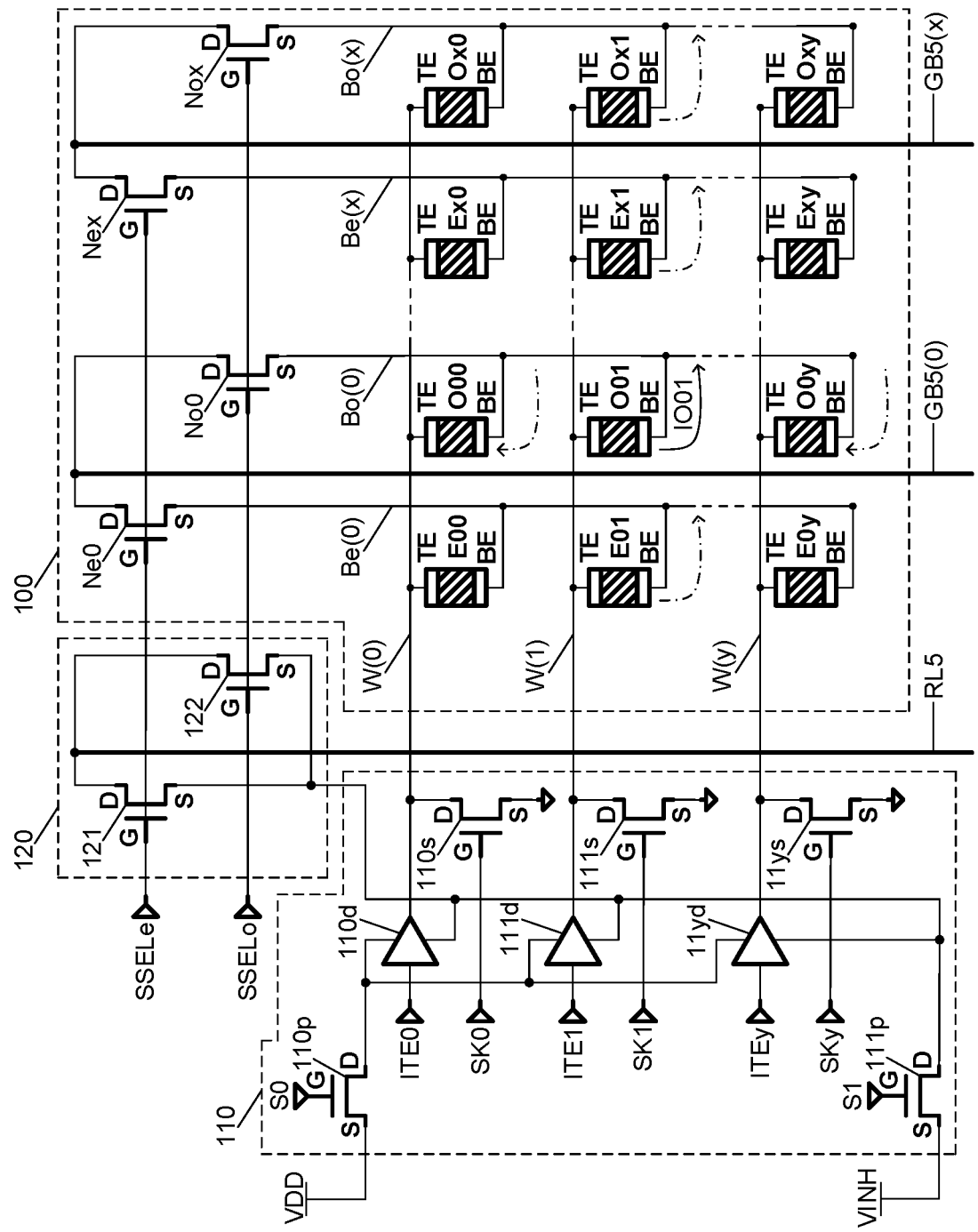
Figures 2, 5D:
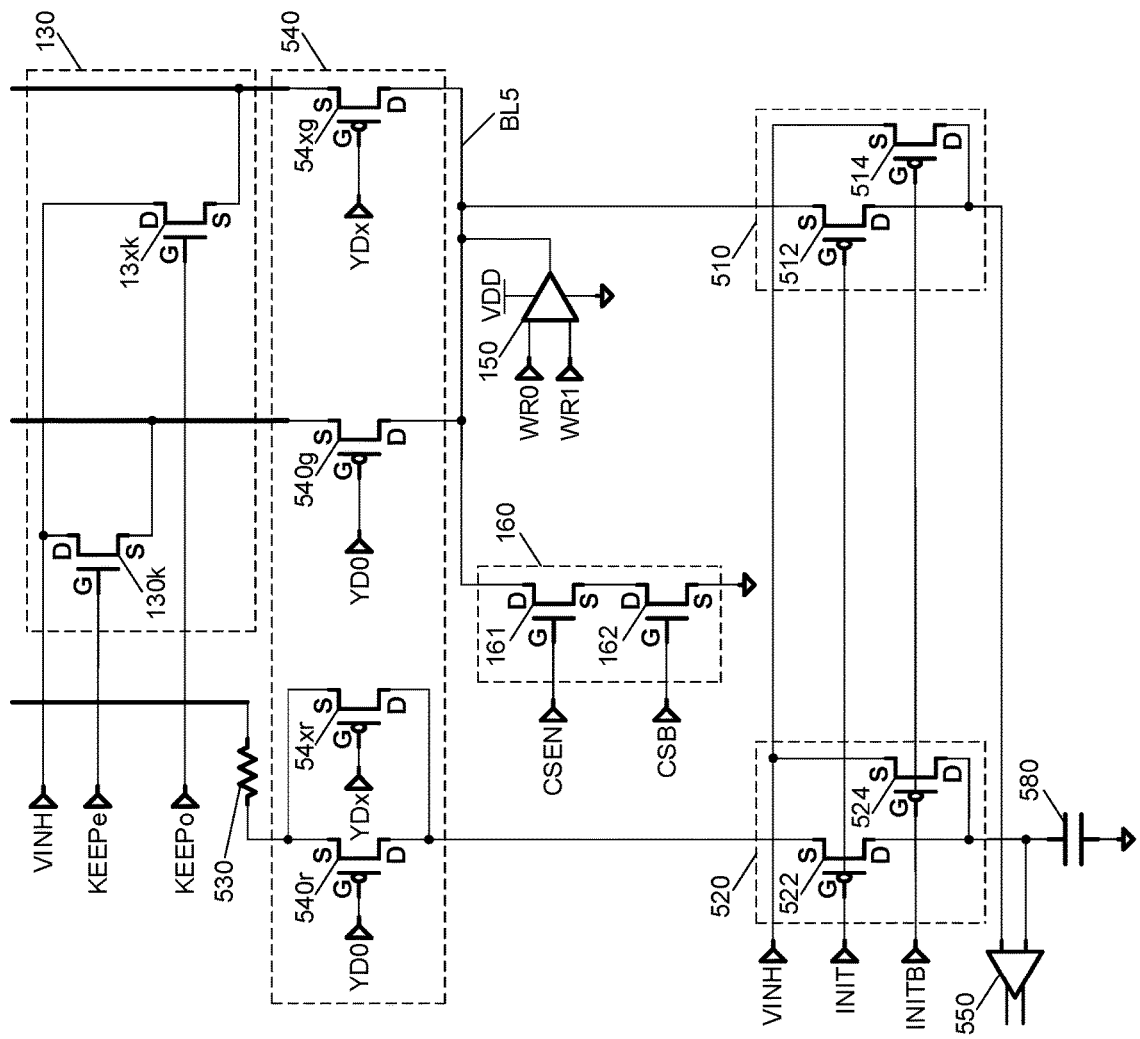
Figures 1, 5E:
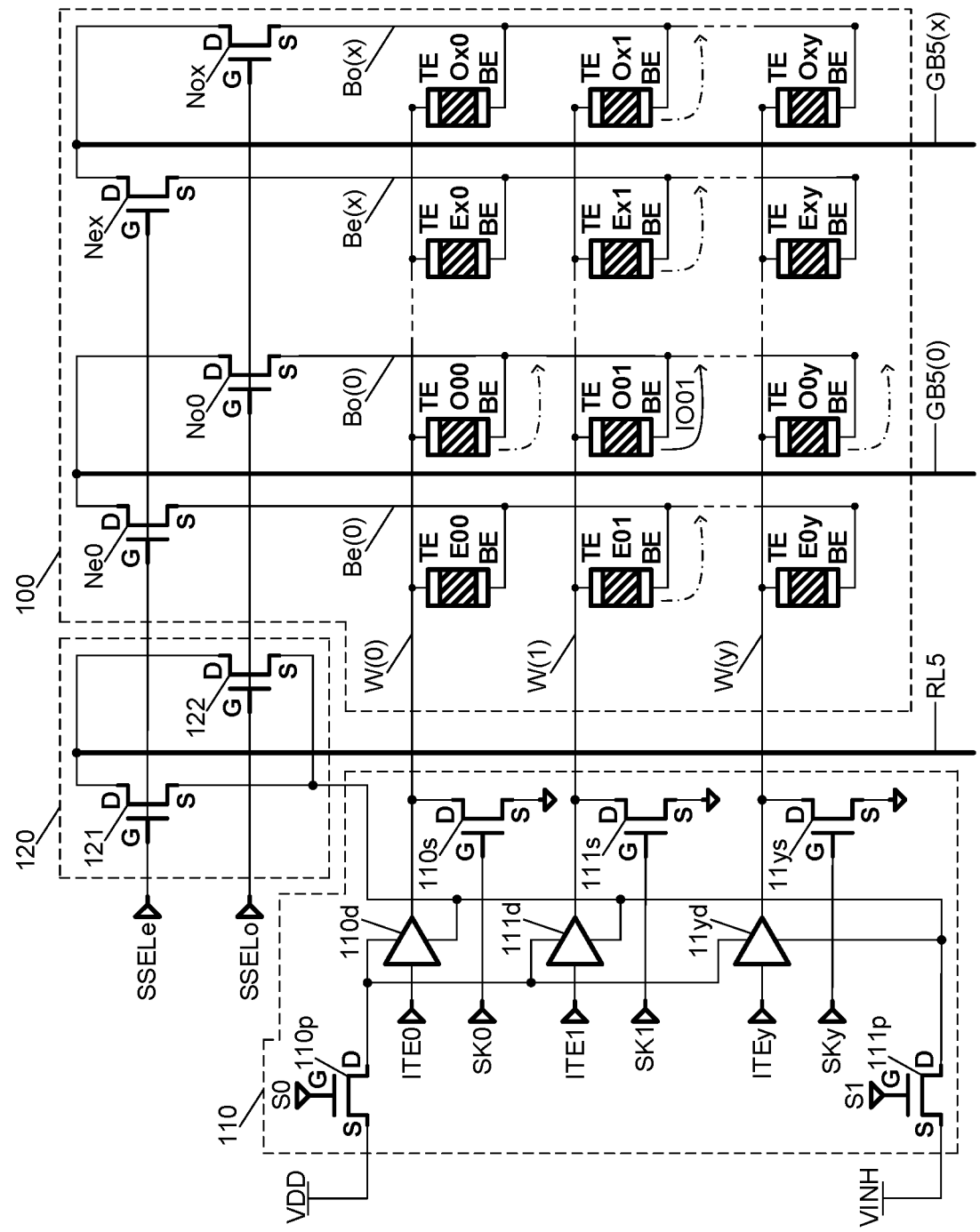
Figures 2, 5E:
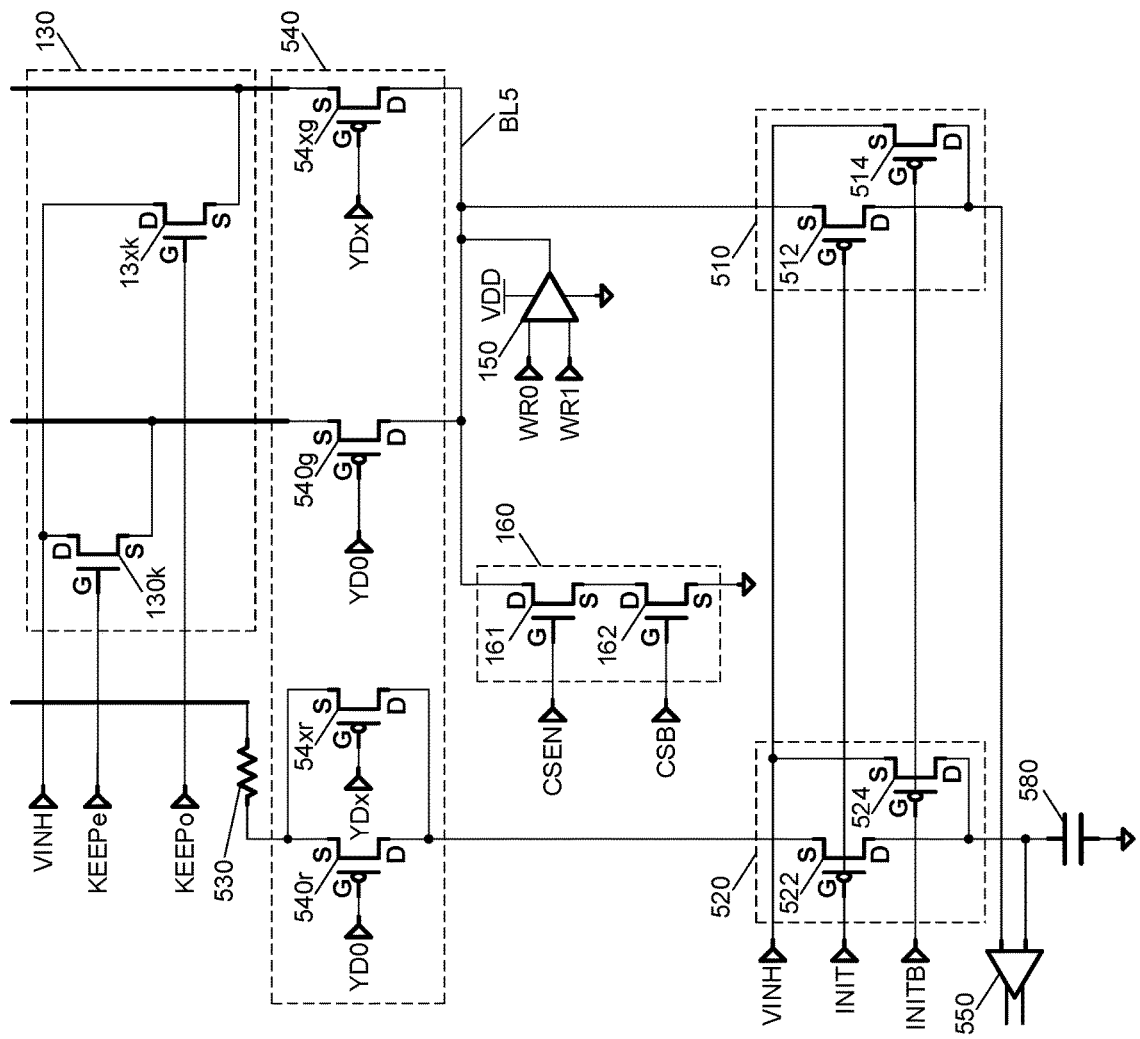
Figures 1, 5F:
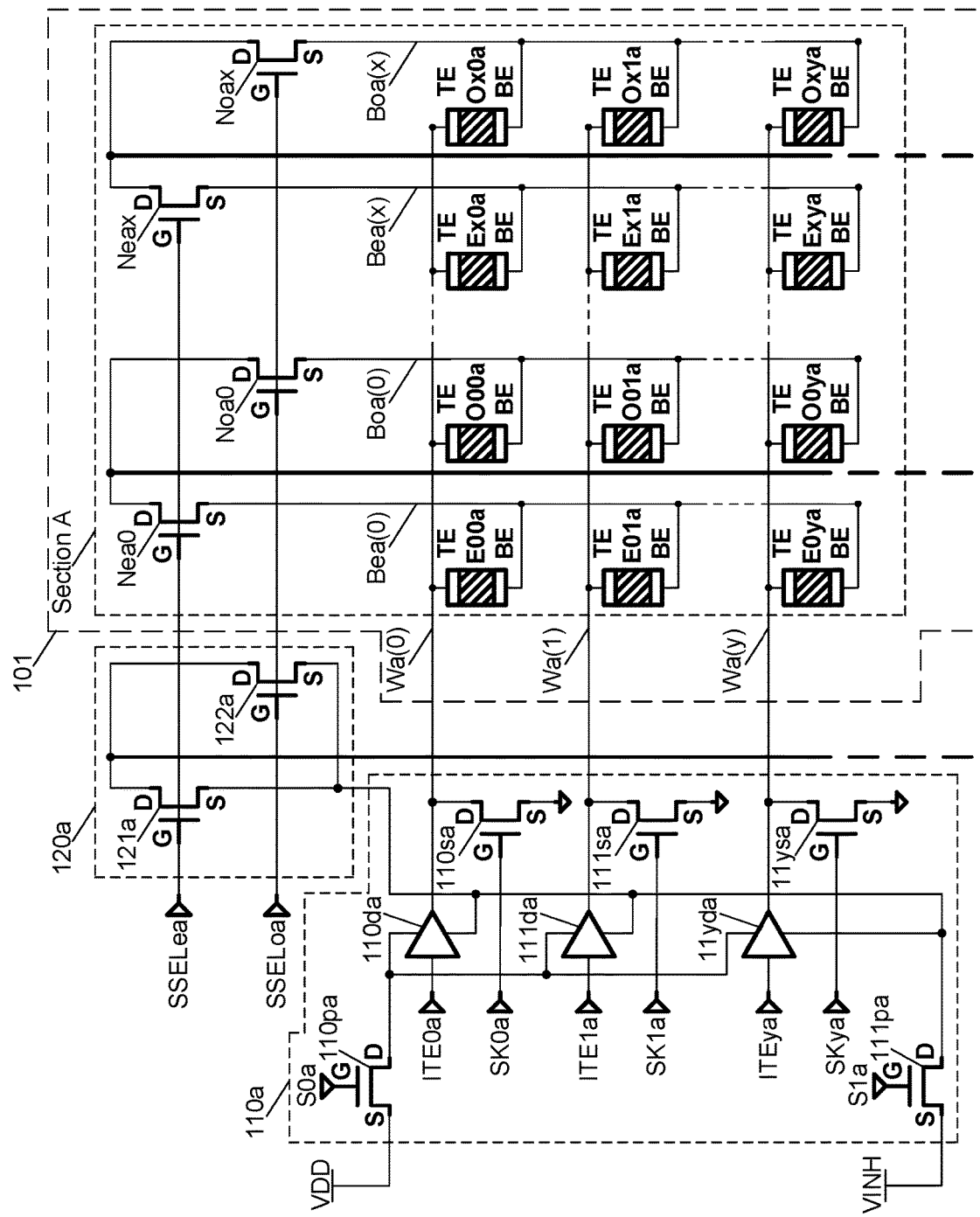
Figures 2, 5F:
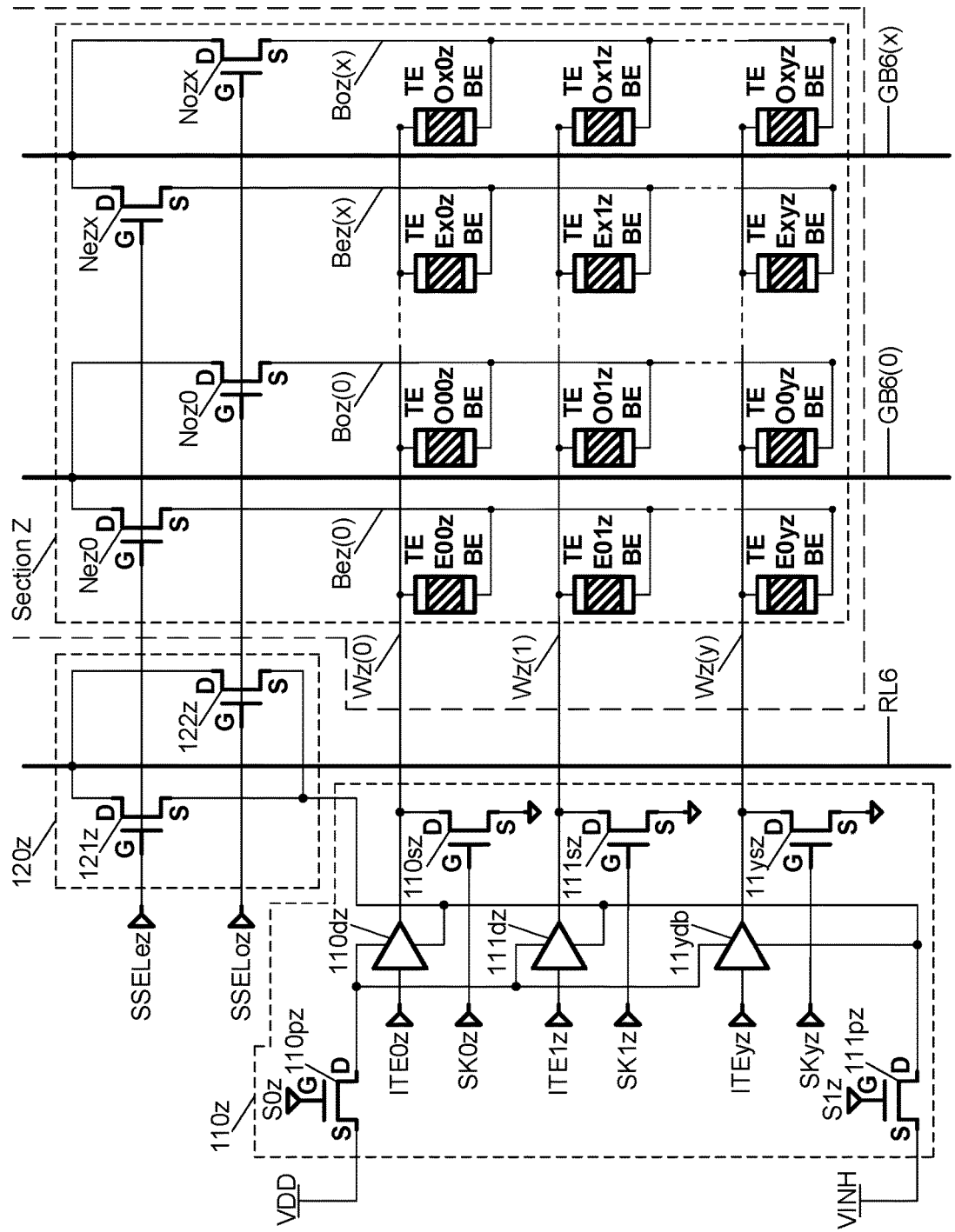
Figures 3, 5F:
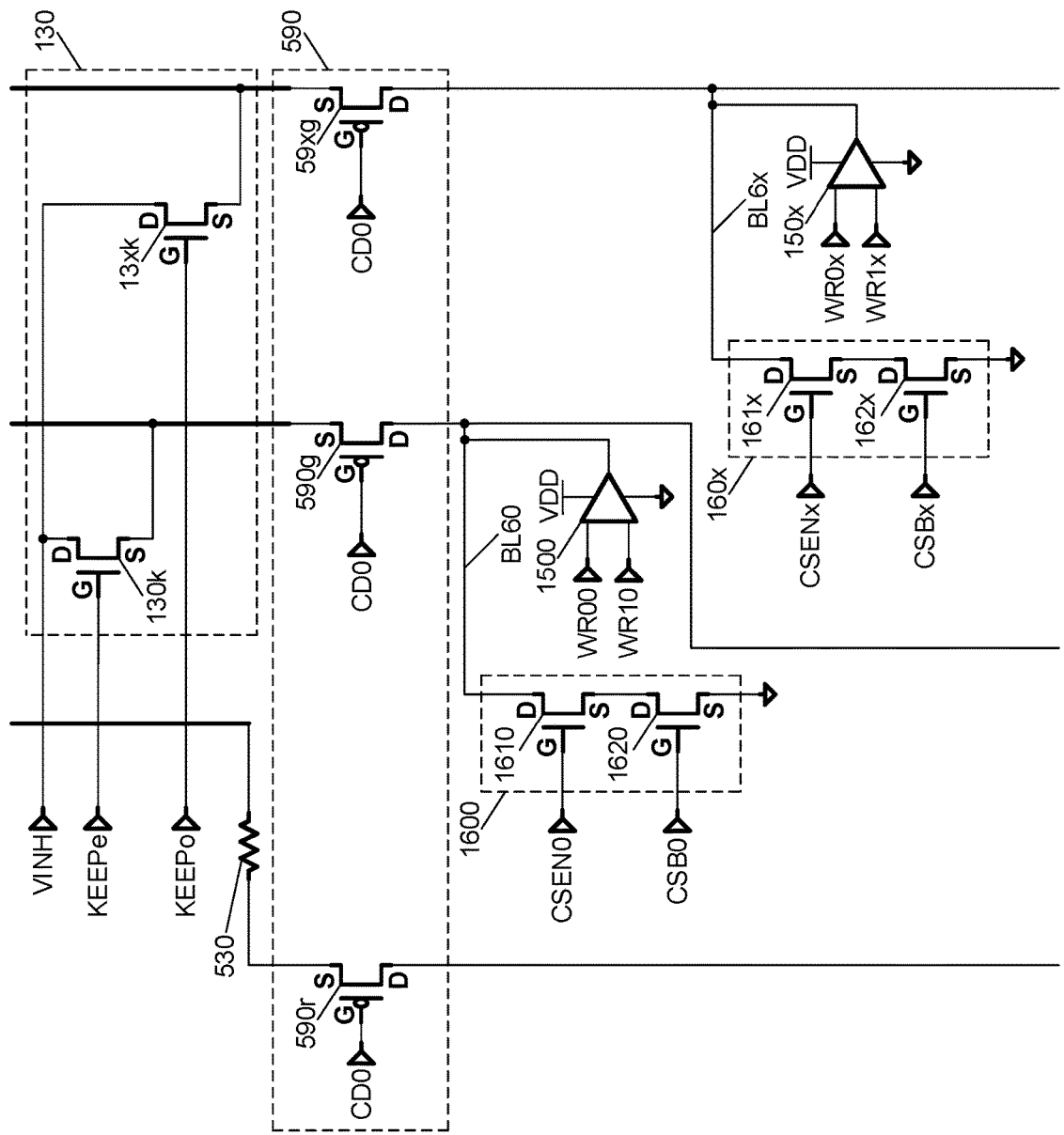
Figures 4, 5F:
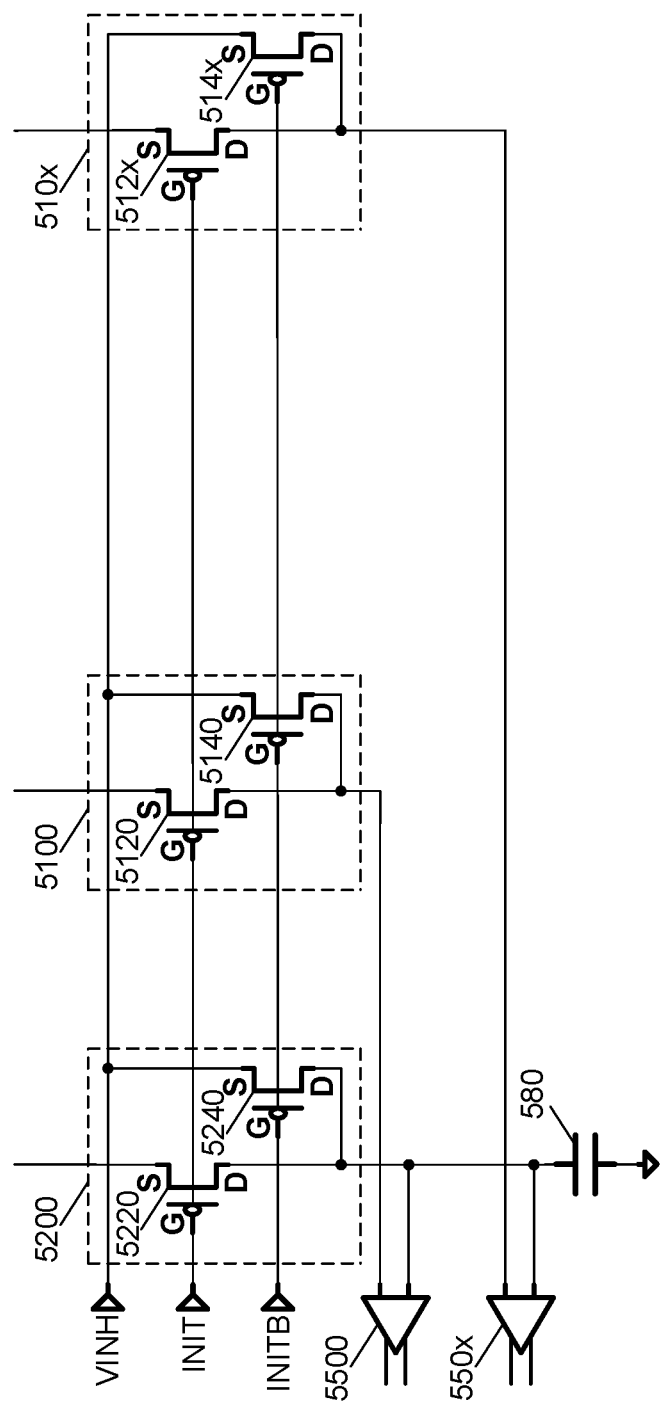

FIG. 4 illustrates a flow chart 400 showing a method for accessing resistive change elements using neutral voltage conditions. The method starts in step 402 with providing neutral voltage conditions for at least one plurality of resistive change elements in a resistive change element array in an electrical device, where each resistive change element of the at least one plurality of resistive change elements is in electrical communication with a bit line and a word line, and where each resistive change element of the at least one plurality of resistive change elements is adjustable between at least two resistive states. The method continues in step 404 with biasing a plurality of global bit lines. The method proceeds in step 406 with selecting at least one resistive change element from the at least one plurality of resistive change elements. The method continues in step 408 with preparing the electrical device for determining a resistive state of each of the at least one resistive change element. The method proceeds in step 410 with generating a voltage indicative of a resistive state for each of the at least one resistive change element. The method continues in step 412 with determining a resistive state based on a voltage indicative of a resistive state for that resistive change element for each of the at least one resistive change element. The method proceeds in step 414 with restoring neutral voltage conditions for resistive change elements impacted by generating a voltage indicative of a resistive state for each of the at least one resistive change element. The method continues in step 416 with biasing global bit lines impacted by generating a voltage indicative of a resistive state for each of the at least one resistive change element. It is noted that the steps of the method for accessing a resistive change element using neutral voltage conditions are not limited to being performed in the order shown in FIG. 4. For example, the steps of providing neutral voltage conditions for at least one plurality of resistive change elements in a resistive change element array in an electrical device and biasing a plurality of global bit lines can be performed at the same time. It is also noted that the method for accessing a resistive change element using neutral voltage conditions is not limited to the first exemplary architecture and that the method for accessing a resistive change element using neutral voltage conditions can be performed by other architectures and systems. For example, the method for accessing a resistive change element using neutral voltage conditions can be performed by the second exemplary architecture shown in FIG. 5A. It is further noted that the method for accessing a resistive change element using neutral voltage conditions can include additional steps, such as selecting an amount of current for generating a voltage indicative of a resistive state of the resistive change element. It is additionally noted that READ operations, SET VERIFY operations, and RESET VERIFY operations generally use different amounts of current for generating a voltage indicative of a resistive state of a resistive change element because READ operations, SET VERIFY operations, and RESET VERIFY operation make different determinations.

Referring now to FIGS. 1G-1 and 1G-2, a READ operation of the resistive change element O01 starts, as similarly discussed above in step 402 of the flow chart 400, by providing neutral voltage conditions for the plurality of resistive change elements E00-Oxy in the resistive change element array 100. The neutral voltage conditions are provided for the plurality of resistive change elements E00-Oxy by floating the plurality of even bit lines Be(0)-Be(x) and the plurality of odd bit lines Bo(0)-Bo(x) and applying the inhibit voltage VINH to the plurality of word lines W(0)-W(y) with the plurality of even bit lines Be(0)-Be(x) and the plurality of odd bit lines Bo(0)-Bo(x) floating so that voltages approximately equal to the inhibit voltage VINH are applied to the top electrodes and the bottom electrodes of the resistive change elements in the plurality of resistive change elements E00-Oxy. Floating a line refers to electrically connecting the line such that a voltage on the line exists due to a line capacitance of the line. The plurality of even bit lines Be(0)-Be(x) are floated by disconnecting the plurality of even bit lines Be(0)-Be(x) from the plurality of global bit lines GB2(0)-GB2(x) by turning off the plurality of even selection devices Ne0-Nex. The plurality of even selection devices Ne0-Nex are turned off by control logic, such as a processor, a controller, and a microcontroller, supplying a signal SSELe having a low level. The plurality of odd bit lines Bo(0)-Bo(x) are floated by disconnecting the plurality of odd bit lines Bo(0)-Bo(x) from the plurality of global bit lines GB2(0)-GB2(x) by turning off the plurality of odd selection devices No0-Nox. The plurality of odd selection devices No0-Nox are turned off by control logic, such as a processor, a controller, and a microcontroller, supplying a signal SSELo having a low level. It is noted that control logic, such as a processor, a controller, and a microcontroller, supplying a signal SSELe having a low level and a signal SSELo having a low level also turns off the first NMOS transistor 121 and the second NMOS transistor 122 of the reference line connection circuit 120 and floats the reference line RL2.

The inhibit voltage VINH is applied to the plurality of word lines W(0)-W(y) by the word line driver circuitry 110 driving voltages on the plurality of word lines W(0)-W(y) to the inhibit voltage VINH. The plurality of word line driver circuits 110d-11yd receive the system voltage VDD on the first power terminals because the first NMOS transistor 110p is turned on by control logic, such as a processor, a controller, and a microcontroller, supplying the signal S0 having a high level and receive the inhibit voltage VINH on the second power terminals because the second NMOS transistor 111p is turned on by the control logic supplying the signal S1 having a high level. The plurality of word line driver circuits 110d-11yd supply the inhibit voltage VINH based on the plurality of signals ITE0-ITEy supplied by control logic, such as a processor, a controller, and a microcontroller. The plurality of sink transistors 110s-11ys are turned off because control logic, such as a processor, a controller, and a microcontroller, supplies the plurality of signal SK0-Sky having low levels.

Driving the plurality of word lines W(0)-W(y) to the inhibit voltage VINH with the plurality of even bit lines Be(0)-Be(x) and the plurality of odd bit lines Bo(0)-Bo(x) floating causes voltages on the plurality of word lines W(0)-W(y), voltages on the plurality of even bit lines Be(0)-Be(x), and voltages on the plurality of odd bit lines Bo(0)-Bo(x) to be approximately equal to the inhibit voltage VINH. Voltages on the plurality of even bit lines Be(0)-Be(x) and voltages on the plurality of odd bit lines Bo(0)-Bo(x) are approximately equal to the inhibit voltage VINH because currents flow from the plurality of word lines W(0)-W(y) through the plurality of resistive change elements E00-Oxy into the plurality of even bit lines Be(0)-Be(x) and the plurality of odd bit lines Bo(0)-Bo(x). The inhibit voltage VINH exists on the plurality of even bit lines Be(0)-Be(x) and the plurality of odd bit lines Bo(0)-Bo(x) due to line capacitances because the plurality of even bit lines Be(0)-Be(x) and the plurality of odd bit lines Bo(0)-Bo(x) are floating. Thus, driving voltages on the plurality of word lines W(0)-W(y) to the inhibit voltage VINH with the plurality of even bit lines Be(0)-Be(x) and the plurality of odd bit lines Bo(0)-Bo(x) floating results in application of voltages approximately equal to the inhibit voltage VINH to the top electrodes and the bottom electrodes of the resistive change elements in the plurality of resistive change elements E00-Oxy. Additionally, driving the plurality of word lines W(0)-W(y) to the inhibit voltage VINH with the plurality of even bit lines Be(0)-Be(x) and the plurality of odd bit lines Bo(0)-Bo(x) floating causes the voltages across resistive change elements in the plurality of resistive change elements E00-Oxy to be approximately 0 volts.

The READ operation of the resistive change element O01 continues, as similarly discussed above in step 404 of the flow chart 400, by biasing the plurality of global bit lines GB2(0)-GB2(x). The plurality of global bit lines GB2(0)-GB2(x) are biased to the inhibit voltage VINH by floating the plurality of global bit lines GB2(0)-GB2(x) and applying the inhibit voltage VINH to the plurality of global bit lines GB2(0)-GB2(x). The plurality of global bit lines GB2(0)-GB2(x) are floated by disconnecting the plurality of global bit lines GB2(0)-GB2(x) from the plurality of even bit lines Be(0)-Be(x), the plurality of odd bit lines Bo(0)-Bo(x), and the bus line BL2. The plurality of global bit lines GB2(0)-GB2(x) may be disconnected from the plurality of even bit lines Be(0)-Be(x) and the plurality of odd bit lines Bo(0)-Bo(x) as part of providing neutral voltage conditions for the plurality of resistive change elements E00-Oxy as discussed above. The plurality of global bit lines GB2(0)-GB2(x) are disconnected from the bus line BL2 by turning off the plurality of PMOS transistors 140g-14xg in the global bit line connection circuit 140. The plurality of PMOS transistors 140g-14xg are turned off by control logic, such as a processor, a controller, and a microcontroller, supplying a plurality of signals YD0-YDx having high levels. The inhibit voltage VINH is applied to the plurality of global bit lines GB2(0)-GB2(x) by electrically connecting the plurality of global bit lines GB2(0)-GB2(x) to a power supply, a voltage source, a driver circuit, or other device that supplies the inhibit voltage VINH by turning on the plurality of NMOS transistors 130k-13xk in the keeper circuit 130. The plurality of NMOS transistors 130k-13xk are turned on by control logic, such as a processor, a controller, and a microcontroller, supplying a signal KEEPe having a high level and a signal KEEPo having a high level.

The READ operation of the resistive change element O01 proceeds, as similarly discussed above in step 406 of the flow chart 400, by selecting the resistive change element O01 from the plurality of resistive change elements E00-Oxy. The resistive change element O01 is selected from the plurality of resistive change elements E00-Oxy by control logic, such as a processor, a controller, and a microcontroller. The resistive change elements E00-Ox0, E01, Ex1-Ox1 and E0y-Oxy in the plurality of resistive change elements E00-Oxy that are not selected are referred to as unselected resistive change elements.

The READ operation of the resistive change element O01 continues, as similarly discussed above in step 408 of the flow chart 400, by preparing the exemplary implementation of the first exemplary architecture for determining a resistive state of the resistive change element O01. The exemplary implementation of the first exemplary architecture is prepared for determining a resistive state of the resistive change element O01 by driving the voltage on the reference line RL2 to the inhibit voltage VINH, changing electrical connections of the odd bit line Bo(0), changing electrical connections of the global bit line GB2(0), and disconnecting a power supply, a voltage source, a driver circuit, or the device that supplies the inhibit voltage VINH from the global bit line GB2(0). The voltage on the reference line RL2 is driven to the inhibit voltage VINH by electrically connecting the reference line RL2 through the second NMOS transistor 122 of the reference line connection circuit 120 and the second NMOS transistor 111p of the word line driver circuit 110 to a power supply, a voltage source, a driver circuit, or other device that supplies the inhibit voltage VINH. The second NMOS transistor 122 is turned on by control logic, such as a processor, a controller, and a microcontroller, supplying a signal SSELo having a high level and, as discussed above with respect to providing neutral voltage conditions for the plurality of resistive change elements E00-Oxy in the resistive change element array 100, the second NMOS transistor 111p of the word line driver circuit 110 is turned on.

The electrical connections of the odd bit line Bo(0) and the electrical connections of the global bit line GB2(0) are changed and a power supply, a voltage source, a driver circuit, or other device that supplies the inhibit voltage VINH is disconnected from the global bit line GB2(0) so that a voltage indicative of the resistive state of the resistive change element O01 can be generated on the odd bit line Bo(0), the global bit line GB2(0), and the bus line BL2. The electrical connections of the odd bit line Bo(0) are changed so that the odd bit line Bo(0) is in electrical communication with the global bit line GB2(0). The odd bit line Bo(0) is electrically connected to the global bit line GB2(0) by turning on the odd selection device No0. The odd selection device No0 is turned on by control logic, such as a processor, a controller, and a microcontroller, supplying a signal SSELo having a high level. The odd bit line Bo(0) may be electrically connected to the global bit line GB2(0) as part of driving the voltage on the reference line RL2 to the inhibit voltage VINH as discussed above. It is noted that the plurality of odd selection devices No0-Nox are turned on by the control logic supplying a signal SSELo having a high level, and thus, the plurality of odd bit lines Bo(0)-Bo(x) are electrically connected to the plurality of global bit lines GB2(0)-GB2(x).

The electrical connections of the global bit line GB2(0) are changed so that the global bit line GB2(0) is in electrical communication with the odd bit line Bo(0) and the bus line BL2. The global bit line GB2(0) is electrically connected to the odd bit line Bo(0) by turning on the odd selection device No0 as discussed above and the global bit line GB2(0) may be electrically connected to the odd bit line Bo(0) as part of driving the voltage on the reference line RL2 to the inhibit voltage VINH as discussed above. The global bit line GB2(0) is electrically connected to the bus line BL2 by turning on the PMOS transistor 140g. The PMOS transistor 140g is turned on by control logic, such as a processor, a controller, and a microcontroller, supplying a signal YD0 having a low level. A power supply, a voltage source, a driver circuit, or other device that supplies the inhibit voltage VINH is disconnected from the global bit line GB2(0) by turning off the NMOS transistor 130k. The NMOS transistor 130k is turned off by control logic, such as a processor, a controller, and a microcontroller, supplying a signal KEEPe having a low level. It is noted that the control logic supplying a signal KEEPe having a low level also turns off NMOS transistors in the plurality of NMOS transistors 130k-13xk in electrical communication with global bit lines having even column numbers and disconnects global bit lines having even column numbers from a power supply, a voltage source, a driver circuit, or other device that supplies the inhibit voltage VINH.

The READ operation of the resistive change element O01 continues, as similarly discussed above in step 410 of the flow chart 400, by generating a voltage indicative of a resistive state of the resistive change element O01. The voltage indicative of the resistive state of the resistive change element O01 is generated on the odd bit line Bo(0), the global bit line GB2(0), and the bus line BL2 by driving the voltage on the word line W(1) to the system voltage VDD and sinking an amount of current for a READ operation from the bus line BL2. As discussed above, providing neutral voltage conditions for the plurality of resistive change elements E00-Oxy causes voltages on the plurality of word lines W(0)-W(y), voltages on the plurality of even bit lines Be(0)-Be(x), and voltages on the plurality of odd bit lines Bo(0)-Bo(x) to be approximately equal to the inhibit voltage VINH. Also, as discussed above, the plurality of global bit lines GB2(0)-GB2(x) are biased to the inhibit voltage VINH. Thus, for generating a voltage indicative of a resistive state of the resistive change element O01, a voltage on the word line W(1) transitions from the inhibit voltage VINH to the system voltage VDD and the voltages on the odd bit line Bo(0) and the global bit line GB2(0) transition from the inhibit voltage VINH to a voltage indicative of a resistive state of the resistive change element O01.

The voltage transition of the voltage on the word line W(1) generally corresponds with the voltage transition of the voltage on the top electrode TE of the resistive change element O01 because the voltage on the word line W(1) generally corresponds with the voltage on the top electrode TE of the resistive change element O01. The voltage transition of the voltage on the odd bit line Bo(0) generally corresponds with the voltage transition of the voltage on the bottom electrode BE of the resistive change element O01 because the voltage on the odd bit line Bo(0) generally corresponds with the voltage on the bottom electrode BE of the resistive change element O01. The magnitude of the voltage transition to place the top electrode TE of the resistive change element O01 at the system voltage VDD for generating a voltage indicative of a resistive state of the resistive change element O01 is reduced because the voltage applied to the top electrode TE of the resistive change element O01 is not required to transition by the magnitude of the system voltage VDD. A voltage transition of the system voltage VDD minus the inhibit voltage VINH is required to place the top electrode at the system voltage VDD. For example, when the inhibit voltage VINH is VDD/2 (half of the system voltage VDD) a voltage transition of VDD−VDD/2=VDD/2 is required to place the top electrode at the system voltage VDD. Further, the number of voltage transitions for generating a voltage indicative of a resistive state of the resistive change element O01 is reduced because only voltages on the word line W(1), the global bit line GB2(0), and the odd bit line Bo(0) are adjusted for generating a voltage indicative of a resistive state of the resistive change element O01. It is noted that applying the inhibit voltage VINH to a top electrode, a bottom electrode, or both a top electrode and a bottom electrode of a resistive change element limits a voltage applied across a resistive change element to a voltage less than a voltage limit for disturbing a resistive state of a resistive change element while generating a voltage indicative of a resistive state of the resistive change element O01.

The voltage on the word line W(1) is driven from the inhibit voltage VINH to the system voltage VDD by changing the voltage supplied by the word line driver circuit 111d from the inhibit voltage VINH to the system voltage VDD. The word line driver circuit 111d changes from supplying the inhibit voltage VINH to the system voltage VDD based on a signal ITE1 supplied by control logic, such as a processor, a controller, and a microcontroller. The write buffer circuit 150 does not supply a voltage based on the write set signal WR0 and the write reset signal WR1 supplied by control logic, such as a processor, a controller, and a microcontroller. The amount of current for a READ operation is sunk from the bus line BL2 by the current source 160. The amount of current for a READ operation is based on the amount of current that would flow through a resistor having an intermediate resistance and having the system voltage VDD applied to one terminal of the resistor and the inhibit voltage VINH applied to the other terminal of the resistor. The amount of current that would flow through a resistor having an intermediate resistance and having the system voltage VDD applied to one terminal of the resistor and the inhibit voltage VINH applied to the other terminal of the resistor can be approximated by the following equation, I=(VDD−VINH)/Intermediate Resistance. For example, when the intermediate resistance=5.5 MΩ, the system voltage VDD=2V, and the inhibit voltage VINH=1V, the current source 160 is configured to sink an amount of current that can be approximated as I=(2V−1V)/5.5 MΩ=0.18 μA. It is noted that, ignoring leakage currents, the amount of current for the READ operation flows through the resistive change element O01, the odd bit line Bo(0), the global bit line GB2(0), and the bus line BL2 to the current source 160.

The intermediate resistance sets a boundary for resistance values that correspond with a low resistive state during READ operations and resistance values that correspond with a high resistive state during READ operations. The intermediate resistance is a design variable that can be selected by a circuit designer and the circuit designer typically selects an intermediate resistance greater than a model resistance for a low resistive state of a resistive change element and less than a model resistance for a high resistive state of a resistive change element. For example, when a model resistance for a low resistive state of a resistive change element is 1 MΩ and a model resistance for a high resistive state of a resistive change elements is 10 MΩ, a circuit designer can select an intermediate resistance of 5.5 MΩ so that resistive change elements having a resistance less than approximately 5.5 MΩ are determined to have a low resistive state during READ operations and resistive change elements having a resistance greater than approximately 5.5 MΩ are determined to have a high resistive state during READ operations. It is noted that the intermediate resistance is not limited to a resistance at the exact midpoint between a model resistance for a low resistive state of a resistive change element and a model resistance for a high resistive state of a resistive change element, but rather the intermediate resistance can be closer the model resistance for the low resistive state or the model resistance for the high resistive state.

FIG. 1G-1 shows a current IO01 flowing through the resistive change element O01 from the top electrode TE to the bottom electrode BE because the top electrode TE is at the system voltage VDD and the bottom electrode BE is at a voltage indicative of a resistive state of the resistive change element O01. While, ignoring leakage currents, the amount of the current flowing through the resistive change element O01, the odd bit line Bo(0), the global bit line GB2(0), and the bus line BL2 are the same amount of current (the amount of current for the READ operation). Additionally, ignoring leakage currents, routing parasitics, and on resistance of the odd selection device No0, the voltage VBo(0) on the odd bit line Bo(0), the voltage VGB2(0) on the global bit line GB2(0), and the voltage on the bus line BL2 are generally the same voltage and the voltage VBo(0) on the odd bit line Bo(0), the voltage VGB2(0) on the global bit line GB2(0), and the voltage on the bus line BL2 are indicative of the resistive state of the resistive change element O01. It is noted that the voltage indicative of a resistive state of the resistive change element O01 is discussed below with respect to the voltage VGB2(0) on the global bit line GB2(0).

The voltage VGB2(0) on the global bit line GB2(0), ignoring leakage currents, routing parasitics, and on resistance of the odd selection device No0, can be approximated by subtracting the voltage drop across the resistive change element O01 from the voltage VW(1) on the word line W(1). The voltage drop across the resistive change element O01 can be approximated using Ohm's Law. Thus, the voltage VGB2(0) on the global bit line GB2(0) can be approximated by the following equation VGB2(0)=VW(1)−(IO01×RO01), where VW(1) is the voltage on the word line W(1), the current IO01 is the current flowing through resistive change element O01, and RO01 is the resistance of the resistive change element O01. As shown by this equation, the voltage VGB2(0) on the global bit line GB2(0) changes when the resistance of the resistive change element O01 changes because the voltage VW(1) on the word line W(1) and the current IO01 flowing through the resistive change element O01 are generally the same for READ operations. For example, when VW(1)=2 volts, IO01=1/5.5 microamps, and RO01=5.5 MΩ, the voltage VGB2(0)=2V−(1/5.5 μA×5.5 MΩ)=1V. For example, when VW(1)=2 volts, IO01=1/5.5 microamps, and RO01=1 MΩ, the voltage VGB2(0)=2V−(1/5.5 μA×1 MΩ)=1.82V. For example, when VW(1)=2 volts, IO01=1/5.5 microamps, and RO01=10 MΩ, the voltage VGB2(0)=2V−(1/5.5 μA×10 MΩ)=0.182V.

FIG. 1G-1 also shows leakage currents flowing through the resistive change elements O00, O0y in electrical communication with the odd bit line Bo(0) and leakage currents flowing through the resistive change elements E01, Ex1-Ox1 in electrical communication with the word line W(1). The leakage currents are shown using dashed lines in FIG. 1G-1. Leakage currents flow through the resistive change elements O00, O0y because the bottom electrodes of the resistive change elements O00, O0y are at a voltage indicative of a resistive state of the resistive change element O01 and the top electrodes of the resistive change elements O00, O0y are the inhibit voltage VINH. Leakage currents flow through resistive change elements E01, Ex1-Ox1 because the bottom electrodes of the resistive change elements E01, Ex1-Ox1 are at the inhibit voltage VINH and the top electrodes of the resistive change elements E01, Ex1-Ox1 are at the system voltage VDD. It is noted that leakage currents may flow through resistive change elements other than the resistive change elements in electrical communication with the odd bit line Bo(0) and the resistive change elements in electrical communication with the word line W(1) because voltages on other lines may be impacted by generating a voltage indicative of a resistive state of the resistive change element O01. It is also noted that leakage currents do not prevent the READ operation of the resistive change element O01 when the leakage currents are much less than the amount of the current IO01. It is further noted that the voltage differences across the resistive change elements that cause the leakage currents do not disturb the resistive states of the resistive change elements because the voltage differences are less than a voltage limit for disturbing a resistive state of a resistive change element.

It is additionally noted that when the voltage VBo(0) on the odd bit line Bo(0) is less than the inhibit voltage VINH and the word lines W(0), W(y) in electrical communication with the other resistive change elements O00, O0y on the odd bit line Bo(0) are driven to the inhibit voltage VINH, leakage currents flow into the odd bit line Bo(0) through the other resistive change elements O00, O0y and pull up the voltage VBo(0) on the odd bit line Bo(0). It is also noted that when the voltage VBo(0) on the odd bit line Bo(0) is greater than the inhibit voltage VINH and the word lines W(0), W(y) in electrical communication with the other resistive change elements O00, O0y on the odd bit line Bo(0) are driven to the inhibit voltage VINH, leakage currents flow from the odd bit line Bo(0) through the other resistive change elements O00, O0y and pull down the voltage VBo(0) on the bit line Bo(0). It is further noted that when the voltage VBo(0) on the odd bit line Bo(0) is pulled up by leakage currents flowing into the odd bit line Bo(0) and when the voltage VBo(0) on the odd bit line Bo(0) is pulled down by leakage currents flowing from the odd bit line Bo(0), the number of the word lines W(0), W(y) should be small enough to allow a margin to determine a resistive state of the resistive change element O01.

The READ operation of the resistive change element O01 proceeds, as similarly discussed above in step 412 of the flow chart 400, by determining the resistive state of the resistive change element O01 based on the voltage VGB2(0) on the global bit line GB2(0). The resistive state of the resistive change element O01 is determined by comparing the voltage VGB2(0) on with global bit line GB2(0) with the inhibit voltage VINH on the reference line RL2. As discussed above, the voltage VGB2(0) on the global bit line GB2(0) is indicative of the resistive state of the resistive change element O01. For READ operations the inhibit voltage VINH is indicative of the intermediate resistance because the inhibit voltage VINH is equal to the system voltage VDD minus a voltage calculated by multiplying the amount of current for a READ operation and the intermediate resistance of 5.5 MΩ. For example, when the system voltage VDD=2V, the inhibit voltage VINH=1V, the amount of current for READ operations=1/5.5 µA, and the intermediate resistance=5.5 MΩ, VINH=2V−(1/5.5 µA×5.5 MΩ)=1V. When the voltage VGB2(0) on the global bit line GB2(0) is greater than the inhibit voltage (i.e. the voltage VGB2(0) on the global bit line GB2(0)>VINH) the resistance of the resistive change element O01 is less than the intermediate resistance (i.e. RO01<intermediate resistance, where RO01 is the resistance of the resistive change element O01) and the resistive state of the resistive change element O01 is determined to be a low resistive state. When the voltage VGB2(0) on the global bit line GB2(0) is less than the inhibit voltage VINH (i.e. the voltage VGB2(0) on the global bit line GB2(0)<VINH) the resistance of the resistive change element O01 is greater than the intermediate resistance (i.e. RO01>intermediate resistance, where RO01 is the resistance of the resistive change element O01) and the resistive state of resistive change element O01 is determined to be a high resistive state.

The first sense amplifier 200 receives the inhibit voltage VINH on the reference line RL2 and the voltage VGB2(0) on the global bit line GB2(0) and determines the resistive state of the resistive change element O01 by comparing the inhibit voltage VINH on the reference line RL2 with the voltage VGB2(0) on the global bit line GB2(0). The first sense amplifier 200 outputs signals indicative of the resistive state of the resistive change element O01 on two outputs. When the voltage VGB2(0) on the global bit line GB2(0) is greater than the inhibit voltage VINH, the first sense amplifier 200 outputs signals indicating the resistive change element O01 has a low resistive state. When the voltage VGB2(0) on the global bit line GB2(0) is less than the inhibit voltage VINH, the first sense amplifier 200 outputs signals indicating the resistive change element O01 has a high resistive state. The operation of the first sense amplifier 200 is discussed in greater detail with respect to the simplified schematic diagram of the first sense amplifier 200 shown in FIG. 2A and the exemplary voltage waveforms for describing operation of the first sense amplifier 200 for READ operations of resistive change element O01. It is noted that providing the inhibit voltage VINH on the reference line RL2 to the first sense amplifier 200 can increase the accuracy of determining the resistive state of the resistive change element O01 because the inhibit voltage VINH on the reference line RL2 and the voltage VGB2(0) on the global bit line GB2(0) are subject to similar conditions.

The READ operation of the resistive change element O01 proceeds, as similarly discussed above in step 414 of the flow chart 400, by restoring neutral voltage conditions for resistive change elements impacted by generating a voltage indicative of a resistive state of the resistive change element O01. Neutral voltage conditions are restored for resistive change elements impacted by generating a voltage indicative of a resistive state of the resistive change element O01 by floating the plurality of odd bit lines Bo(0)-Bo(x) and applying the inhibit voltage VINH to the word line W(1). The plurality of even bit lines Be(0)-Be(x) are already floating because the plurality of even selection devices Ne0-Nex are turned off. The inhibit voltage VINH is already applied to the word lines W(0), W(y) because the word line driver circuits 110d, 11yd are already supplying the inhibit voltage VINH. The plurality of odd bit lines Bo(0)-Bo(x) are floated by disconnecting the plurality of odd bit lines Bo(0)-Bo(x) from the plurality of global bit lines GB2(0)-GB2(x) by turning off the plurality of odd selection devices No0-Nox. The plurality of odd selection devices No0-Nox are turned off by control logic, such as a processor, a controller, and a microcontroller, supplying a signal SSELo having a low level. The inhibit voltage VINH is applied to the word line W(1) by the word line driver circuit 111d driving the voltage on the word line W(1) to the inhibit voltage VINH. The word line driver circuit 111d supplies the inhibit voltage VINH based on a signal ITE1 supplied by control logic, such as a processor, a controller, and a microcontroller. Thus, the inhibit voltage VINH is applied to the plurality of word lines W(0)-W(y) with the plurality of even bit lines Be(0)-Be(x) and the plurality of odd bit lines Bo(0)-Bo(x) floating so that voltages approximately equal to the inhibit voltage VINH are applied to the top electrodes and the bottom electrodes of the resistive change elements in the plurality of resistive change elements E00-Oxy.

The READ operation of the resistive change element O01 proceeds, as similarly discussed above in step 416 of the flow chart 400, by biasing global bit lines impacted by generating a voltage indicative of a resistive state of the resistive change element O01. Global bit lines impacted by generating a voltage indicative of a resistive state of the resistive change element O01 are biased to the inhibit voltage VINH by floating the plurality of global bit lines GB2(0)-GB2(x) and applying the inhibit voltage VINH to global bit lines having even column numbers. The plurality of global bit lines GB2(0)-GB2(x) are floated by disconnecting the plurality of global bit lines GB2(0)-GB2(x) from the plurality of odd bit lines Bo(0)-Bo(x) and disconnecting the global bit line GB2(0) from the bus line BL2. The plurality of global bit lines GB2(0)-GB2(x) are already disconnected from the plurality of even bit lines Be(0)-Be(x) because the plurality of even selection devices Ne0-Nex are turned off. The global bit lines other than global bit line GB2(0) are already disconnected from the bus line BL2 because the PMOS transistors in the global bit line connection circuit 140 other than PMOS transistor 140g are turned off. The plurality of global bit lines GB2(0)-GB2(x) may be disconnected from the plurality of odd bit lines Bo(0)-Bo(x) as part of restoring neutral voltage conditions for resistive change elements impacted by generating a voltage indicative of a resistive state of the resistive change element O01 as discussed above. The global bit line GB2(0) is disconnected from the bus line BL2 by turning off the PMOS transistor 140g. The PMOS transistor 140g is turned off by control logic, such as a processor, a controller, and a microcontroller, supplying a signal YD0 having a high level. The inhibit voltage VINH is already applied to the global bit lines having odd column numbers because the global bit lines having odd column numbers are in electrical communication with a power supply, a voltage source, a driver circuit, or other device that supplies the inhibit voltage VINH because the NMOS transistors 13xk are turned on. The inhibit voltage VINH is applied to the global bit lines having even column numbers by electrically connecting the global bit lines having even column numbers to a power supply, a voltage source, a driver circuit, or other device that supplies the inhibit voltage VINH by turning on the NMOS transistors 130k. The NMOS transistors 130k in electrical communication with the global bit lines having even column numbers are turned on by control logic, such as a processor, a controller, and a microcontroller, supplying a signal KEEPe having a high level.

Referring now to FIGS. 1H-1 and 1H-2, a simplified schematic diagram of the exemplary implementation of the first exemplary architecture showing current flow through the resistive change element array 100 during a READ operation of resistive change element O01 when resistive change element O01 has a high resistive state is illustrated. A READ operation of the resistive change element O01 when resistive change element O01 has a high resistive state is performed in the same manner as a READ operation of the resistive change element O01 when resistive change element O01 has a low resistive as discussed above with respect to FIGS. 1G-1 and 1G-2. However, a voltage indicative of a resistive state of resistive change element O01 when resistive change element O01 has a high resistive state differs from a voltage indicative of a resistive state of resistive change element O01 when resistive change element O01 has a low resistive state. Thus, current flow through the resistive change element array 100 during a READ operation of the resistive change element O01 when resistive change element O01 has a high resistive state may differ from current flow through the resistive change element array 100 during a READ operation of the resistive change element O01 when resistive change element O01 has a low resistive state.

FIG. 1H-1 shows a current IO01 flowing through the resistive change element O01 from the top electrode TE to the bottom electrode BE because the top electrode TE is at the system voltage VDD and the bottom electrode BE is at a voltage indicative of a resistive state of the resistive change element O01. FIG. 1H-1 also shows leakage currents flowing through the resistive change elements O00, O0y in electrical communication with the odd bit line Bo(0) and leakage currents flowing through the resistive change elements E01, Ex1-Ox1 in electrical communication with the word line W(1). The leakage currents are shown using dashed lines in FIG. 1H-1. Leakage currents flow through the resistive change elements O00, O0y because the bottom electrodes of the resistive change elements O00, O0y are at a voltage indicative of a resistive state of the resistive change element O01 and the top electrodes of the resistive change elements O00, O0y are the inhibit voltage VINH. Leakage currents flow through resistive change elements E01, Ex1-Ox1 because the bottom electrodes of the resistive change elements E01, Ex1-Ox1 are at the inhibit voltage VINH and the top electrodes of the resistive change elements E01, Ex1-Ox1 are at the system voltage VDD. It is noted that leakage currents may flow through resistive change elements other than the resistive change elements in electrical communication with the odd bit line Bo(0) and the resistive change elements in electrical communication with the word line W(1) because voltages on other lines may be impacted by generating a voltage indicative of a resistive state of the resistive change element O01. It is also noted that leakage currents do not prevent the READ operation of the resistive change element O01 when the leakage currents are much less than the amount of the current IO01. It is further noted that the voltage differences across the resistive change elements that cause the leakage currents do not disturb the resistive states of the resistive change elements because the voltage differences are less than a voltage limit for disturbing a resistive state of a resistive change element.

SET VERIFY operations of resistive change elements in the exemplary implementation of the first exemplary architecture can be performed in a similar manner to READ operations of resistive change element O01 discussed above, but with the current source 160 set to sink an amount of current for a SET VERIFY operation. The amount of current for a SET VERIFY operation is based on the amount of current that would flow through a resistor having a low resistance and having the system voltage VDD applied to one terminal of the resistor and the inhibit voltage VINH applied to the other terminal of the resistor. The amount of current that would flow through a resistor having a low resistance and having the system voltage VDD applied to one terminal of the resistor and the inhibit voltage VINH applied to the other terminal of the resistor can be approximated by the following equation, I=(VDD−VINH)/Low Resistance. For example, when the low resistance is 2 MΩ, the system voltage VDD is 2V, and the inhibit voltage VINH is 1V, the current source 160 is configured to sink an amount of current for a SET VERIFY operation that can be approximated as I=(2V−1V)/2 MΩ=0.5 µA.

The low resistance sets an upper boundary for resistance values that correspond with a low resistive state during SET VERIFY operations. The low resistance is a design variable that can be selected by a circuit designer and the circuit designer typically selects a low resistance greater than a model resistance for a low resistive state of a resistive change element so that resistive change elements can have resistances greater than the model resistance for the low resistive state and be determined to have a low resistive state during SET VERIFY operations. For example, when a model resistance for a low resistive state of a resistive change element is 1 MΩ, a circuit designer can select a low resistance of 2 MΩ so that resistive change elements having a resistance less than approximately 2 MΩ are determined to have a low resistive state during SET VERIFY operations. It is noted that the circuit designer typically selects a low resistance greater than a model resistance for a low resistive state of a resistive change element and less than an intermediate resistance for READ operations.

RESET VERIFY operations of resistive change elements in the exemplary implementation of the first exemplary architecture can be performed in a similar manner to READ operations of resistive change element O01 discussed above, but with the current source 160 set to sink an amount of current for a RESET VERIFY operation. The amount of current for a RESET VERIFY operation is based on the amount of current that would flow through a resistor having a high resistance and having the system voltage VDD applied to one terminal of the resistor and the inhibit voltage VINH applied to the other terminal of the resistor. The amount of current that would flow through a resistor having a high resistance and having the system voltage VDD applied to one terminal of the resistor and the inhibit voltage VINH applied to the other terminal of the resistor can be approximated by the following equation, I=(VDD−VINH)/High Resistance. For example, when the high resistance is 9 MΩ, the system voltage VDD is 2V, and the inhibit voltage VINH is 1V, the current source 160 is configured to sink an amount of current for a RESET VERIFY operation that can be approximated as I=(2V−1V)/9 MΩ=0.11 μA.

The high resistance sets an upper boundary for resistance values that correspond with a high resistive state during RESET VERIFY operations. The high resistance is a design variable that can be selected by a circuit designer and the circuit designer typically selects a high resistance less than a model resistance for a high resistive state of a resistive change element so that resistive change elements can have resistances less than the model resistance for the high resistive state and be determined to have a high resistive state during RESET VERIFY operations. For example, when a model resistance for a high resistive state of a resistive change element is 10 MΩ, a circuit designer can select a high resistance of 9 MΩ so that resistive change elements having a resistance greater than approximately 9 MΩ are determined to have a high resistive state during RESET VERIFY operations. It is noted that the circuit designer typically selects a high resistance less than a model resistance for a high resistive state of a resistive change element and greater than an intermediate resistance for READ operations.

Figure 2A:
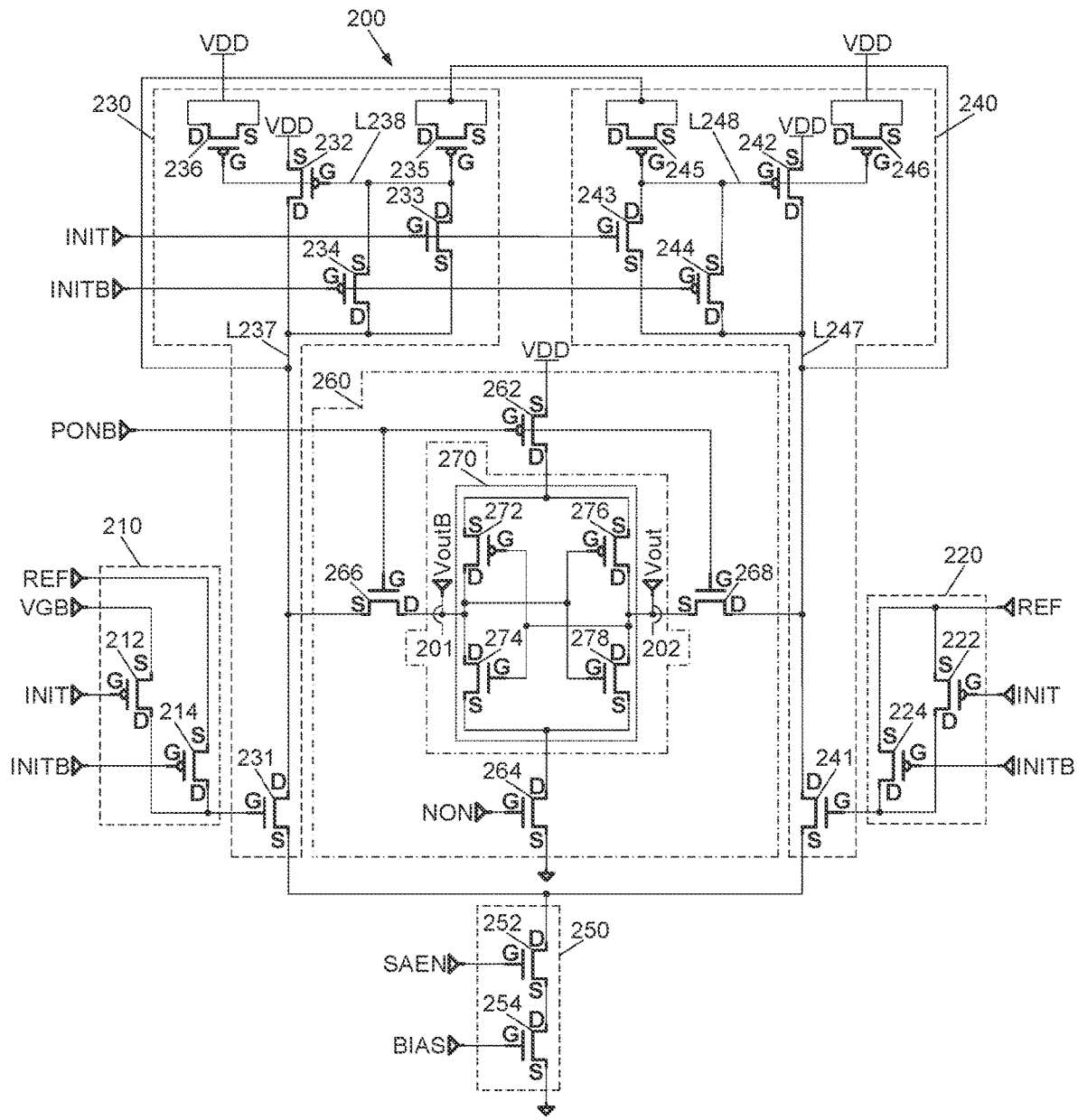
FIG. 2A illustrates a simplified schematic diagram of a first sense amplifier.

Referring now to FIG. 2A, the first sense amplifier 200 receives the voltage on the reference line RL2 labeled as the voltage REF, the voltage on the bus line BL2, an initialization signal INIT, a complementary initialization signal INITB, a first power on signal PONB, a second power on signal NON, a sense amplifier enable signal SAEN, and a bias current signal BIAS and outputs a voltage VoutB and a voltage Vout. The voltage on the bus line BL2 is shown in FIG. 2A as the voltage VGB2(0) on the global bit line GB2(0) labeled as the voltage VGB for describing operation of the first sense amplifier 200 for READ operation of resistive change element O01. The first sense amplifier 200 includes a first input device 210, a second input device 220, a first load device 230, a second load device 240, a current source 250, a power control device 260, and a latch device 270.

The first input device 210 includes a first PMOS transistor 212 having a drain terminal, a gate terminal, and a source terminal and a second PMOS transistor 214 having a drain terminal, a gate terminal, and a source terminal. The drain terminal of the first PMOS transistor 212 is in electrical communication with the drain terminal of the second PMOS transistor 214 and the first load device 230, the gate terminal of the first PMOS transistor 212 is in electrical communication with control logic, such as a processor, a controller, and a microcontroller, to receive the initialization signal INIT, and the source terminal of the first PMOS transistor 212 is in electrical communication with the bus line BL2 to receive the voltage VGB. The drain terminal of the second PMOS transistor 214 is in electrical communication with the drain terminal of the first PMOS transistor 212 and the first load device 230, the gate terminal of the second PMOS transistor 214 is in electrical communication with control logic, such as a processor, a controller, and a microcontroller, to receive the complementary initialization signal INITB, and the source terminal of the second PMOS transistor 214 is in electrical communication with the reference line RL2 to receive the voltage REF.

The second input device 220 includes a first PMOS transistor 222 having a drain terminal, a gate terminal, and a source terminal and a second PMOS transistor 224 having a drain terminal, a gate terminal, and a source terminal. The drain terminal of the first PMOS transistor 222 is in electrical communication with the drain terminal of the second PMOS transistor 224 and the second load device 240, the gate terminal of the first PMOS transistor 222 is in electrical communication with control logic, such as a processor, a controller, and a microcontroller, to receive the initialization signal INIT, and the source terminal of the first PMOS transistor 222 is in electrical communication with the reference line RL2 to receive the voltage REF and the source terminal of the second PMOS transistor 224. The drain terminal of the second PMOS transistor 224 is in electrical communication with the drain terminal of the first PMOS transistor 222 and the second load device 240, the gate terminal of the second PMOS transistor 224 is in electrical communication with control logic, such as a processor, a controller, and a microcontroller, to receive the complementary initialization signal INITB, and the source terminal of the second PMOS transistor 224 is in electrical communication with the reference line RL2 to receive the voltage REF and the source terminal of the first PMOS transistor 222.

The first load device 230 includes a first NMOS transistor 231 having a drain terminal, a gate terminal, and a source terminal, a first PMOS transistor 232 having a drain terminal, a gate terminal, and a source terminal, a second NMOS transistor 233 having a drain terminal, a gate terminal, and a source terminal, a second PMOS transistor 234 having a drain terminal, a gate terminal, and a source terminal, a first capacitor connected PMOS transistor 235 having a drain terminal, a gate terminal, and a source terminal, and a second capacitor connected PMOS transistor 236 having a drain terminal, a gate terminal, and a source terminal. The drain terminal of the first NMOS transistor 231 is in electrical communication with the power control device 260, the second load device 240, the drain terminal of the first PMOS transistor 232, the drain terminal of the second PMOS transistor 234, and the source terminal of the second NMOS transistor 233. The gate terminal of the first NMOS transistor 231 is in electrical communication with the first input device 210. The source terminal of the first NMOS transistor 231 is in electrical communication with the current source 250 and the second load device 240. The drain terminal of the first PMOS transistor 232 is in electrical communication with the drain terminal of the second PMOS transistor 234, the source terminal of the second NMOS transistor 233, the second load device 240, the power control device 260, and the drain terminal of the first NMOS transistor 231. The gate terminal of the first PMOS transistor 232 is in electrical communication with the source terminal of the second PMOS transistor 234, the drain terminal of the second NMOS transistor 233, the gate terminal of the first capacitor connected PMOS transistor 235, and the gate terminal of the second capacitor connected PMOS transistor 236. The source terminal of the first PMOS transistor 232 is in electrical communication with a power supply, a voltage source, a driver circuit, or other device that supplies the system voltage VDD. The drain terminal of the second NMOS transistor 233 is in electrical communication with the source terminal of the second PMOS transistor 234, the gate terminal of the first PMOS transistor 232, the gate terminal of the first capacitor connected PMOS transistor 235, and the gate terminal of the second capacitor connected PMOS transistor 236. The gate terminal of the second NMOS transistor 233 is in electrical communication with control logic, such as a processor, a controller, and a microcontroller, to receive the initialization signal INIT. The source terminal of the second NMOS transistor 233 is in electrical communication with the drain terminal of the second PMOS transistor 234, the drain terminal of the first PMOS transistor 232, the second load device 240, the power control device 260, and the drain terminal of the first NMOS transistor 231. The drain terminal of the second PMOS transistor 234 is in electrical communication with the source terminal of the second NMOS transistor 233, the drain terminal of the first PMOS transistor 232, the second load device 240, the power control device 260, and the drain terminal of the first NMOS transistor 231. The gate terminal of the second PMOS transistor 234 is in electrical communication with control logic, such as a processor, a controller, and a microcontroller, to receive the complementary initialization signal INITB. The source terminal of the second PMOS transistor 234 is in electrical communication with the gate terminal of the first PMOS transistor 232, the drain terminal of the second NMOS transistor 233, the gate terminal of the first capacitor connected PMOS transistor 235, and the gate terminal of the second capacitor connected PMOS transistor 236. The drain terminal and the source terminal of the first capacitor connected PMOS transistor 235 are in electrical communication and the drain terminal and the source terminal are in electrical communication with the second load device 240. The gate terminal of the first capacitor connected PMOS transistor 235 is in electrical communication with the drain terminal of the second NMOS transistor 233, the source terminal of the second PMOS transistor 234, the gate terminal of the first PMOS transistor 232, and the gate terminal of the second capacitor connected PMOS transistor 236. The drain terminal and the source terminal of the second capacitor connected PMOS transistor 236 are in electrical communication and the drain terminal and the source terminal are in electrical communication with a power supply, a voltage source, a driver circuit, or other device that supplies the system voltage VDD. The gate terminal of the second capacitor connected PMOS transistor 236 is in electrical communication with the gate terminal of the first PMOS transistor 232, the source terminal of the second PMOS transistor 234, the drain terminal of the second NMOS transistor 233, and the gate terminal of the first capacitor connected PMOS transistor 235.

The second load device 240 includes a first NMOS transistor 241 having a drain terminal, a gate terminal, and a source terminal, a first PMOS transistor 242 having a drain terminal, a gate terminal, and a source terminal, a second NMOS transistor 243 having a drain terminal, a gate terminal, and a source terminal, a second PMOS transistor 244 having a drain terminal, a gate terminal, and a source terminal, a first capacitor connected PMOS transistor 245 having a drain terminal, a gate terminal, and a source terminal, and a second capacitor connected PMOS transistor 246 having a drain terminal, a gate terminal, and a source terminal. The drain terminal of the first NMOS transistor 241 is in electrical communication with the power control device 260, the first load device 230, the drain terminal of the first PMOS transistor 242, the drain terminal of the second PMOS transistor 244, and the source terminal of the second NMOS transistor 243. The gate terminal of the first NMOS transistor 241 is in electrical communication with the second input device 220. The source terminal of the first NMOS transistor 241 is in electrical communication with the current source 250 and the first load device 230. The drain terminal of the first PMOS transistor 242 is in electrical communication with the drain terminal of the second PMOS transistor 244, the source terminal of the second NMOS transistor 243, the first load device 230, the power control device 260, and the drain terminal of the first NMOS transistor 241. The gate terminal of the first PMOS transistor 242 is in electrical communication with the source terminal of the second PMOS transistor 244, the drain terminal of the second NMOS transistor 243, the gate terminal of the first capacitor connected PMOS transistor 245, and the gate terminal of the second capacitor connected PMOS transistor 246. The source terminal of the first PMOS transistor 242 is in electrical communication with a power supply, a voltage source, a driver circuit, or other device that supplies the system voltage VDD. The drain terminal of the second NMOS transistor 243 is in electrical communication with the source terminal of the second PMOS transistor 244, the gate terminal of the first PMOS transistor 242, the gate terminal of the first capacitor connected PMOS transistor 245, and the gate terminal of the second capacitor connected PMOS transistor 246. The gate terminal of the second NMOS transistor 243 is in electrical communication with control logic, such as a processor, a controller, and a microcontroller, to receive the initialization signal INIT. The source terminal of the second NMOS transistor 243 is in electrical communication with the drain terminal of the second PMOS transistor 244, the drain terminal of the first PMOS transistor 242, the first load device 230, the power control device 260, and the drain terminal of the first NMOS transistor 241. The drain terminal of the second PMOS transistor 244 is in electrical communication with the source terminal of the second NMOS transistor 243, the drain terminal of the first PMOS transistor 242, the first load device 230, the power control device 260, and the drain terminal of the first NMOS transistor 241. The gate terminal of the second PMOS transistor 244 is in electrical communication with control logic, such as a processor, a controller, and a microcontroller, to receive the complementary initialization signal INITB. The source terminal of the second PMOS transistor 244 is in electrical communication with the gate terminal of the first PMOS transistor 242, the drain terminal of the second NMOS transistor 243, the gate terminal of the first capacitor connected PMOS transistor 245, and the gate terminal of the second capacitor connected PMOS transistor 246. The drain terminal and the source terminal of the first capacitor connected PMOS transistor 245 are in electrical communication and the drain terminal and the source terminal are in electrical communication with the first load device 230. The gate terminal of the first capacitor connected PMOS transistor 245 is in electrical communication with the drain terminal of the second NMOS transistor 243, the source terminal of the second PMOS transistor 244, the gate terminal of the first PMOS transistor 242, and the gate terminal of the second capacitor connected PMOS transistor 246. The drain terminal and the source terminal of the second capacitor connected PMOS transistor 246 are in electrical communication and the drain terminal and the source terminal are in electrical communication with a power supply, a voltage source, a driver circuit, or other device that supplies the system voltage VDD. The gate terminal of the second capacitor connected PMOS transistor 246 is in electrical communication with the gate terminal of the first PMOS transistor 242, the source terminal of the second PMOS transistor 244, the drain terminal of the second NMOS transistor 243, and the gate terminal of the first capacitor connected PMOS transistor 245.

The current source 250 includes a first NMOS transistor 252 have a drain terminal, a gate terminal, and a source terminal and a second NMOS transistor 254 having a drain terminal, a gate terminal, and a source terminal. The drain terminal of the first NMOS transistor 252 is in electrical communication with the first load device 230 and the second load device 240. The gate terminal of the first NMOS transistor 252 is in electrical communication with control logic, such as a processor, a controller, and a microcontroller, to receive the sense amplifier enable signal SAEN. The source terminal of the first NMOS transistor 252 is in electrical communication with the drain terminal of the second NMOS transistor 254. The drain terminal of the second NMOS transistor 254 is in electrical communication with the source terminal of the first NMOS transistor 252. The gate terminal of the second NMOS transistor 254 is in electrical communication with control logic, such as a processor, a controller, and a microcontroller, to receive the bias current signal BIAS. The source terminal of the second NMOS transistor 254 is in electrical communication with a power supply, a voltage source, a driver circuit, or other device that supplies 0 volts or ground.

The power control device 260 includes a PMOS transistor 262 having a drain terminal, a gate terminal, and a source terminal, a first NMOS transistor 264 having a drain terminal, a gate terminal, and a source terminal, a second NMOS transistor 266 having a drain terminal, a gate terminal, and a source terminal, and a third NMOS transistor 268 having a drain terminal, a gate terminal, and a source terminal. The drain terminal of the PMOS transistor 262 is in electrical communication with the latch device 270. The gate terminal of the PMOS transistor 262 is in electrical communication with control logic, such as a processor, a controller, and a microcontroller, to receive the first power on signal PONB. The source terminal of the PMOS transistor 262 is in electrical communication with a power supply, a voltage source, a driver circuit, or other device that supplies the system voltage VDD. The drain terminal of the first NMOS transistor 264 is in electrical communication with the latch device 270. The gate terminal of the first NMOS transistor 264 is in electrical communication control logic, such as a processor, a controller, and a microcontroller, to receive the second power on signal NON. The source terminal of the first NMOS transistor 264 is in electrical communication with a power supply, a voltage source, a driver circuit, or other device that supplies 0 volts or ground. The drain terminal of the second NMOS transistor 266 is in electrical communication with the latch device 270. The gate terminal of the second NMOS transistor 266 is in electrical communication with control logic, such as a processor, a controller, and a microcontroller, to receive the first power on signal PONB. The source terminal of the second NMOS transistor 266 is in electrical communication with the first load device 230. The drain terminal of the third NMOS transistor 268 is in electrical communication with the second load device 240. The gate terminal of the third NMOS transistor 268 is in electrical communication with control logic, such as a processor, a controller, and a microcontroller, to receive the first power on signal PONB. The source terminal of the third NMOS transistor 268 is in electrical communication with the latch device 270. Alternatively, each of the second NMOS transistor 266 and the third NMOS transistor 268 may be replaced with a NMOS transistor and a PMOS transistor in electrical communication in parallel, with each of the NMOS transistors having a drain terminal, a gate terminal, and a source terminal, each of the PMOS transistors having a drain terminal, a gate terminal, and a source terminal, the gate terminals of both NMOS transistors in electrical communication with a circuit to receive a signal to turn on and turn off both NMOS transistors, the gate terminals of both PMOS transistors in electrical communication with a circuit to receive a signal to turn on and turn off both PMOS transistors, and the signals being coordinated such that both NMOS transistors and both PMOS transistors are turned on and turned off at generally the same time.

The latch device 270 includes a first PMOS transistor 272 having a drain terminal, a gate terminal, and a source terminal, a first NMOS transistor 274 having a drain terminal, a gate terminal, and a source terminal, a second PMOS transistor 276 having a drain terminal, a gate terminal, and a source terminal, and a second NMOS transistor 278 having a drain terminal, a gate terminal, and a source terminal. The drain terminal of the first PMOS transistor 272 is in electrical communication with the gate terminal of the second PMOS transistor 276, the gate terminal of the second NMOS transistor 278, the power control device 260, and the drain terminal of the first NMOS transistor 274. The gate terminal of the first PMOS transistor 272 is in electrical communication with the drain terminal of the second PMOS transistor 276, the drain terminal of the second NMOS transistor 278, the power control device 260, and the gate terminal of the first NMOS transistor 274. The source terminal of the first PMOS transistor 272 is in electrical communication with the power control device 260 and the source terminal of the second PMOS transistor 276. The drain terminal of the first NMOS transistor 274 is in electrical communication with the power control device 260, the gate terminal of the second PMOS transistor 276, the gate terminal of the second NMOS transistor 278, and the drain terminal of the first PMOS transistor 272. The gate terminal of the first NMOS transistor 274 is in electrical communication with the drain terminal of the second PMOS transistor 276, the drain terminal of the second NMOS transistor 278, the power control device 260, and the gate terminal of the first PMOS transistor 272. The source terminal of the first NMOS transistor 274 is in electrical communication with the power control device 260 and the source terminal of the second NMOS transistor 278. The drain terminal of the second PMOS transistor 276 is in electrical communication with the power control device 260, the gate terminal of the first PMOS transistor 272, the gate terminal of the first NMOS transistor 274, and the drain terminal of the second NMOS transistor 278. The gate terminal of the second PMOS transistor 276 is in electrical communication with the drain terminal of the first PMOS transistor 272, the drain terminal of the first NMOS transistor 274, the power control device 260, and the gate terminal of the second NMOS transistor 278. The source terminal of the second PMOS transistor 276 is in electrical communication with the power control device 260 and the source terminal of the first PMOS transistor 272. The drain terminal of the second NMOS transistor 278 is in electrical communication with the power control device 260, the gate terminal of the first PMOS transistor 272, the gate terminal of the first NMOS transistor 274, and the drain terminal of the second PMOS transistor 276. The gate terminal of the second NMOS transistor 278 is in electrical communication with the drain terminal of the first PMOS transistor 272, the drain terminal of the first NMOS transistor 274, the power control device 260, and the gate terminal of the second PMOS transistor 276. The source terminal of the second NMOS transistor 278 is in electrical communication with the power control device 260 and the source terminal of the first NMOS transistor 274.

Figure 2B:
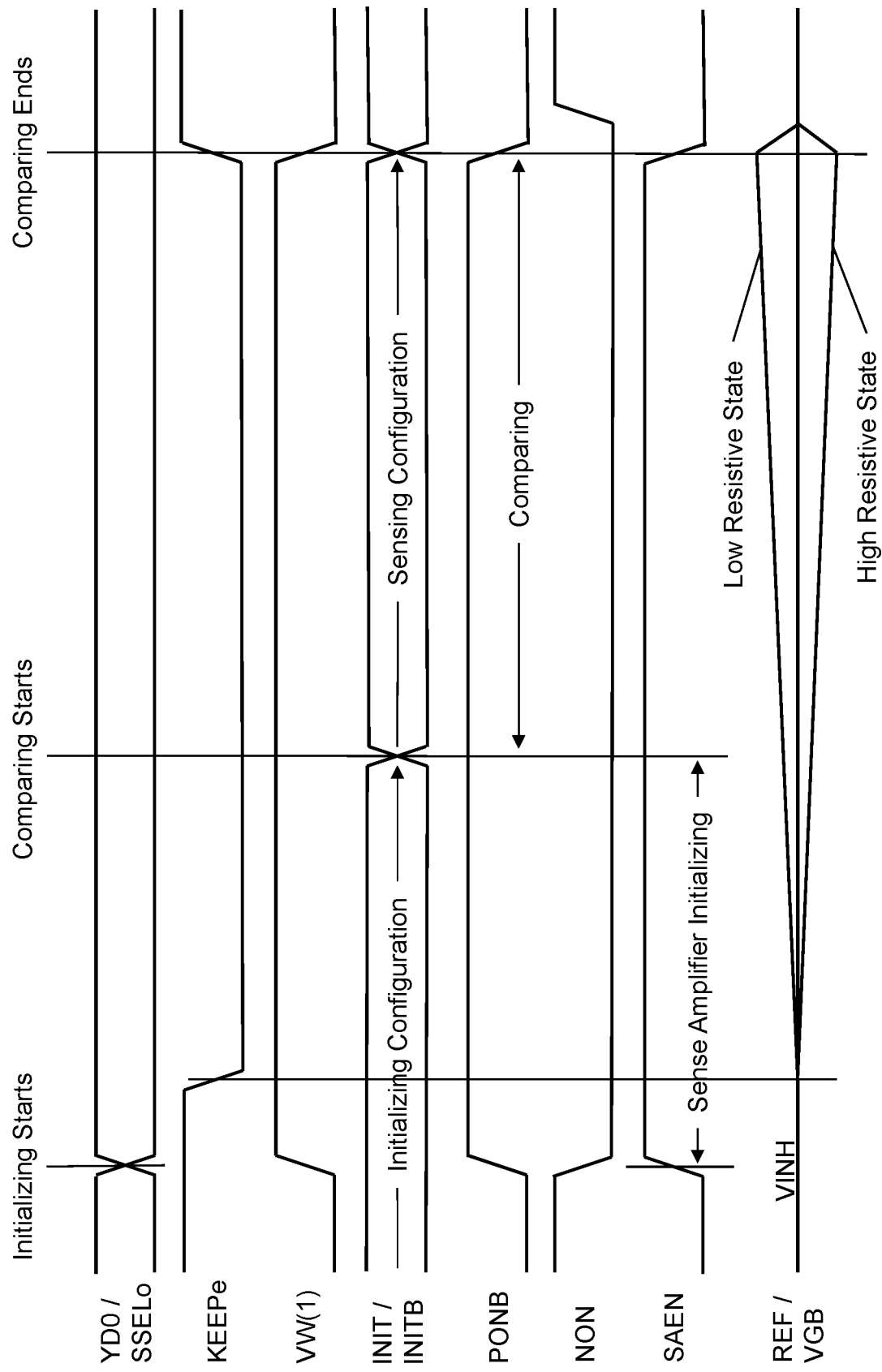
FIG. 2B illustrates exemplary voltage waveforms for describing operation of the first sense amplifier of FIG. 2A for READ operations of resistive change element O01, for describing operation of the second sense amplifier of FIG. 6 for READ operations of resistive change element O01, and for describing operation of the third sense amplifier of FIG. 7 for READ operations of resistive change element O01.

Referring now to the simplified schematic diagram of the first sense amplifier 200 shown in FIG. 2A, the first input device 210 receives the voltage on the reference line RL2 labeled as the voltage REF, the voltage VGB2(0) on the global bit line GB2(0) labeled as the voltage VGB, the initialization signal INIT, and the complementary initialization signal INITB. The second input device 220 receives the voltage on the reference line RL2 labeled as the voltage REF, the initialization signal INIT, and the complementary initialization signal INITB. The first load device 230 receives the initialization signal INIT and the complementary initialization signal INITB and the second load device 240 receives the initialization signal INIT and the complementary initialization signal INITB. The current source 250 receives the sense amplifier enable signal SAEN and the bias current signal BIAS. The power control device 260 receives the first power on signal PONB and the second power on signal NON. Control logic, such as a processor, a controller, and a microcontroller, supplies the initialization signal INIT, the complementary initialization signal INITB, the sense amplifier enable signal SAEN, the bias current signal BIAS, the first power on signal PONB, and the second power on signal NON to the first sense amplifier 200. Exemplary voltage waveforms for the initialization signal INIT, the complementary initialization signal INITB, the sense amplifier enable signal SAEN, the first power on signal PONB, and the second power on signal NON for describing operation of the first sense amplifier 200 for READ operations of resistive change element O01 are shown in FIG. 2B. Additionally, although an exemplary voltage waveform for the bias current signal BIAS is not shown in FIG. 2B, the control logic supplies the bias current signal BIAS. The control logic supplies the sense amplifier enable signal SAEN to enable and disable the current source 250 and the bias current signal BIAS to set the amount of current sunk by the current source 250. Also, exemplary voltage waveforms for the signal YD0, the signal SSELo, the signal KEEPe, the voltage VW(1) on the word line W(1), the voltage on the reference line RL2 labeled as the voltage REF, and the voltage VGB2(0) on the global bit line GB2(0) labeled as the voltage VGB for describing operation of the first sense amplifier 200 for READ operations of resistive change element O01 are shown in FIG. 2B. Further, FIG. 2B shows two exemplary voltage waveforms for the voltage VGB, a voltage waveform for when the resistive change element O01 has a low resistive state and a voltage waveform for when the resistive change element O01 has a high resistive state.

The first sense amplifier 200 is in an initializing configuration when the initialization signal INIT has a high level and the complementary initialization signal INITB has a low level and the first sense amplifier 200 is in a comparing configuration when the initialization signal INIT has a low level and the complementary initialization signal INITB has a high level. When the first sense amplifier 200 is in an initializing configuration the first PMOS transistor 232 of the first load device 230 is electrically connected to function as a diode and the first PMOS transistor 242 of the second load device 240 is electrically connected to function as a diode. When the first sense amplifier 200 is in a comparing configuration the first PMOS transistor 232 is electrically connected to function as a resistor and the first PMOS transistor 242 is electrically connected to function as a resistor with the operating points of the first PMOS transistor 232 and the second PMOS transistor 242 set to compensate for performance differences between the first load device 230 and the second load device 240 by keeping the gate voltage of the first PMOS transistor 232 at a bias voltage VB232 and the gate voltage of the first PMOS transistor 242 at a bias voltage VB242. Additionally, when the initialization signal INIT has a high level and the complementary initialization signal INITB has a low level the first input device 210 provides the voltage on the reference line RL2 to the first load device 230 and the second input device 220 provides the voltage on the reference line RL2 to the second load device 240. Further, when the initialization signal INIT has a low level and the complementary initialization signal INITB has a high level the first input device 210 provides the voltage VGB2(0) on the global bit line GB2(0) to the first load device 230 and the second input device 220 provides the voltage on the reference line RL2 to the second load device 240.

The first sense amplifier 200 is initialized to generate the bias voltage VB232 for setting the operating point of the first PMOS transistor 232 and the bias voltage VB242 for setting the operating point of the first PMOS transistor 242 before comparing the voltage VGB2(0) on the global bit line GB2(0) with the voltage on the reference line RL2. As shown in FIG. 2B, at the start of initializing the first sense amplifier 200, the first sense amplifier 200 is in the initializing configuration, the initialization signal INIT has a high level, the complementary initialization signal INITB has a low level, the sense amplifier enable signal SAEN transitions to a high level, the first power on signal PONB transitions to a high level, and the second power on signal NON transitions to a low level. During initializing the first sense amplifier 200, the bias voltage VB232 for setting the operating point for the first PMOS transistor 232 of the first load device 230 is generated and the bias voltage VB242 for setting the operating point for the first PMOS transistor 242 of the second load device 240 is generated.

The bias voltage VB232 is generated on the first line L237 and the second line L238 of the first load device 230 and the bias voltage VB242 is generated on the first line L247 and the second line L248 of the second load device 240. The voltage on the first line L237 and the voltage on the second line L238 of the first load device 230 are generally the same voltage because turning on the second NMOS transistor 233 and the second PMOS transistor 234 electrically connects the first PMOS transistor 232 to function as a diode by electrically connecting the first line L237 and the second line L238. The voltage on the first line L247 and the voltage on the second line L248 of the second load device 240 are generally the same voltage because turning on the second NMOS transistor 243 and the second PMOS transistor 244 electrically connects the first PMOS transistor 242 to function as a diode by electrically connecting the first line L247 and the second line L248. The bias voltage VB232 is based on an amount of current flowing through the first load device 230 and the bias voltage VB242 is based on an amount of current flowing through the second load device 240. The sum of the amount of current flowing through the first load device 230 and the amount of current flowing through the second load device 240 is equal to an amount of current sunk by the current source 250.

A current path through the first load device 230 is created by electrically connecting the first PMOS transistor 232 to function as a diode and providing the inhibit voltage VINH on the reference line RL2 to the gate terminal of the first NMOS transistor 231. The first PMOS transistor 232 is electrically connected to function as a diode by turning on the second NMOS transistor 233 and the second PMOS transistor 234. The voltage on the reference line RL2 is driven to the inhibit voltage VINH by turning on the second NMOS transistor 122 in the reference line connection circuit 120 and the second NMOS transistor 122 may be turned on as part of preparing the exemplary implementation of the first exemplary architecture for determining a resistive state of the resistive change element O01 as discussed above. The inhibit voltage VINH is provided to the gate terminal of the first NMOS transistor 231 of the first load device 230 by turning off the first PMOS transistor 212 of the first input device 210 and turning on the second PMOS transistor 214 of the first input device 210. The second NMOS transistor 233 of the first load device 230 is turned on and the first PMOS transistor 212 of the first input device 210 is turned off because the initialization signal INIT has a high level. The second PMOS transistor 234 of the first load device 230 and the second PMOS transistor 214 of the first input device 210 are turned on because the complementary initialization signal INITB has a low level.

A current path through the second load device 240 is created by electrically connecting the first PMOS transistor 242 to function as a diode and providing the inhibit voltage VINH on the reference line RL2 to the gate terminal of the first NMOS transistor 241. The first PMOS transistor 242 is electrically connected to function as a diode by turning on the second NMOS transistor 243 and the second PMOS transistor 244. The voltage on the reference line RL2 is driven to the inhibit voltage VINH by turning on the second NMOS transistor 122 in the reference line connection circuit 120 and the second NMOS transistor 122 may be turned on as part of preparing the exemplary implementation of the first exemplary architecture for determining a resistive state of the resistive change element O01 as discussed above. The inhibit voltage VINH is provided to the gate terminal of the first NMOS transistor 241 of the second load device 240 by turning off the first PMOS transistor 222 of the second input device 220 and turning on the second PMOS transistor 224 of the second input device 220. The second NMOS transistor 243 of the second load device 240 is turned on and the first PMOS transistor 222 of the second input device 220 is turned off because the initialization signal INIT has a high level. The second PMOS transistor 244 of the second load device 240 and the second PMOS transistor 224 of the second input device 220 are turned on because the complementary initialization signal INITB has a low level.

The first capacitor connected PMOS transistor 235 and the second capacitor connected PMOS transistor 236 of the first load device 230 are charged to the bias voltage VB232 because the first capacitor connected PMOS transistor 235 and the second capacitor connected PMOS transistor 236 are electrically connected to the second line L238. The bias voltage VB232 on the first line L237 and the second line L238 is approximately equal to the voltage on the drain terminal of the first PMOS transistor 232. The first capacitor connected PMOS transistor 245 and the second capacitor connected PMOS transistor 246 of the second load device 240 are charged to the bias voltage VB242 because the first capacitor connected PMOS transistor 245 and the second capacitor connected PMOS transistor 246 are electrically connected to the second line L248. The bias voltage VB242 on the first line L247 and the second line L248 is approximately equal to the voltage on the drain terminal of the first PMOS transistor 242.

The impact of noise and voltage offsets on the bias voltage VB232 and the bias voltage VB242 are reduced because the first capacitor connected PMOS transistor 235 of the first load device 230 and the first capacitor connected PMOS transistor 245 of the second load device 240 are cross coupled so that noise and voltage offsets on line L237 and line L238 of the first load device 230 are similar to noise and voltage offsets on line L247 and line L248 of the second load device 240. The impact of voltage transients on the bias voltage VB232 and the bias voltage VB242 are reduced by the voltage levels of the initialization signal INIT and the complementary initialization signal INITB being offset. Voltage transients introduced through gate to channel capacitance of the second NMOS transistor 233 by turning on and off the second NMOS transistor 233 and voltage transients introduced through gate to channel capacitance of the second PMOS transistor 234 by turning on and off the second PMOS transistor 234 are offset because the voltage levels of the initialization signal INIT and the complementary initialization signal INITB are offset. Thus, voltage transients introduced through gate to channel capacitance of the second NMOS transistor 233 by turning on and off the second NMOS transistor 233 and voltage transients introduced through gate to channel capacitance of the second PMOS transistor 234 by turning on and off the second PMOS transistor 234 at least partially cancel each other because the voltage transients are offset. Voltage transients introduced through gate to channel capacitance of the second NMOS transistor 243 by turning on and off the second NMOS transistor 243 and voltage transients introduced through gate to channel capacitance of the second PMOS transistor 244 by turning on and off the second PMOS transistor 244 are offset because the voltage levels of the initialization signal INIT and the complementary initialization signal INITB are offset. Thus, voltage transients introduced through gate to channel capacitance of the second NMOS transistor 243 by turning on and off the second NMOS transistor 243 and voltage transients introduced through gate to channel capacitance of the second PMOS transistor 244 by turning on and off the second PMOS transistor 244 at least partially cancel each other because the voltage transients are offset.

After initializing the first sense amplifier 200 to generate the bias voltage VB232 and the bias voltage VB242, the first sense amplifier 200 compares the voltage VGB2(0) on the global bit line GB2(0) with the voltage on the reference line RL2. The first PMOS transistor 232 is electrically connected to function as a resistor with the gate voltage of the first PMOS transistor 232 kept at the bias voltage VB232 and the first PMOS transistor 242 is electrically connected to function as a resistor with the gate voltage of the first PMOS transistor 242 kept at the bias voltage VB242. Keeping the gate voltage of the first PMOS transistor 232 at the bias voltage VB232 and the gate voltage of the first PMOS transistor 242 at the bias voltage VB242 increases the accuracy of comparing the voltage VGB2(0) on the global bit line GB2(0) with the voltage on the reference line RL2 because keeping the gate voltage of the first PMOS transistor 232 at the bias voltage VB232 and the gate voltage of the first PMOS transistor 242 at the bias voltage VB242 compensates for performance differences between the first load device 230 and the second load device 240.

As shown in FIG. 2B, at the start of comparing the voltage VGB2(0) on the global bit line GB2(0) with the voltage on the reference line RL2, the initialization signal INIT transitions to a low level, the complementary initialization signal INITB transitions to a high level, the sense amplifier enable signal SAEN has a high level, the first power on signal PONB has a high level, and the second power on signal NON has a low level. As discussed above, when the initialization signal INIT has a low level and the complementary initialization signal INITB has a high level, the first sense amplifier 200 is in a comparing configuration, the first input device 210 provides the voltage VGB2(0) on the global bit line GB2(0) to the first load device 230, and the second input device 220 provides the voltage on the reference line RL2 to the second load device 240. During comparing the voltage VGB2(0) on the global bit line GB2(0) with the voltage on the reference line RL2, a voltage VS237 is generated on the first line L237 of the first load device 230 and a voltage VS247 is generated on the first line L247 of the second load device 240 with the voltage VS237 and the voltage VS247 being indicative of a difference between the voltage VGB2(0) on the global bit line GB2(0) and the voltage on the reference line RL2. The voltage VS237 is based on an amount of current flowing through the first load device 230 and the voltage VS247 is based on an amount of current flowing through the second load device 240. The sum of the amount of current flowing through the first load device 230 and the amount of current flowing through the second load device 240 is equal to an amount of current sunk by the current source 250.

A current path through the first load device 230 is created by keeping the gate voltage of first PMOS transistor 232 at the bias voltage VB232 and providing the voltage VGB2(0) on the global bit line GB2(0) to the gate terminal of the first NMOS transistor 231. The gate voltage of the first PMOS transistor 232 is kept at the bias voltage VB232 by disconnecting the first line L237 from the second line L238 with the first capacitor connected PMOS transistor 235 and the second capacitor connected PMOS transistor 236 charged to the bias voltage VB232. After disconnecting the first line L237 from the second line L238 the voltage on the second line L238 and the gate voltage of the first PMOS transistor 232 are kept at the bias voltage VB232 by the first capacitor connected PMOS transistor 235 and the second capacitor connected PMOS transistor 236. The first line L237 is disconnected from the second line L238 by turning off the second NMOS transistor 233 and the second PMOS transistor 234. The voltage VGB2(0) on the global bit line GB2(0) is provided to the gate terminal of the first NMOS transistor 231 of the first load device 230 by turning on the first PMOS transistor 212 of the first input device 210 and turning off the second PMOS transistor 214 of the first input device 210. The voltage VGB2(0) on the global bit line GB2(0) is driven to a voltage indicative of a resistive state of the resistive change element O01 as discussed above with respect to generating a voltage indicative of a resistive state of the resistive change element O01. The second NMOS transistor 233 of the first load device 230 is turned off and the first PMOS transistor 212 of the first input device 210 is turned on because the initialization signal INIT has a low level. The second PMOS transistor 234 of the first load device 230 and the second PMOS transistor 214 of the first input device 210 are turned off because the complementary initialization signal INITB has a high level.

A current path through the second load device 240 is created by keeping the gate voltage of first PMOS transistor 242 at the bias voltage VB242 and providing the voltage on the reference line RL2 to the gate terminal of the first NMOS transistor 241. The gate voltage of the first PMOS transistor 242 is kept at the bias voltage VB242 by disconnecting the first line L247 from the second line L248 with the first capacitor connected PMOS transistor 245 and the second capacitor connected PMOS transistor 246 charged to the bias voltage VB242. After disconnecting the first line L247 from the second line L248 the voltage on the second line L248 and the gate voltage of the first PMOS transistor 242 are kept at the bias voltage VB242 by the first capacitor connected PMOS transistor 245 and the second capacitor connected PMOS transistor 246. The first line L247 is disconnected from the second line L248 by turning off the second NMOS transistor 243 and the second PMOS transistor 244. The voltage on the reference line RL2 is provided to the gate terminal of the first NMOS transistor 241 of the second load device 240 by turning on the first PMOS transistor 222 of the second input device 220 and turning off the second PMOS transistor 224 of the second input device 220. The voltage on the reference line RL2 is driven to the inhibit voltage VINH by turning on the second NMOS transistor 122 in the reference line connection circuit 120 and the second NMOS transistor 122 may be turned on as part of preparing the exemplary implementation of the first exemplary architecture for determining a resistive state of the resistive change element O01 as discussed above. The second NMOS transistor 243 of the second load device 240 is turned off and the first PMOS transistor 222 of the second input device 210 is turned on because the initialization signal INIT has a low level. The second PMOS transistor 244 of the second load device 240 and the second PMOS transistor 224 of the second input device 220 are turned off because the complementary initialization signal INITB has a high level.

The amount of current flowing through the first load device 230 and the amount of current flowing through the second load device 240 generally change when the voltage VGB2(0) on the global bit line GB2(0) changes because the voltage on the reference line RL2 is the inhibit voltage VINH and the inhibit voltage VINH is generally the same for READ operations. When the voltage VGB2(0) on the global bit line GB2(0) increases, the amount of current flowing through the first load device 230 increases, the amount of current flowing through the second load device 240 decreases, the voltage VS237 on the first line L237 of the first load device 230 decreases, and the voltage VS247 on the first line L247 of the second load device 240 increases. When the voltage VGB2(0) on the global bit line GB2(0) decreases, the amount of current flowing through first load device 230 decreases, the amount of current flowing through the second load device 240 increases, the voltage VS237 on the first line L237 of the first load device 230 increases, and the voltage VS247 on the first line L247 of the second load device 240 decreases.

The difference between the voltage VS237 on the first line L237 in the first load device 230 and the voltage VS247 on the first line L247 in the second load device 240 is indicative of a resistive state of the resistive change element O01. When the resistive change element O01 has a low resistive state, the voltage VGB2(0) on the global bit line GB2(0) is greater than the inhibit voltage VINH, the amount of current flowing through the first load device 230 is greater than the amount of current flowing through the second load device 240 and the voltage VS237 on first line L237 of the first load device 230 is less than the voltage VS247 on the first line L247 of the second load device 240. When the resistive change element O01 has a high resistive state, the voltage VGB2(0) on the global bit line GB2(0) is less than the inhibit voltage VINH, the amount of current flowing through the first load device 230 is less than the amount of current flowing through the second load device 240 and the voltage VS237 on first line L237 of the first load device 230 is greater than the voltage VS247 on the first line L247 of the second load device 240.

While the first power on signal PONB has a high level, the power control device 260 provides the voltage VS237 to the first output 201, the gate terminal of the second PMOS transistor 276 of the latch device 270, and the gate terminal of the second NMOS transistor 278 of the latch device 270 because the second NMOS transistor 266 of the power control device 260 is turned on. Also, while the first power on signal PONB has a high level, the power control device 260 provides the voltage VS247 to the second output 202, the gate terminal of the first PMOS transistor 272 of the latch device 270, and the gate terminal of the first NMOS transistor 274 of the latch device 270 because the third NMOS transistor 268 of the power control device 260 is turned on.

When resistive change element O01 has a low resistive state, the voltage VS237 has a voltage level less than a voltage level of the voltage VS247, the gate voltage of the first PMOS transistor 272 is greater than the gate voltage of the second PMOS transistor 276 and the first PMOS transistor 272 is turned on less than the second PMOS transistor 276. Additionally, when resistive change element O01 has a low resistive state, the gate voltage of the first NMOS transistor 274 is greater than the gate voltage of the second NMOS transistor 278 and the first NMOS transistor 274 is turned on greater than the second NMOS transistor 278. When resistive change element O01 has a high resistive state, the voltage VS237 has a voltage level greater than a voltage level of the voltage VS247, the gate voltage of the first PMOS transistor 272 is less than the gate voltage of the second PMOS transistor 276 and the first PMOS transistor 272 is turned on greater than the second PMOS transistor 276. Additionally, when the resistive change element O01 has a high resistive state, the gate voltage of the first NMOS transistor 274 is less than the gate voltage of the second NMOS transistor 278 and the first NMOS transistor 274 is turned on less than the second NMOS transistor 278. During comparing the voltage VGB2(0) on the global bit line GB2(0) with the voltage on the reference line RL2, current generally does not flow through the latch device 270 because the first PMOS transistor 262 of the power control device 260 and the first NMOS transistor 264 of the power control device 260 are turned off. The first PMOS transistor 262 of the power control device 260 is turned off because the first power on signal PONB has a high level and the first NMOS transistor 264 of the power control device 260 is turned off because the second power on signal NON has a low level.

As shown in FIG. 2B, at the conclusion of comparing the voltage VGB2(0) on the global bit line GB2(0) with the voltage on the reference line RL2, the initialization signal INIT transitions to a low level, the complementary initialization signal INITB transitions to a high level, the sense amplifier enable signal SAEN transitions to a low level, the first power on signal PONB transitions to a low level, and after a small delay the second power on signal NON transitions to a high level. As discussed above, when the initialization signal INIT has a high level and the complementary initialization signal INITB has a low level, the first sense amplifier 200 is in an initializing configuration, the first input device 210 provides the voltage on the reference line RL2 to the first load device 230, and the second input device 220 provides the voltage on the reference line RL2 to the second input device 240. Additionally, when the first power on signal PONB has a low level, the latch device 270 is disconnected from the first load device 230 and the second load device 240 and the latch device 270 is in electrical communication with a power supply, a voltage source, a driver circuit, or other device that supplies the system voltage VDD. The latch device 270 is disconnected from the first load device 230 by turning off the second NMOS transistor 266 of the power control device 260 and the latch device 270 is disconnected from the second load device 240 by turning off the third NMOS transistor 268. The latch device 270 is electrically connected to a power supply, a voltage source, a driver circuit, or other device that supplies the system voltage VDD by turning on the PMOS transistor 262 of the power control device 260. The PMOS transistor 262 is turned on, the second NMOS transistor 266 is turned off, and the third NMOS transistor 268 is turned off because the first power on signal PONB has a low level. Further, when the second power on signal NON has a high level, the latch device 270 is in electrical communication with a power supply, a voltage source, a driver circuit, or other device that supplies 0 volts or ground. The latch device 270 is electrically connected to the power supply, the voltage source, the driver circuit, or other device that supplies the 0 volts or ground by turning on the first NMOS transistor 264 of the power control device 260. The first NMOS transistor 264 is turned on because the second power on signal NON has a high level.

When comparing the voltage VGB2(0) on the global bit line GB2(0) with the voltage on the reference line RL2 concludes, the voltage on the first output 201, the voltage on the gate terminal of the second PMOS transistor 276, and the voltage on the gate terminal of the second NMOS transistor 278 are approximately equal to the voltage VS237 and the voltage on the second output 202, the voltage on the gate terminal of the first PMOS transistor 272, and the voltage on the gate terminal of the first NMOS transistor 274 are approximately equal to the voltage VS247. The voltage difference between the voltage VS237 and the voltage VS247 can be increased by having a small delay between the first power on signal PONB transitioning to a low level and the second power on signal NON transitioning to high level. During the small delay, current can flow from the power supply, the voltage source, the driver circuit, or other device that supplies the system voltage VDD through the PMOS transistor 262 of the power control device 260 and the first PMOS transistor 272 of the latch device 270 and pull up the voltages on the first output 201, the gate terminal of the second PMOS transistor 276, and the gate terminal of the second NMOS transistor 278. Also, during the small delay, current can flow from the power supply, the voltage source, the driver circuit, or other device that supplies the system voltage VDD through the PMOS transistor 262 of the power control device 260 and the second PMOS transistor 276 of the latch device 270 and pull up the voltages on the second output 202, the gate terminal of the first PMOS transistor 272, and the gate terminal of the first NMOS transistor 274. When the voltage level of the voltage VS237 is less than the voltage level of the voltage VS247, the first PMOS transistor 272 is turned on less than the second PMOS transistor 276 and the voltages on the first output 201, the gate terminal of the second PMOS transistor 276, and the gate terminal of the second NMOS transistor 278 are pulled up less than the voltages on the second output 202, the gate terminal of the first PMOS transistor 272, and the gate terminal of the first NMOS transistor 274 because an amount of current flowing through the first PMOS transistor 272 is less than an amount of current flowing through the second PMOS transistor 276. When the voltage level of the voltage VS237 is greater than the voltage level of the voltage VS247, the first PMOS transistor 272 is turned on greater than the second PMOS transistor 276 and the voltages on the first output 201, the gate terminal of the second PMOS transistor 276, and the gate terminal of the second NMOS transistor 278 are pulled up greater than the voltages on the second output 202, the gate terminal of the first PMOS transistor 272, and the gate terminal of the first NMOS transistor 274 because an amount of current flowing through the first PMOS transistor 272 is greater than an amount of current flowing through the second PMOS transistor 276. Alternatively, the first power on signal PONB transitioning to a low level and the second power on signal NON transitioning to a high level can occur at approximately the same time.

After the first power on signal PONB has a low level and the second power on signal NON has a high level, the voltages on the first output 201, the gate terminal of the second PMOS transistor 276, and the gate terminal of the second NMOS transistor 278 transition to the system voltage VDD or 0 volts or ground and the voltages on the second output 202, the gate terminal of the first PMOS transistor 272, and the gate terminal of the first NMOS transistor 274 transition to the system voltage VDD or 0 volts or ground. When the resistive change element O01 has a low resistive state the voltage on the first output 201, the gate terminal of the second PMOS transistor 276, and the gate terminal of the second NMOS transistor 278 transition to 0 volts or ground and the voltages on the second output 202, the gate terminal of the first PMOS transistor 272, and the gate terminal of the first NMOS transistor 274 transition to the system voltage VDD because the first PMOS transistor 272 is turned on less than the second PMOS transistor 276 and the first NMOS transistor 274 is turned on greater than the second NMOS transistor 278. The voltage on the first output 201 being 0 volts or ground and the voltage on the second output 202 being the system voltage VDD is stored in the latch device 270 by the first PMOS transistor 272 being turned off, the first NMOS transistor 274 being turned on, the second PMOS transistor 276 being turned on, and the second NMOS transistor 278 being turned off. Additionally, the voltage on the first output 201 is generally kept at 0 volts or ground and the voltage on the second output 202 is generally kept at the system voltage VDD by the first PMOS transistor 272 being turned off, the first NMOS transistor 274 being turned on, the second PMOS transistor 276 being turned on, and the second NMOS transistor 278 being turned off. Therefore, when resistive change element O01 has a low resistive state the first sense amplifier 200 outputs 0 volts or ground on the first output 201 and the system voltage VDD on the second output 202.

When the resistive change element O01 has a high resistive state the voltage on the first output 201, the gate terminal of the second PMOS transistor 276, and the gate terminal of the second NMOS transistor 278 transition to the system voltage VDD and the voltages on the second output 202, the gate terminal of the first PMOS transistor 272, and the gate terminal of the first NMOS transistor 274 transition to 0 volts or ground because the first PMOS transistor 272 is turned on greater than the second PMOS transistor 276 and the first NMOS transistor 274 is turned on less than the second NMOS transistor 278. The voltage on the first output 201 being the system voltage VDD and the voltage on the second output 202 being 0 volts or ground is stored in the latch device 270 by the first PMOS transistor 272 being turned on, the first NMOS transistor 274 being turned off, the second PMOS transistor 276 being turned off, and the second NMOS transistor 278 being turned on. Additionally, the voltage on the first output 201 is generally kept the system voltage VDD and the voltage on the second output 202 is generally kept 0 volts or ground by the first PMOS transistor 272 being turned on, the first NMOS transistor 274 being turned off, the second PMOS transistor 276 being turned off, and the second NMOS transistor 278 being turned on. Therefore, when resistive change element O01 has a high resistive state the first sense amplifier 200 outputs the system voltage VDD on the first output 201 and 0 volts or ground on the second output 202.

Referring now to FIGS. I1-1, I1-2, and I1-3, an exemplary DDR compatible implementation of the first exemplary architecture for programming and accessing resistive change elements is illustrated in a simplified schematic diagram. The exemplary DDR compatible implementation of the first exemplary architecture includes a plurality of global bit lines GB3(0)-GB3(x), a resistive change element array 101 having a plurality of sections Section A-Section Z, word line driver circuitry 110a-110z for each section, a reference line RL3, a reference line connection circuit 120a-120z for each section, a plurality of bus lines BL30-BL3x, a keeper circuit 130, a global bit line connection circuit 180, a plurality of write buffer circuits 1500-150x, a plurality of current sources 1600-160x, a capacitor 170, and a plurality of sense amplifiers 2000-200x. The keeper circuit 130 and the capacitor 170 have a similar structure to the keeper circuit 130 and the capacitor 170 discussed above with respect to the exemplary implementation of first exemplary architecture for programming and accessing resistive change elements. Therefore, the keeper circuit 130 and the capacitor 170 are not discussed in detail with respect to the exemplary DDR compatible implementation of the first exemplary architecture.

Each section of the plurality of sections Section A-Section Z has the same structure as Section A, and thus, the discussion below of Section A is applicable to each section in the plurality of sections Section A-Section Z. Additionally, the numbering convention for the plurality of sections Section A-Section Z is for convenience of description and ease of distinction between groups of features and is not intended to limit the number of sections in the plurality of sections Section A-Section Z.

Section A includes a plurality of resistive change elements E00a-Oxya, a plurality of even bit lines Bea(0)-Bea(x), a plurality of odd bit lines Boa(0)-Boa(x), a plurality of word lines Wa(0)-Wa(y), a plurality of even selection devices Nea0-Neax, and a plurality of odd selection devices Noa0-Noax. Each resistive change element in the plurality of resistive change elements E00a-Oxya includes a bottom electrode BE, a resistive change material, and a top electrode TE. A nanotube fabric serves as the resistive change material. The resistive change material is shown in FIG. 1I-1 using diagonal lines between the bottom electrode BE and the top electrode TE. The bottom electrode BE is in contact with the resistive change material and the top electrode TE is in contact with the resistive change material. Alternatively, each resistive change element in the plurality of resistive change elements E00a-Oxya can include at least one intervening layer located between the bottom electrode BE and the resistive change material, at least one intervening layer located between the resistive change material and the top electrode TE, or at least one intervening layer located between the bottom electrode BE and the resistive change material and at least one intervening layer located between the resistive change material and the top electrode TE. Alternatively, the bottom electrode BE can be omitted from each resistive change element in the plurality of resistive change elements E00a-Oxya, the top electrode TE can be omitted from the each resistive change element in the plurality of resistive change elements E00a-Oxya, or the bottom electrode BE and the top electrode TE can be omitted from each resistive change element in the plurality of resistive change elements E00a-Oxya. Alternatively, the resistive change material can comprise another resistive change material such as other carbon allotropes such as Buckyballs, graphene flakes, nanocapsules, and nanohorns. It is noted that while the present disclosure provides some examples of resistive change elements including nanotube fabrics or other carbon allotropes as resistive change materials the present disclosure is not limited to resistive change elements including nanotube fabrics or other carbon allotropes as resistive change materials and that the present disclosure is applicable to other types of resistive change elements such as phase change, metal oxide, and solid electrolyte.

Each resistive change element of the plurality of resistive change elements E00a-Oxya can be adjusted (programmed) between two non-volatile resistive states, a low resistive state, for example a resistance on the order of 1 MΩ (corresponding, typically, to a logic '1,' a SET state), and a high resistive state, for example a resistance on the order of 10 MΩ (corresponding, typically, to a logic '0,' a RESET state), by applying electrical stimuli to the resistive change element. When the resistive change elements are adjusted (programmed) between resistive states in a bidirectional manner, the resistive change elements are adjusted (programmed) between resistive states by electrical stimuli that cause current flow in different directions relative to the top electrodes TE and the bottom electrodes BE. When the resistive change elements are adjusted (programmed) between resistive states in a bidirectional manner, the resistive change elements can be adjusted to the low resistive state by an electrical stimulus that causes current flow from the bottom electrode BE to the top electrode TE and can be adjusted to the high resistive state by an electrical stimulus that causes current flow from the top electrode TE to the bottom electrode BE. When the resistive change elements are adjusted (programmed) between resistive states in a unidirectional manner, the resistive change elements are adjusted (programmed) between resistive states by electrical stimuli that cause current flow in the same direction relative to the top electrodes TE and the bottom electrodes BE. When the resistive change elements are adjusted (programmed) between resistive states in a unidirectional manner, the resistive change elements can be adjusted between the low resistive state and the high resistive state by electrical stimuli that cause current flow in the same direction relative to the top electrode TE and the bottom electrode BE. Alternatively, each resistive change element of the plurality of resistive change elements E00a-Oxya can be adjusted (programmed) between more than two non-volatile resistive states, where each non-volatile resistive state corresponds with a different resistance value, by applying electrical stimuli to the resistive change elements.

As shown in FIG. 1I-1, the even bit lines of the plurality of even bit lines Bea(0)-Bea(x) may be arranged generally along the Y-axis and generally in parallel with respect to each other, the odd bit lines of the plurality of odd bit lines Boa(0)-Boa(x) may be arranged generally along the Y-axis and generally in parallel with respect to each other, and the global bit lines of the plurality of global bit lines GB3(0)-GB3(x) may be arranged generally along the Y-axis and generally in parallel with respect to each other. Also, as shown in FIG. 1I-1, the even bit lines of the plurality of even bit lines Bea(0)-Bea(x), the odd bit lines of the plurality of odd bit lines Boa(0)-Boa(x), and the global bit lines of the plurality of global bit lines GB3(0)-GB3(x) may be arranged generally in parallel with respect to each other. Additionally, as shown in FIG. 1I-1, the word lines of the plurality of word lines Wa(0)-Wa(y) may be arranged generally along the X-axis and generally in parallel with respect to each other. It is noted that the even bit lines Bea(0)-Bea(x) are described as being generally in parallel with respect to each other, the odd bit lines Boa(0)-Boa(x) are described as being generally in parallel with respect to each other, the global bit lines GB3(0)-GB3(x) are described as being generally in parallel with respect to each other, and the word lines Wa(0)-Wa(y) are described as being generally in parallel with respect to each other to allow for variations from exactly parallel due to the fabrication process. It is also noted that the even bit lines Bea(0)-Bea(x), the odd bit lines Boa(0)-Boa(x), and the global bit lines GB3(0)-GB3(x) are described as being generally in parallel with respect to each other to allow for variations from exactly parallel due to the fabrication process.

Section A has one even bit line and one odd bit line per column and one word line per row. The numbering convention for the plurality of even bit lines Bea(0)-Bea(x) and the plurality of odd bit lines Boa(0)-Boa(x) reflects that section A has one even bit line and one odd bit line per column. The numbering convention for the plurality of even bit lines Bea(0)-Bea(x) begins with the letter B indicating the array line is a bit line followed by the letter e indicating the bit line is an even bit line followed by the letter a indicating the bit line is in section A followed by a column number in parentheses. The numbering convention for the plurality of odd bit lines Boa(0)-Boa(x) begins with the letter B indicating the array line is a bit line followed by the letter o indicating the bit line is an odd bit line followed by the letter a indicating the bit line is in section A followed by a column number in parentheses. The numbering convention for the plurality of word lines Wa(0)-Wa(y) begins with the letter W indicating the array line is a word line followed by the letter a indicating the word line is in section A followed by a row number in parentheses. The numbering convention for the global bit lines GB3(0)-GB3(x) begins with the letters and number GB3 indicating the line is a global bit line followed by a column number in parentheses. Alternatively, section A may have at least one column with one even bit line and at least one column with one even bit line and one odd bit line, at least one column with one odd bit line and at least one column with one even bit line and one odd bit line, or at least one column with one even bit line, at least one column with one odd bit line, and at least one column with one even bit line and one odd bit line. It is noted that for discussion purposes the number 0 is considered to be an even number. Also, references to "even" and "odd" herein are for convenience of description and ease of distinction between groups of features and are not intended to be rigid characterizations, insofar as a same architecture could relabel the "even" structures as "odd" structures and vice versa.

As shown in FIG. 1I-1, the word lines of the plurality of word lines Wa(0)-Wa(y) may be generally orthogonal to the even bit lines of the plurality of even bit lines Bea(0)-Bea(x), the odd bit lines of the plurality of odd bit lines Boa(0)-Boa(x), and the global bit lines of the plurality of global bit lines GB3(0)-GB3(x). Additionally, as shown in FIG. 1I-1, the resistive change elements of the plurality of resistive change elements E00a-Oxya may be located where a word line of the plurality of word lines Wa(0)-Wa(y) crosses an even bit line of the plurality of even bit lines Bea(0)-Bea(x) and where a word line of the plurality of word lines Wa(0)-Wa(y) crosses an odd bit line of the plurality of odd bit lines Boa(0)-Boa(x). Resistive change elements located where a word line of the plurality of word lines Wa(0)-Wa(y) crosses an even bit line of the plurality of even bit lines Bea(0)-Bea(x) have top electrodes TE in electrical communication with word lines of the plurality of word lines Wa(0)-Wa(y) and bottom electrodes BE in electrical communication with even bit lines of the plurality of even bit lines Bea(0)-Bea(x). Resistive change elements located where a word line of the plurality of word lines Wa(0)-Wa(y) crosses an odd bit line of the plurality of odd bit lines Boa(0)-Boa(x) have top electrodes TE in electrical communication with word lines of the plurality of word lines Wa(0)-Wa(y) and bottom electrodes BE in electrical communication with odd bit lines in the plurality of odd bit lines Boa(0)-Boa(x).

The arrangement of the plurality of resistive change elements E00a-Oxya reflects section A having one even bit line and one odd bit line per column and one word line per row. As shown in FIG. 1I-1, the plurality of resistive change elements E00a-Oxya is arranged in a N×M matrix, where N is a positive integer that is a multiple of 2 and M is a positive integer. The numbering convention for the plurality of resistive change elements E00a-Oxya includes the letter E indicating the resistive change element is in electrical communication with an even bit line or the letter O indicating the resistive change element is in electrical communication with an odd bit line followed by a column number followed by a row number followed by the letter a indicating the resistive change element is in Section A. It is noted that although the plurality of resistive change elements E00a-Oxya is arranged in a rectangular matrix, the plurality of resistive change elements E00a-Oxya can be arranged in other layouts such as a square matrix. It is also noted that a plurality of resistive change elements in a different section is not limited to having the same number of resistive change elements and the same layout as the plurality of resistive change elements E00a-Oxya in Section A and that a plurality of resistive change elements in a different section can have a number of resistive change elements that differs from the number of resistive change elements in the plurality of resistive change elements E00a-Oxya in Section A and/or a layout that differs from the layout of the plurality of resistive change elements E00a-Oxya in Section A.

As shown in FIG. 1I-1, even bit lines of the plurality of even bit lines Bea(0)-Bea(x) and global bit lines of the plurality of global bit lines GB3(0)-GB3(x) having the same column number are in electrical communication with the same even selection device of the plurality of even selection devices Nea0-Neax. The plurality of even selection devices Nea0-Neax are NMOS transistors having drain terminals, gate terminals, and source terminals. The drain terminals of the plurality of even selection devices Nea0-Neax are in electrical communication with the plurality of global bit lines GB3(0)-GB3(x). The gate terminals of the plurality of even selection devices Nea0-Neax are in electrical communication with control logic, such as a processor, a controller, and a microcontroller. The source terminals of the plurality of even selection devices Nea0-Neax are in electrical communication with the plurality of even bit lines Bea(0)-Bea(x). The numbering convention for the plurality of even selection devices Nea0-Neax includes the letter e indicating the even selection device is in electrical communication with an even bit line followed by the letter a indicating the even selection device is in section A followed by a column number. Alternatively, the even selection devices Nea0-Neax can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the plurality of even selection devices Nea0-Neax.

Also, as shown in FIG. 1I-1, odd bit lines of the plurality of odd bit lines Boa(0)-Boa(x) and global bit lines of the plurality of global bit lines GB3(0)-GB3(x) having the same column number are in electrical communication with the same odd selection device of the plurality of odd selection devices Noa0-Noax. The plurality of odd selection devices Noa0-Noax are NMOS transistors having drain terminals, gate terminals, and source terminals. The drain terminals of the plurality of odd selection devices Noa0-Noax are in electrical communication with the plurality of global bit lines GB3(0)-GB3(x). The gate terminals of the plurality of odd selection devices Noa0-Noax are in electrical communication with control logic, such as a processor, a controller, and a microcontroller. The source terminals of the plurality of odd selection devices Noa0-Noax are in electrical communication with the plurality of odd bit lines Boa(0)-Boa(x). The numbering convention for the plurality of odd selection devices Noa0-Noax includes the letter o indicating the odd selection device is in electrical communication with an odd bit line followed by the letter a indicating the odd selection device is in section A followed by a column number. Alternatively, the odd selection devices Noa0-Noax can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the plurality of odd selection devices Noa0-Noax.

Each of the word line driver circuitries 110a-110z has the same structure as the word line driver circuitry 110a for Section A, and thus, the discussion below of the word line driver circuitry 110a for Section A is applicable to each of the word line driver circuitries 110a-110z. The numbering convention for the word line driver circuitries 110a-110z reflects the section of the resistive change element array that a word line driver circuitry corresponds with because the last reference character for each word line driver circuitry refers to the section of the resistive change element array.

The word line driver circuitry for Section A includes a first NMOS transistor 110pa, a second NMOS transistor 111pa, a plurality of word line driver circuits 110da-11yda, and a plurality of sink transistors 110sa-11ysa. The first NMOS transistor 110pa has a drain terminal, a gate terminal, and a source terminal, and the second NMOS transistor 111pa has a drain terminal, a gate terminal, and a source terminal. The drain terminal of the first NMOS transistor 110pa is in electrical communication with the plurality of word line driver circuits 110da-11yda, the gate terminal of the first NMOS transistor 110pa is in electrical communication with control logic, such as a processor, a controller, and a microcontroller, to receive a signal S0a for controlling current flow through the first NMOS transistor 110pa, and the source terminal of the first NMOS transistor 110pa is in electrical communication with a power supply, a voltage source, a driver circuit, or other device that supplies the system voltage VDD. The drain terminal of the second NMOS transistor 111pa is in electrical communication with the plurality of word line driver circuits 110da-11yda and the reference line connection circuit 120a for Section A, the gate terminal of the second NMOS transistor 111pa is in electrical communication with control logic, such as a processor, a controller, and a microcontroller, to receive a signal S1a for controlling current flow through the second NMOS transistor 111pa, and the source terminal of the second NMOS transistor 111pa is in electrical communication with a power supply, a voltage source, a driver circuit, or other device that supplies the inhibit voltage VINH.

Each word line driver circuit in the plurality of word line driver circuits 110da-11yda has an input terminal, an output terminal, a first power terminal, and a second power terminal. The input terminals of the word line driver circuits in the plurality of word line driver circuits 110da-11yda are in electrical communication with control logic, such as a processor, a controller, and a microcontroller. The output terminals of the word line driver circuits in the plurality of word line driver circuits 110da-11yda are in electrical communication with word lines in the plurality of word lines Wa(0)-Wa(y) with the third reference character for each word line driver circuit indicating the word line that word line driver circuit is in electrical communication with because the third reference character for each word line driver circuit refers to a row number. The first power terminals of the word line driver circuits in the plurality of word line driver circuits 110da-11yda are in electrical communication with the drain terminal of the first NMOS transistor 110pa. The second power terminals of the word line driver circuits in the plurality of word line driver circuits 110da-11yda are in electrical communication with the drain terminal of the second NMOS transistor 111pa.

The plurality of word line driver circuits 110da-11yda receive a plurality of signals ITE0a-ITEya for operating the plurality of word line driver circuits 110da-11yda. The control logic supplies the plurality of signals ITE0a-ITEya. The plurality of word line driver circuits 110da-11yda receive the system voltage VDD on the first power terminals when the first NMOS transistor 110pa is turned on and do not receive a voltage on the first power terminals when the first NMOS transistor 110pa is turned off. The plurality of word line driver circuits 110da-11yda receive the inhibit voltage VINH on the second power terminals when the second NMOS transistor 111pa is turned on and do not receive a voltage on the second power terminals when the second NMOS transistor 111pa is turned off. When the first NMOS transistor 110pa and the second NMOS transistor 111pa are turned on each word line driver circuit in the plurality of word line driver circuits 110da-11yda supplies a voltage based on the signal in the plurality of signals ITE0a-ITEya received by that word line driver circuit. For example, when the first NMOS transistor 110pa and the second NMOS transistor 111pa are turned on and the word line driver circuit 110da receives a signal ITE0a having a low level the word line driver circuit 110da supplies the system voltage VDD and when the first NMOS transistor 110pa and the second NMOS transistor 111pa are turned on and the word line driver circuit 110da receives a signal ITE0a having a high level the word line driver circuit 110da supplies the inhibit voltage VINH. When one of the first NMOS transistor 110pa and the second NMOS transistor 111pa is turned on and one of the first NMOS transistor 110pa and the second NMOS transistor 111pa is turned off each word line driver circuit in the plurality of word line driver circuits 110d-11yd supplies a voltage or does not supply a voltage based on the signal in the plurality of signals ITE0a-ITEya received by that word line driver circuit. For example, when the first NMOS transistor 110pa is turned off and the second NMOS transistor 111pa is turned on and the word line driver circuit 110da receives a signal ITE0a having a low level the word line driver circuit 110da does not supply a voltage and when the first NMOS transistor 110pa is turned off and the second NMOS transistor 111pa is turned on and the word line driver circuit 110da receives a signal ITE0a having a high level the word line driver circuit 110da supplies the inhibit voltage VINH. It is noted that, as discussed below, the inhibit voltage VINH is applied to a top of a resistive change element and the inhibit voltage VINH is applied to a bottom of the resistive change element to provide a neutral voltage condition. It is also noted that the inhibit voltage VINH can have a voltage level of VDD/2 (half of the system voltage VDD) for example, however, the inhibit voltage is not limited to a voltage of VDD/2 and that a circuit designer can select other voltages that may deviate somewhat from VDD/2 for the inhibit voltage VINH.

The plurality of sink transistors 110sa-11ysa are NMOS transistors having drain terminals, gate terminals, and source terminals. The drain terminals of the plurality of sink transistors 110sa-11ysa are in electrical communication with the plurality of word lines Wa(0)-Wa(y) with the third reference character for each sink transistor indicating the word line that sink transistor is in electrical communication with because the third reference character for each sink transistor refers to a row number. The gate terminals of the plurality of sink transistors 110sa-11ysa are in electrical communication with control logic, such as a processor, a controller, and a microcontroller. The source terminals of the plurality of sink transistors 110sa-11ysa are in electrical communication with a power supply, a voltage source, a driver circuit, or other device that supplies 0 volts or ground. The plurality of sink transistors 110sa-11ysa receive a plurality of signals SK0a-SKya for controlling current flow through the plurality of sink transistors 110sa-11ysa. The control logic supplies the plurality of signals SK0a-SKya. Alternatively, the sink transistors 110sa-11ysa can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the plurality of sink transistors 110sa-11ysa.

Each of the reference line connection circuits 120a-120z has the same structure as the reference line connection circuit 120a for Section A, and thus, the discussion below of the reference line connection circuit 120a for Section A is applicable to each of the reference line connection circuits 120a-120z. The numbering convention for the reference line connection circuits 120a-120z reflects the section of the resistive change element array that a reference line connection circuit corresponds with because the last reference character for each reference line connection circuit refers to the section of the resistive change element array.

The reference line connection circuit 120a includes a first NMOS transistor 121a having a drain terminal, a gate terminal, and a source terminal and a second NMOS transistor 122a having a drain terminal, a gate terminal, and a source terminal. The drain terminal of the first NMOS transistor 121a is in electrical communication with the reference line RL3, the gate terminal of the first NMOS transistor 121a is in electrical communication with control logic, such as a processor, a controller, and a microcontroller, and the source terminal of the first NMOS transistor 121a is in electrical communication with the word line driver circuitry 110a. The drain terminal of the second NMOS transistor 122a is in electrical communication with the reference line RL3, the gate terminal of the second NMOS transistor 122a is in electrical communication with control logic, such as a processor, a controller, and a microcontroller, and the source terminal of the second NMOS transistor 122a is in electrical communication with the word line driver circuitry 110a. The first NMOS transistor 121a receives a signal SSELea for controlling current flow through the first NMOS transistor 121a and the plurality of even selection devices Nea0-Neax. The second NMOS transistor 122*a* receives a signal SSELoa for controlling current flow through the second NMOS transistor 122*a* and the plurality of odd selection devices Noa0-Noax. The control logic supplies the signal SSELea and the signal SSELoa. Alternatively, the source terminal of the first NMOS transistor 121*a* and the source terminal of the second NMOS transistor 122*a* may be in electrical communication a power supply, a voltage source, a driver circuit, or other device that supplies the inhibit voltage VINH. Alternatively, the first NMOS transistor 121*a* and the second NMOS transistor 122*a* can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the first NMOS transistor 121*a* and the second NMOS transistor 122*a*.

The global bit line connection circuit 180 includes a plurality of PMOS transistors 180*g*-18*xg* having drain terminals, gate terminals, and source terminals. The numbering convention for the plurality of PMOS transistors 180*g*-18*xg* includes a column number as the next to last reference character, the numbering convention for the plurality of bus lines BL30-BL3*x* includes a column number as the last reference character, and as discussed above the numbering convention for the plurality of global bit lines GB3(0)-GB3(*x*) begins with letters and number GB3 indicating the line is a global bit line followed by a column number in parentheses. The drain terminals of the plurality of PMOS transistors 180*g*-18*xg* are in electrical communication with bus lines BL30-BL3*x* having the same column numbers. The gate terminals of the plurality of PMOS transistors 180*g*-18*xg* are in electrical communication with control logic, such as a processor, a controller, and a microcontroller. The source terminals of the plurality of PMOS transistors 180*g*-18*xg* are in electrical communication with global bit lines GB3(0)-GB3(*x*) having the same column number. The plurality of PMOS transistors 180*g*-18*xg* receive a signal CD0 for controlling current flow through the plurality of PMOS transistors 180*g*-18*xg*. The control logic supplies the signal CD0. Alternatively, the PMOS transistors 180*g*-18*xg* can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the plurality of PMOS transistors 180*g*-18*xg*.

Each write buffer circuit of the plurality of write buffer circuits 1500-150*x* has the same structure as the write buffer circuit 1500, and thus, the discussion below of the write buffer circuit 1500 is applicable to each write buffer circuit of the plurality of write buffer circuits 1500-150*x*. The numbering convention for the plurality of write buffer circuits 1500-150*x* includes a column number as the last reference character and a write buffer circuit corresponds with a global bit line having the same column number. Additionally, the numbering conventions for write set signals WR00-WR0*x* and write reset signals WR10-WR1*x* received by the plurality of write buffer circuits 1500-150*x* include a column number as the last reference character and each write buffer circuit receives a write set signal and a write reset signal having the same column number as that write buffer circuit.

The write buffer circuit 1500 has a first input terminal, a second input terminal, an output terminal, a first power terminal, and a second power terminal. The first input terminal and the second input terminal of the write buffer circuit 1500 are in electrical communication with control logic, such as a processor, a controller, and a microcontroller. The output terminal of the write buffer circuit 1500 is in electrical communication with the bus line BL30 having the same column number as the write buffer circuit 1500. The first power terminal of the write buffer circuit 1500 is in electrical communication with a power supply, a voltage source, a driver circuit, or other device that supplies a system voltage VDD. The second power terminal of the write buffer circuit 1500 is in electrical communication with a power supply, a voltage source, a driver circuit, or other device that supplies 0 volts or ground. The write buffer circuit 1500 receives a write set signal WR00 on the first input terminal and a write reset signal WR10 on the second input terminal. The control logic supplies the write set signal WR00 and the write reset signal WR10. When the write buffer circuit 1500 receives the write set signal WR00 having a low level and the write reset signal WR10 having a low level the write buffer circuit 1500 supplies the system voltage VDD. When the write buffer circuit 1500 receives the write set signal WR00 having a high level and the write reset signal WR10 having a high level the write buffer circuit 1500 supplies 0 volts or ground. When the write buffer circuit 1500 receives the write set signal WR00 having a high level and the write reset signal WR10 having a low level the write buffer circuit 1500 does not supply a voltage. Although, not shown in FIG. 1I-3, the output terminal of the write buffer circuit 1500 may be in electrical communication with the bus line BL30 through a resistor for limiting current flow from the write buffer circuit 1500. Alternatively, the first power terminal of the write buffer circuit 1500 may be in electrical communication with a field effect transistor and the field effect transistor may be in electrical communication with a power supply, a voltage source, a driver circuit, or other device that supplies the system voltage VDD and/or the second power terminal of the write buffer circuit 1500 may be in electrical communication with a field effect transistor and the field effect transistor may be in electrical communication with a power supply, a voltage source, a driver circuit, or other device that supplies 0 volts or ground.

Each current source of the plurality of current sources 1600-160*x* has the same structure as the current source 1600, and thus, the discussion below of the current source 1600 is applicable to each current source of the plurality of current sources 1600-160*x*. The numbering convention for the plurality of current sources 1600-160*x* includes a column number as the last reference character and a current source corresponds with a global bit line having the same column number. Additionally, the numbering conventions for current source enable signals CSEN0-CSEN*x* and current source bias current signals CSB0-CSB*x* received by the plurality of current sources 1600-160*x* include column numbers as the last reference characters and each current source receives a current source enable signal and a current source bias current signal having the same column number as that current source.

The current source 1600 includes a first NMOS transistor 1610 have a drain terminal, a gate terminal, and a source terminal and a second NMOS transistor 1620 having a drain terminal, a gate terminal, and a source terminal. The drain terminal of the first NMOS transistor 1610 is in electrical communication with the bus line BL30 having the same column number as the current source 1600. The gate terminal of the first NMOS transistor 1610 is in electrical communication with control logic, such as a processor, a controller, and a microcontroller, to receive a current source enable signal CSEN0. The source terminal of the first NMOS transistor 1610 is in electrical communication with the drain terminal of the second NMOS transistor 1620. The drain terminal of the second NMOS transistor 1620 is in electrical communication with the source terminal of the first NMOS transistor 1610. The gate terminal of the second NMOS transistor 1620 is in electrical communication with control logic, such as a processor, a controller, and a microcontroller, to receive a current source bias current signal CSB0. The source terminal of the second NMOS transistor 1620 is in electrical communication with a power supply, a voltage source, a driver circuit, or other device that supplies 0 volts or ground. The control logic supplies the current source enable signal CSEN0 to enable and disable the current source 1600 and the current source bias current signal CSB0 to set the amount of current sunk by the current source 1600. The current source 1600 may be set to sink different amounts of current for different operations of a resistive change element. For example, the current source 1600 may be set to sink an amount of current for a READ operation, an amount of current for a SET VERIFY operation, and an amount of current for a RESET VERIFY operation.

Each sense amplifier of the plurality of sense amplifiers 2000-200x has the same structure as the first sense amplifier 200 discussed above. The numbering convention for the plurality of sense amplifiers 2000-200x includes a column number as the last reference character and a sense amplifier corresponds with a global bit line having the same column number. For ease of illustration, FIG. 1I-3 shows a simplified diagram of each sense amplifier of the plurality of sense amplifiers 2000-200x having two input terminals in electrical communication with the reference line RL3, one input terminal in electrical communication with the bus line having the same column number as that sense amplifier, and two output terminals. The two output terminals of each sense amplifier of the plurality of sense amplifiers 2000-200x can be in electrical communication with a bus, a buffer, a level shift circuit, a test circuit, or control logic such as a processor, a controller, and a microcontroller.

The exemplary DDR compatible implementation of the first exemplary architecture shown in FIGS. 1I-1, 1I-2, and 1I-3 provides for PROGRAMMING operations of multiple resistive change elements to the same resistive state at the same time and READ operations, SET VERIFY operations, and RESET VERIFY operations of multiple resistive change elements at the same time. For example, PROGRAMMING operations to adjust resistive states of even resistive change elements in electrical communication with a word line in a section of the resistive change element array 101 can be performed at the same time. For example, PROGRAMMING operations to adjust resistive states of NUM even resistive change elements in electrical communication with a word line in a section of the resistive change element array 101 can be performed at the same time, where NUM is a number of resistive change elements greater than one and less than the total number of even resistive change elements in electrical communication with the word line. For example, PROGRAMMING operations to adjust resistive states of odd resistive change elements in electrical communication with a word line in a section of the resistive change element array 101 can be performed at the same time. For example, PROGRAMMING operations to adjust resistive states of NUM odd resistive change elements in electrical communication with a word line in a section of the resistive change element array 101 can be performed at the same time, where NUM is a number of resistive change elements greater than one and less than the total number of odd resistive change elements in electrical communication with the word line. For example, READ operations, SET VERIFY operations, and RESET VERIFY operations of even resistive change elements in electrical communication with a word line in a section of the resistive change element array 101 can be performed at the same time. For example, READ operations, SET VERIFY operations, and RESET VERIFY operations of NUM even resistive change elements in electrical communication with a word line in a section of the resistive change element array 101 can be performed at the same time, where NUM is a number of resistive change elements greater than one and less than the total number of even resistive change elements in electrical communication with the word line. For example, READ operations, SET VERIFY operations, and RESET VERIFY operations of odd resistive change elements in electrical communication with a word line in a section of the resistive change element array 101 can be performed at the same time. For example, READ operations, SET VERIFY operations, and RESET VERIFY operations of NUM odd resistive change elements in electrical communication with a word line in a section of the resistive change element array 101 can be performed at the same time, where NUM is a number of resistive change elements greater than one and less than the total number of odd resistive change elements in electrical communication with the word line.

Additionally, the exemplary DDR compatible implementation of the first exemplary architecture shown in FIGS. 1I-1, 1I-2, and 1I-3 provides for PROGRAMMING operations, READ operations, SET VERIFY operations, and RESET VERIFY operations of one resistive change element at a time. For example, PROGRAMMING operations, READ operations, SET VERIFY operations, and RESET VERIFY operations of one resistive change element at a time may be performed in a test mode of the exemplary DDR compatible implementation of the first exemplary architecture. PROGRAMMING operations, READ operations, SET VERIFY operations, and RESET VERIFY operations of one resistive change element at a time in the exemplary DDR compatible implementation of the first exemplary architecture can be performed in a similar manner to PROGRAMMING operations, READ operations, SET VERIFY operations, and RESET VERIFY operations of resistive change elements in the exemplary implementation of the first exemplary architecture shown in FIGS. 1D-1 and 1D-2 and discussed above. Therefore, PROGRAMMING operations, READ operations, SET VERIFY operations, and RESET VERIFY operations of one resistive change element at a time in the exemplary DDR compatible implementation of the first exemplary architecture are not discussed in detail below. It is noted that the exemplary DDR compatible implementation of the first exemplary architecture may be used with interface circuitry tailored for other SRAM interfaces so that the exemplary DDR compatible implementation of the first exemplary architecture is compatible with other SRAM interfaces.

PROGRAMMING operations to adjust resistive states of odd resistive change elements in electrical communication with a word line in a section of the resistive change element array 101 are discussed below with respect to FIGS. 1J-1, 1J-2, and 1J-3 that show current flow during a PROGRAMMING operation to adjust resistive states of odd resistive change elements in electrical communication with word line Wa(1) in Section A to low resistive states and FIGS. 1K-1, 1K-2, and 1K-3 that show current flow during a PROGRAMMING operation to adjust resistive states of odd resistive change elements in electrical communication with word line Wa(1) in Section A to high resistive states. READ operations, SET VERIFY operations, and RESET VERIFY operations of odd resistive change elements in electrical communication with a word line in a section of the resistive change element array 101 are discussed below with respect to FIGS. 1L-1, 1L-2, and 1L-3 that show current flow during a READ operation of odd resistive change elements in electrical communication with word line Wa(1). It is noted that PROGRAMMING operations to adjust resistive states of odd resistive change elements in electrical communication with a word line in a section of resistive change element array 101 and PROGRAMMING operations to adjust resistive states of even resistive change elements in electrical communication with a word line in a section of resistive change element array 101 can be performed in a similar manner to PROGRAMMING operations to adjust resistive states of odd resistive change elements in electrical communication with word line Wa(1) in Section A. It is additionally noted that READ operations, SET VERIFY operations, and RESET VERIFY operations of odd resistive change elements in electrical communication with a word line in a section of resistive change element array 101 and READ operations, SET VERIFY operations, and RESET VERIFY operations of even resistive change elements in electrical communication with a word line in a section of resistive change element array 101 can be performed in a similar manner to the READ operations, SET VERIFY operations, and RESET VERIFY operations of odd resistive change elements in electrical communication with word line Wa(1).

Referring now to FIGS. 1J-1, 1J-2, and 1J-3, a PROGRAMMING operation to adjust resistive states of odd resistive change elements in electrical communication with word line Wa(1) in Section A to low resistive states starts, as similarly discussed above in step 302 of the flow chart 300, by providing neutral voltage conditions for the plurality of resistive change elements E00a-Oxya in Section A and the plurality of resistive change elements E00z-Oxyz in Section Z. The neutral voltage conditions are provided for the plurality of resistive change elements E00a-Oxya in section A by floating the plurality of even bit lines Bea(0)-Bea(x) and the plurality of odd bit lines Boa(0)-Boa(x) and applying the inhibit voltage VINH to the plurality of word lines Wa(0)-Wa(y) with the plurality of even bit lines Bea(0)-Bea(x) and the plurality of odd bit lines Boa(0)-Boa(x) floating so that voltages approximately equal to the inhibit voltage VINH are applied to the top electrodes and the bottom electrodes of the resistive change elements in the plurality of resistive change elements E00a-Oxya. Floating a line refers to electrically connecting the line such that a voltage on the line exists due to a line capacitance of the line. The plurality of even bit lines Bea(0)-Bea(x) are floated by disconnecting the plurality of even bit lines Bea(0)-Bea(x) from the plurality of global bit lines GB3(0)-GB3(x) by turning off the plurality of even selection devices Nea0-Neax in Section A. The plurality of even selection devices Nea0-Neax are turned off by control logic, such as a processor, a controller, and a microcontroller, supplying a signal SSELea having a low level. The plurality of odd bit lines Boa(0)-Boa(x) are floated by disconnecting the plurality of odd bit lines Boa(0)-Boa(x) from the plurality of global bit lines GB3(0)-GB3(x) by turning off the plurality of odd selection devices Noa0-Noax in Section A. The plurality of odd selection devices Noa0-Noax are turned off by control logic, such as a processor, a controller, and a microcontroller, supplying a signal SSELoa having a low level. It is noted that control logic, such as a processor, a controller, and a microcontroller, supplying a signal SSELea having a low level and a signal SSELoa having a low level also turns off the first NMOS transistor 121a and the second NMOS transistor 122a of the reference line connection circuit 120a for Section A.

The inhibit voltage VINH is applied to the plurality of word lines Wa(0)-Wa(y) by the word line driver circuitry 110a for Section A driving voltages on the plurality of word lines Wa(0)-Wa(y) to the inhibit voltage VINH. The plurality of word line driver circuits 110da-11yda do not receive a voltage on the first power terminals because the first NMOS transistor 110pa is turned off by control logic, such as a processor, a controller, and a microcontroller, supplying the signal S0a having a low level and receive the inhibit voltage VINH on the second power terminals because the second NMOS transistor 111pa is turned on by the control logic supplying the signal S1a having a high level. The plurality of word line driver circuits 110da-11yda supply the inhibit voltage VINH based on the plurality of signals ITE0a-ITEya supplied by control logic, such as a processor, a controller, and a microcontroller. The plurality of sink transistors 110sa-11ysa are turned off because control logic, such as a processor, a controller, and a microcontroller, supplies the plurality of signals SK0a-SKya have low levels.

Driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating causes voltages on the plurality of word lines Wa(0)-Wa(y), voltages on the plurality of even bit lines Bea(0)-Bea(x), and voltages on the plurality of odd bit lines Boa(0)-Boa(x) to be approximately equal to the inhibit voltage VINH. Voltages on the plurality of even bit lines Bea(0)-Bea(x) and voltages on the plurality of odd bit lines Boa(0)-Boa(x) are approximately equal to the inhibit voltage VINH because currents flow from the plurality of word lines Wa(0)-Wa(y) through the plurality of resistive change elements E00a-Oxya into the plurality of even bit lines Bea(0)-Bea(x) and the plurality of odd bit lines Boa(0)-Boa(x). The inhibit voltage VINH exists on the plurality of even bit lines Bea(0)-Bea(x) and the plurality of odd bit lines Boa(0)-Boa(x) due to line capacitances because the plurality of even bit lines Bea(0)-Bea(x) and the plurality of odd bit lines Boa(0)-Boa(x) are floating. Thus, driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating results in application of voltages approximately equal to the inhibit voltage VINH to the top electrodes and the bottom electrodes of the resistive change elements in the plurality of resistive change elements E00a-Oxya. Additionally, driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating causes the voltages across resistive change elements in the plurality of resistive change elements E00a-Oxya to be approximately 0 volts.

The neutral voltage conditions are provided for the plurality of resistive change elements E00z-Oxyz in section Z by floating the plurality of even bit lines Bez(0)-Bez(x) and the plurality of odd bit lines Boz(0)-Boz(x) and applying the inhibit voltage VINH to the plurality of word lines Wz(0)-Wz(y) with the plurality of even bit lines Bez(0)-Bez(x) and the plurality of odd bit lines Boz(0)-Boz(x) floating so that voltages approximately equal to the inhibit voltage VINH are applied to the top electrodes and the bottom electrodes of the resistive change elements in the plurality of resistive change elements E00z-Oxyz. Floating a line refers to electrically connecting the line such that a voltage on the line exists due to a line capacitance of the line. The plurality of even bit lines Bez(0)-Bez(x) are floated by disconnecting the plurality of even bit lines Bez(0)-Bez(x) from the plurality of global bit lines GB3(0)-GB3(x) by turning off the plurality of even selection devices Nez0-Nezx in Section Z. The plurality of even selection devices Nez0-Nezx are turned off by control logic, such as a processor, a controller, and a microcontroller, supplying a signal SSELez having a low level. The plurality of odd bit lines Boz(0)-Boz(x) are floated by disconnecting the plurality of odd bit lines Boz(0)-Boz(x) from the plurality of global bit lines GB3(0)-GB3(x) by turning off the plurality of odd selection devices Noz0-Nozx in Section Z. The plurality of odd selection devices Noz0-Nozx are turned off by control logic, such as a processor, a controller, and a microcontroller, supplying a signal SSELoz having a low level. It is noted that control logic, such as a processor, a controller, and a microcontroller, supplying a signal SSELez having a low level and a signal SSELoz having a low level also turns off the first NMOS transistor 121z and the second NMOS transistor 122z of the reference line connection circuit 120z for Section Z. It is further noted that the reference line RL3 floats because the first NMOS transistor 121a and the second NMOS transistor 122a of the reference line connection circuit 120a for Section A are turned off and the first NMOS transistor 121z and the second NMOS transistor 122z of the reference line connection circuit 120z for Section Z are turned off.

The inhibit voltage VINH is applied to the plurality of word lines Wz(0)-Wz(y) by the word line driver circuitry 110z for Section Z driving voltages on the plurality of word lines Wz(0)-Wz(y) to the inhibit voltage VINH. The plurality of word line driver circuits 110dz-11ydz do not receive a voltage on the first power terminals because the first NMOS transistor 110pz is turned off by control logic, such as a processor, a controller, and a microcontroller, supplying the signal S0z having a low level and receive the inhibit voltage VINH on the second power terminals because the second NMOS transistor 111pz is turned on by the control logic supplying the signal S1z having a high level. The plurality of word line driver circuits 110dz-11ydz supply the inhibit voltage VINH based on the plurality of signals ITE0z-ITEyz supplied by control logic, such as a processor, a controller, and a microcontroller. The plurality of sink transistors 110sz-11ysz are turned off because control logic, such as a processor, a controller, and a microcontroller, supplies the plurality of signals SK0z-SKyz have low levels.

Driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating causes voltages on the plurality of word lines Wz(0)-Wz(y), voltages on the plurality of even bit lines Bez(0)-Bez(x), and voltages on the plurality of odd bit lines Boz(0)-Boz(x) to be approximately equal to the inhibit voltage VINH. Voltages on the plurality of even bit lines Bez(0)-Bez(x) and voltages on the plurality of odd bit lines Boz(0)-Boz(x) are approximately equal to the inhibit voltage VINH because currents flow from the plurality of word lines Wz(0)-Wz(y) through the plurality of resistive change elements E00z-Oxyz into the plurality of even bit lines Bez(0)-Bez(x) and the plurality of odd bit lines Boz(0)-Boz(x). The inhibit voltage VINH exists on the plurality of even bit lines Bez(0)-Bez(x) and the plurality of odd bit lines Boz(0)-Boz(x) due to line capacitances because the plurality of even bit lines Bez(0)-Bez(x) and the plurality of odd bit lines Boz(0)-Boz(x) are floating. Thus, driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating results in application of voltages approximately equal to the inhibit voltage VINH to the top electrodes and the bottom electrodes of the resistive change elements in the plurality of resistive change elements E00z-Oxyz. Additionally, driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating causes the voltages across resistive change elements in the plurality of resistive change elements E00z-Oxyz to be approximately 0 volts.

The PROGRAMMING operation to adjust resistive states of odd resistive change elements in electrical communication with word line Wa(1) in Section A to low resistive states continues, as similarly discussed above in step 304 of the flow chart 300, by biasing the plurality of global bit lines GB3(0)-GB3(x). The plurality of global bit lines GB3(0)-GB3(x) are biased to the inhibit voltage VINH by floating the plurality of global bit lines GB3(0)-GB3(x) and applying the inhibit voltage VINH to the plurality of global bit lines GB3(0)-GB3(x). The plurality of global bit lines GB3(0)-GB3(x) are floated by disconnecting the plurality of global bit lines GB3(0)-GB3(x) from the plurality of even bit lines Bea(0)-Bea(x) and the plurality of odd bit lines Boa(0)-Boa(x) in Section A, the plurality of even bit lines Bez(0)-Bez(x) and the plurality of odd bit lines Boz(0)-Boz(x) in Section Z, and the plurality of bus lines BL30-BL3x. The plurality of global bit lines GB3(0)-GB3(x) may be disconnected from the plurality of even bit lines Bea(0)-Bea(x) and the plurality of odd bit lines Boa(0)-Boa(x) in Section A as part of providing neutral voltage conditions for the plurality of resistive change elements E00a-Oxya in Section A as discussed above. The plurality of global bit lines GB3(0)-GB3(x) may be disconnected from the plurality of even bit lines Bez(0)-Bez(x) and the plurality of odd bit lines Boz(0)-Boz(x) in Section Z as part of providing neutral voltage conditions for the plurality of resistive change elements E00z-Oxyz in Section Z as discussed above. The plurality of global bit lines GB3(0)-GB3(x) are disconnected from the plurality of bus lines BL30-BL3x by turning off the plurality of PMOS transistors 180g-18xg in the global bit line connection circuit 180. The plurality of PMOS transistors 180g-18xg are turned off by control logic, such as a processor, a controller, and a microcontroller, supplying a signal CD0 having a high level. The inhibit voltage VINH is applied to the plurality of global bit lines GB3(0)-GB3(x) by electrically connecting the plurality of global bit lines GB3(0)-GB3(x) to a power supply, a voltage source, a driver circuit, or other device that supplies the inhibit voltage VINH by turning on the plurality of NMOS transistors 130k-13xk in the keeper circuit 130. The plurality of NMOS transistors 130k-13xk are turned on by control logic, such as a processor, a controller, and a microcontroller, supplying a signal KEEPe having a high level and a signal KEEPo having a high level.

The PROGRAMMING operation to adjust resistive states of odd resistive change elements in electrical communication with word line Wa(1) in Section A to low resistive states proceeds, as similarly discussed above in step 306 of the flow chart 300, by selecting the odd resistive change elements O01a, Ox1a in electrical communication with word line Wa(1) in Section A from the plurality of resistive change elements E00a-Oxya in Section A and the plurality of resistive change elements E00z-Oxyz in Section Z. The odd resistive change elements O01a, Ox1a in electrical communication with word line Wa(1) in Section A are selected from the plurality of resistive change elements E00a-Oxya in Section A and the plurality of resistive change elements E00z-Oxyz in Section Z by control logic, such as a processor, a controller, and a microcontroller. The resistive change elements E00a-Ox0a, E01a, Ex1a, and E0ya-Oxya in the plurality of resistive change elements E00a-Oxya in Section A and the plurality of resistive change elements E00z-Oxyz in Section Z that are not selected are referred to as unselected resistive change elements.

The PROGRAMMING operation to adjust resistive states of odd resistive change elements in electrical communication with word line Wa(1) in Section A to low resistive states continues, as similarly discussed above in step 308 of the flow chart 300, by preparing the exemplary DDR compatible implementation of the first exemplary architecture for applying electrical stimuli to the odd resistive change elements O01, Ox1a. The exemplary DDR compatible implementation of the first exemplary architecture is prepared for applying electrical stimuli to the odd resistive change elements O01, Ox1a by changing electrical connections of the plurality of odd bit lines Boa(0)-Boa(x), changing electrical connections of the plurality of global bit lines GB3(0)-GB3(x), and disconnecting a power supply, a voltage source, a driver circuit, or other device that supplies the inhibit voltage VINH from the plurality of global bit lines GB3(0)-GB3(x). The electrical connections of the plurality of odd bit lines Boa(0)-Boa(x) and the electrical connections of the plurality of global bit lines GB3(0)-GB3(x) are changed and a power supply, a voltage source, a driver circuit, or other device that supplies the inhibit voltage VINH is disconnected from the plurality of global bit lines GB3(0)-GB3(x) so that voltages on the plurality of odd bit lines Boa(0)-Boa(x) can be driven to voltages for applying electrical stimuli to the odd resistive change elements O01a, Ox1a. The electrical connections of the plurality of odd bit lines Boa(0)-Boa(x) are changed so that the plurality of odd bit lines Boa(0)-Boa(x) are in electrical communication with the plurality of global bit lines GB3(0)-GB3(x). The plurality of odd bit lines Boa(0)-Boa(x) are electrically connected to the plurality of global bit lines GB3(0)-GB3(x) by turning on the plurality of odd selection devices Noa0-Noax. The plurality of odd selection devices Noa0-Noax are turned on by control logic, such as a processor, a controller, and a microcontroller, supplying a signal SSELo having a high level. It is also noted that the control logic supplying a signal SSELo having a high level also turns on the second NMOS transistor 122a of the reference line connection circuit 120a for Section A and drives the voltage on the reference line RL3 to the inhibit voltage VINH by electrically connecting the reference line RL3 through the second NMOS transistor 122a of the reference line connection circuit 120a and the second NMOS transistor 111pa of the word line driver circuitry 110a to a power supply, a voltage source, a driver circuit, or other device that supplies the inhibit voltage VINH. It is further noted that, as discussed above with respect to providing neutral voltage conditions for the plurality of resistive change elements E00a-Oxya in Section A and the plurality of resistive change elements E00z-Oxyz in Section Z, the second NMOS transistor 111pa of the word line driver circuitry 110a is turned on.

The electrical connections of the plurality of global bit lines GB3(0)-GB3(x) are changed so that the plurality of global bit lines GB3(0)-GB3(x) are in electrical communication with the plurality of odd bit lines Boa(0)-Boa(x) and the plurality of bus lines BL30-BL3x. The plurality of global bit lines GB3(0)-GB3(x) are electrically connected to the plurality of odd bit lines Boa(0)-Boa(x) by turning on the plurality of odd selection devices Noa0-Noax as discussed above. The plurality of global bit lines GB3(0)-GB3(x) are electrically connected to the plurality of bus lines BL30-BL3x by turning on the plurality of PMOS transistors 180g-18xg. The plurality of PMOS transistors 180g-18xg are turned on by control logic, such as a processor, a controller, and a microcontroller, supplying a signal CD0 having a low level. A power supply, a voltage source, a driver circuit, or other device that supplies the inhibit voltage VINH is disconnected from the plurality of global bit lines GB3(0)-GB3(x) by turning off the plurality of NMOS transistors 130k-13xk. The plurality of NMOS transistors 130k-13xk are turned off by control logic, such as a processor, a controller, and a microcontroller, supplying a signal KEEPe having a low level and a signal KEEPo having a low level.

The PROGRAMMING operation to adjust resistive states of odd resistive change elements in electrical communication with word line Wa(1) in Section A to low resistive states proceeds, as similarly discussed above in step 310 of the flow chart 300, by applying electrical stimuli to the odd resistive change elements O01a, Ox1a to adjust resistive states of the odd resistive change elements O01a, Ox1a to low resistive states. Electrical stimuli to adjust resistive states of the odd resistive change elements O01a, Ox1a to low resistive states cause current flow from the bottom electrodes BE of the odd resistive change elements O01a, Ox1a to the top electrodes TE of the odd resistive change elements O01a, Ox1a and the magnitudes of the voltages of the electrical stimuli are approximately equal to the system voltage VDD. As discussed above, providing neutral voltage conditions for the plurality of resistive change elements E00a-Oxya in Section A causes voltages on the plurality of word lines Wa(0)-Wa(y), voltages on the plurality of even bit lines Bea(0)-Bea(x), and voltages on the plurality of odd bit lines Boa(0)-Boa(x) to be approximately equal to the inhibit voltage VINH. Also, as discussed above, the plurality of global bit lines GB3(0)-GB3(x) are biased to the inhibit voltage VINH. Thus, electrical stimuli to adjust resistive states of the odd resistive change elements O01a, Ox1a to low resistive states are applied to the odd resistive change elements O01a, Ox1a by driving the voltage on the word line Wa(1) from approximately the inhibit voltage VINH to 0 volts or ground, driving the voltage on the global bit line GB3(0) and the voltage on the odd bit line Boa(0) from approximately the inhibit voltage VINH to the system voltage VDD, and driving the voltage on the global bit line GB3(x) and the voltage on the odd bit line Boa(x) from approximately the inhibit voltage VINH to the system voltage VDD.

The voltage transition of the voltage on the word line Wa(1) generally corresponds with the voltage transition of the voltage on the top electrodes TE of the odd resistive change elements O01, Ox1a because the voltage on the word line Wa(1) generally corresponds with the voltage on the top electrodes TE of the odd resistive change elements O01a, Ox1a. The voltage transition of the voltage on the odd bit line Boa(0) generally corresponds with the voltage transition of the voltage on the bottom electrode BE of the resistive change element O01a because the voltage on the odd bit line Boa(0) generally corresponds with the voltage on the bottom electrode BE of the resistive change element O01a. The voltage transition of the voltage on the odd bit line Boa(x) generally corresponds with the voltage transition of the voltage on the bottom electrode BE of the resistive change element Ox1a because the voltage on the odd bit line Boa(x) generally corresponds with the voltage on the bottom electrode BE of the resistive change element Ox1a. The magnitude of the voltage transitions for applying the electrical stimuli to the odd resistive change elements O01a, Ox1a to adjust resistive states of the odd resistive change elements O01a, Ox1a to low resistive states are reduced because the voltage applied to the top electrodes TE and the voltage applied to the bottom electrodes BE are not required to transition by the magnitude of the system voltage VDD. A voltage transition of 0 volts or ground minus the inhibit voltage VINH is required to place the top electrodes at 0 volts or ground and a voltage transition of the system voltage VDD minus the inhibit voltage VINH is required to place the bottom electrodes at the system voltage VDD. For example, when the inhibit voltage VINH is VDD/2 (half of the system voltage VDD), a voltage transition of 0 volts–VDD/2=–VDD/2 is required to place the top electrodes at 0 volts or ground and a voltage transition of VDD–VDD/2=VDD/2 is required to place the bottom electrodes at the system voltage VDD. Further, the number of voltage transitions for applying the electrical stimulus to adjust resistive states of the odd resistive change elements O01a, Ox1a to low resistive states is reduced because only voltages on the word line Wa(1), the global bit lines GB3(0)-GB3(x), and the odd bit lines Boa(0)-Boa(x) are adjusted for applying electrical stimuli to adjust resistive states of the odd resistive change elements O01a, Ox1a to low resistive states. It is noted that applying the inhibit voltage VINH to a top electrode, a bottom electrode, or both a top electrode and a bottom electrode of a resistive change element limits a voltage applied across a resistive change element to a voltage less than a voltage limit for disturbing a resistive state of a resistive change element while applying electrical stimuli to the odd resistive change elements O01a, Ox1a to adjust resistive states of the odd resistive change elements O01a, Ox1a to low resistive states.

The voltage on the word line Wa(1) is driven from the inhibit voltage VINH to 0 volts or ground by the word line driver circuit 111da not supplying a voltage and by electrically connecting the word line Wa(1) to a power supply, a voltage source, a driver circuit, or other device that supplies 0 volts or ground by turning on the sink transistor 111sa. The word line driver circuit 111da does not supply a voltage because the word line driver circuit 111da is set to supply a voltage on the first power terminal based on the signal ITE1a supplied by control logic, such as a processor, a controller, and a microcontroller, and the word line driver circuit 111da does not receive a voltage on the first power terminal because the first NMOS transistor 110pa is turned off by the control logic suppling the signal S0a having a low level. The sink transistor 111sa is turned on by control logic, such as a processor, a controller, and a microcontroller, supplying a signal SK1a having a high level. The voltages on the plurality of global bit lines GB3(0)-GB3(x) and the voltages on the plurality of odd bit lines Boa(0)-Boa(x) are driven from the inhibit voltage VINH to the system voltage VDD by the plurality of write buffer circuits 1500-150x supplying the system voltage VDD. The plurality of write buffer circuits 1500-150x supply the system voltage VDD based on the write set signals WR00-WR0x and the write reset signals WR10-WR1x supplied by control logic, such as a processor, a controller, and a microcontroller.

Figures 1, 1J:
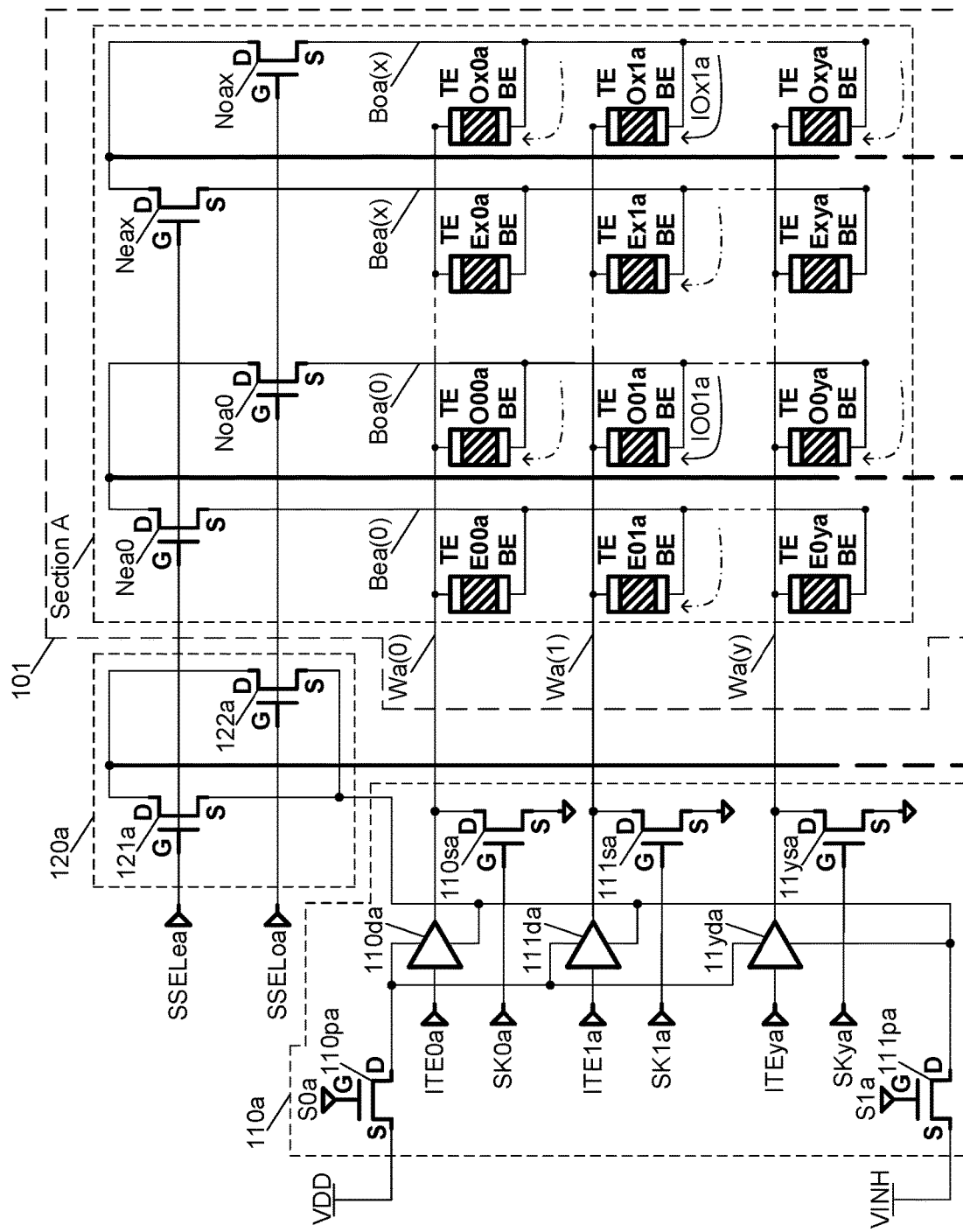
Figures 1, 1J, 2:
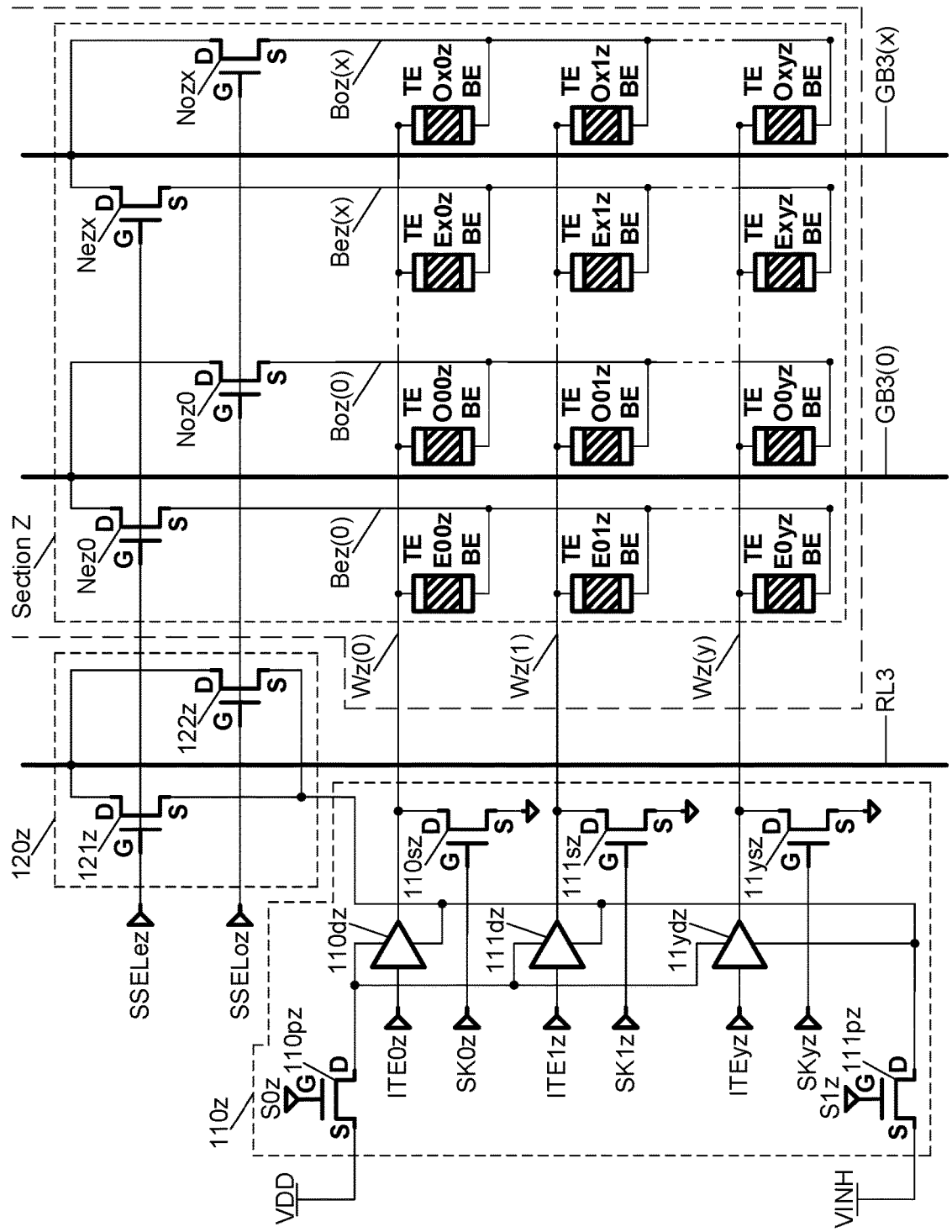
Figures 1, 1J, 2, 3:
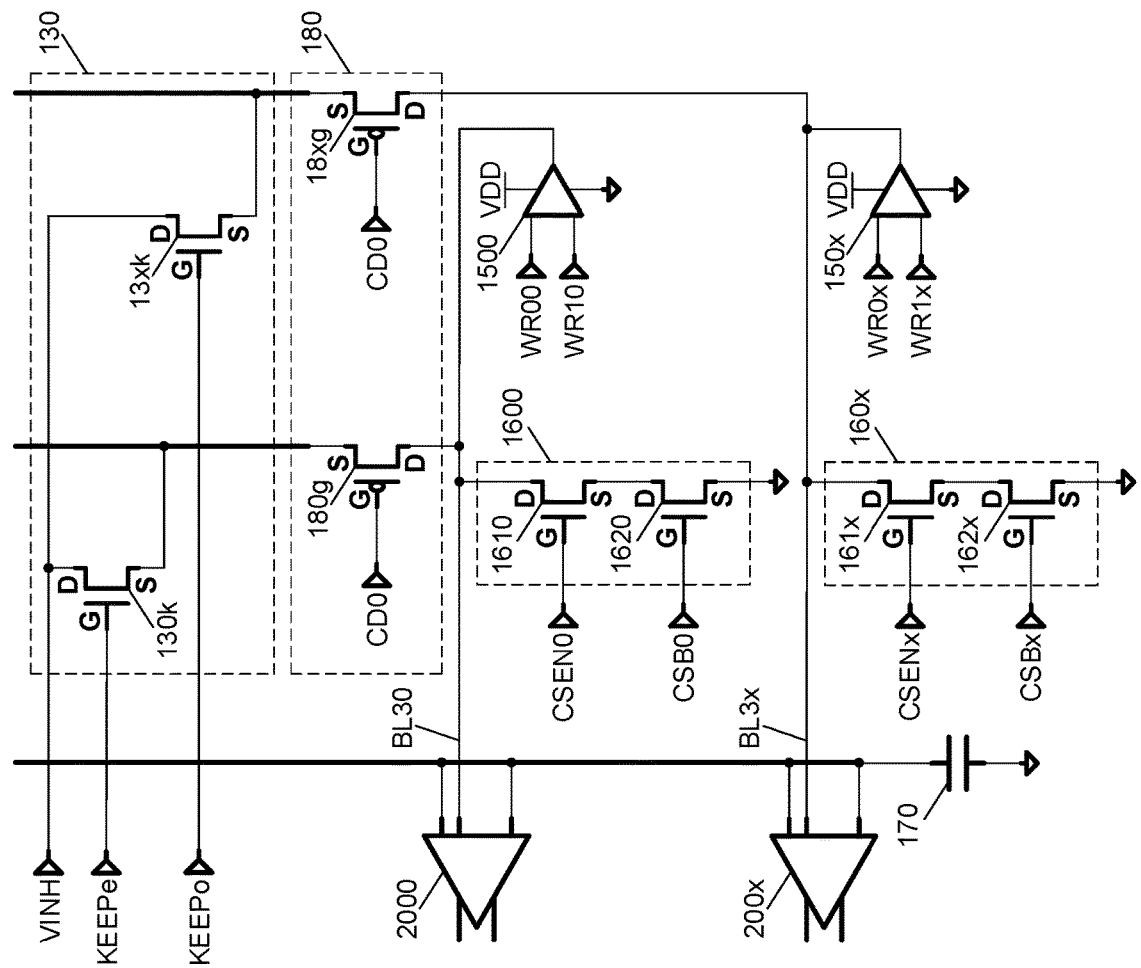

As shown in FIG. 1J-1, a current IO01a flows through the resistive change element O01a from the bottom electrode BE to the top electrode TE because the bottom electrode BE is at the system voltage VDD and the top electrode TE is at 0 volts or ground. Also, as shown in FIG. 1J-1, a current IOx1a flows through the resistive change element Ox1a from the bottom electrode BE to the top electrode TE because the bottom electrode BE is at the system voltage VDD and the top electrode TE is at 0 volts or ground. FIG. 1J-1 also shows leakage currents flowing through the resistive change elements O00a, O0ya in electrical communication with the odd bit line Boa(0), leakage currents flowing through the resistive change elements Ox0a, Oxya in electrical communication with the odd bit line Boa(x), and leakage currents flowing through the even resistive change elements E01a, Ex1a in electrical communication with the word line Wa(1). The leakage currents are shown using dashed lines in FIG. 1J-1. Leakage currents flow through the resistive change elements O00a, O0ya because the bottom electrodes of the resistive change elements O00a, O0ya are at the system voltage VDD and the top electrodes of the resistive change elements O00a, O0ya are the inhibit voltage VINH. Leakage currents flow through the resistive change elements Ox0a, Oxya because the bottom electrodes of the resistive change elements Ox0a, Oxya are at the system voltage VDD and the top electrodes of the resistive change elements Ox0a, Oxya are the inhibit voltage VINH. Leakage currents flow through the even resistive change elements E01a, Ex1a because the bottom electrodes of the even resistive change elements E01a, Ex1a are at the inhibit voltage VINH and the top electrodes of the even resistive change elements E01a, Ex1a are at 0 volts or ground. It is noted that leakage currents may flow through resistive change elements other than the resistive change elements in electrical communication with the odd bit line Boa(0), the resistive change elements in electrical communication with the odd bit line Boa(x), and the resistive change elements in electrical communication with the word line Wa(1) because voltages on other lines may be impacted by applying electrical stimuli to adjust resistive states of the odd resistive change elements O01a, Ox1a to low resistive states. It is also noted that leakage currents generally do not flow through the plurality of resistive change elements E00z-Oxyz in Section Z because the bottom electrodes of the plurality of resistive change elements E00z-Oxyz are at the inhibit voltage VINH and the top electrodes of the plurality of resistive change elements E00z-Oxyz are at the inhibit voltage VINH. It is additionally noted that leakage currents do not prevent the PROGRAMMING operation of the odd resistive change elements O01a, Ox1a when the leakage currents are much less than the amounts of the current IO01a and the current IOx1a. It is further noted that the voltage differences across the resistive change elements that cause the leakage currents do not disturb the resistive states of the resistive change elements because the voltage differences are less than a voltage limit for disturbing a resistive state of a resistive change element.

The PROGRAMMING operation to adjust resistive states of odd resistive change elements in electrical communication with word line Wa(1) in Section A to low resistive states proceeds, as similarly discussed above in step 312 of the flow chart 300, by restoring neutral voltage conditions for resistive change elements impacted by applying electrical stimuli to the odd resistive change elements O01a, Ox1a.

Neutral voltage conditions are restored for resistive change elements impacted by applying the electrical stimuli to the odd resistive change elements O01a, Ox1a by floating the plurality of odd bit lines Boa(0)-Boa(x) and applying the inhibit voltage VINH to the word line Wa(1). The plurality of even bit lines Bea(0)-Bea(x) are already floating because the plurality of even selection devices Nea0-Neax are turned off. The inhibit voltage VINH is already applied to the word lines Wa(0), Wa(y) because the word line driver circuits 110da, 11yda are already supplying the inhibit voltage VINH. The plurality of odd bit lines Boa(0)-Boa(x) are floated by disconnecting the plurality of odd bit lines Boa(0)-Boa(x) from the plurality of global bit lines GB3(0)-GB3(x) by turning off the plurality of odd selection devices Noa0-Noax. The plurality of odd selection devices Noa0-Noax are turned off by control logic, such as a processor, a controller, and a microcontroller, supplying a signal SSELo having a low level. The inhibit voltage VINH is applied to the word line Wa(1) by turning off the sink transistor 111sa and by the word line driver circuit 111da driving the voltage on the word line Wa(1) to the inhibit voltage VINH. The sink transistor 111sa is turned off by control logic, such as a processor, a controller, and a microcontroller, supplying the signal SK1a having a low level. The word line driver circuit 111da supplies the inhibit voltage VINH based on the signal ITE1a supplied by control logic, such as a processor, a controller, and a microcontroller. Thus, the inhibit voltage VINH is applied to the plurality of word lines Wa(0)-Wa(y) with the plurality of even bit lines Bea(0)-Bea(x) and the plurality of odd bit lines Boa(0)-Boa(x) floating so that voltages approximately equal to the inhibit voltage VINH are applied to the top electrodes and the bottom electrodes of the resistive change elements in the plurality of resistive change elements E00a-Oxya.

The PROGRAMMING operation to adjust resistive states of odd resistive change elements in electrical communication with word line Wa(1) in Section A to low resistive states continues, as similarly discussed above in step 314 of the flow chart 300, by biasing global bit lines impacted by applying electrical stimuli to the odd resistive change element O01a, Ox1a. Global bit lines impacted by applying electrical stimuli to the odd resistive change elements O01a, Ox1a are biased to the inhibit voltage VINH by floating the plurality of global bit lines GB3(0)-GB3(x) and applying the inhibit voltage VINH to the plurality of global bit lines GB3(0)-GB3(x). The plurality of global bit lines GB3(0)-GB3(x) are floated by disconnecting the plurality of global bit lines GB3(0)-GB3(x) from the plurality of odd bit lines Boa(0)-Boa(x) and disconnecting the plurality of global bit lines GB3(0)-GB3(x) from the plurality of bus lines BL30-BL3x. The plurality of global bit lines GB3(0)-GB3(x) are already disconnected from the plurality of even bit lines Bea(0)-Bea(x) because the plurality of even selection devices Nea0-Neax are turned off. The plurality of global bit lines GB3(0)-GB3(x) may be disconnected from the plurality of odd bit lines Boa(0)-Boa(x) as part of restoring neutral voltage conditions for resistive change elements impacted by applying the electrical stimuli to the odd resistive change elements O01a, Ox1a as discussed above. The plurality of global bit lines GB3(0)-GB3(x) are disconnected from the plurality of bus lines BL30-BL3x by turning off the plurality of PMOS transistors 180g-18xg. The plurality of PMOS transistors 180g-18xg are turned off by control logic, such as a processor, a controller, and a microcontroller, supplying a signal CD0 having a high level. The inhibit voltage VINH is applied to the plurality of global bit lines GB3(0)-GB3(x) by electrically connecting the plurality of global bit lines GB3(0)-GB3(x) to a power supply, a voltage source, a driver circuit, or other device that supplies the inhibit voltage VINH by turning on the plurality of NMOS transistors 130k-13xk. The plurality of NMOS transistors 130k-13xk are turned on by control logic, such as a processor, a controller, and a microcontroller, supplying a signal KEEPe having a high level and a signal KEEPo having a high level.

Referring now to FIGS. 1K-1, 1K-2, and 1K-3, a PROGRAMMING operation to adjust resistive states of odd resistive change elements in electrical communication with word line Wa(1) in Section A to high resistive states starts, as similarly discussed above in step 302 of the flow chart 300, by providing neutral voltage conditions for the plurality of resistive change elements E00a-Oxya in Section A and the plurality of resistive change elements E00z-Oxyz in Section Z. The neutral voltage conditions are provided for the plurality of resistive change elements E00a-Oxya in section A by floating the plurality of even bit lines Bea(0)-Bea(x) and the plurality of odd bit lines Boa(0)-Boa(x) and applying the inhibit voltage VINH to the plurality of word lines Wa(0)-Wa(y) with the plurality of even bit lines Bea(0)-Bea(x) and the plurality of odd bit lines Boa(0)-Boa(x) floating so that voltages approximately equal to the inhibit voltage VINH are applied to the top electrodes and the bottom electrodes of the resistive change elements in the plurality of resistive change elements E00a-Oxya. Floating a line refers to electrically connecting the line such that a voltage on the line exists due to a line capacitance of the line. The plurality of even bit lines Bea(0)-Bea(x) are floated by disconnecting the plurality of even bit lines Bea(0)-Bea(x) from the plurality of global bit lines GB3(0)-GB3(x) by turning off the plurality of even selection devices Nea0-Neax in Section A. The plurality of even selection devices Nea0-Neax are turned off by control logic, such as a processor, a controller, and a microcontroller, supplying a signal SSELea having a low level. The plurality of odd bit lines Boa(0)-Boa(x) are floated by disconnecting the plurality of odd bit lines Boa(0)-Boa(x) from the plurality of global bit lines GB3(0)-GB3(x) by turning off the plurality of odd selection devices Noa0-Noax in Section A. The plurality of odd selection devices Noa0-Noax are turned off by control logic, such as a processor, a controller, and a microcontroller, supplying a signal SSELoa having a low level. It is noted that control logic, such as a processor, a controller, and a microcontroller, supplying a signal SSELea having a low level and a signal SSELoa having a low level also turns off the first NMOS transistor 121a and the second NMOS transistor 122a of the reference line connection circuit 120a for Section A.

The inhibit voltage VINH is applied to the plurality of word lines Wa(0)-Wa(y) by the word line driver circuitry 110a for Section A driving voltages on the plurality of word lines Wa(0)-Wa(y) to the inhibit voltage VINH. The plurality of word line driver circuits 110da-11yda receive the system voltage VDD on the first power terminals because the first NMOS transistor 110pa is turned on by control logic, such as a processor, a controller, and a microcontroller, supplying the signal S0a having a high level and receive the inhibit voltage VINH on the second power terminals because the second NMOS transistor 111pa is turned on by the control logic supplying the signal S1a having a high level. The plurality of word line driver circuits 110da-11yda supply the inhibit voltage VINH based on the plurality of signals ITE0a-ITEya supplied by control logic, such as a processor, a controller, and a microcontroller. The plurality of sink transistors 110sa-11ysa are turned off because control logic, such as a processor, a controller, and a microcontroller, supplies the plurality of signals SK0a-SKya have low levels.

Driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating causes voltages on the plurality of word lines Wa(0)-Wa(y), voltages on the plurality of even bit lines Bea(0)-Bea(x), and voltages on the plurality of odd bit lines Boa(0)-Boa(x) to be approximately equal to the inhibit voltage VINH. Voltages on the plurality of even bit lines Bea(0)-Bea(x) and voltages on the plurality of odd bit lines Boa(0)-Boa(x) are approximately equal to the inhibit voltage VINH because currents flow from the plurality of word lines Wa(0)-Wa(y) through the plurality of resistive change elements E00a-Oxya into the plurality of even bit lines Bea(0)-Bea(x) and the plurality of odd bit lines Boa(0)-Boa(x). The inhibit voltage VINH exists on the plurality of even bit lines Bea(0)-Bea(x) and the plurality of odd bit lines Boa(0)-Boa(x) due to line capacitances because the plurality of even bit lines Bea(0)-Bea(x) and the plurality of odd bit lines Boa(0)-Boa(x) are floating. Thus, driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating results in application of voltages approximately equal to the inhibit voltage VINH to the top electrodes and the bottom electrodes of the resistive change elements in the plurality of resistive change elements E00a-Oxya. Additionally, driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating causes the voltages across resistive change elements in the plurality of resistive change elements E00a-Oxya to be approximately 0 volts.

The neutral voltage conditions are provided for the plurality of resistive change elements E00z-Oxyz in section Z by floating the plurality of even bit lines Bez(0)-Bez(x) and the plurality of odd bit lines Boz(0)-Boz(x) and applying the inhibit voltage VINH to the plurality of word lines Wz(0)-Wz(y) with the plurality of even bit lines Bez(0)-Bez(x) and the plurality of odd bit lines Boz(0)-Boz(x) floating so that voltages approximately equal to the inhibit voltage VINH are applied to the top electrodes and the bottom electrodes of the resistive change elements in the plurality of resistive change elements E00z-Oxyz. Floating a line refers to electrically connecting the line such that a voltage on the line exists due to a line capacitance of the line. The plurality of even bit lines Bez(0)-Bez(x) are floated by disconnecting the plurality of even bit lines Bez(0)-Bez(x) from the plurality of global bit lines GB3(0)-GB3(x) by turning off the plurality of even selection devices Nez0-Nezx in Section Z. The plurality of even selection devices Nez0-Nezx are turned off by control logic, such as a processor, a controller, and a microcontroller, supplying a signal SSELez having a low level. The plurality of odd bit lines Boz(0)-Boz(x) are floated by disconnecting the plurality of odd bit lines Boz(0)-Boz(x) from the plurality of global bit lines GB3(0)-GB3(x) by turning off the plurality of odd selection devices Noz0-Nozx in Section Z. The plurality of odd selection devices Noz0-Nozx are turned off by control logic, such as a processor, a controller, and a microcontroller, supplying a signal SSELoz having a low level. It is noted that control logic, such as a processor, a controller, and a microcontroller, supplying a signal SSELez having a low level and a signal SSELoz having a low level also turns off the first NMOS transistor 121z and the second NMOS transistor 122z of the reference line connection circuit 120z for Section Z. It is further noted that the reference line RL3 floats because the first NMOS transistor 121a and the second NMOS transistor 122a of the reference line connection circuit 120a for Section A are turned off and the first NMOS transistor 121z and the second NMOS transistor 122z of the reference line connection circuit 120z for Section Z are turned off.

The inhibit voltage VINH is applied to the plurality of word lines Wz(0)-Wz(y) by the word line driver circuitry 110z for Section Z driving voltages on the plurality of word lines Wz(0)-Wz(y) to the inhibit voltage VINH. The plurality of word line driver circuits 110dz-11ydz receive the system voltage VDD on the first power terminals because the first NMOS transistor 110pz is turned on by control logic, such as a processor, a controller, and a microcontroller, supplying the signal S0z having a high level and receive the inhibit voltage VINH on the second power terminals because the second NMOS transistor 111pz is turned on by the control logic supplying the signal S1z having a high level. The plurality of word line driver circuits 110dz-11ydz supply the inhibit voltage VINH based on the plurality of signals ITE0z-ITEyz supplied by control logic, such as a processor, a controller, and a microcontroller. The plurality of sink transistors 110sz-11ysz are turned off because control logic, such as a processor, a controller, and a microcontroller, supplies the plurality of signals SK0z-SKyz have low levels.

Driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating causes voltages on the plurality of word lines Wz(0)-Wz(y), voltages on the plurality of even bit lines Bez(0)-Bez(x), and voltages on the plurality of odd bit lines Boz(0)-Boz(x) to be approximately equal to the inhibit voltage VINH. Voltages on the plurality of even bit lines Bez(0)-Bez(x) and voltages on the plurality of odd bit lines Boz(0)-Boz(x) are approximately equal to the inhibit voltage VINH because currents flow from the plurality of word lines Wz(0)-Wz(y) through the plurality of resistive change elements E00z-Oxyz into the plurality of even bit lines Bez(0)-Bez(x) and the plurality of odd bit lines Boz(0)-Boz(x). The inhibit voltage VINH exists on the plurality of even bit lines Bez(0)-Bez(x) and the plurality of odd bit lines Boz(0)-Boz(x) due to line capacitances because the plurality of even bit lines Bez(0)-Bez(x) and the plurality of odd bit lines Boz(0)-Boz(x) are floating. Thus, driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating results in application of voltages approximately equal to the inhibit voltage VINH to the top electrodes and the bottom electrodes of the resistive change elements in the plurality of resistive change elements E00z-Oxyz. Additionally, driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating causes the voltages across resistive change elements in the plurality of resistive change elements E00z-Oxyz to be approximately 0 volts.

The PROGRAMMING operation to adjust resistive states of odd resistive change elements in electrical communication with word line Wa(1) in Section A to high resistive states continues, as similarly discussed above in step 304 of the flow chart 300, by biasing the plurality of global bit lines GB3(0)-GB3(x). The plurality of global bit lines GB3(0)-GB3(x) are biased to the inhibit voltage VINH by floating the plurality of global bit lines GB3(0)-GB3(x) and applying the inhibit voltage VINH to the plurality of global bit lines GB3(0)-GB3(x). The plurality of global bit lines GB3(0)-GB3(x) are floated by disconnecting the plurality of global bit lines GB3(0)-GB3(x) from the plurality of even bit lines Bea(0)-Bea(x) and the plurality of odd bit lines Boa(0)-Boa(x) in Section A, the plurality of even bit lines Bez(0)-Bez(x) and the plurality of odd bit lines Boz(0)-Boz(x) in Section Z, and the plurality of bus lines BL30-BL3x. The plurality of global bit lines GB3(0)-GB3(x) may be disconnected from the plurality of even bit lines Bea(0)-Bea(x) and the plurality of odd bit lines Boa(0)-Boa(x) in Section A as part of providing neutral voltage conditions for the plurality of resistive change elements E00a-Oxya in Section A as discussed above. The plurality of global bit lines GB3(0)-GB3(x) may be disconnected from the plurality of even bit lines Bez(0)-Bez(x) and the plurality of odd bit lines Boz(0)-Boz(x) in Section Z as part of providing neutral voltage conditions for the plurality of resistive change elements E00z-Oxyz in Section Z as discussed above. The plurality of global bit lines GB3(0)-GB3(x) are disconnected from the plurality of bus lines BL30-BL3x by turning off the plurality of PMOS transistors 180g-18xg in the global bit line connection circuit 180. The plurality of PMOS transistors 180g-18xg are turned off by control logic, such as a processor, a controller, and a microcontroller, supplying a signal CD0 having a high level. The inhibit voltage VINH is applied to the plurality of global bit lines GB3(0)-GB3(x) by electrically connecting the plurality of global bit lines GB3(0)-GB3(x) to a power supply, a voltage source, a driver circuit, or other device that supplies the inhibit voltage VINH by turning on the plurality of NMOS transistors 130k-13xk in the keeper circuit 130. The plurality of NMOS transistors 130k-13xk are turned on by control logic, such as a processor, a controller, and a microcontroller, supplying a signal KEEPe having a high level and a signal KEEPo having a high level.

The PROGRAMMING operation to adjust resistive states of odd resistive change elements in electrical communication with word line Wa(1) in Section A to high resistive states proceeds, as similarly discussed above in step 306 of the flow chart 300, by selecting the odd resistive change elements O01a, Ox1a in electrical communication with word line Wa(1) in Section A from the plurality of resistive change elements E00a-Oxya in Section A and the plurality of resistive change elements E00z-Oxyz in Section Z. The odd resistive change elements O01a, Ox1a in electrical communication with word line Wa(1) in Section A are selected from the plurality of resistive change elements E00a-Oxya in Section A and the plurality of resistive change elements E00z-Oxyz in Section Z by control logic, such as a processor, a controller, and a microcontroller. The resistive change elements E00a-Ox0a, E01a, Ex1a, and E0ya-Oxya in the plurality of resistive change elements E00a-Oxya in Section A and the plurality of resistive change elements E00z-Oxyz in Section Z that are not selected are referred to as unselected resistive change elements.

The PROGRAMMING operation to adjust resistive states of odd resistive change elements in electrical communication with word line Wa(1) in Section A to high resistive states continues, as similarly discussed above in step 308 of the flow chart 300, by preparing the exemplary DDR compatible implementation of the first exemplary architecture for applying electrical stimuli to the odd resistive change elements O01, Ox1a. The exemplary DDR compatible implementation of the first exemplary architecture is prepared for applying electrical stimuli to the odd resistive change elements O01, Ox1a by changing electrical connections of the plurality of odd bit lines Boa(0)-Boa(x), changing electrical connections of the plurality of global bit lines GB3(0)-GB3(x), and disconnecting a power supply, a voltage source, a driver circuit, or other device that supplies the inhibit voltage VINH from the plurality of global bit lines GB3(0)-GB3(x). The electrical connections of the plurality of odd bit lines Boa(0)-Boa(x) and the electrical connections of the plurality of global bit lines GB3(0)-GB3(x) are changed and a power supply, a voltage source, a driver circuit, or other device that supplies the inhibit voltage VINH is disconnected from the plurality of global bit lines GB3(0)-GB3(x) so that voltages on the plurality of odd bit lines Boa(0)-Boa(x) can be driven to voltages for applying electrical stimuli to the odd resistive change elements O01a, Ox1a. The electrical connections of the plurality of odd bit lines Boa(0)-Boa(x) are changed so that the plurality of odd bit lines Boa(0)-Boa(x) are in electrical communication with the plurality of global bit lines GB3(0)-GB3(x). The plurality of odd bit lines Boa(0)-Boa(x) are electrically connected to the plurality of global bit lines GB3(0)-GB3(x) by turning on the plurality of odd selection devices Noa0-Noax. The plurality of odd selection devices Noa0-Noax are turned on by control logic, such as a processor, a controller, and a microcontroller, supplying a signal SSELo having a high level. It is also noted that the control logic supplying a signal SSELo having a high level also turns on the second NMOS transistor 122a of the reference line connection circuit 120a for Section A and drives the voltage on the reference line RL3 to the inhibit voltage VINH by electrically connecting the reference line RL3 through the second NMOS transistor 122a of the reference line connection circuit 120a and the second NMOS transistor 111pa of the word line driver circuitry 110a to a power supply, a voltage source, a driver circuit, or other device that supplies the inhibit voltage VINH. It is further noted that, as discussed above with respect to providing neutral voltage conditions for the plurality of resistive change elements E00a-Oxya in Section A and the plurality of resistive change elements E00z-Oxyz in Section Z, the second NMOS transistor 111pa of the word line driver circuitry 110a is turned on.

The electrical connections of the plurality of global bit lines GB3(0)-GB3(x) are changed so that the plurality of global bit lines GB3(0)-GB3(x) are in electrical communication with the plurality of odd bit lines Boa(0)-Boa(x) and the plurality of bus lines BL30-BL3x. The plurality of global bit lines GB3(0)-GB3(x) are electrically connected to the plurality of odd bit lines Boa(0)-Boa(x) by turning on the plurality of odd selection devices Noa0-Noax as discussed above. The plurality of global bit lines GB3(0)-GB3(x) are electrically connected to the plurality of bus lines BL30-BL3x by turning on the plurality of PMOS transistors 180g-18xg. The plurality of PMOS transistors 180g-18xg are turned on by control logic, such as a processor, a controller, and a microcontroller, supplying a signal CD0 having a low level. A power supply, a voltage source, a driver circuit, or other device that supplies the inhibit voltage VINH is disconnected from the plurality of global bit lines GB3(0)-GB3(x) by turning off the plurality of NMOS transistors 130k-13xk. The plurality of NMOS transistors 130k-13xk are turned off by control logic, such as a processor, a controller, and a microcontroller, supplying a signal KEEPe having a low level and a signal KEEPo having a low level.

The PROGRAMMING operation to adjust resistive states of odd resistive change elements in electrical communication with word line Wa(1) in Section A to high resistive states proceeds, as similarly discussed above in step 310 of the flow chart 300, by applying electrical stimuli to the odd resistive change elements O01a, Ox1a to adjust resistive states of the odd resistive change elements O01a, Ox1a to high resistive states. Electrical stimuli to adjust resistive states of the odd resistive change elements O01a, Ox1a to high resistive states cause current flow from the top electrodes TE of the odd resistive change elements O01a, Ox1a to the bottom electrodes BE of the odd resistive change elements O01a, Ox1a and the magnitudes of the voltages of the electrical stimuli are approximately equal to the system voltage VDD. As discussed above, providing neutral voltage conditions for the plurality of resistive change elements E00a-Oxya in Section A causes voltages on the plurality of word lines Wa(0)-Wa(y), voltages on the plurality of even bit lines Bea(0)-Bea(x), and voltages on the plurality of odd bit lines Boa(0)-Boa(x) to be approximately equal to the inhibit voltage VINH. Also, as discussed above, the plurality of global bit lines GB3(0)-GB3(x) are biased to the inhibit voltage VINH. Thus, electrical stimuli to adjust resistive states of the odd resistive change elements O01a, Ox1a to high resistive states are applied to the odd resistive change elements O01a, Ox1a by driving the voltage on the word line Wa(1) from approximately the inhibit voltage VINH to the system voltage VDD, driving the voltage on the global bit line GB3(0) and the voltage on the odd bit line Boa(0) from approximately the inhibit voltage VINH to 0 volts or ground, and driving the voltage on the global bit line GB3(x) and the voltage on the odd bit line Boa(x) from approximately the inhibit voltage VINH to 0 volts or ground.

The voltage transition of the voltage on the word line Wa(1) generally corresponds with the voltage transition of the voltage on the top electrodes TE of the odd resistive change elements O01, Ox1a because the voltage on the word line Wa(1) generally corresponds with the voltage on the top electrodes TE of the odd resistive change elements O01a, Ox1a. The voltage transition of the voltage on the odd bit line Boa(0) generally corresponds with the voltage transition of the voltage on the bottom electrode BE of the resistive change element O01a because the voltage on the odd bit line Boa(0) generally corresponds with the voltage on the bottom electrode BE of the resistive change element O01a. The voltage transition of the voltage on the odd bit line Boa(x) generally corresponds with the voltage transition of the voltage on the bottom electrode BE of the resistive change element Ox1a because the voltage on the odd bit line Boa(x) generally corresponds with the voltage on the bottom electrode BE of the resistive change element Ox1a. The magnitude of the voltage transitions for applying the electrical stimuli to the odd resistive change elements O01a, Ox1a to adjust resistive states of the odd resistive change elements O01a, Ox1a to high resistive states are reduced because the voltage applied to the top electrodes TE and the voltage applied to the bottom electrodes BE are not required to transition by the magnitude of the system voltage VDD. A voltage transition of the system voltage VDD minus the inhibit voltage VINH is required to place the top electrodes at the system voltage VDD and a voltage transition of 0 volts or ground minus the inhibit voltage VINH is required to place the bottom electrodes at 0 volts or ground. For example, when the inhibit voltage VINH is VDD/2 (half of the system voltage VDD), a voltage transition of VDD−VDD/2=VDD/2 is required to place the top electrodes at the system voltage VDD and a voltage transition of 0 volts−VDD/2=−VDD/2 is required to place the bottom electrodes at 0 volts or ground. Further, the number of voltage transitions for applying the electrical stimulus to adjust resistive states of the odd resistive change elements O01a, Ox1a to high resistive states is reduced because only voltages on the word line Wa(1), the global bit lines GB3(0)-GB3(x), and the odd bit lines Boa(0)-Boa(x) are adjusted for applying electrical stimuli to adjust resistive states of the odd resistive change elements O01a, Ox1a to high resistive states. It is noted that applying the inhibit voltage VINH to a top electrode, a bottom electrode, or both a top electrode and a bottom electrode of a resistive change element limits a voltage applied across a resistive change element to a voltage less than a voltage limit for disturbing a resistive state of a resistive change element while applying electrical stimuli to the odd resistive change elements O01a, Ox1a to adjust resistive states of the odd resistive change elements O01a, Ox1a to high resistive states.

The voltage on the word line Wa(1) is driven from the inhibit voltage VINH to the system voltage VDD by changing the voltage supplied by the word line driver circuit 111da from the inhibit voltage VINH to the system voltage VDD. The word line driver circuit 111da changes from supplying the inhibit voltage VINH to the system voltage VDD based on a signal ITE1a supplied by control logic, such as a processor, a controller, and a microcontroller. The voltages on the plurality of global bit lines GB3(0)-GB3(x) and the voltages on the plurality of odd bit lines Boa(0)-Boa(x) are driven from the inhibit voltage VINH to 0 volts or ground by the plurality of write buffer circuits 1500-150x supplying 0 volts or ground. The plurality of write buffer circuits 1500-150x supply 0 volts or ground based on the write set signals WR00-WR0x and the write reset signals WR10-WR1x supplied by control logic, such as a processor, a controller, and a microcontroller.

Figures 1, 1K:
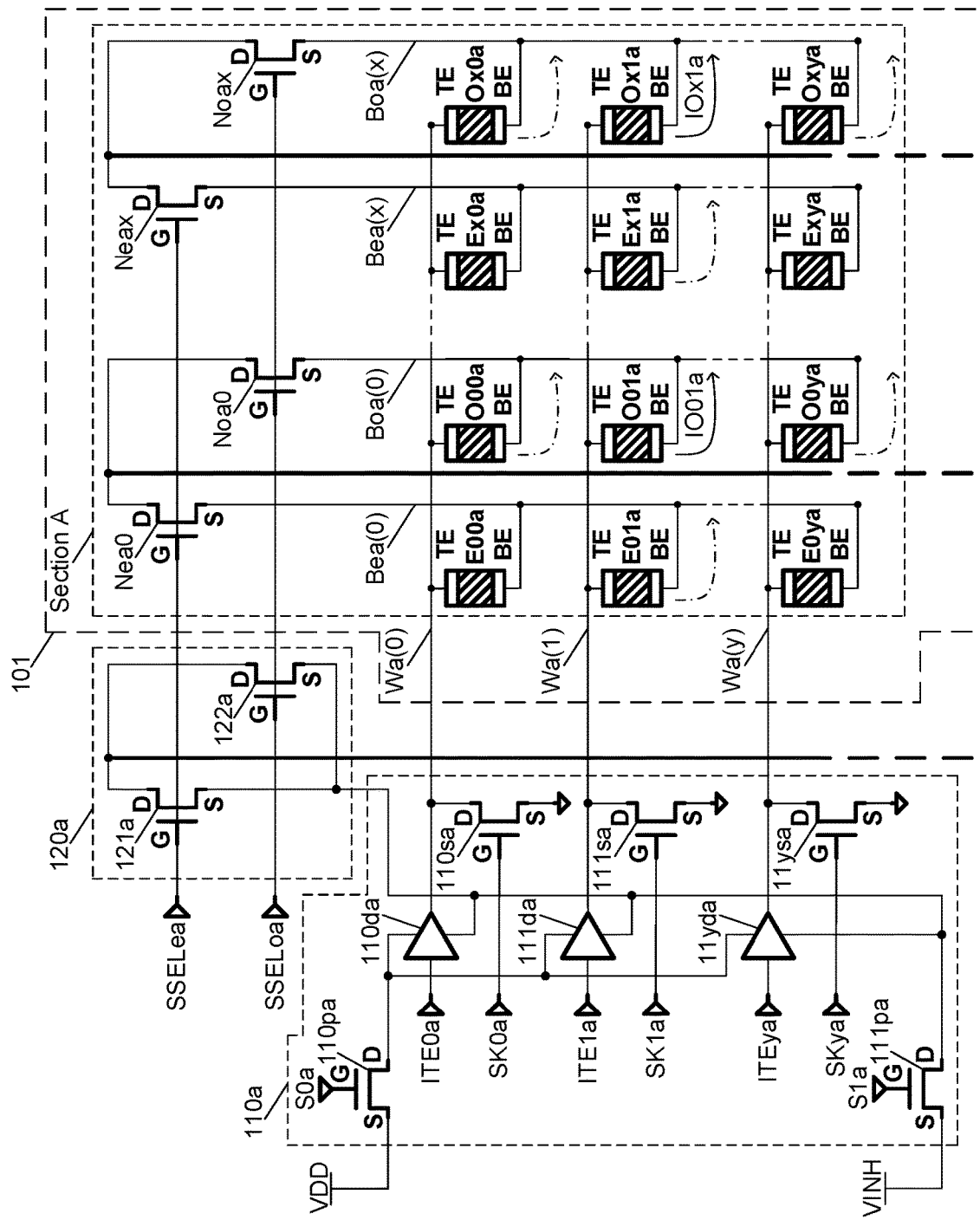
Figures 1, 1K, 2:
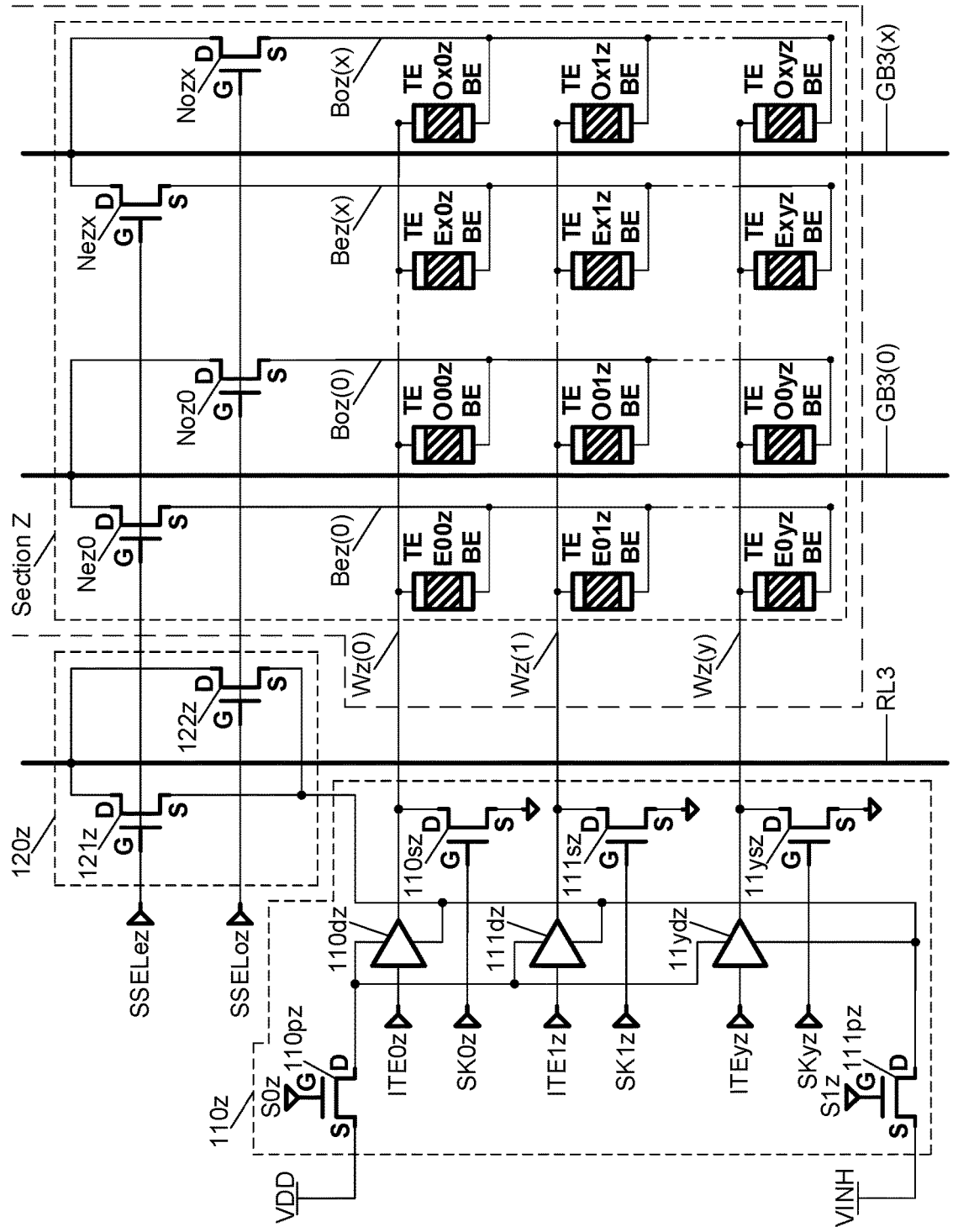
Figures 1, 1K, 2, 3:
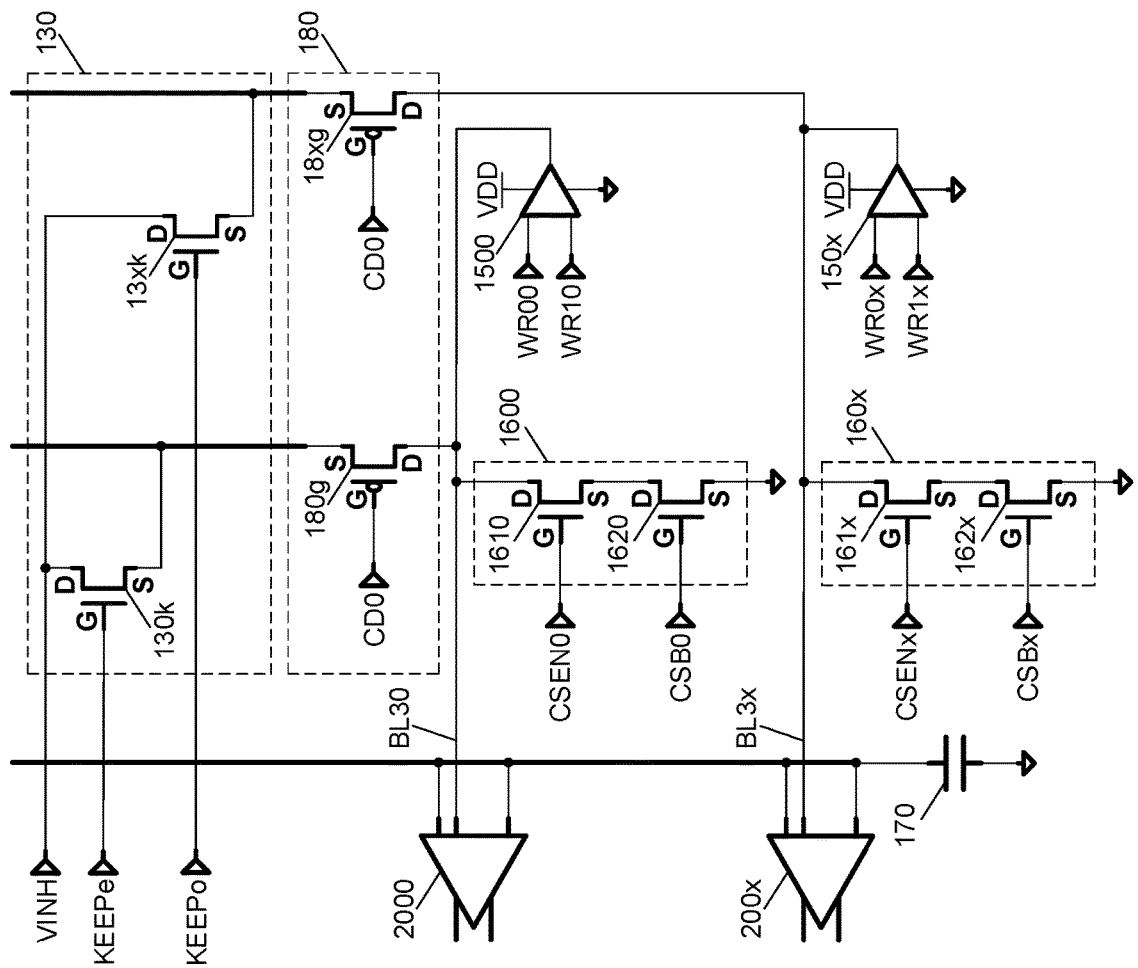

As shown in FIG. 1K-1, a current IO01a flows through the resistive change element O01a from the top electrode TE to the bottom electrode BE because the top electrode TE is at the system voltage VDD and the bottom electrode BE is at 0 volts or ground. Also, as shown in FIG. 1K-1, a current IOx1a flows through the resistive change element Ox1a from the top electrode TE to the bottom electrode BE because the top electrode TE is at the system voltage VDD and the bottom electrode BE is at 0 volts or ground. FIG. 1K-1 also shows leakage currents flowing through the resistive change elements O00a, O0ya in electrical communication with the odd bit line Boa(0), leakage currents flowing through the resistive change elements Ox0a, Oxya in electrical communication with the odd bit line Boa(x), and leakage currents flowing through the even resistive change elements E01a, Ex1a in electrical communication with the word line Wa(1). The leakage currents are shown using dashed lines in FIG. 1K-1. Leakage currents flow through the resistive change elements O00a, O0ya because the top electrodes of the resistive change elements O00a, O0ya are at the inhibit voltage VINH and the bottom electrodes of the resistive change elements O00a, O0ya are at 0 volts or ground. Leakage currents flow through the resistive change elements Ox0a, Oxya because the top electrodes of the resistive change elements Ox0a, Oxya are at the inhibit voltage VINH and the bottom electrodes of the resistive change elements Ox0a, Oxya are at 0 volts or ground. Leakage currents flow through the even resistive change elements E01a, Ex1a because the top electrodes of the even resistive change elements E01a, Ex1a are at the system voltage VDD and the bottom electrodes of the even resistive change elements E01a, Ex1a are at the inhibit voltage VINH. It is noted that leakage currents may flow through resistive change elements other than the resistive change elements in electrical communication with the odd bit line Boa(0), the resistive change elements in electrical communication with the odd bit line Boa(x), and the resistive change elements in electrical communication with the word line Wa(1) because voltages on other lines may be impacted by applying electrical stimuli to adjust resistive states of the odd resistive change elements O01a, Ox1a to high resistive states. It is also noted that leakage currents generally do not flow through the plurality of resistive change elements E00z-Oxyz in Section Z because the bottom electrodes of the plurality of resistive change elements E00z-Oxyz are at the inhibit voltage VINH and the top electrodes of the plurality of resistive change elements E00z-Oxyz are at the inhibit voltage VINH. It is additionally noted that leakage currents do not prevent the PROGRAMMING operation of the odd resistive change elements O01a, Ox1a when the leakage currents are much less than the amounts of the current IO01a and the current IOx1a. It is further noted that the voltage differences across the resistive change elements that cause the leakage currents do not disturb the resistive states of the resistive change elements because the voltage differences are less than a voltage limit for disturbing a resistive state of a resistive change element.

The PROGRAMMING operation to adjust resistive states of odd resistive change elements in electrical communication with word line Wa(1) in Section A to high resistive states proceeds, as similarly discussed above in step 312 of the flow chart 300, by restoring neutral voltage conditions for resistive change elements impacted by applying electrical stimuli to the odd resistive change elements O01a, Ox1a. Neutral voltage conditions are restored for resistive change elements impacted by applying the electrical stimuli to the odd resistive change elements O01a, Ox1a by floating the plurality of odd bit lines Boa(0)-Boa(x) and applying the inhibit voltage VINH to the word line Wa(1). The plurality of even bit lines Bea(0)-Bea(x) are already floating because the plurality of even selection devices Nea0-Neax are turned off. The inhibit voltage VINH is already applied to the word lines Wa(0), Wa(y) because the word line driver circuits 110da, 11yda are already supplying the inhibit voltage VINH. The plurality of odd bit lines Boa(0)-Boa(x) are floated by disconnecting the plurality of odd bit lines Boa(0)-Boa(x) from the plurality of global bit lines GB3(0)-GB3(x) by turning off the plurality of odd selection devices Noa0-Noax. The plurality of odd selection devices Noa0-Noax are turned off by control logic, such as a processor, a controller, and a microcontroller, supplying a signal SSELo having a low level. The inhibit voltage VINH is applied to the word line Wa(1) by changing the voltage supplied by the word line driver circuit 111da from the system voltage VDD to the inhibit voltage VINH. The word line driver circuit 111da changes from supplying the system voltage VDD to the inhibit voltage VINH based on a signal ITE1a supplied by control logic, such as a processor, a controller, and a microcontroller. Thus, the inhibit voltage VINH is applied to the plurality of word lines Wa(0)-Wa(y) with the plurality of even bit lines Bea(0)-Bea(x) and the plurality of odd bit lines Boa(0)-Boa(x) floating so that voltages approximately equal to the inhibit voltage VINH are applied to the top electrodes and the bottom electrodes of the resistive change elements in the plurality of resistive change elements E00a-Oxya.

The PROGRAMMING operation to adjust resistive states of odd resistive change elements in electrical communication with word line Wa(1) in Section A to high resistive states continues, as similarly discussed above in step 314 of the flow chart 300, by biasing global bit lines impacted by applying electrical stimuli to the odd resistive change element O01a, Ox1a. Global bit lines impacted by applying electrical stimuli to the odd resistive change elements O01a, Ox1a are biased to the inhibit voltage VINH by floating the plurality of global bit lines GB3(0)-GB3(x) and applying the inhibit voltage VINH to the plurality of global bit lines GB3(0)-GB3(x). The plurality of global bit lines GB3(0)-GB3(x) are floated by disconnecting the plurality of global bit lines GB3(0)-GB3(x) from the plurality of odd bit lines Boa(0)-Boa(x) and disconnecting the plurality of global bit lines GB3(0)-GB3(x) from the plurality of bus lines BL30-BL3x. The plurality of global bit lines GB3(0)-GB3(x) are already disconnected from the plurality of even bit lines Bea(0)-Bea(x) because the plurality of even selection devices Nea0-Neax are turned off. The plurality of global bit lines GB3(0)-GB3(x) may be disconnected from the plurality of odd bit lines Boa(0)-Boa(x) as part of restoring neutral voltage conditions for resistive change elements impacted by applying the electrical stimuli to the odd resistive change elements O01a, Ox1a as discussed above. The plurality of global bit lines GB3(0)-GB3(x) are disconnected from the plurality of bus lines BL30-BL3x by turning off the plurality of PMOS transistors 180g-18xg. The plurality of PMOS transistors 180g-18xg are turned off by control logic, such as a processor, a controller, and a microcontroller, supplying a signal CD0 having a high level. The inhibit voltage VINH is applied to the plurality of global bit lines GB3(0)-GB3(x) by electrically connecting the plurality of global bit lines GB3(0)-GB3(x) to a power supply, a voltage source, a driver circuit, or other device that supplies the inhibit voltage VINH by turning on the plurality of NMOS transistors 130k-13xk. The plurality of NMOS transistors 130k-13xk are turned on by control logic, such as a processor, a controller, and a microcontroller, supplying a signal KEEPe having a high level and a signal KEEPo having a high level.

Referring now to FIGS. 1L-1, 1L-2, and 1L-3, a READ operation of odd resistive change elements in electrical communication with word line Wa(1) starts, as similarly discussed above in step 402 of the flow chart 400, by providing neutral voltage conditions for the plurality of resistive change elements E00a-Oxya in Section A and the plurality of resistive change elements E00z-Oxyz in Section Z. The neutral voltage conditions are provided for the plurality of resistive change elements E00a-Oxya in section A by floating the plurality of even bit lines Bea(0)-Bea(x) and the plurality of odd bit lines Boa(0)-Boa(x) and applying the inhibit voltage VINH to the plurality of word lines Wa(0)-Wa(y) with the plurality of even bit lines Bea(0)-Bea(x) and the plurality of odd bit lines Boa(0)-Boa(x) floating so that voltages approximately equal to the inhibit voltage VINH are applied to the top electrodes and the bottom electrodes of the resistive change elements in the plurality of resistive change elements E00a-Oxya. Floating a line refers to electrically connecting the line such that a voltage on the line exists due to a line capacitance of the line. The plurality of even bit lines Bea(0)-Bea(x) are floated by disconnecting the plurality of even bit lines Bea(0)-Bea(x) from the plurality of global bit lines GB3(0)-GB3(x) by turning off the plurality of even selection devices Nea0-Neax in Section A. The plurality of even selection devices Nea0-Neax are turned off by control logic, such as a processor, a controller, and a microcontroller, supplying a signal SSELea having a low level. The plurality of odd bit lines Boa(0)-Boa(x) are floated by disconnecting the plurality of odd bit lines Boa(0)-Boa(x) from the plurality of global bit lines GB3(0)-GB3(x) by turning off the plurality of odd selection devices Noa0-Noax in Section A. The plurality of odd selection devices Noa0-Noax are turned off by control logic, such as a processor, a controller, and a microcontroller, supplying a signal SSELoa having a low level. It is noted that control logic, such as a processor, a controller, and a microcontroller, supplying a signal SSELea having a low level and a signal SSELoa having a low level also turns off the first NMOS transistor 121a and the second NMOS transistor 122a of the reference line connection circuit 120a for Section A.

The inhibit voltage VINH is applied to the plurality of word lines Wa(0)-Wa(y) by the word line driver circuitry 110a for Section A driving voltages on the plurality of word lines Wa(0)-Wa(y) to the inhibit voltage VINH. The plurality of word line driver circuits 110da-11yda receive the system voltage VDD on the first power terminals because the first NMOS transistor 110pa is turned on by control logic, such as a processor, a controller, and a microcontroller, supplying the signal S0a having a high level and receive the inhibit voltage VINH on the second power terminals because the second NMOS transistor 111pa is turned on by the control logic supplying the signal Sla having a high level. The plurality of word line driver circuits 110da-11yda supply the inhibit voltage VINH based on the plurality of signals ITE0a-ITEya supplied by control logic, such as a processor, a controller, and a microcontroller. The plurality of sink transistors 110sa-11ysa are turned off because control logic, such as a processor, a controller, and a microcontroller, supplies the plurality of signals SK0a-SKya have low levels.

Driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating causes voltages on the plurality of word lines Wa(0)-Wa(y), voltages on the plurality of even bit lines Bea(0)-Bea(x), and voltages on the plurality of odd bit lines Boa(0)-Boa(x) to be approximately equal to the inhibit voltage VINH. Voltages on the plurality of even bit lines Bea(0)-Bea(x) and voltages on the plurality of odd bit lines Boa(0)-Boa(x) are approximately equal to the inhibit voltage VINH because currents flow from the plurality of word lines Wa(0)-Wa(y) through the plurality of resistive change elements E00a-Oxya into the plurality of even bit lines Bea(0)-Bea(x) and the plurality of odd bit lines Boa(0)-Boa(x). The inhibit voltage VINH exists on the plurality of even bit lines Bea(0)-Bea(x) and the plurality of odd bit lines Boa(0)-Boa(x) due to line capacitances because the plurality of even bit lines Bea(0)-Bea(x) and the plurality of odd bit lines Boa(0)-Boa(x) are floating. Thus, driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating results in application of voltages approximately equal to the inhibit voltage VINH to the top electrodes and the bottom electrodes of the resistive change elements in the plurality of resistive change elements E00a-Oxya. Additionally, driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating causes the voltages across resistive change elements in the plurality of resistive change elements E00a-Oxya to be approximately 0 volts.

The neutral voltage conditions are provided for the plurality of resistive change elements E00z-Oxyz in section Z by floating the plurality of even bit lines Bez(0)-Bez(x) and the plurality of odd bit lines Boz(0)-Boz(x) and applying the inhibit voltage VINH to the plurality of word lines Wz(0)-Wz(y) with the plurality of even bit lines Bez(0)-Bez(x) and the plurality of odd bit lines Boz(0)-Boz(x) floating so that voltages approximately equal to the inhibit voltage VINH are applied to the top electrodes and the bottom electrodes of the resistive change elements in the plurality of resistive change elements E00z-Oxyz. Floating a line refers to electrically connecting the line such that a voltage on the line exists due to a line capacitance of the line. The plurality of even bit lines Bez(0)-Bez(x) are floated by disconnecting the plurality of even bit lines Bez(0)-Bez(x) from the plurality of global bit lines GB3(0)-GB3(x) by turning off the plurality of even selection devices Nez0-Nezx in Section Z. The plurality of even selection devices Nez0-Nezx are turned off by control logic, such as a processor, a controller, and a microcontroller, supplying a signal SSELez having a low level. The plurality of odd bit lines Boz(0)-Boz(x) are floated by disconnecting the plurality of odd bit lines Boz(0)-Boz(x) from the plurality of global bit lines GB3(0)-GB3(x) by turning off the plurality of odd selection devices Noz0-Nozx in Section Z. The plurality of odd selection devices Noz0-Nozx are turned off by control logic, such as a processor, a controller, and a microcontroller, supplying a signal SSELoz having a low level. It is noted that control logic, such as a processor, a controller, and a microcontroller, supplying a signal SSELez having a low level and a signal SSELoz having a low level also turns off the first NMOS transistor 121z and the second NMOS transistor 122z of the reference line connection circuit 120z for Section Z. It is further noted that the reference line RL3 floats because the first NMOS transistor 121a and the second NMOS transistor 122a of the reference line connection circuit 120a for Section A are turned off and the first NMOS transistor 121z and the second NMOS transistor 122z of the reference line connection circuit 120z for Section Z are turned off.

The inhibit voltage VINH is applied to the plurality of word lines Wz(0)-Wz(y) by the word line driver circuitry 110z for Section Z driving voltages on the plurality of word lines Wz(0)-Wz(y) to the inhibit voltage VINH. The plurality of word line driver circuits 110dz-11ydz receive the system voltage VDD on the first power terminals because the first NMOS transistor 110pz is turned on by control logic, such as a processor, a controller, and a microcontroller, supplying the signal S0z having a high level and receive the inhibit voltage VINH on the second power terminals because the second NMOS transistor 111pz is turned on by the control logic supplying the signal S1z having a high level. The plurality of word line driver circuits 110dz-11ydz supply the inhibit voltage VINH based on the plurality of signals ITE0z-ITEyz supplied by control logic, such as a processor, a controller, and a microcontroller. The plurality of sink transistors 110sz-11ysz are turned off because control logic, such as a processor, a controller, and a microcontroller, supplies the plurality of signals SK0z-SKyz have low levels.

Driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating causes voltages on the plurality of word lines Wz(0)-Wz(y), voltages on the plurality of even bit lines Bez(0)-Bez(x), and voltages on the plurality of odd bit lines Boz(0)-Boz(x) to be approximately equal to the inhibit voltage VINH. Voltages on the plurality of even bit lines Bez(0)-Bez(x) and voltages on the plurality of odd bit lines Boz(0)-Boz(x) are approximately equal to the inhibit voltage VINH because currents flow from the plurality of word lines Wz(0)-Wz(y) through the plurality of resistive change elements E00z-Oxyz into the plurality of even bit lines Bez(0)-Bez(x) and the plurality of odd bit lines Boz(0)-Boz(x). The inhibit voltage VINH exists on the plurality of even bit lines Bez(0)-Bez(x) and the plurality of odd bit lines Boz(0)-Boz(x) due to line capacitances because the plurality of even bit lines Bez(0)-Bez(x) and the plurality of odd bit lines Boz(0)-Boz(x) are floating. Thus, driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating results in application of voltages approximately equal to the inhibit voltage VINH to the top electrodes and the bottom electrodes of the resistive change elements in the plurality of resistive change elements E00z-Oxyz. Additionally, driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating causes the voltages across resistive change elements in the plurality of resistive change elements E00z-Oxyz to be approximately 0 volts.

The READ operation of odd resistive change elements in electrical communication with word line Wa(1) in Section A continues, as similarly discussed above in step 404 of the flow chart 400, by biasing the plurality of global bit lines GB3(0)-GB3(x). The plurality of global bit lines GB3(0)-GB3(x) are biased to the inhibit voltage VINH by floating the plurality of global bit lines GB3(0)-GB3(x) and applying the inhibit voltage VINH to the plurality of global bit lines GB3(0)-GB3(x). The plurality of global bit lines GB3(0)-GB3(x) are floated by disconnecting the plurality of global bit lines GB3(0)-GB3(x) from the plurality of even bit lines Bea(0)-Bea(x) and the plurality of odd bit lines Boa(0)-Boa(x) in Section A, the plurality of even bit lines Bez(0)-Bez(x) and the plurality of odd bit lines Boz(0)-Boz(x) in Section Z, and the plurality of bus lines BL30-BL3x. The plurality of global bit lines GB3(0)-GB3(x) may be disconnected from the plurality of even bit lines Bea(0)-Bea(x) and the plurality of odd bit lines Boa(0)-Boa(x) in Section A as part of providing neutral voltage conditions for the plurality of resistive change elements E00a-Oxya in Section A as discussed above. The plurality of global bit lines GB3(0)-GB3(x) may be disconnected from the plurality of even bit lines Bez(0)-Bez(x) and the plurality of odd bit lines Boz(0)-Boz(x) in Section Z as part of providing neutral voltage conditions for the plurality of resistive change elements E00z-Oxyz in Section Z as discussed above. The plurality of global bit lines GB3(0)-GB3(x) are disconnected from the plurality of bus lines BL30-BL3x by turning off the plurality of PMOS transistors 140g-14xg in the global bit line connection circuit 140. The plurality of PMOS transistors 140g-14xg are turned off by control logic, such as a processor, a controller, and a microcontroller, supplying a plurality of signals YD0-YDx having high levels. The inhibit voltage VINH is applied to the plurality of global bit lines GB3(0)-GB3(x) by electrically connecting the plurality of global bit lines GB3(0)-GB3(x) to a power supply, a voltage source, a driver circuit, or other device that supplies the inhibit voltage VINH by turning on the plurality of NMOS transistors 130k-13xk in the keeper circuit 130. The plurality of NMOS transistors 130k-13xk are turned on by control logic, such as a processor, a controller, and a microcontroller, supplying a signal KEEPe having a high level and a signal KEEPo having a high level.

The READ operation of odd resistive change elements in electrical communication with word line Wa(1) in Section A proceeds, as similarly discussed above in step 406 of the flow chart 400, by selecting the odd resistive change elements O01a, Ox1a in electrical communication with word line Wa(1) in Section A from the plurality of resistive change elements E00a-Oxya in Section A and the plurality of resistive change elements E00z-Oxyz in Section Z. The odd resistive change elements O01a, Ox1a in electrical communication with word line Wa(1) in Section A are selected from the plurality of resistive change elements E00a-Oxya in Section A and the plurality of resistive change elements E00z-Oxyz in Section Z by control logic, such as a processor, a controller, and a microcontroller. The resistive change elements E00a-Ox0a, E01a, Ex1a, and E0ya-Oxya in the plurality of resistive change elements E00a-Oxya in Section A and the plurality of resistive change elements E00z-Oxyz in Section Z that are not selected are referred to as unselected resistive change elements.

The READ operation of odd resistive change elements in electrical communication with word line Wa(1) in Section A continues, as similarly discussed above in step 408 of the flow chart 400, by preparing the exemplary DDR compatible implementation of the first exemplary architecture for determining resistive states of the odd resistive change elements O01a, Ox1a. The exemplary DDR compatible implementation of the first exemplary architecture is prepared for determining resistive states of the odd resistive change elements O01a, Ox1a by driving the voltage on the reference line RL3 to the inhibit voltage VINH, changing electrical connections of the plurality of odd bit lines Boa(0)-Boa(x), changing electrical connections of the plurality of global bit lines GB3(0)-GB3(0), and disconnecting a power supply, a voltage source, a driver circuit, or the device that supplies the inhibit voltage VINH from the plurality of global bit lines GB3(0)-GB3(x). The voltage on the reference line RL3 is driven to the inhibit voltage VINH by electrically connecting the reference line RL3 through the second NMOS transistor 122a of the reference line connection circuit 120a and the second NMOS transistor 111pa of the word line driver circuit 110a to a power supply, a voltage source, a driver circuit, or other device that supplies the inhibit voltage VINH. The second NMOS transistor 122a is turned on by control logic, such as a processor, a controller, and a microcontroller, supplying a signal SSELoa having a high level and, as discussed above with respect to providing neutral voltage conditions for the plurality of resistive change elements E00a-Oxya in Section A and the plurality of resistive change elements E00z-Oxyz in Section Z, the second NMOS transistor 111pa of the word line driver circuit 110a is turned on.

The electrical connections of the plurality of odd bit lines Boa(0)-Boa(x) and the electrical connections of the plurality of global bit lines GB3(0)-GB3(x) are changed and a power supply, a voltage source, a driver circuit, or other device that supplies the inhibit voltage VINH is disconnected from the plurality of global bit lines GB3(0)-GB3(x) so that voltages indicative of the resistive states of the odd resistive change elements O01a, Ox1a can be generated on the plurality of odd bit lines Boa(0)-Boa(x), the plurality of global bit lines GB3(0)-GB3(x), and the plurality of bus lines BL30-BL3x. The electrical connections of the plurality of odd bit lines Boa(0)-Boa(x) are changed so that the plurality of odd bit lines Boa(0)-Boa(x) are in electrical communication with the plurality of global bit lines GB3(0)-GB3(x). The plurality of odd bit lines Boa(0)-Boa(x) are electrically connected to the plurality of global bit lines GB3(0)-GB3(x) by turning on the plurality of odd selection devices Noa0-Noax. The plurality of odd selection devices Noa0-Noax are turned on by control logic, such as a processor, a controller, and a microcontroller, supplying a signal SSELo having a high level. The plurality of odd bit lines Boa(0)-Boa(x) may be electrically connected to the plurality of global bit lines GB3(0)-GB3(x) as part of driving the voltage on the reference line RL3 to the inhibit voltage VINH as discussed above.

The electrical connections of the plurality of global bit lines GB3(0)-GB3($x$) are changed so that the plurality of global bit lines GB3(0)-GB3($x$) are in electrical communication with the plurality of odd bit lines Boa(0)-Boa(x) and the plurality of bus lines BL30-BL3$x$. The plurality of global bit lines GB3(0)-GB3($x$) are electrically connected to the plurality of odd bit lines Boa(0)-Boa(x) by turning on the plurality of odd selection devices Noa0-Noax as discussed above and the plurality of global bit lines GB3(0)-GB3($x$) may be electrically connected to the plurality of odd bit lines Boa(0)-Boa(x) as part of driving the voltage on the reference line RL3 to the inhibit voltage VINH as discussed above. The plurality of global bit lines GB3(0)-GB3($x$) are electrically connected to the plurality of bus lines BL30-BL3$x$ by turning on the plurality of PMOS transistors 180$g$-180$x$. The plurality of PMOS transistors 180$g$-180$x$ are turned on by control logic, such as a processor, a controller, and a microcontroller, supplying a signal CD0 having a low level. A power supply, a voltage source, a driver circuit, or other device that supplies the inhibit voltage VINH is disconnected from the plurality of global bit lines GB3(0)-GB3($x$) by turning off the plurality of NMOS transistors 130$k$-13$x$$k$. The plurality of NMOS transistors 130$k$-13$x$$k$ are turned off by control logic, such as a processor, a controller, and a microcontroller, supplying a signal KEEPe having a low level and a signal KEEPo having a low level.

The READ operation of odd resistive change elements in electrical communication with word line Wa(1) in Section A continues, as similarly discussed above in step 410 of the flow chart 400, by generating voltages indicative of resistive states of the odd resistive change elements O01$a$, Ox1$a$. Voltages indicative of resistive states of the odd resistive change elements O01$a$, Ox1$a$ are generated on the plurality of odd bit lines Boa(0)-Boa(x), the plurality of global bit lines GB3(0)-GB3($x$), and the plurality of bus lines BL30-BL3$x$ by driving the voltage on the word line Wa(1) to the system voltage VDD and sinking an amount of current for a READ operation from each bus line of the plurality of bus lines BL30-BL3$x$. As discussed above, providing neutral voltage conditions for the plurality of resistive change elements E00$a$-Oxy$a$ causes voltages on the plurality of word lines Wa(0)-Wa(y), voltages on the plurality of even bit lines Bea(0)-Bea(x), and voltages on the plurality of odd bit lines Boa(0)-Boa(x) to be approximately equal to the inhibit voltage VINH. Also, as discussed above, the plurality of global bit lines GB3(0)-GB3($x$) are biased to the inhibit voltage VINH. Thus, for generating voltages indicative of resistive states of the odd resistive change elements O01$a$, Ox1$a$, a voltage on the word line Wa(1) transitions from the inhibit voltage VINH to the system voltage VDD and the voltages on the plurality of odd bit lines Boa(0)-Boa(x) and the plurality of global bit lines GB3(0)-GB3($x$) transition from the inhibit voltage VINH to voltages indicative of resistive states of the odd resistive change elements O01$a$, Ox1$a$.

The voltage transition of the voltage on the word line Wa(1) generally corresponds with the voltage transition of the voltage on the top electrodes TE of the odd resistive change elements O01$a$, Ox1$a$ because the voltage on the word line Wa(1) generally corresponds with the voltage on the top electrodes TE of the odd resistive change elements O01$a$, Ox1$a$. The voltage transitions of the voltages on the plurality of odd bit lines Boa(0)-Boa(x) generally corresponds with the voltage transitions of the voltages on the bottom electrodes BE of the odd resistive change elements O01$a$, Ox1$a$ because the voltages on the plurality of odd bit lines Boa(0)-Boa(x) generally corresponds with the voltages on the bottom electrodes BE of the odd resistive change elements O01$a$, Ox1$a$. The magnitude of the voltage transition to place the top electrodes TE of the odd resistive change elements O01$a$, Ox1$a$ at the system voltage VDD for generating voltages indicative of resistive states of the odd resistive change elements O01$a$, Ox1$a$ is reduced because the voltage applied to the top electrodes TE of the odd resistive change elements O01$a$, Ox1$a$ is not required to transition by the magnitude of the system voltage VDD. A voltage transition of the system voltage VDD minus the inhibit voltage VINH is required to place the top electrodes at the system voltage VDD. For example, when the inhibit voltage VINH is VDD/2 (half of the system voltage VDD) a voltage transition of VDD−VDD/2=VDD/2 is required to place the top electrodes at the system voltage VDD. Further, the number of voltage transitions for generating voltages indicative of resistive states of the odd resistive change elements O01$a$, Ox1$a$ is reduced because only voltages on the word line Wa(1), the plurality of global bit lines GB3(0)-GB(x), and the plurality of odd bit lines Boa(0)-Boa(x) are adjusted for generating voltages indicative of resistive states of the odd resistive change elements O01$a$, Ox1$a$. It is noted that applying the inhibit voltage VINH to a top electrode, a bottom electrode, or both a top electrode and a bottom electrode of a resistive change element limits a voltage applied across a resistive change element to a voltage less than a voltage limit for disturbing a resistive state of a resistive change element while generating voltages indicative of resistive states of the odd resistive change elements O01$a$, Ox1$a$.

The voltage on the word line Wa(1) is driven from the inhibit voltage VINH to the system voltage VDD by changing the voltage supplied by the word line driver circuit 111$da$ from the inhibit voltage VINH to the system voltage VDD. The word line driver circuit 111$da$ changes from supplying the inhibit voltage VINH to the system voltage VDD based on a signal ITE1$a$ supplied by control logic, such as a processor, a controller, and a microcontroller. The plurality of write buffer circuits 1500-150$x$ do not supply voltages based on the write set signals WR00-WR0$x$ and the write reset signals WR10-WR1$x$ supplied by control logic, such as a processor, a controller, and a microcontroller. The amount of current for a READ operation is sunk from each bus line of the plurality of bus lines BL30-BL3$x$ by the current source in electrical communication with that bus line. The amount of current for a READ operation is based on the amount of current that would flow through a resistor having an intermediate resistance and having the system voltage VDD applied to one terminal of the resistor and the inhibit voltage VINH applied to the other terminal of the resistor. The amount of current that would flow through a resistor having an intermediate resistance and having the system voltage VDD applied to one terminal of the resistor and the inhibit voltage VINH applied to the other terminal of the resistor can be approximated by the following equation, I=(VDD−VINH)/Intermediate Resistance. For example, when the intermediate resistance=5.5 MΩ, the system voltage VDD=2V, and the inhibit voltage VINH=1V, each current source of the plurality of current sources 1600-160$x$ is configured to sink an amount of current that can be approximated as I=(2V−1V)/5.5 MΩ=0.18 μA. It is noted that, ignoring leakage currents, the amount of current for the READ operation flows through each odd resistive change element O01$a$,Ox1$a$ in electrical communication with the word line Wa(1), each odd bit line of the plurality of odd bit lines Boa(0)-Boa(x), each global bit line of the plurality of global bit lines GB3(0)-GB3($x$), and each bus line of the plurality of bus lines BL30-BL3*x* to each current source of the plurality of current sources 1600-160*x*.

The intermediate resistance sets a boundary for resistance values that correspond with a low resistive state during READ operations and resistance values that correspond with a high resistive state during READ operations. The intermediate resistance is a design variable that can be selected by a circuit designer and the circuit designer typically selects an intermediate resistance greater than a model resistance for a low resistive state of a resistive change element and less than a model resistance for a high resistive state of a resistive change element. For example, when a model resistance for a low resistive state of a resistive change element is 1 MΩ and a model resistance for a high resistive state of a resistive change elements is 10 MΩ, a circuit designer can select an intermediate resistance of 5.5 MΩ so that resistive change elements having a resistance less than approximately 5.5 MΩ are determined to have a low resistive state during READ operations and resistive change elements having a resistance greater than approximately 5.5 MΩ are determined to have a high resistive state during READ operations. It is noted that the intermediate resistance is not limited to a resistance at the exact midpoint between a model resistance for a low resistive state of a resistive change element and a model resistance for a high resistive state of a resistive change element, but rather the intermediate resistance can be closer the model resistance for the low resistive state or the model resistance for the high resistive state.

Figures 1, 1L:
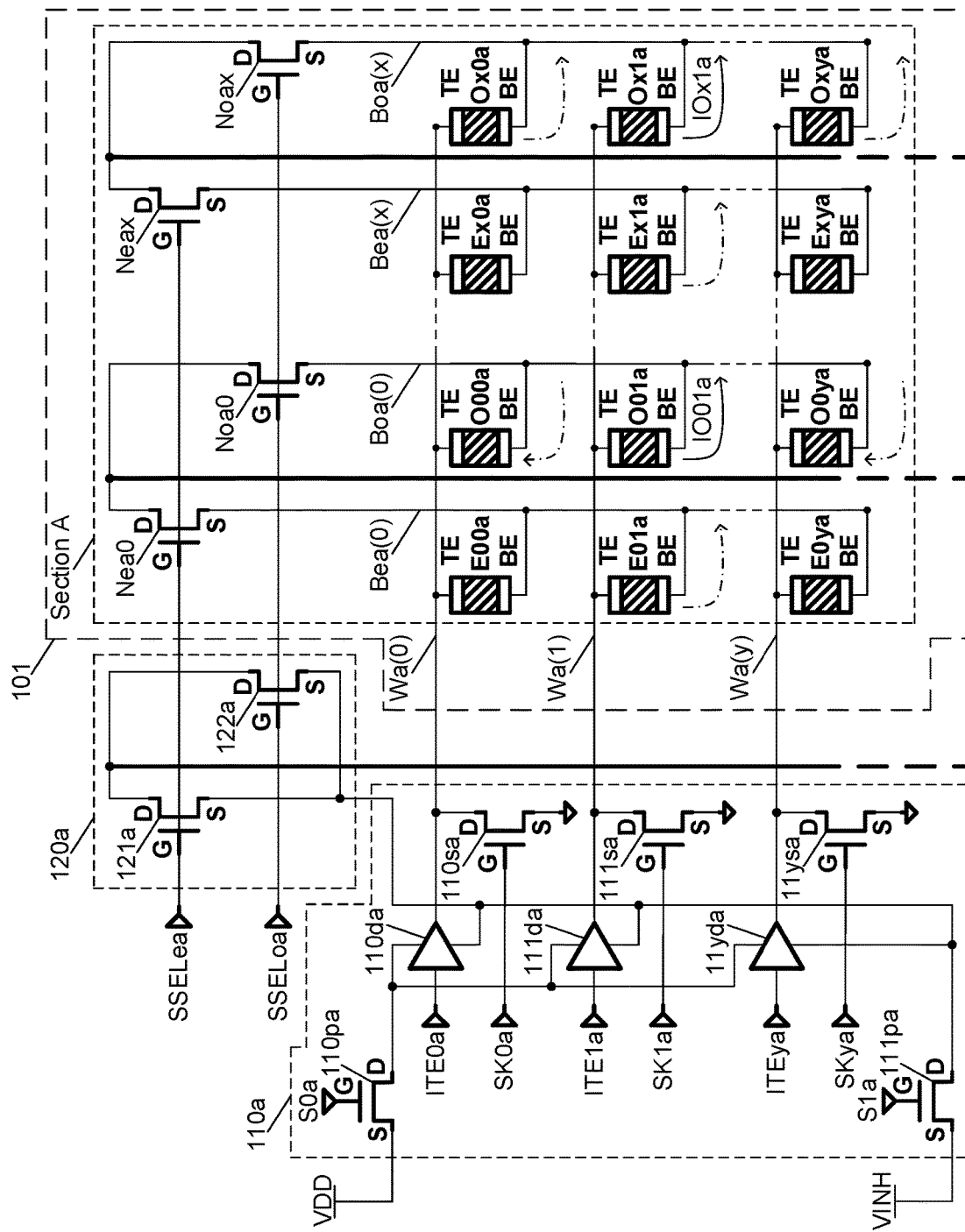
Figures 1, 1L, 2:
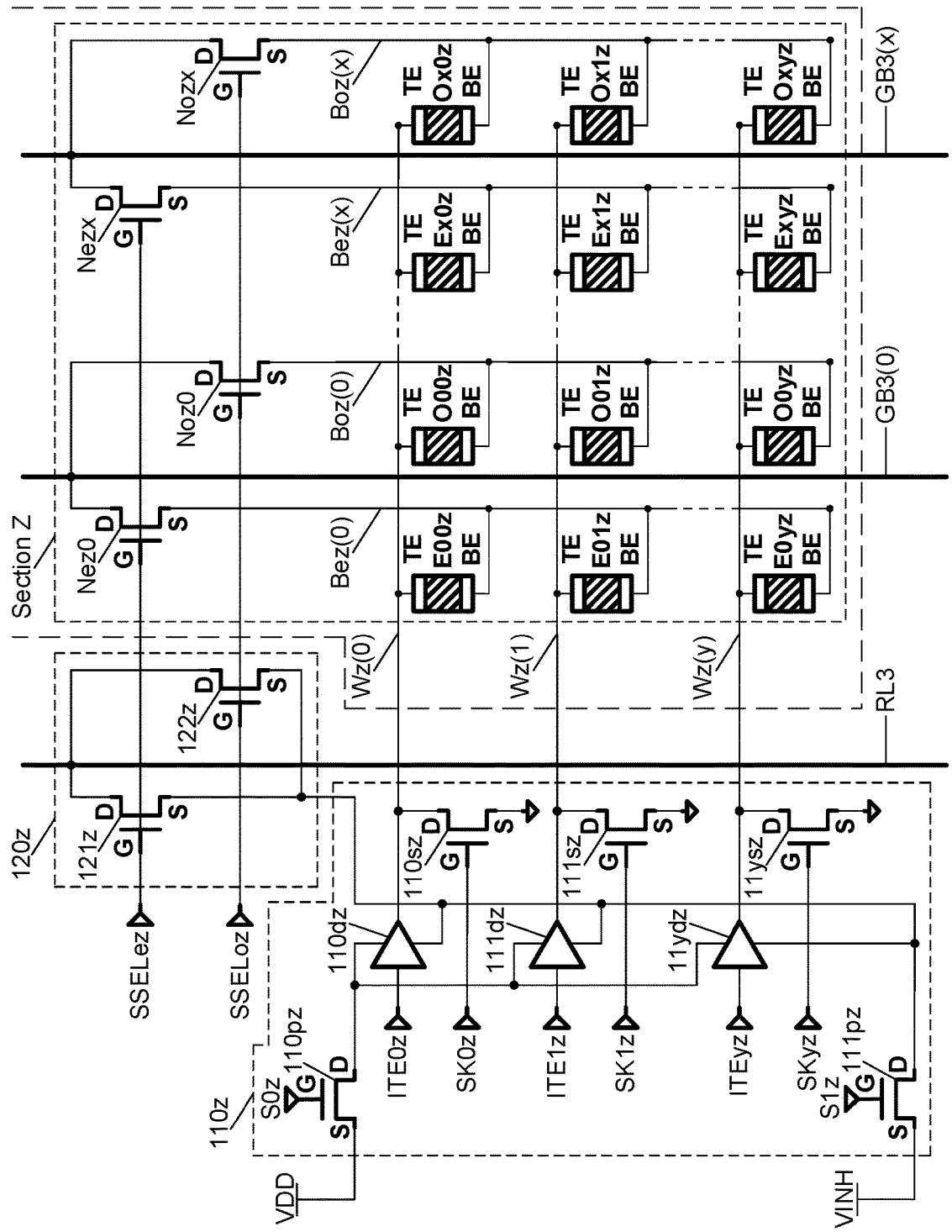
Figures 1, 1L, 2, 3:
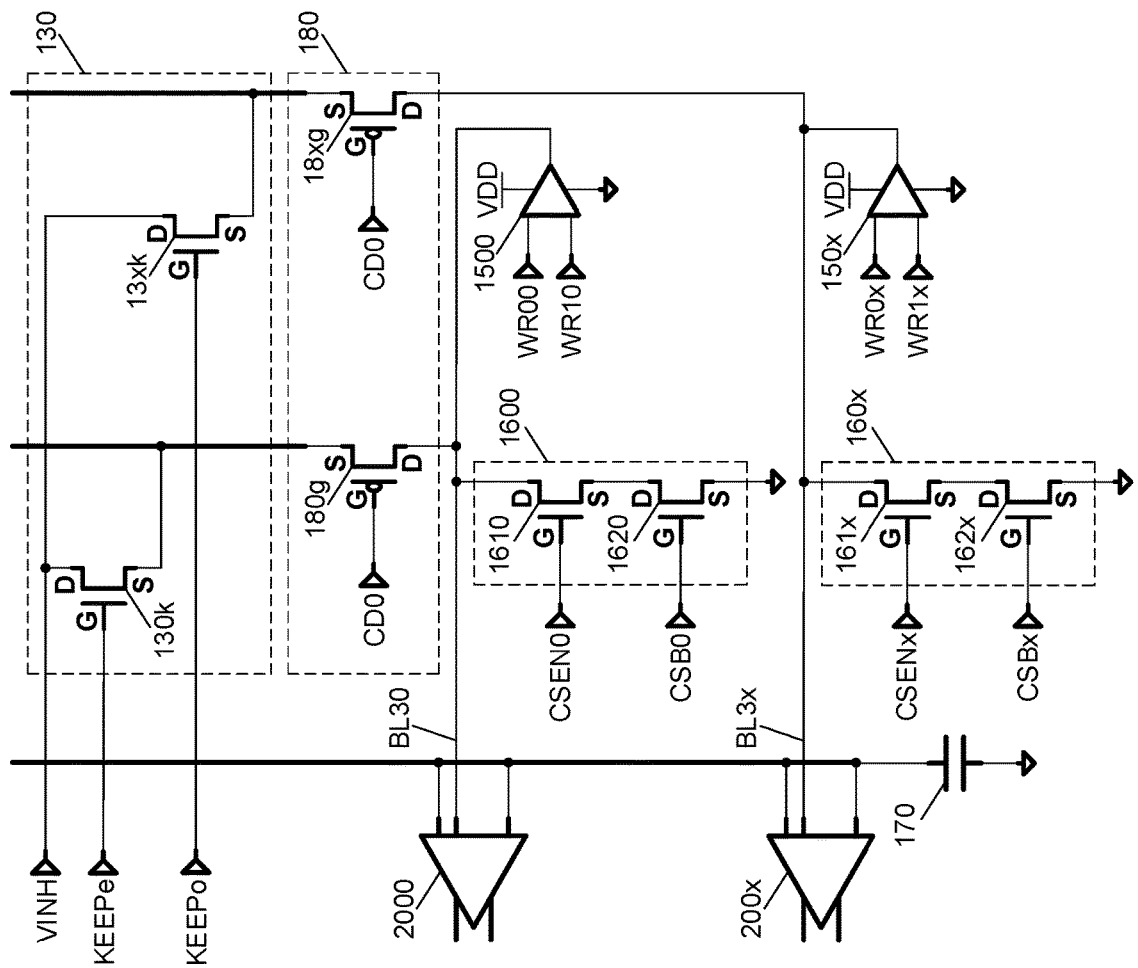

FIG. 1L-1 shows a current IO01*a* flowing through the resistive change element O01*a* from the top electrode TE to the bottom electrode BE because the top electrode TE is at the system voltage VDD and the bottom electrode BE is at a voltage indicative of a resistive state of the resistive change element O01*a*. FIG. 1L-1 also shows a current IO*x*1*a* flowing through the resistive change element O*x*1*a* from the top electrode TE to the bottom electrode BE because the top electrode TE is at the system voltage VDD and the bottom electrode BE is at a voltage indicative of a resistive state of the resistive change element O*x*1*a*. While, ignoring leakage currents, the amount of the current flowing through the resistive change element O01*a*, the odd bit line Boa(0), the global bit line GB3(0), and the bus line BL30 are the same amount of current (the amount of current for the READ operation) and the amount of the current flowing through the resistive change element O*x*1*a*, the odd bit line Boa(x), the global bit line GB3(*x*), and the bus line BL3*x* are the same amount of current (the amount of current for the READ operation). Additionally, ignoring leakage currents, routing parasitics, and an on resistance of an odd selection device of the plurality of odd selection devices Noa0-Noa*x*, the voltage on an odd bit line in the plurality of odd bit lines Boa(0)-Boa(x), the voltage on a global bit line in the plurality of global bit lines GB3(0)-GB3(*x*), and the voltage on a bus line in the plurality of bus lines BL30-BL3*x* having the same column number are generally the same voltage and the voltage on an odd bit line in the plurality of odd bit lines Boa(0)-Boa(x), the voltage on a global bit line in the plurality of global bit lines GB3(0)-GB3(*x*), and the voltage on a bus line in the plurality of bus lines BL30-BL3*x* having the same column number are indicative of a resistive state of an odd resistive change element in the odd resistive change elements O01*a*, O*x*1*a* having the same column number. It is noted that the voltage indicative of a resistive state of the resistive change element O01*a* is discussed below with respect to the voltage VGB3(0) on the global bit line GB3(0) and the voltage indicative of a resistive state of the resistive change element O*x*1*a* is discussed below with respect to the voltage VGB3(*x*) on the global bit line GB3(*x*).

The voltage VGB3(0) on the global bit line GB3(0), ignoring leakage currents, routing parasitics, and on resistance of the odd selection device Noa0, can be approximated by subtracting the voltage drop across the resistive change element O01*a* from the voltage VWa(1) on the word line Wa(1). The voltage drop across the resistive change element O01*a* can be approximated using Ohm's Law. Thus, the voltage VGB3(0) on the global bit line GB3(0) can be approximated by the following equation VGB3(0)=VWa(1)−(IO01*a*×RO01*a*), where VWa(1) is the voltage on the word line Wa(1), the current IO01*a* is the current flowing through resistive change element O01*a*, and RO01*a* is the resistance of the resistive change element O01*a*. As shown by this equation, the voltage VGB3(0) on the global bit line GB3(0) changes when the resistance of the resistive change element O01*a* changes because the voltage VWa(1) on the word line Wa(1) and the current IO01*a* flowing through the resistive change element O01*a* are generally the same for READ operations. For example, when VWa(1)=2 volts, IO01*a*=1/5.5 microamps, and RO01*a*=5.5 MΩ, the voltage VGB3(0)=2V−(1/5.5 μA×5.5 MΩ)=1V. For example, when VWa(1)=2 volts, IO01*a*=1/5.5 microamps, and RO01*a*=1 MΩ, the voltage VGB3(0)=2V−(1/5.5 μA×1 MΩ)=1.82V. For example, when VWa(1)=2 volts, IO01*a*=1/5.5 microamps, and RO01*a*=10 MΩ, the voltage VGB3(0)=2V−(1/5.5 μA×10 MΩ)=0.182V.

The voltage VGB3(*x*) on the global bit line GB3(*x*), ignoring leakage currents, routing parasitics, and on resistance of the odd selection device Noa*x*, can be approximated by subtracting the voltage drop across the resistive change element O*x*1*a* from the voltage VWa(1) on the word line Wa(1). The voltage drop across the resistive change element O*x*1*a* can be approximated using Ohm's Law. Thus, the voltage VGB3(*x*) on the global bit line GB3(*x*) can be approximated by the following equation VGB3(*x*)=VWa(1)−(IO*x*1*a*×RO*x*1*a*), where VWa(1) is the voltage on the word line Wa(1), the current IO*x*1*a* is the current flowing through resistive change element O*x*1*a*, and RO*x*1*a* is the resistance of the resistive change element O*x*1*a*. As shown by this equation, the voltage VGB3(*x*) on the global bit line GB3(*x*) changes when the resistance of the resistive change element O*x*1*a* changes because the voltage VWa(1) on the word line Wa(1) and the current IO*x*1*a* flowing through the resistive change element O*x*1*a* are generally the same for READ operations. For example, when VWa(1)=2 volts, IO*x*1*a*=1/5.5 microamps, and RO*x*1*a*=5.5 MΩ, the voltage VGB3(*x*)=2V−(1/5.5 μA×5.5 MΩ)=1V. For example, when VWa(1)=2 volts, IO*x*1*a*=1/5.5 microamps, and RO*x*1*a*=1 MΩ, the voltage VGB3(*x*)=2V−(1/5.5 μA×1 MΩ)=1.82V. For example, when VWa(1)=2 volts, IO*x*1*a*=1/5.5 microamps, and RO*x*1*a*=10 MΩ, the voltage VGB3(*x*)=2V−(1/5.5 μA×10 MΩ)=0.182V.

FIG. 1L-1 also shows leakage currents flowing through the resistive change elements O00*a*, O0*ya* in electrical communication with the odd bit line Boa(0), leakage currents flowing through the resistive change elements O*x*0*a*, O*xya* in electrical communication with the odd bit line Boa(x), and leakage currents flowing through the resistive change elements E01*a*, E*x*1*a* in electrical communication with the word line Wa(1). The leakage currents are shown using dashed lines in FIG. 1L-1. Leakage currents flow through the resistive change elements O00*a*, O0*ya* because the bottom electrodes of the resistive change elements O00*a*, O0*ya* are at a voltage indicative of a resistive state of the resistive change element O01*a* and the top electrodes of the resistive change elements O00a, O0ya are the inhibit voltage VINH. Leakage currents flow through the resistive change elements Ox0a, Oxya because the bottom electrodes of the resistive change elements Ox0a, Oxya are at a voltage indicative of a resistive state of the resistive change element Ox1a and the top electrodes of the resistive change elements Ox0a, Oxya are the inhibit voltage VINH. Leakage currents flow through resistive change elements E01a, Ex1a because the bottom electrodes of the resistive change elements E01a, Ex1a are at the inhibit voltage VINH and the top electrodes of the resistive change elements E01a, Ex1a are at the system voltage VDD. It is noted that leakage currents may flow through resistive change elements other than the resistive change elements in electrical communication with the odd bit line Boa(0), the resistive change elements in electrical communication with the odd bit line Boa(x), and the resistive change elements in electrical communication with the word line Wa(1) because voltages on other lines may be impacted by generating voltages indicative of resistive states of the odd resistive change elements O01a, Ox1a. It is also noted that leakage currents generally do not flow through the plurality of resistive change elements E00z-Oxyz in Section Z because the bottom electrodes of the plurality of resistive change elements E00z-Oxyz are at the inhibit voltage VINH and the top electrodes of the plurality of resistive change elements E00z-Oxyz are at the inhibit voltage VINH. It is additionally noted that leakage currents do not prevent the READ operation of the odd resistive change elements O01a, Ox1a when the leakage currents are much less than the amounts of the current IO01a and the current IOx1a. It is further noted that the voltage differences across the resistive change elements that cause the leakage currents do not disturb the resistive states of the resistive change elements because the voltage differences are less than a voltage limit for disturbing a resistive state of a resistive change element.

FIG. 1L-1 shows leakage currents flowing through the resistive change elements O00a, O0ya from the odd bit line Boa(0) because the resistive change element O01a has a low resistive state and a voltage indicative of a low resistive state of resistive change element O01a is greater than the inhibit voltage VINH. FIG. 1L-1 shows leakage currents flowing through the resistive change elements Ox0a, Oxya into the odd bit line Boa(x) because the resistive change element Ox1a has a high resistive state and a voltage indicative of a high resistive state of resistive change element Ox1a is greater than the inhibit voltage VINH. It is noted that when the voltage VBoa(0) on the odd bit line Boa(0) is less than the inhibit voltage VINH and the word lines Wa(0), Wa(y) in electrical communication with the other resistive change elements O00a, O0ya on the odd bit line Boa(0) are driven to the inhibit voltage VINH, leakage currents flow into the odd bit line Boa(0) through the other resistive change elements O00a, O0ya and pull up the voltage VBoa(0) on the odd bit line Boa(0). It is also noted that when the voltage VBoa(0) on the odd bit line Boa(0) is greater than the inhibit voltage VINH and the word lines Wa(0), Wa(y) in electrical communication with the other resistive change elements O00a, O0ya on the odd bit line Boa(0) are driven to the inhibit voltage VINH, leakage currents flow from the odd bit line Boa(0) through the other resistive change elements O00a, O0ya and pull down the voltage VBoa(0) on the bit line Boa(0). It is noted that when the voltage VBoa(x) on the odd bit line Boa(x) is less than the inhibit voltage VINH and the word lines Wa(0), Wa(y) in electrical communication with the other resistive change elements Ox0a, Oxya on the odd bit line Boa(x) are driven to the inhibit voltage VINH, leakage currents flow into the odd bit line Boa(x) through the other resistive change elements Ox0a, Oxya and pull up the voltage VBoa(x) on the odd bit line Boa(x). It is also noted that when the voltage VBoa(x) on the odd bit line Boa(x) is greater than the inhibit voltage VINH and the word lines Wa(0), Wa(y) in electrical communication with the other resistive change elements Ox0a, Oxya on the odd bit line Boa(x) are driven to the inhibit voltage VINH, leakage currents flow from the odd bit line Boa(x) through the other resistive change elements Ox0a, Oxya and pull down the voltage VBoa(x) on the bit line Boa(x). It is further noted that when voltages on the plurality of odd bit lines Boa(0)-Boa(x) are pulled up by leakage currents flowing into the plurality of odd bit lines Boa(0)-Boa(x), when voltages on the plurality of odd bit lines Boa(0)-Boa(a) are pulled down by leakage currents flowing from the plurality of bit lines Boa(0)-Boa(x), and when a voltage on at least one odd bit line of the plurality of odd bit lines Boa(0)-Boa(x) is pulled up by leakage currents flowing into the at least one odd bit line and a voltage on at least one other odd bit line of the plurality of odd bit lines Boa(0)-Boa(x) is pulled down by leakage currents flowing from the at least one other odd bit line, the number of the word lines Wa(0), Wa(y) should be small enough to allow a margin to determine resistive states of the odd resistive change elements O01a, Ox1a.

The READ operation of odd resistive change elements in electrical communication with word line Wa(1) in Section A proceeds, as similarly discussed above in step 412 of the flow chart 400, by determining the resistive states of the odd resistive change elements O01a, Ox1a based on the voltages VGB3(0)-VGB3(x) on the plurality of global bit lines GB3 (0)-GB3(x). As discussed above, a voltage indicative of a resistive state of an odd resistive change element in the odd resistive change elements O01a, Ox1a is generated on a global bit line in the plurality of global bit lines GB3(0)-GB3(x) having the same column number as the odd resistive change element. The resistive state of the resistive change element O01a is determined by comparing the voltage VGB3(0) on with global bit line GB3(0) with the inhibit voltage VINH on the reference line RL3 and the resistive state of the resistive change element Ox1a is determined by comparing the voltage VGB3(x) on with global bit line GB3(x) with the inhibit voltage VINH on the reference line RL3. For READ operations the inhibit voltage VINH is indicative of the intermediate resistance because the inhibit voltage VINH is equal to the system voltage VDD minus a voltage calculated by multiplying the amount of current for a READ operation and the intermediate resistance of 5.5 MΩ. For example, when the system voltage VDD=2V, the inhibit voltage VINH=1V, the amount of current for READ operations=1/5.5 μA, and the intermediate resistance=5.5 MΩ, VINH=2V−(1/5.5 μA×5.5 MΩ)=1V.

When the voltage VGB3(0) on the global bit line GB3(0) is greater than the inhibit voltage (i.e. the voltage VGB3(0) on the global bit line GB3(0)>VINH) the resistance of the resistive change element O01a is less than the intermediate resistance (i.e. RO01a<intermediate resistance, where RO01a is the resistance of the resistive change element O01a) and the resistive state of the resistive change element O01a is determined to be a low resistive state. When the voltage VGB3(0) on the global bit line GB3(0) is less than the inhibit voltage VINH (i.e. the voltage VGB3(0) on the global bit line GB3(0)<VINH) the resistance of the resistive change element O01a is greater than the intermediate resistance (i.e. RO01a>intermediate resistance, where RO01a is the resistance of the resistive change element O01a) and the resistive state of resistive change element O01a is determined to be a high resistive state.

When the voltage VGB3($x$) on the global bit line GB3($x$) is greater than the inhibit voltage (i.e. the voltage VGB3($x$) on the global bit line GB3($x$)>VINH) the resistance of the resistive change element Ox1$a$ is less than the intermediate resistance (i.e. ROx1$a$<intermediate resistance, where ROx1$a$ is the resistance of the resistive change element Ox1$a$) and the resistive state of the resistive change element Ox1$a$ is determined to be a low resistive state. When the voltage VGB3($x$) on the global bit line GB3($x$) is less than the inhibit voltage VINH (i.e. the voltage VGB3($x$) on the global bit line GB3($x$)<VINH) the resistance of the resistive change element Ox1$a$ is greater than the intermediate resistance (i.e. ROx1$a$>intermediate resistance, where ROx1$a$ is the resistance of the resistive change element Ox1$a$) and the resistive state of resistive change element Ox1$a$ is determined to be a high resistive state.

The sense amplifier 2000 receives the inhibit voltage VINH on the reference line RL3 and the voltage VGB3(0) on the global bit line GB3(0) and determines the resistive state of the resistive change element O01$a$ by comparing the inhibit voltage VINH on the reference line RL3 with the voltage VGB3(0) on the global bit line GB3(0). The sense amplifier 2000 outputs signals indicative of the resistive state of the resistive change element O01$a$ on two outputs. When the voltage VGB3(0) on the global bit line GB3(0) is greater than the inhibit voltage VINH, the sense amplifier 2000 outputs signals indicating the resistive change element O01$a$ has a low resistive state. When the voltage VGB3(0) on the global bit line GB3(0) is less than the inhibit voltage VINH, the sense amplifier 2000 outputs signals indicating the resistive change element O01$a$ has a high resistive state. The sense amplifier 2000 operates in the same manner as the first sense amplifier 200 discussed above. It is noted that providing the inhibit voltage VINH on the reference line RL3 to the sense amplifier 2000 can increase the accuracy of determining the resistive state of the resistive change element O01$a$ because the inhibit voltage VINH on the reference line RL3 and the voltage VGB3(0) on the global bit line GB3(0) are subject to similar conditions.

The sense amplifier 200$x$ receives the inhibit voltage VINH on the reference line RL3 and the voltage VGB3($x$) on the global bit line GB3($x$) and determines the resistive state of the resistive change element Ox1$a$ by comparing the inhibit voltage VINH on the reference line RL3 with the voltage VGB3($x$) on the global bit line GB3($x$). The sense amplifier 200$x$ outputs signals indicative of the resistive state of the resistive change element Ox1$a$ on two outputs. When the voltage VGB3($x$) on the global bit line GB3($x$) is greater than the inhibit voltage VINH, the sense amplifier 200$x$ outputs signals indicating the resistive change element Ox1$a$ has a low resistive state. When the voltage VGB3($x$) on the global bit line GB3($x$) is less than the inhibit voltage VINH, the sense amplifier 200$x$ outputs signals indicating the resistive change element Ox1$a$ has a high resistive state. The sense amplifier 200$x$ operates in the same manner as the first sense amplifier 200 discussed above. It is noted that providing the inhibit voltage VINH on the reference line RL3 to the sense amplifier 200$x$ can increase the accuracy of determining the resistive state of the resistive change element O01$a$ because the inhibit voltage VINH on the reference line RL3 and the voltage VGB3(0) on the global bit line GB3(0) are subject to similar conditions.

The READ operation of odd resistive change elements in electrical communication with word line Wa(1) in Section A proceeds, as similarly discussed above in step 414 of the flow chart 400, by restoring neutral voltage conditions for resistive change elements impacted by generating voltages indicative of resistive states of the odd resistive change elements O01$a$, Ox1$a$. Neutral voltage conditions are restored for resistive change elements impacted by generating voltages indicative of resistive states of the odd resistive change elements O01$a$, Ox1$a$ by floating the plurality of odd bit lines Boa(0)-Boa(x) and applying the inhibit voltage VINH to the word line Wa(1). The plurality of even bit lines Bea(0)-Bea(x) are already floating because the plurality of even selection devices Nea0-Neax are turned off. The inhibit voltage VINH is already applied to the word lines Wa(0), Wa(y) because the word line driver circuits 110$da$, 11$yda$ are already supplying the inhibit voltage VINH. The plurality of odd bit lines Boa(0)-Boa(x) are floated by disconnecting the plurality of odd bit lines Boa(0)-Boa(x) from the plurality of global bit lines GB3(0)-GB3($x$) by turning off the plurality of odd selection devices Noa0-Noax. The plurality of odd selection devices Noa0-Noax are turned off by control logic, such as a processor, a controller, and a microcontroller, supplying a signal SSELo having a low level. The inhibit voltage VINH is applied to the word line Wa(1) by the word line driver circuit 111$da$ driving the voltage on the word line Wa(1) to the inhibit voltage VINH. The word line driver circuit 111$da$ supplies the inhibit voltage VINH based on the signal ITE1$a$ supplied by control logic, such as a processor, a controller, and a microcontroller. Thus, the inhibit voltage VINH is applied to the plurality of word lines Wa(0)-Wa(y) with the plurality of even bit lines Bea(0)-Bea(x) and the plurality of odd bit lines Boa(0)-Boa(x) floating so that voltages approximately equal to the inhibit voltage VINH are applied to the top electrodes and the bottom electrodes of the resistive change elements in the plurality of resistive change elements E00$a$-Oxya.

The READ operation of odd resistive change elements in electrical communication with word line Wa(1) in Section A continues, as similarly discussed above in step 416 of the flow chart 400, by biasing global bit lines impacted by generating voltages indicative of resistive states of the odd resistive change elements O01$a$, Ox1$a$. Global bit lines impacted by generating voltages indicative of resistive states of the odd resistive change elements O01$a$, Ox1$a$ are biased to the inhibit voltage VINH by floating the plurality of global bit lines GB3(0)-GB3($x$) and applying the inhibit voltage VINH to the plurality of global bit lines GB3(0)-GB3($x$). The plurality of global bit lines GB3(0)-GB3($x$) are floated by disconnecting the plurality of global bit lines GB3(0)-GB3($x$) from the plurality of odd bit lines Boa(0)-Boa(x) and disconnecting the plurality of global bit lines GB3(0)-GB3($x$) from the plurality of bus lines BL30-BL3$x$. The plurality of global bit lines GB3(0)-GB3($x$) are already disconnected from the plurality of even bit lines Bea(0)-Bea(x) because the plurality of even selection devices Nea0-Neax are turned off. The plurality of global bit lines GB3(0)-GB3($x$) may be disconnected from the plurality of odd bit lines Boa(0)-Boa(x) as part of restoring neutral voltage conditions for resistive change elements impacted by generating voltages indicative of resistive states of the odd resistive change elements O01$a$, Ox1$a$ as discussed above. The plurality of global bit lines GB3(0)-GB3($x$) are disconnected from the plurality of bus lines BL30-BL3$x$ by turning off the plurality of PMOS transistors 180$g$-18$xg$. The plurality of PMOS transistors 180$g$-18$xg$ are turned off by control logic, such as a processor, a controller, and a microcontroller, supplying a signal CD0 having a high level. The inhibit voltage VINH is applied to the plurality of global bit lines GB3(0)-GB3($x$) by electrically connecting the plurality of global bit lines GB3(0)-GB3($x$) to a power supply, a voltage source, a driver circuit, or other device that supplies the inhibit voltage VINH by turning on the plurality of NMOS transistors 130k-13xk. The plurality of NMOS transistors 130k-13xk are turned on by control logic, such as a processor, a controller, and a microcontroller, supplying a signal KEEPe having a high level and a signal KEEPo having a high level.

SET VERIFY operations of odd resistive change elements in electrical communication with a word line in a section of resistive change element array 101 in the exemplary DDR compatible implementation of the first exemplary architecture and SET VERIFY operations of even resistive change elements in electrical communication with a word line in a section of resistive change element array 101 in the exemplary DDR compatible implementation of the first exemplary architecture can be performed in a similar manner to the READ operations of odd resistive change elements in electrical communication with word line Wa(1) discussed above, but with each current source of the plurality of current sources 1600-160x set to sink an amount of current for a SET VERIFY operation. The amount of current for a SET VERIFY operation is based on the amount of current that would flow through a resistor having a low resistance and having the system voltage VDD applied to one terminal of the resistor and the inhibit voltage VINH applied to the other terminal of the resistor. The amount of current that would flow through a resistor having a low resistance and having the system voltage VDD applied to one terminal of the resistor and the inhibit voltage VINH applied to the other terminal of the resistor can be approximated by the following equation, I=(VDD−VINH)/Low Resistance. For example, when the low resistance is 2 MΩ, the system voltage VDD is 2V, and the inhibit voltage VINH is 1V, each current source of the plurality of current sources 1600-160x is configured to sink an amount of current for a SET VERIFY operation that can be approximated as I=(2V−1V)/2 MΩ=0.5 μA.

The low resistance sets an upper boundary for resistance values that correspond with a low resistive state during SET VERIFY operations. The low resistance is a design variable that can be selected by a circuit designer and the circuit designer typically selects a low resistance greater than a model resistance for a low resistive state of a resistive change element so that resistive change elements can have resistances greater than the model resistance for the low resistive state and be determined to have a low resistive state during SET VERIFY operations. For example, when a model resistance for a low resistive state of a resistive change element is 1 MΩ, a circuit designer can select a low resistance of 2 MΩ so that resistive change elements having a resistance less than approximately 2 MΩ are determined to have a low resistive state during SET VERIFY operations. It is noted that the circuit designer typically selects a low resistance greater than a model resistance for a low resistive state of a resistive change element and less than an intermediate resistance for READ operations.

RESET VERIFY operations of odd resistive change elements in electrical communication with a word line in a section of resistive change element array 101 in the exemplary DDR compatible implementation of the first exemplary architecture and RESET VERIFY operations of even resistive change elements in electrical communication with a word line in a section of resistive change element array 101 in the exemplary DDR compatible implementation of the first exemplary architecture can be performed in a similar manner to the READ operations of odd resistive change elements in electrical communication with word line Wa(1) discussed above, but with each current source of the plurality of current sources 1600-160x set to sink an amount of current for a RESET VERIFY operation. The amount of current for a RESET VERIFY operation is based on the amount of current that would flow through a resistor having a high resistance and having the system voltage VDD applied to one terminal of the resistor and the inhibit voltage VINH applied to the other terminal of the resistor. The amount of current that would flow through a resistor having a high resistance and having the system voltage VDD applied to one terminal of the resistor and the inhibit voltage VINH applied to the other terminal of the resistor can be approximated by the following equation, I=(VDD−VINH)/High Resistance. For example, when the high resistance is 9 MΩ, the system voltage VDD is 2V, and the inhibit voltage VINH is 1V, each current source of the plurality of current sources 1600-160x is configured to sink an amount of current for a RESET VERIFY operation that can be approximated as I=(2V−1V)/9 MΩ=0.11 μA.

The high resistance sets an upper boundary for resistance values that correspond with a high resistive state during RESET VERIFY operations. The high resistance is a design variable that can be selected by a circuit designer and the circuit designer typically selects a high resistance less than a model resistance for a high resistive state of a resistive change element so that resistive change elements can have resistances less than the model resistance for the high resistive state and be determined to have a high resistive state during RESET VERIFY operations. For example, when a model resistance for a high resistive state of a resistive change element is 10 MΩ, a circuit designer can select a high resistance of 9 MΩ so that resistive change elements having a resistance greater than approximately 9 MΩ are determined to have a high resistive state during RESET VERIFY operations. It is noted that the circuit designer typically selects a high resistance less than a model resistance for a high resistive state of a resistive change element and greater than an intermediate resistance for READ operations.

Referring now to FIG. 5A, a second exemplary architecture for programming and accessing resistive change elements is illustrated in a simplified schematic diagram. The second exemplary architecture includes a resistive change element array 100, a plurality of global bit lines GB4(0)-G4(x), word line driver circuitry 101, a reference line RL4, a reference line connection circuit 102, a keeper circuit 103, a resistor 501, a global bit line connection circuit 502, a bus line BL4, a write buffer circuit 105, a current source 106, a first input device 503, a second input device 504, a capacitor 505, and a sense device 506. The resistive change element array 100, the plurality of global bit lines GB4(0)-G4(x), the word line driver circuitry 101, the reference line connection circuit 102, the keeper circuit 103, the write buffer circuit 105, and the current source 106 have similar structure to the resistive change element array 100, the plurality of global bit lines GB1(0)-GB1(x), the word line driver circuitry 101, the reference line connection circuit 102, the keeper circuit 103, the write buffer circuit 105, and the current source 106 as discussed above with respect to the first exemplary architecture for programming and accessing resistive change elements. Therefore, the resistive change element array 100, the word line driver circuitry 101, the reference line connection circuit 102, the keeper circuit 103, the write buffer circuit 105, and the current source 106 are not discussed in detail with respect to the second exemplary architecture for programming and accessing resistive change elements.

It is noted that although the second exemplary architecture is shown in FIG. 5A including one bus line, one write buffer circuit, one current source, one first input device, one second input device, and one sense device, the second exemplary architecture can include multiple bus lines, multiple write buffer circuits, multiple current sources, multiple first input devices, multiple second input devices, and multiple sense devices. For example, the second exemplary architecture can include multiple bus lines, multiple write buffer circuits, multiple current sources, multiple first input devices, and multiple sense devices so that multiple resistive change elements can be programmed to the same resistive state at the same time and so that multiple resistive change elements can be accessed at the same time. For example, to facilitate compatibility with memory functionality where programming operations program multiple bits of data at the same time and accessing operations access multiple bits of data at the same time, such as double data rate (DDR) memory functionality, the second exemplary architecture can include one bus line, one write buffer circuit, one current source, one first input device, and one sense device for each global bit line in the plurality of global bit lines GB4(0)-GB4(x). In the above example where the second exemplary architecture includes one bus line, one write buffer circuit, one current source, one first input device, and one sense device for each global bit line in the plurality of global bit lines GB4(0)-GB4(x), a circuit designer may select the number of global bit lines based on the number of bits of data to be accessed at the same time, such as 32 global bit lines so that 32 bits of data can be accessed at the same time and 64 global bit lines so that 64 bits of data can be accessed at the same time. It is also noted that when the second exemplary architecture includes multiple sense devices, the second exemplary architecture can include a second input devices for each of the multiple sense devices or the second exemplary architecture can include fewer second input devices than sense devices because second input devices can be shared between sense devices as discussed below.

Further, although the second exemplary architecture is shown in FIG. 5A including a resistive change element array 100 having one section in electrical communication with the plurality of global bit lines GB4(0)-GB4(x), the second exemplary architecture can include a resistive change element array having multiple sections in electrical communication with the plurality of global bit lines GB4(0)-GB4(x) along with word line driver circuitry for each of the multiple sections and a reference line connection circuit for each of the multiple sections. For example, the second exemplary architecture can include a resistive change element array having two sections in electrical communication with the plurality of global bit lines GB4(0)-GB4(x), word line driver circuitry for each section and a reference line connection circuit for each section. In the above example, when the resistive change element array includes two sections having the same number of resistive change elements, the amount of data storage may be doubled as compared to a resistive change element array including one section having the same number of resistive change elements as one of the two sections without doubling the chip area consumed by the second exemplary architecture because the resistor 501, the keeper circuit 103, the global bit line connection circuit 502, the bus line BL4, the write buffer circuit 105, the current source 106, the first input device 503, the second input device 504, the capacitor 505, and the sense device 506 can be shared by the two sections. It is also noted that the chip area consumed by the second exemplary architecture also can be reduced by locating word line driver circuitry for each section and a reference line connection circuit for each section below the resistive change element array. It is further noted that the second exemplary architecture can include multiple bus lines, multiple write buffer circuits, multiple current sources, multiple first input devices, multiple sense devices, and a resistive change element array having multiple sections in electrical communication with the plurality of global bit lines GB4(0)-GB4(x) and that the multiple bus lines, multiple write buffer circuits, multiple current sources, multiple first input devices, and multiple sense devices can be shared by the multiple sections.

The global bit line connection circuit 502 is in electrical communication with the reference line RL4, the second input device 504, the plurality of global bit lines GB4(0)-GB4(x), and the bus line BL4. The global bit line connection circuit 502 is configured to electrically connect the reference line RL4 and the second input device 504 and to electrically connect the plurality of global bit lines GB4(0)-GB4(x) and the bus line BL4. An exemplary circuit for the global bit line connection circuit 502 is discussed below with respect to FIGS. 5B-1 and 5B-2. However, the global bit line connection circuit 502 is not limited to the global bit line connection circuit 502 discussed below with respect to FIGS. 5B-1 and 5B-2. For example, the global bit line connection circuit 502 can be other circuits configured to electrically connect the reference line RL4 and the second input device 504 and to electrically connect the plurality of global bit lines GB4(0)-GB4(x) and the bus line BL4. The global bit line connection circuit 502 is in electrical communication with the reference line RL4 through the resistor 501. The resistor 501 is included in the second exemplary architecture to increase the impedance as seen from the second input device 504 so that the impedance as seen from the second input device 504 generally corresponds with the impedance as seen from the first input device 503, however, when the resistor 501 is not needed the resistor 501 may be omitted. For example, the resistor 501 may have a resistance that is an average of a model resistance for a low resistive state of a resistive change element and a model resistance for a high resistive state of a resistive change element because the impedance as seen from the first input device 503 during an accessing operation is dominated by a resistance of the resistive change element being accessed. In the above example, when the model resistance for a low resistive state of a resistive change element is 1 MΩ and the model resistance for a high resistive state of a resistive change element is 10 MΩ the resistor 501 may have a resistance=(1 MΩ+10 MΩ)/2=5.5 MΩ.

The first input device 503 is in electrical communication with the bus line BL4, the sense amplifier 506, and a power supply, a voltage source, a driver circuit, or other device that supplies a desired voltage. The first input device 503 is configured to supply the voltage on the bus line BL4 or the desired voltage to the sense device 506. An exemplary circuit for the first input device 503 is discussed below with respect to FIGS. 5B-1 and 5B-2. However, the first input device 503 is not limited to the first input device discussed below with respect to FIGS. 5B-1 and 5B-2. For example, the first input device 503 can be other circuits configured to supply the voltage on the bus line BL4 or the desired voltage to the sense device 506.

The second input device 504 is in electrical communication with the global bit line connection circuit 502, the sense amplifier 506, and a power supply, a voltage source, a driver circuit, or other device that supplies a desired voltage. The second input device 504 is configured to supply a voltage supplied by the global bit line connection circuit 502 or the desired voltage to the sense device 506. An exemplary circuit for the second input device 504 is discussed below with respect to FIGS. 5B-1 and 5B-2. However, the second input device 504 is not limited to the second input device discussed below with respect to FIGS. 5B-1 and 5B-2. For example, the second input device 504 can be other circuits configured to supply a voltage supplied by the global bit line connection circuit 502 or the desired voltage to the sense device 506.

The capacitor 505 has a first terminal and a second terminal. The first terminal of the capacitor 505 is in electrical communication with the reference line RL4 and the second terminal of the capacitor 505 is in electrical communication with a power supply, a voltage source, a driver circuit, or other device that supplies 0 volts or ground. The capacitor 505 can reduce noise on the reference line RL4 by providing a path for noise to flow to 0 volts or ground. Alternatively, the capacitor 505 can be replaced with a plurality of capacitors, with each capacitor having a first terminal in electrical communication with the reference line RL4 and a second terminal in electrical communication with a power supply, a voltage source, a driver circuit, or other device that supplies 0 volts or ground. Alternatively, the capacitor 505 can be omitted.

The sense device 506 is in electrical communication with the first input device 503 and the second input device 504 and the sense device 506 is configured to generate at least one output voltage based on a voltage supplied by the first input device 503 and a voltage supplied by the second input device 504. Exemplary sense amplifiers for the sense device 506 are discussed below with respect to FIGS. 5B-1, 5B-2, 6, and 7. However, the sense device 506 is not limited to the sense amplifiers discussed below with respect to FIGS. 5B-1, 5B-2, 6, and 7. For example, the sense device 506 can be a component that generates at least one output voltage based on at least two input voltages, such as a differential amplifier and a sense amplifier other than the sense amplifiers discussed below with respect to FIGS. 5B-1, 5B-2, 6, and 7.

Referring now to FIGS. 5B-1 and 5B-2, an exemplary implementation of the second exemplary architecture for programming and accessing resistive change elements is illustrated in a simplified schematic diagram. The exemplary implementation of the second exemplary architecture includes a resistive change element array 100, a plurality of global bit lines GB5(0)-GB5($x$), word line driver circuitry 110, a reference line RL5, a reference line connection circuit 120, a resistor 530, a bus line BL5, a keeper circuit 130, a global bit line connection circuit 540, a write buffer circuit 150, a current source 160, a first input device 510, a second input device 520, a capacitor 580, and a sense amplifier 550. The resistive change element array 100, the plurality of global bit lines GB5(0)-GB5($x$), the word line driver circuitry 110, the reference line connection circuit 120, the keeper circuit 130, the write buffer circuit 150, and the current source 160 have a similar structure to the resistive change element array 100, the plurality of global bit lines GB1(0)-GB1($x$), the word line driver circuitry 110, the reference line connection circuit 120, the keeper circuit 130, the write buffer circuit 150, and the current source 160 as discussed above with respect to the exemplary implementation of the first exemplary architecture for programming and accessing resistive change elements. Therefore, the resistive change element array 100, the plurality of global bit lines GB5(0)-GB5($x$), the word line driver circuitry 110, the reference line connection circuit 120, the keeper circuit 130, the write buffer circuit 150, and the current source 160 are not discussed in detail with respect to the exemplary implementation of the second exemplary architecture for programming and accessing resistive change elements.

The resistor 530 is included in the exemplary implementation of the second exemplary architecture to increase the impedance as seen from the second input device 520 so that the impedance as seen from the second input device 520 generally corresponds with the impedance as seen from the first input device 510, however, when the resistor 530 is not needed the resistor 530 may be omitted. For example, the resistor 530 may have a resistance that is an average of a model resistance for a low resistive state of a resistive change element and a model resistance for a high resistive state of a resistive change element because the impedance as seen from the first input device 510 during an accessing operation is dominated by a resistance of the resistive change element being accessed. In the above example, when the model resistance for a low resistive state of a resistive change element is 1 MΩ and the model resistance for a high resistive state of a resistive change element is 10 MΩ the resistor 530 may have a resistance=(1 MΩ+10 MΩ)/2=5.5 MΩ.

The global bit line connection circuit 540 includes a first plurality of PMOS transistors 540$g$-54$xg$ having drain terminals, gate terminals, and source terminals and a second plurality of PMOS transistors 540$r$-54$xr$ having drain terminals, gate terminals, and source terminals. The numbering convention for the first plurality of PMOS transistors 540$g$-54$xg$ includes a column number as the next to last reference character, the numbering convention for the second plurality of PMOS transistors 540$r$-54$xr$ includes a column number as the next to last reference character, and the numbering convention for the plurality of global bit lines GB5(0)-GB5($x$) begins with letters and number GB5 indicating the line is a global bit line followed by a column number in parentheses. The drain terminals of the first plurality of PMOS transistors 540$g$-54$xg$ are in electrical communication with the bus line BL5. The gate terminals of the first plurality of PMOS transistors 540$g$-54$xg$ are in electrical communication with control logic, such as a processor, a controller, and a microcontroller. The source terminals of the first plurality of PMOS transistors 540$g$-54$xg$ are in electrical communication with the global bit lines GB5(0)-GB5($x$) having the same column number. The drain terminals of the second plurality of PMOS transistors 540$r$-54$xr$ are in electrical communication with the second input device 520. The gate terminals of the second plurality of PMOS transistors 540$r$-54$xr$ are in electrical communication with control logic, such as a processor, a controller, and a microcontroller. The source terminals of the second plurality of PMOS transistors 540$r$-54$xr$ are in electrical communication with the reference line RL5 through the resistor 530. Alternatively, the first plurality of PMOS transistors 540$g$-54$xg$ can be other types of field effect transistors, such as carbon nanotube field effect transistors (CNTFETs), SiGE FETs, fully-depleted silicon-on-insulator FETs, or multiple gate field effect transistors such as FinFETs, and/or the second plurality of PMOS transistors 540$r$-54$xr$ can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the first plurality of PMOS transistors 540$g$-54$xg$ and the second plurality of PMOS transistors 540$r$-54$xr$.

The global bit line connection circuit 540 includes the second plurality of PMOS transistors 540r-54xr in electrical communication with the reference line RL5 and the second input device 520 so that the noise behavior of a voltage on the reference line RL5 received by the second input device 520 is similar to the noise behavior of a voltage on the bus line BL5 received by the first input device 510. The number of PMOS transistors in the first plurality of PMOS transistors 540g-54xg and the number of PMOS transistors in the second plurality of PMOS transistors 540r-54xr are generally the same number. The first plurality of PMOS transistors 540g-54xg and the second plurality of PMOS transistors 540r-54xr receive a plurality of signals YD0-YDx for controlling current flow through the first plurality of PMOS transistors 540g-54xg and the second plurality of PMOS transistors 540r-54xr. PMOS transistors in the first plurality of PMOS transistors 540g-54xg and PMOS transistors in the second plurality of PMOS transistors 540r-54xr having the same column numbers receive the same signals.

The capacitor 580 has a first terminal and a second terminal. The first terminal of the capacitor 580 is in electrical communication with the reference line RL5 and the second terminal of the capacitor 580 is in electrical communication with a power supply, a voltage source, a driver circuit, or other device that supplies 0 volts or ground. The capacitor 580 can reduce noise on the reference line RL5 by providing a path for noise to flow to 0 volts or ground. Alternatively, the capacitor 580 can be replaced with a plurality of capacitors, with each capacitor having a first terminal in electrical communication with the reference line RL5 and a second terminal in electrical communication with a power supply, a voltage source, a driver circuit, or other device that supplies 0 volts or ground. Alternatively, the capacitor 580 can be omitted.

The first input device 510 includes a first PMOS transistor 512 having a drain terminal, a gate terminal, and a source terminal and a second PMOS transistor 514 having a drain terminal, a gate terminal, and a source terminal. The drain terminal of the first PMOS transistor 512 is in electrical communication with a first input terminal of the sense amplifier 550, the gate terminal of the first PMOS transistor 512 is in electrical communication with control logic, such as a processor, a controller, and a microcontroller, to receive an initialization signal INIT, and the source terminal of the first PMOS transistor 512 is in electrical communication with the bus line BL5. The drain terminal of the second PMOS transistor 514 is in electrical communication with a first input terminal of the sense amplifier 550, the gate terminal of the second PMOS transistor 514 is in electrical communication with control logic, such as a processor, a controller, and a microcontroller, to receive a complementary initialization signal INITB, and the source terminal of the second PMOS transistor 514 is in electrical communication with a power supply, a voltage source, a driver circuit, or other device that supplies an inhibit voltage VINH.

The second input device 520 includes a first PMOS transistor 522 having a drain terminal, a gate terminal, and a source terminal and a second PMOS transistor 524 having a drain terminal, a gate terminal, and a source terminal. The drain terminal of the first PMOS transistor 522 is in electrical communication with a second input terminal of the sense amplifier 550 and the capacitor 580, the gate terminal of the first PMOS transistor 522 is in electrical communication with control logic, such as a processor, a controller, and a microcontroller, to receive an initialization signal INIT, and the source terminal of the first PMOS transistor 522 is in electrical communication with the global bit line connection circuit 540. The drain terminal of the second PMOS transistor 524 is in electrical communication with a second input terminal of sense amplifier 550 and the capacitor 580, the gate terminal of the second PMOS transistor 524 is in electrical communication with control logic, such as a processor, a controller, and a microcontroller, to receive a complementary initialization signal INITB, and the source terminal of the second PMOS transistor 524 is in electrical communication with a power supply, a voltage source, a driver circuit, or other device that supplies an inhibit voltage VINH.

The sense amplifier 550 has a first input terminal in electrical communication with the first input device 510, a second input terminal in electrical communication with the second input device 520, and two output terminals. The two output terminals can be in electrical communication with a bus, a buffer, a level shift circuit, a test circuit, or control logic such as a processor, a controller, and a microcontroller. The sense amplifier 550 can be a second sense amplifier 600 or a third sense amplifier 700. The second sense amplifier 600 is discussed below with respect to FIG. 6. The third sense amplifier 700 is discussed below with respect to FIG. 7.

As shown in FIGS. 5B-1 and 5B-2, the first input device 510 and the second input device 520 are located outside of the sense amplifier 550 and this permits the first input device 510 and/or the second input device 520 to be shared with multiple sense amplifiers. For example, when the exemplary implementation of the second exemplary architecture additionally includes another sense amplifier for comparing the voltage on the reference line RL5 and a voltage on another bus line, the second input device 520 can be shared by the sense amplifier 550 and the another sense amplifier. For example, when the exemplary implementation of the second exemplary architecture additionally includes another sense amplifier for comparing a voltage on another reference line and the voltage on the bus line BL5, the first input device 510 can be shared by the sense amplifier 550 and the another sense amplifier. In the above examples, where the sense amplifier 550 and another sense amplifier share an input device the exemplary implementation of the second exemplary architecture includes three input devices instead of four input devices. Sharing input devices between multiple sense amplifiers can reduce the number of the input devices included in an architecture and thus reduce the amount of chip area consumed. Additionally, sharing input devices between multiple sense amplifiers can reduce the number of input devices in electrical communication with a reference line and/or a bus line. Further, sharing input devices between multiple sense amplifiers can reduce the number of transistors that are supplied with signals by control logic, such as a processor, a controller, and a microcontroller.

Referring now to FIG. 5C, an exemplary arrangement for two sense amplifiers sharing an input device is illustrated. The exemplary arrangement includes two sense amplifiers 550a and 550b, two first input devices 560a, 560b, and a second input device 570. In the exemplary arrangement of FIG. 5C, the sense amplifier 550a is used for comparing a voltage on a bus line BL51 and a voltage on a reference line RL51 and the sense amplifier 550b is used for comparing a voltage on a bus line BL52 and a voltage on the reference line RL51. Each of the two sense amplifiers 550a, 550b has a first input terminal, a second input terminal, and two output terminals.

The first input device 560a includes a first PMOS transistor 562a having a drain terminal, a gate terminal, and a source terminal and a second PMOS transistor 564a having a drain terminal, a gate terminal, and a source terminal. The drain terminal of the first PMOS transistor 562a is in electrical communication with a first input terminal of the sense amplifier 550a, the gate terminal of the first PMOS transistor 562a is in electrical communication with control logic, such as a processor, a controller, and a microcontroller, to receive an initialization signal INIT, and the source terminal of the first PMOS transistor 562a is in electrical communication with the bus line BL51. The drain terminal of the second PMOS transistor 564a is in electrical communication with a first input terminal of the sense amplifier 550a, the gate terminal of the second PMOS transistor 564a is in electrical communication with control logic, such as a processor, a controller, and a microcontroller, to receive a complementary initialization signal INITB, and the source terminal of the second PMOS transistor 564a is in electrical communication with a power supply, a voltage source, a driver circuit, or other device that supplies an inhibit voltage VINH.

The first input device 560b includes a first PMOS transistor 562b having a drain terminal, a gate terminal, and a source terminal and a second PMOS transistor 564b having a drain terminal, a gate terminal, and a source terminal. The drain terminal of the first PMOS transistor 562b is in electrical communication with a first input terminal of the sense amplifier 550b, the gate terminal of the first PMOS transistor 562b is in electrical communication with control logic, such as a processor, a controller, and a microcontroller, to receive an initialization signal INIT, and the source terminal of the first PMOS transistor 562b is in electrical communication with the bus line BL52. The drain terminal of the second PMOS transistor 564b is in electrical communication with a first input terminal of the sense amplifier 550b, the gate terminal of the second PMOS transistor 564b is in electrical communication with control logic, such as a processor, a controller, and a microcontroller, to receive a complementary initialization signal INITB, and the source terminal of the second PMOS transistor 564b is in electrical communication with a power supply, a voltage source, a driver circuit, or other device that supplies an inhibit voltage VINH.

The second input device 570 includes a first PMOS transistor 572 having a drain terminal, a gate terminal, and a source terminal and a second PMOS transistor 574 having a drain terminal, a gate terminal, and a source terminal. The drain terminal of the first PMOS transistor 572 is in electrical communication with a second input terminal of the sense amplifier 550a and a second input terminal of the sense amplifier 550b, the gate terminal of the first PMOS transistor 572 is in electrical communication with control logic, such as a processor, a controller, and a microcontroller, to receive an initialization signal INIT, and the source terminal of the first PMOS transistor 572 is in electrical communication with the reference line RL51. The drain terminal of the second PMOS transistor 574 is in electrical communication with a second input terminal of the sense amplifier 550a and a second input terminal of the sense amplifier 550b, the gate terminal of the second PMOS transistor 574 is in electrical communication with control logic, such as a processor, a controller, and a microcontroller, to receive a complementary initialization signal INITB, and the source terminal of the second PMOS transistor 574 is in electrical communication with a power supply, a voltage source, a driver circuit, or other device that supplies an inhibit voltage VINH. The second input device 570 is shared between the two sense amplifiers 550a, 550b by having the drain terminals of the first PMOS transistor 572 and the second PMOS transistor 574 in electrical communication with the second input terminal of the sense amplifier 550a and the second input terminal of the sense amplifier 550b.

PROGRAMMING operations of resistive change elements in the exemplary implementation of the second exemplary architecture shown in FIGS. 5B-1 and 5B-2 are performed in a similar manner to PROGRAMMING operations of resistive change elements in the exemplary implementation of the first exemplary architecture. PROGRAMMING operations of resistive change elements in the exemplary implementation of the first exemplary architecture are discussed above. Therefore, PROGRAMMING operations of resistive change elements in the exemplary implementation of the second exemplary architecture shown in FIGS. 5B-1 and 5B-2 are not discussed in detail below. READ operations, SET VERIFY operations, and RESET VERIFY operations of resistive change elements in the exemplary implementation of the second exemplary architecture of FIGS. 5B-1 and 5B-2 are discussed below with respect to FIGS. 5D-1 and 5D-2 that show current flow during a READ operation of resistive change element O01 when resistive change element O01 has a low resistive state and FIGS. 5E-1 and 5E-2 that show current flow during a READ operation of resistive change element O01 when resistive change element O01 has a high resistive state. It is noted that although READ operations, SET VERIFY operations, and RESET VERIFY operations of resistive change element O01 in the exemplary implementation of the second exemplary architecture of FIGS. 5B-1 and 5B-2 will be explained in detail below, READ operations, SET VERIFY operations, and RESET VERIFY operations of each resistive change element in the exemplary implementation of the second exemplary architecture of FIGS. 5B-1 and 5B-2 can be performed in a similar manner to resistive change element O01.

Referring now to FIGS. 5D-1 and 5D-2, a READ operation of the resistive change element O01 starts, as similarly discussed above in step 402 of the flow chart 400, by providing neutral voltage conditions for the plurality of resistive change elements E00-Oxy in the resistive change element array 100. The neutral voltage conditions are provided for the plurality of resistive change elements E00-Oxy by floating the plurality of even bit lines Be(0)-Be(x) and the plurality of odd bit lines Bo(0)-Bo(x) and applying the inhibit voltage VINH to the plurality of word lines W(0)-W(y) with the plurality of even bit lines Be(0)-Be(x) and the plurality of odd bit lines Bo(0)-Bo(x) floating so that voltages approximately equal to the inhibit voltage VINH are applied to the top electrodes and the bottom electrodes of the resistive change elements in the plurality of resistive change elements E00-Oxy. Floating a line refers to electrically connecting the line such that a voltage on the line exists due to a line capacitance of the line. The plurality of even bit lines Be(0)-Be(x) are floated by disconnecting the plurality of even bit lines Be(0)-Be(x) from the plurality of global bit lines GB5(0)-GB5(x) by turning off the plurality of even selection devices Ne0-Nex. The plurality of even selection devices Ne0-Nex are turned off by control logic, such as a processor, a controller, and a microcontroller, supplying a signal SSELe having a low level. The plurality of odd bit lines Bo(0)-Bo(x) are floated by disconnecting the plurality of odd bit lines Bo(0)-Bo(x) from the plurality of global bit lines GB5(0)-GB5(x) by turning off the plurality of odd selection devices No0-Nox. The plurality of odd selection devices No0-Nox are turned off by control logic, such as a processor, a controller, and a microcontroller, supplying a signal SSELo having a low level. It is noted that control logic, such as a processor, a controller, and a microcontroller, supplying a signal SSELe having a low level and a signal SSELo having a low level also turns off the first NMOS transistor 121 and the second NMOS transistor 122 of the reference line connection circuit 120.

The inhibit voltage VINH is applied to the plurality of word lines W(0)-W(y) by the word line driver circuitry 110 driving voltages on the plurality of word lines W(0)-W(y) to the inhibit voltage VINH. The plurality of word line driver circuits 110d-11yd receive the system voltage VDD on the first power terminals because the first NMOS transistor 110p is turned on by control logic, such as a processor, a controller, and a microcontroller, supplying the signal S0 having a high level and receive the inhibit voltage VINH on the second power terminals because the second NMOS transistor 111p is turned on by the control logic supplying the signal S1 having a high level. The plurality of word line driver circuits 110d-11yd supply the inhibit voltage VINH based on the plurality of signals ITE0-ITEy supplied by control logic, such as a processor, a controller, and a microcontroller. The plurality of sink transistors 110s-11ys are turned off because control logic, such as a processor, a controller, and a microcontroller, supplies the plurality of signals SK0-Sky having low levels.

Driving the plurality of word lines W(0)-W(y) to the inhibit voltage VINH with the plurality of even bit lines Be(0)-Be(x) and the plurality of odd bit lines Bo(0)-Bo(x) floating causes voltages on the plurality of word lines W(0)-W(y), voltages on the plurality of even bit lines Be(0)-Be(x), and voltages on the plurality of odd bit lines Bo(0)-Bo(x) to be approximately equal to the inhibit voltage VINH. Voltages on the plurality of even bit lines Be(0)-Be(x) and voltages on the plurality of odd bit lines Bo(0)-Bo(x) are approximately equal to the inhibit voltage VINH because currents flow from the plurality of word lines W(0)-W(y) through the plurality of resistive change elements E00-Oxy into the plurality of even bit lines Be(0)-Be(x) and the plurality of odd bit lines Bo(0)-Bo(x). The inhibit voltage VINH exists on the plurality of even bit lines Be(0)-Be(x) and the plurality of odd bit lines Bo(0)-Bo(x) due to line capacitances because the plurality of even bit lines Be(0)-Be(x) and the plurality of odd bit lines Bo(0)-Bo(x) are floating. Thus, driving voltages on the plurality of word lines W(0)-W(y) to the inhibit voltage VINH with the plurality of even bit lines Be(0)-Be(x) and the plurality of odd bit lines Bo(0)-Bo(x) floating results in application of voltages approximately equal to the inhibit voltage VINH to the top electrodes and the bottom electrodes of the resistive change elements in the plurality of resistive change elements E00-Oxy. Additionally, driving the plurality of word lines W(0)-W(y) to the inhibit voltage VINH with the plurality of even bit lines Be(0)-Be(x) and the plurality of odd bit lines Bo(0)-Bo(x) floating causes the voltages across resistive change elements in the plurality of resistive change elements E00-Oxy to be approximately 0 volts.

The READ operation of the resistive change element O01 continues, as similarly discussed above in step 404 of the flow chart 400, by biasing the plurality of global bit lines GB5(0)-GB5(x). The plurality of global bit lines GB5(0)-GB5(x) are biased to the inhibit voltage VINH by floating the plurality of global bit lines GB5(0)-GB5(x) and applying the inhibit voltage VINH to the plurality of global bit lines GB5(0)-GB5(x). The plurality of global bit lines GB5(0)-GB5(x) are floated by disconnecting the plurality of global bit lines GB5(0)-GB5(x) from the plurality of even bit lines Be(0)-Be(x), the plurality of odd bit lines Bo(0)-Bo(x), and the bus line BL5. The plurality of global bit lines GB5(0)-GB5(x) may be disconnected from the plurality of even bit lines Be(0)-Be(x) and the plurality of odd bit lines Bo(0)-Bo(x) as part of providing neutral voltage conditions for the plurality of resistive change elements E00-Oxy as discussed above. The plurality of global bit lines GB5(0)-GB5(x) are disconnected from the bus line BL5 by turning off the first plurality of PMOS transistors 540g-54xg in the global bit line connection circuit 540. The first plurality of PMOS transistors 540g-54xg are turned off by control logic, such as a processor, a controller, and a microcontroller, supplying a plurality of signals YD0-YDx having high levels. The inhibit voltage VINH is applied to the plurality of global bit lines GB5(0)-GB5(x) by electrically connecting the plurality of global bit lines GB5(0)-GB5(x) to a power supply, a voltage source, a driver circuit, or other device that supplies the inhibit voltage VINH by turning on the plurality of NMOS transistors 130k-13xk in the keeper circuit 130. The plurality of NMOS transistors 130k-13xk are turned on by control logic, such as a processor, a controller, and a microcontroller, supplying a signal KEEPe having a high level and a signal KEEPo having a high level. It is noted that control logic, such as a processor, a controller, and a microcontroller, supplying a plurality of signals YD0-YDx having high levels also turns off the second plurality of PMOS transistors 540r-54xr in the global bit line connection circuit 540. It is further noted that the reference line RL5 floats because the second plurality of PMOS transistors 540r-54xr, the first NMOS transistor 121, and the second NMOS transistor 122 are turned off.

The READ operation of the resistive change element O01 proceeds, as similarly discussed above in step 406 of the flow chart 400, by selecting the resistive change element O01 from the plurality of resistive change elements E00-Oxy. The resistive change element O01 is selected from the plurality of resistive change elements E00-Oxy by control logic, such as a processor, a controller, and a microcontroller. The resistive change elements E00-Ox0, E01, Ex1-Ox1 and E0y-Oxy in the plurality of resistive change elements E00-Oxy that are not selected are referred to as unselected resistive change elements.

The READ operation of the resistive change element O01 continues, as similarly discussed above in step 408 of the flow chart 400, by preparing the exemplary implementation of the second exemplary architecture for determining a resistive state of the resistive change element O01. The exemplary implementation of the second exemplary architecture is prepared for determining a resistive state of the resistive change element O01 by changing electrical connections of the reference line RL5, driving the voltage on the reference line RL5 to the inhibit voltage VINH, changing electrical connections of the odd bit line Bo(0), changing electrical connections of the global bit line GB5(0), and disconnecting a power supply, a voltage source, a driver circuit, or the device that supplies the inhibit voltage VINH from the global bit line GB5(0). The electrical connections of the reference line RL5 are changed so that the reference line RL5 is in electrical communication with the second input device 520. The reference line RL5 is electrically connected to the second input device 520 by turning on the PMOS transistor 540r. The PMOS transistor 540r is turned on by control logic, such as a processor, a controller, and a microcontroller, supplying a signal YD0 having a low level. The voltage on the reference line RL5 is driven to the inhibit voltage VINH by electrically connecting the reference line RL5 through the second NMOS transistor 122 of the reference line connection circuit 120 and the second NMOS transistor 111*p* of the word line driver circuitry 110 to a power supply, a voltage source, a driver circuit, or other device that supplies the inhibit voltage VINH. The second NMOS transistor 122 is turned on by control logic, such as a processor, a controller, and a microcontroller, supplying a signal SSELo having a high level and, as discussed above with respect to providing neutral voltage conditions for the plurality of resistive change elements E00-Oxy in the resistive change element array 100, the second NMOS transistor 111*p* of the word line driver circuitry 110 is turned on.

The electrical connections of the odd bit line Bo(0) and the electrical connections of the global bit line GB5(0) are changed and a power supply, a voltage source, a driver circuit, or other device that supplies the inhibit voltage VINH is disconnected from the global bit line GB5(0) so that a voltage indicative of the resistive state of the resistive change element O01 can be generated on the odd bit line Bo(0), the global bit line GB5(0), and the bus line BL5. The electrical connections of the odd bit line Bo(0) are changed so that the odd bit line Bo(0) is in electrical communication with the global bit line GB5(0). The odd bit line Bo(0) is electrically connected to the global bit line GB5(0) by turning on the odd selection device No0. The odd selection device No0 is turned on by control logic, such as a processor, a controller, and a microcontroller, supplying a signal SSELo having a high level. The odd bit line Bo(0) may be electrically connected to the global bit line GB5(0) as part of driving the voltage on the reference line RL5 to the inhibit voltage VINH as discussed above. It is noted that the plurality of odd selection devices No0-Nox are turned on by the control logic supplying a signal SSELo having a high level, and thus, the plurality of odd bit lines Bo(0)-Bo(x) are electrically connected to the plurality of global bit lines GB5(0)-GB5(x).

The electrical connections of the global bit line GB5(0) are changed so that the global bit line GB5(0) is in electrical communication with the odd bit line Bo(0) and the bus line BL5. The global bit line GB5(0) is electrically connected to the odd bit line Bo(0) by turning on the odd selection device No0 as discussed above and the global bit line GB5(0) may be electrically connected to the odd bit line Bo(0) as part of driving the voltage on the reference line RL5 to the inhibit voltage VINH as discussed above. The global bit line GB5(0) is electrically connected to the bus line BL5 by turning on the PMOS transistor 540*g*. The PMOS transistor 540*g* is turned on by control logic, such as a processor, a controller, and a microcontroller, supplying a signal YD0 having a low level. The global bit line GB5(0) may be electrically connected to the bus line BL5 as part of electrically connecting the reference line RL5 to the second input device 520 as discussed above. A power supply, a voltage source, a driver circuit, or other device that supplies the inhibit voltage VINH is disconnected from the global bit line GB5(0) by turning off the NMOS transistor 130*k*. The NMOS transistor 130*k* is turned off by control logic, such as a processor, a controller, and a microcontroller, supplying a signal KEEPe having a low level. It is noted that the control logic supplying a signal KEEPe having a low level also turns off NMOS transistors in the plurality of NMOS transistors 130*k*-13*xk* in electrical communication with global bit lines having even column numbers and disconnects global bit lines having even column numbers from a power supply, a voltage source, a driver circuit, or other device that supplies the inhibit voltage VINH.

The READ operation of the resistive change element O01 continues, as similarly discussed above in step 410 of the flow chart 400, by generating a voltage indicative of a resistive state of the resistive change element O01. The voltage indicative of the resistive state of the resistive change element O01 is generated on the odd bit line Bo(0), the global bit line GB5(0), and the bus line BL5 by driving the voltage on the word line W(1) to the system voltage VDD and sinking an amount of current for a READ operation from the bus line BL5. As discussed above, providing neutral voltage conditions for the plurality of resistive change elements E00-Oxy causes voltages on the plurality of word lines W(0)-W(y), voltages on the plurality of even bit lines Be(0)-Be(x), and voltages on the plurality of odd bit lines Bo(0)-Bo(x) to be approximately equal to the inhibit voltage VINH. Also, as discussed above, the plurality of global bit lines GB5(0)-GB5(x) are biased to the inhibit voltage VINH. Thus, for generating a voltage indicative of a resistive state of the resistive change element O01, a voltage on the word line W(1) transitions from the inhibit voltage VINH to the system voltage VDD and the voltages on the odd bit line Bo(0) and the global bit line GB5(0) transition from the inhibit voltage VINH to a voltage indicative of a resistive state of the resistive change element O01.

The voltage transition of the voltage on the word line W(1) generally corresponds with the voltage transition of the voltage on the top electrode TE of the resistive change element O01 because the voltage on the word line W(1) generally corresponds with the voltage on the top electrode TE of the resistive change element O01. The voltage transition of the voltage on the odd bit line Bo(0) generally corresponds with the voltage transition of the voltage on the bottom electrode BE of the resistive change element O01 because the voltage on the odd bit line Bo(0) generally corresponds with the voltage on the bottom electrode BE of the resistive change element O01. The magnitude of the voltage transition to place the top electrode TE of the resistive change element O01 at the system voltage VDD for generating a voltage indicative of a resistive state of the resistive change element O01 is reduced because the voltage applied to the top electrode TE of the resistive change element O01 is not required to transition by the magnitude of the system voltage VDD. A voltage transition of the system voltage VDD minus the inhibit voltage VINH is required to place the top electrode at the system voltage VDD. For example, when the inhibit voltage VINH is VDD/2 (half of the system voltage VDD) a voltage transition of VDD−VDD/2=VDD/2 is required to place the top electrode at the system voltage VDD. Further, the number of voltage transitions for generating a voltage indicative of a resistive state of the resistive change element O01 is reduced because only voltages on the word line W(1), the global bit line GB5(0), and the odd bit line Bo(0) are adjusted for generating a voltage indicative of a resistive state of the resistive change element O01. It is noted that applying the inhibit voltage VINH to a top electrode, a bottom electrode, or both a top electrode and a bottom electrode of a resistive change element limits a voltage applied across a resistive change element to a voltage less than a voltage limit for disturbing a resistive state of a resistive change element while generating a voltage indicative of a resistive state of the resistive change element O01.

The voltage on the word line W(1) is driven from the inhibit voltage VINH to the system voltage VDD by changing the voltage supplied by the word line driver circuit 111*d* from the inhibit voltage VINH to the system voltage VDD. The word line driver circuit 111*d* changes from supplying the inhibit voltage VINH to the system voltage VDD based on a signal ITE1 supplied by control logic, such as a processor, a controller, and a microcontroller. The write buffer circuit 150 does not supply a voltage based on the write set signal WR0 and the write reset signal WR1 supplied by control logic, such as a processor, a controller, and a microcontroller. The amount of current for a READ operation is sunk from the bus line BL5 by the current source 160. The amount of current for a READ operation is based on the amount of current that would flow through a resistor having an intermediate resistance and having the system voltage VDD applied to one terminal of the resistor and the inhibit voltage VINH applied to the other terminal of the resistor. The amount of current that would flow through a resistor having an intermediate resistance and having the system voltage VDD applied to one terminal of the resistor and the inhibit voltage VINH applied to the other terminal of the resistor can be approximated by the following equation, I=(VDD−VINH)/Intermediate Resistance. For example, when the intermediate resistance=5.5 MΩ, the system voltage VDD=2V, and the inhibit voltage VINH=1V, the current source 160 is configured to sink an amount of current that can be approximated as I=(2V−1V)/5.5 MΩ=0.18 μA. It is noted that, ignoring leakage currents, the amount of current for the READ operation flows through the resistive change element O01, the odd bit line Bo(0), the global bit line GB5(0), and the bus line BL5 to the current source 160.

The intermediate resistance sets a boundary for resistance values that correspond with a low resistive state during READ operations and resistance values that correspond with a high resistive state during READ operations. The intermediate resistance is a design variable that can be selected by a circuit designer and the circuit designer typically selects an intermediate resistance greater than a model resistance for a low resistive state of a resistive change element and less than a model resistance for a high resistive state of a resistive change element. For example, when a model resistance for a low resistive state of a resistive change element is 1 MΩ and a model resistance for a high resistive state of a resistive change elements is 10 MΩ, a circuit designer can select an intermediate resistance of 5.5 MΩ so that resistive change elements having a resistance less than approximately 5.5 MΩ are determined to have a low resistive state during READ operations and resistive change elements having a resistance greater than approximately 5.5 MΩ are determined to have a high resistive state during READ operations. It is noted that the intermediate resistance is not limited to a resistance at the exact midpoint between a model resistance for a low resistive state of a resistive change element and a model resistance for a high resistive state of a resistive change element, but rather the intermediate resistance can be closer the model resistance for the low resistive state or the model resistance for the high resistive state.

FIG. 5D-1 shows a current IO01 flowing through the resistive change element O01 from the top electrode TE to the bottom electrode BE because the top electrode TE is at the system voltage VDD and the bottom electrode BE is at a voltage indicative of a resistive state of the resistive change element O01. While, ignoring leakage currents, the amount of the current flowing through the resistive change element O01, the odd bit line Bo(0), the global bit line GB5(0), and the bus line BL5 are the same amount of current (the amount of current of current for the READ operation). Additionally, ignoring leakage currents, routing parasitics, and on resistance of the odd selection device No0, the voltage VBo(0) on the odd bit line Bo(0), the voltage VGB5(0) on the global bit line GB5(0), and the voltage on the bus line BL5 are generally the same voltage and the voltage VBo(0) on the odd bit line Bo(0), the voltage VGB5(0) on the global bit line GB5(0), and the voltage on the bus line BL5 are indicative of the resistive state of the resistive change element O01. It is noted that the voltage indicative of a resistive state of the resistive change element O01 is discussed below with respect to the voltage VGB5(0) on the global bit line GB5(0).

The voltage VGB5(0) on the global bit line GB5(0), ignoring leakage currents, routing parasitics, and on resistance of the odd selection device No0, can be approximated by subtracting the voltage drop across the resistive change element O01 from the voltage VW(1) on the word line W(1). The voltage drop across the resistive change element O01 can be approximated using Ohm's Law. Thus, the voltage VGB5(0) on the global bit line GB5(0) can be approximated by the following equation VGB5(0)=VW(1)−(IO01×RO01), where VW(1) is the voltage on the word line W(1), the current IO01 is the current flowing through resistive change element O01, and RO01 is the resistance of the resistive change element O01. As shown by this equation, the voltage VGB5(0) on the global bit line GB5(0) changes when the resistance of the resistive change element O01 changes because the voltage VW(1) on the word line W(1) and the current IO01 flowing through the resistive change element O01 are generally the same for READ operations. For example, when VW(1)=2 volts, IO01=1/5.5 microamps, and RO01=5.5 MΩ, the voltage VGB5(0)=2V−(1/5.5 μA×5.5 MΩ)=1V. For example, when VW(1)=2 volts, IO01=1/5.5 microamps, and RO01=1 MΩ, the voltage VGB5(0)=2V−(1/5.5 μA×1 MΩ)=1.82V. For example, when VW(1)=2 volts, IO01=1/5.5 microamps, and RO01=10 MΩ, the voltage VGB5(0)=2V−(1/5.5 μA×10 MΩ)=0.182V.

FIG. 5D-1 also shows leakage currents flowing through the resistive change elements O00, O0y in electrical communication with the odd bit line Bo(0) and leakage currents flowing through the resistive change elements E01, Ex1-Ox1 in electrical communication with the word line W(1). The leakage currents are shown using dashed lines in FIG. 5D-1. Leakage currents flow through the resistive change elements O00, O0y because the bottom electrodes of the resistive change elements O00, O0y are at a voltage indicative of a resistive state of the resistive change element O01 and the top electrodes of the resistive change elements O00, O0y are the inhibit voltage VINH. Leakage currents flow through resistive change elements E01, Ex1-Ox1 because the bottom electrodes of the resistive change elements E01, Ex1-Ox1 are at the inhibit voltage VINH and the top electrodes of the resistive change elements E01, Ex1-Ox1 are at the system voltage VDD. It is noted that leakage currents may flow through resistive change elements other than the resistive change elements in electrical communication with the odd bit line Bo(0) and the resistive change elements in electrical communication with the word line W(1) because voltages on other lines may be impacted by generating a voltage indicative of a resistive state of the resistive change element O01. It is also noted that leakage currents do not prevent the READ operation of the resistive change element O01 when the leakage currents are much less than the amount of the current IO01. It is further noted that the voltage differences across the resistive change elements that cause the leakage currents do not disturb the resistive states of the resistive change elements because the voltage differences are less than a voltage limit for disturbing a resistive state of a resistive change element.

It is additionally noted that when the voltage VBo(0) on the odd bit line Bo(0) is less than the inhibit voltage VINH and the word lines W(0), W(y) in electrical communication with the other resistive change elements O00, O0y on the odd bit line Bo(0) are driven to the inhibit voltage VINH, leakage currents flow into the odd bit line Bo(0) through the other resistive change elements O00, O0y and pull up the voltage VBo(0) on the odd bit line Bo(0). It is also noted that when the voltage VBo(0) on the odd bit line Bo(0) is greater than the inhibit voltage VINH and the word lines W(0), W(y) in electrical communication with the other resistive change elements O00, O0y on the odd bit line Bo(0) are driven to the inhibit voltage VINH, leakage currents flow from the odd bit line Bo(0) through the other resistive change elements O00, O0y and pull down the voltage VBo(0) on the bit line Bo(0). It is further noted that when the voltage VBo(0) on the odd bit line Bo(0) is pulled up by leakage currents flowing into the odd bit line Bo(0) and when the voltage VBo(0) on the odd bit line Bo(0) is pulled down by leakage currents flowing from the odd bit line Bo(0), the number of the word lines W(0), W(y) should be small enough to allow a margin to determine a resistive state of the resistive change element O01.

The READ operation of the resistive change element O01 proceeds, as similarly discussed above in step 412 of the flow chart 400, by determining the resistive state of the resistive change element O01 based on the voltage VGB5(0) on the global bit line GB5(0). The resistive state of the resistive change element O01 is determined by comparing the voltage VGB5(0) on with global bit line GB5(0) with the inhibit voltage VINH on the reference line RL5. As discussed above, the voltage VGB5(0) on the global bit line GB5(0) is indicative of the resistive state of the resistive change element O01. For READ operations the inhibit voltage VINH is indicative of the intermediate resistance because the inhibit voltage VINH is equal to the system voltage VDD minus a voltage calculated by multiplying the amount of current for a READ operation and the intermediate resistance of 5.5 MΩ. For example, when the system voltage VDD=2V, the inhibit voltage VINH=1V, the amount of current for READ operations=1/5.5 µA, and the intermediate resistance=5.5 MΩ, VINH=2V−(1/5.5 µA×5.5 MΩ)=1V. When the voltage VGB5(0) on the global bit line GB5(0) is greater than the inhibit voltage (i.e. the voltage VGB5(0) on the global bit line GB5(0)>VINH) the resistance of the resistive change element O01 is less than the intermediate resistance (i.e. RO01<intermediate resistance, where RO01 is the resistance of the resistive change element O01) and the resistive state of the resistive change element O01 is determined to be a low resistive state. When the voltage VGB5(0) on the global bit line GB5(0) is less than the inhibit voltage VINH (i.e. the voltage VGB5(0) on the global bit line GB5(0)<VINH) the resistance of the resistive change element O01 is greater than the intermediate resistance (i.e. RO01>intermediate resistance, where RO01 is the resistance of the resistive change element O01) and the resistive state of resistive change element O01 is determined to be a high resistive state.

As shown in FIG. 5D-2, the first input device 510 receives the voltage VGB5(0) on the global bit line GB5(0), the inhibit voltage VINH from a power supply, a voltage source, a driver circuit, or other device that supplies the inhibit voltage VINH, the initialization signal INIT, and the complementary initialization signal INITB, and the second input device 520 receives the inhibit voltage VINH on the reference line RL5, the inhibit voltage VINH from a power supply, a voltage source, a driver circuit, or other device that supplies the inhibit voltage VINH, the initialization signal INIT, and the complementary initialization signal INITB. When the initialization signal INIT has a low level and the complementary initialization signal INITB has a high level, the first input device 510 supplies the voltage VGB5(0) on the global bit line GB5(0) to the sense amplifier 550 and the second input device 520 supplies the inhibit voltage VINH on the reference line RL5 to the sense amplifier 550. When the initialization signal INIT has a high level and the complementary initialization signal INITB has a low level, the first input device 510 supplies the inhibit voltage VINH from a power supply, a voltage source, a driver circuit, or other device that supplies the inhibit voltage VINH to the sense amplifier 550 and the second input device 520 supplies the inhibit voltage VINH from a power supply, a voltage source, a driver circuit, or other device that supplies the inhibit voltage VINH to the sense amplifier 550.

When the initialization signal INIT has a low level and the complementary initialization signal INITB has a high level the sense amplifier 550 receives the voltage VGB5(0) on the global bit line GB5(0) and the inhibit voltage VINH on the reference line RL5. The sense amplifier 550 determines the resistive state of the resistive change element O01 by comparing the inhibit voltage VINH on the reference line RL5 with the voltage VGB5(0) on the global bit line GB5(0). The sense amplifier 550 outputs signals indicative of the resistive state of the resistive change element O01 on two outputs. When the voltage VGB5(0) on the global bit line GB5(0) is greater than the inhibit voltage VINH, the sense amplifier 550 outputs signals indicating the resistive change element O01 has a low resistive state. When the voltage VGB5(0) on the global bit line GB5(0) is less than the inhibit voltage VINH, the sense amplifier 550 outputs signals indicating the resistive change element O01 has a high resistive state. The operation of the sense amplifier 550 when the sense amplifier 550 is a second sense amplifier 600 is discussed in greater detail with respect to the simplified schematic diagram of the second sense amplifier 600 shown in FIG. 6 and the exemplary voltage waveforms for describing operation of the second sense amplifier 600 for READ operations of resistive change element O01. The operation of the sense amplifier 550 when the sense amplifier 550 is a third sense amplifier 700 is discussed in greater detail with respect to the simplified schematic diagram of the third sense amplifier 700 shown in FIG. 7 and the exemplary voltage waveforms for describing operation of the third sense amplifier 700 for READ operations of resistive change element O01. It is noted that providing the inhibit voltage VINH on the reference line RL5 to the sense amplifier 550 can increase the accuracy of determining the resistive state of the resistive change element O01 because the inhibit voltage VINH on the reference line RL5 and the voltage on the global bit line GB5(0) are subject to similar conditions.

The READ operation of the resistive change element O01 proceeds, as similarly discussed above in step 414 of the flow chart 400, by restoring neutral voltage conditions for resistive change elements impacted by generating a voltage indicative of a resistive state of the resistive change element O01. Neutral voltage conditions are restored for resistive change elements impacted by generating a voltage indicative of a resistive state of the resistive change element O01 by floating the plurality of odd bit lines Bo(0)-Bo(x) and applying the inhibit voltage VINH to the word line W(1). The plurality of even bit lines Be(0)-Be(x) are already floating because the plurality of even selection devices Ne0-Nex are turned off. The inhibit voltage VINH is already applied to the word lines W(0), W(y) because the word line driver circuits 110d, 11yd are already supplying the inhibit voltage VINH. The plurality of odd bit lines Bo(0)-Bo(x) are floated by disconnecting the plurality of odd bit lines Bo(0)-

Bo(x) from the plurality of global bit lines GB5(0)-GB5(x) by turning off the plurality of odd selection devices No0-Nox. The plurality of odd selection devices No0-Nox are turned off by control logic, such as a processor, a controller, and a microcontroller, supplying a signal SSELo having a low level. The inhibit voltage VINH is applied to the word line W(1) by the word line driver circuit 111d driving the voltage on the word line W(1) to the inhibit voltage VINH. The word line driver circuit 111d supplies the inhibit voltage VINH based on a signal ITE1 supplied by control logic, such as a processor, a controller, and a microcontroller. Thus, the inhibit voltage VINH is applied to the plurality of word lines W(0)-W(y) with the plurality of even bit lines Be(0)-Be(x) and the plurality of odd bit lines Bo(0)-Bo(x) floating so that voltages approximately equal to the inhibit voltage VINH are applied to the top electrodes and the bottom electrodes of the resistive change elements in the plurality of resistive change elements E00-Oxy.

The READ operation of the resistive change element O01 proceeds, as similarly discussed above in step 416 of the flow chart 400, by biasing global bit lines impacted by generating a voltage indicative of a resistive state of the resistive change element O01. Global bit lines impacted by generating a voltage indicative of a resistive state of the resistive change element O01 are biased to the inhibit voltage VINH by floating the plurality of global bit lines GB5(0)-GB5(x) and applying the inhibit voltage VINH to global bit lines having even column numbers. The plurality of global bit lines GB5(0)-GB5(x) are floated by disconnecting the plurality of global bit lines GB5(0)-GB5(x) from the plurality of odd bit lines Bo(0)-Bo(x) and disconnecting the global bit line GB5(0) from the bus line BL5. The plurality of global bit lines GB5(0)-GB5(x) are already disconnected from the plurality of even bit lines Be(0)-Be(x) because the plurality of even selection devices Ne0-Nex are turned off. The global bit lines other than global bit line GB5(0) are already disconnected from the bus line BL5 because the PMOS transistors in the first plurality of PMOS transistors 540g-54xg other than PMOS transistor 540g are turned off. The plurality of global bit lines GB5(0)-GB5(x) may be disconnected from the plurality of odd bit lines Bo(0)-Bo(x) as part of restoring neutral voltage conditions for resistive change elements impacted by generating a voltage indicative of a resistive state of the resistive change element O01 as discussed above. The global bit line GB5(0) is disconnected from the bus line BL5 by turning off the PMOS transistor 540g. The PMOS transistor 540g is turned off by control logic, such as a processor, a controller, and a microcontroller, supplying a signal YD0 having a high level. The inhibit voltage VINH is already applied to the global bit lines having odd column numbers because the global bit lines having odd column numbers are in electrical communication with a power supply, a voltage source, a driver circuit, or other device that supplies the inhibit voltage VINH because the NMOS transistors 13xk are turned on. The inhibit voltage VINH is applied to the global bit lines having even column numbers by electrically connecting the global bit lines having even column numbers to a power supply, a voltage source, a driver circuit, or other device that supplies the inhibit voltage VINH by turning on the NMOS transistors 130k. The NMOS transistors 130k in electrical communication with the global bit lines having even column numbers are turned on by control logic, such as a processor, a controller, and a microcontroller, supplying a signal KEEPe having a high level. It is noted that control logic, such as a processor, a controller, and a microcontroller, supplying a signal YD0 having a high level also turns off the PMOS transistor 540r in the global bit line connection circuit 540.

Referring now to FIGS. 5E-1 and 5E-2, a simplified schematic diagram of the exemplary implementation of the second exemplary architecture showing current flow through the resistive change element array 100 during a READ operation of resistive change element O01 when resistive change element O01 has a high resistive state is illustrated. A READ operation of the resistive change element O01 when resistive change element O01 has a high resistive state is performed in the same manner as a READ operation of the resistive change element O01 when resistive change element O01 has a low resistive as discussed above with respect to FIGS. 5D-1 and 5D-2. However, a voltage indicative of a resistive state of resistive change element O01 when resistive change element O01 has a high resistive state differs from a voltage indicative of a resistive state of resistive change element O01 when resistive change element O01 has a low resistive state. Thus, current flow through the resistive change element array 100 during a READ operation of the resistive change element O01 when resistive change element O01 has a high resistive state may differ from current flow through the resistive change element array 100 during a READ operation of the resistive change element O01 when resistive change element O01 has a low resistive state.

FIG. 5E-1 shows a current IO01 flowing through the resistive change element O01 from the top electrode TE to the bottom electrode BE because the top electrode TE is at the system voltage VDD and the bottom electrode BE is at a voltage indicative of a resistive state of the resistive change element O01. FIG. 5E-1 also shows leakage currents flowing through the resistive change elements O00, O0y in electrical communication with the odd bit line Bo(0) and leakage currents flowing through the resistive change elements E01, Ex1-Ox1 in electrical communication with the word line W(1). The leakage currents are shown using dashed lines in FIG. 5E-1. Leakage currents flow through the resistive change elements O00, O0y because the bottom electrodes of the resistive change elements O00, O0y are at a voltage indicative of a resistive state of the resistive change element O01 and the top electrodes of the resistive change elements O00, O0y are the inhibit voltage VINH. Leakage currents flow through resistive change elements E01, Ex1-Ox1 because the bottom electrodes of the resistive change elements E01, Ex1-Ox1 are at the inhibit voltage VINH and the top electrodes of the resistive change elements E01, Ex1-Ox1 are at the system voltage VDD. It is noted that leakage currents may flow through resistive change elements other than the resistive change elements in electrical communication with the odd bit line Bo(0) and the resistive change elements in electrical communication with the word line W(1) because voltages on other lines may be impacted by generating a voltage indicative of a resistive state of the resistive change element O01. It is also noted that leakage currents do not prevent the READ operation of the resistive change element O01 when the leakage currents are much less than the amount of the current IO01. It is further noted that the voltage differences across the resistive change elements that cause the leakage currents do not disturb the resistive states of the resistive change elements because the voltage differences are less than a voltage limit for disturbing a resistive state of a resistive change element.

SET VERIFY operations of resistive change elements in the exemplary implementation of the second exemplary architecture can be performed in a similar manner to READ operations of resistive change element O01 discussed above, but with the current source 160 set to sink an amount of current for a SET VERIFY operation. The amount of current for a SET VERIFY operation is based on the amount of current that would flow through a resistor having a low resistance and having the system voltage VDD applied to one terminal of the resistor and the inhibit voltage VINH applied to the other terminal of the resistor. The amount of current that would flow through a resistor having a low resistance and having the system voltage VDD applied to one terminal of the resistor and the inhibit voltage VINH applied to the other terminal of the resistor can be approximated by the following equation, I=(VDD−VINH)/Low Resistance. For example, when the low resistance is 2 MΩ, the system voltage VDD is 2V, and the inhibit voltage VINH is 1V, the current source 160 is configured to sink an amount of current for a SET VERIFY operation that can be approximated as I=(2V−1V)/2 MΩ=0.5 µA.

The low resistance sets an upper boundary for resistance values that correspond with a low resistive state during SET VERIFY operations. The low resistance is a design variable that can be selected by a circuit designer and the circuit designer typically selects a low resistance greater than a model resistance for a low resistive state of a resistive change element so that resistive change elements can have resistances greater than the model resistance for the low resistive state and be determined to have a low resistive state during SET VERIFY operations. For example, when a model resistance for a low resistive state of a resistive change element is 1 MΩ, a circuit designer can select a low resistance of 2 MΩ so that resistive change elements having a resistance less than approximately 2 MΩ are determined to have a low resistive state during SET VERIFY operations. It is noted that the circuit designer typically selects a low resistance greater than a model resistance for a low resistive state of a resistive change element and less than an intermediate resistance for READ operations.

RESET VERIFY operations of resistive change elements in the exemplary implementation of the second exemplary architecture can be performed in a similar manner to READ operations of resistive change element O01 discussed above, but with the current source 160 set to sink an amount of current for a RESET VERIFY operation. The amount of current for a RESET VERIFY operation is based on the amount of current that would flow through a resistor having a high resistance and having the system voltage VDD applied to one terminal of the resistor and the inhibit voltage VINH applied to the other terminal of the resistor. The amount of current that would flow through a resistor having a high resistance and having the system voltage VDD applied to one terminal of the resistor and the inhibit voltage VINH applied to the other terminal of the resistor can be approximated by the following equation, I=(VDD−VINH)/High Resistance. For example, when the high resistance is 9 MΩ, the system voltage VDD is 2V, and the inhibit voltage VINH is 1V, the current source 160 is configured to sink an amount of current for a RESET VERIFY operation that can be approximated as I=(2V−1V)/9 MΩ=0.11 µA.

The high resistance sets an upper boundary for resistance values that correspond with a high resistive state during RESET VERIFY operations. The high resistance is a design variable that can be selected by a circuit designer and the circuit designer typically selects a high resistance less than a model resistance for a high resistive state of a resistive change element so that resistive change elements can have resistances less than the model resistance for the high resistive state and be determined to have a high resistive state during RESET VERIFY operations. For example, when a model resistance for a high resistive state of a resistive change element is 10 MΩ, a circuit designer can select a high resistance of 9 MΩ so that resistive change elements having a resistance greater than approximately 9 MΩ are determined to have a high resistive state during RESET VERIFY operations. It is noted that the circuit designer typically selects a high resistance less than a model resistance for a high resistive state of a resistive change element and greater than an intermediate resistance for READ operations.

Figure 6:
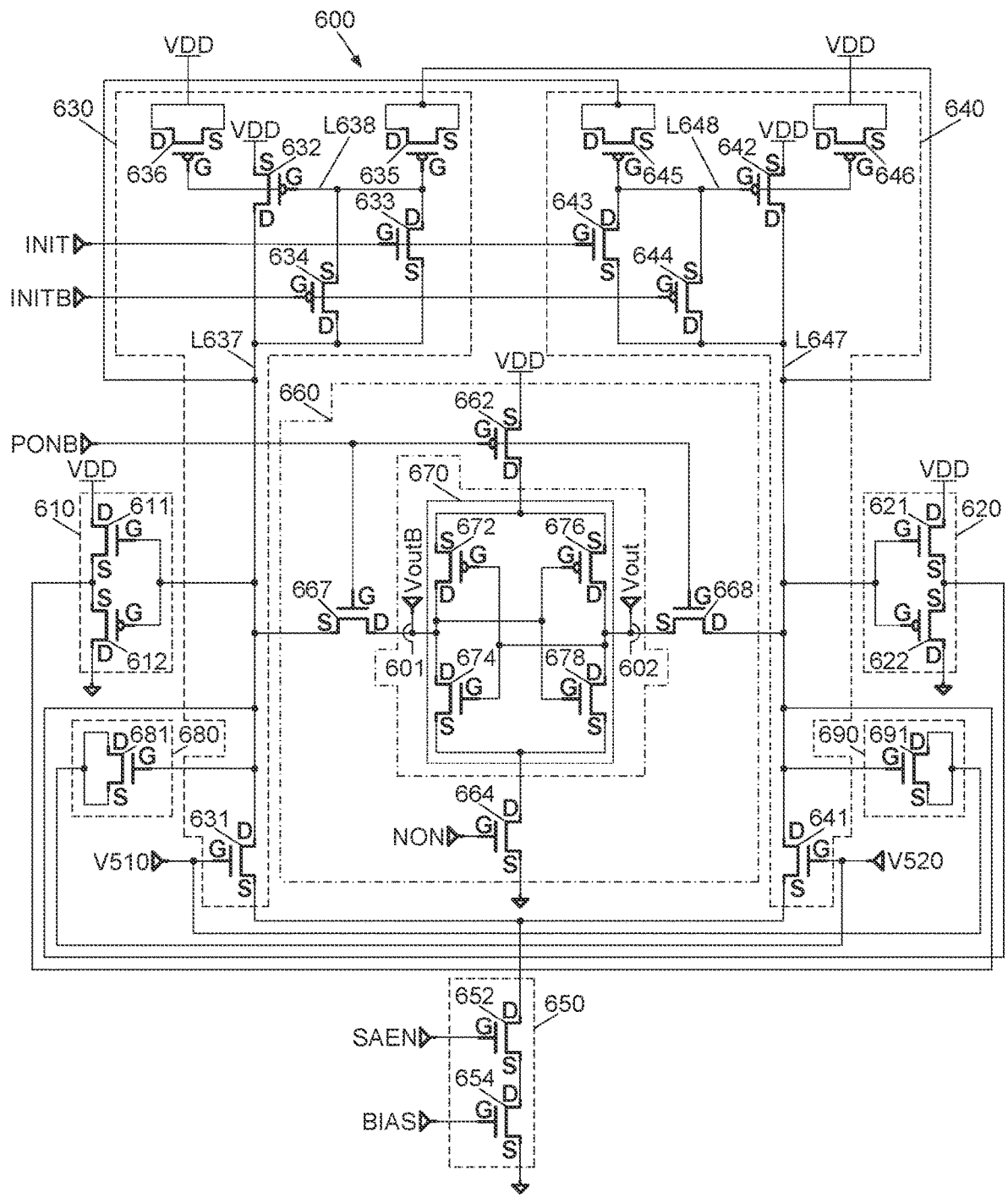
FIG. 6 illustrates a simplified schematic diagram of a second sense amplifier.

Referring now to FIG. 6, the second sense amplifier 600 receives a voltage V510 provided by the first input device 510, a voltage V520 provided by the second input device 520, an initialization signal INIT, a complementary initialization signal INITB, a first power on signal PONB, a second power on signal NON, a sense amplifier enable signal SAEN, and a bias current signal BIAS, and outputs a voltage VoutB and a voltage Vout. The second sense amplifier 600 includes a first voltage swing limiter 610, a second voltage swing limiter 620, a first load device 630, a second load device 640, a current source 650, a first coupling canceller 680, a second coupling canceller 690, a power control device 660, and a latch device 670. The first voltage swing limiter 610 includes a NMOS transistor 611 having a drain terminal, a gate terminal, and a source terminal and a PMOS transistor 612 having a drain terminal, a gate terminal, and a source terminal. The drain terminal of the NMOS transistor 611 is in electrical communication with a power supply, a voltage source, a driver circuit, or other device that supplies the system voltage VDD. The gate terminal of the NMOS transistor 611 is in electrical communication with the first load device 630 and the gate terminal of the PMOS transistor 612. The source terminal of the NMOS transistor 611 is in electrical communication with the second load device 640 and the source terminal of the PMOS transistor 612. The drain terminal of the PMOS transistor 612 is in electrical communication with a power supply, a voltage source, a driver circuit, or other device that supplies 0 volts or ground. The gate terminal of the PMOS transistor 612 is in electrical communication with the first load device 630 and the gate terminal of the NMOS transistor 611. The source terminal of the PMOS transistor 612 is in electrical communication with the second load device 640 and the source terminal of the NMOS transistor 611.

The second voltage swing limiter 620 includes a NMOS transistor 621 having a drain terminal, a gate terminal, and a source terminal and a PMOS transistor 622 having a drain terminal, a gate terminal, and a source terminal. The drain terminal of the NMOS transistor 621 is in electrical communication with a power supply, a voltage source, a driver circuit, or other device that supplies the system voltage VDD. The gate terminal of the NMOS transistor 621 is in electrical communication with the second load device 640 and the gate terminal of the PMOS transistor 622. The source terminal of the NMOS transistor 621 is in electrical communication with the first load device 630 and the source terminal of the PMOS transistor 622. The drain terminal of the PMOS transistor 622 is in electrical communication with a power supply, a voltage source, a driver circuit, or other device that supplies 0 volts or ground. The gate terminal of the PMOS transistor 622 is in electrical communication with the second load device 640 and the gate terminal of the NMOS transistor 621. The source terminal of the PMOS transistor 622 is in electrical communication with the first load device 630 and the source terminal of the NMOS transistor 621.

The first load device 630 includes a first NMOS transistor 631 having a drain terminal, a gate terminal, and a source terminal, a first PMOS transistor 632 having a drain terminal, a gate terminal, and a source terminal, a second NMOS transistor 633 having a drain terminal, a gate terminal, and a source terminal, a second PMOS transistor 634 having a drain terminal, a gate terminal, and a source terminal, a first capacitor connected PMOS transistor 635 having a drain terminal, a gate terminal, and a source terminal, and a second capacitor connected PMOS transistor 636 having a drain terminal, a gate terminal, and a source terminal. The drain terminal of the first NMOS transistor 631 is in electrical communication with the first coupling canceller 680, the second voltage swing limiter 620, the power control device 660, the first voltage swing limiter 610, the second load device 640, the drain terminal of the first PMOS transistor 632, the drain terminal of the second PMOS transistor 634, and the source terminal of the second NMOS transistor 633. The gate terminal of the first NMOS transistor 631 is in electrical communication with the first input device 510 and the second coupling canceller 690. The source terminal of the first NMOS transistor 631 is in electrical communication with the current source 650 and the second load device 640. The drain terminal of the first PMOS transistor 632 is in electrical communication with the drain terminal of the second PMOS transistor 634, the source terminal of the second NMOS transistor 633, the second load device 640, the first voltage swing limiter 610, the power control device 660, the second voltage swing limiter 620, the first coupling canceller 680, and the drain terminal of the first NMOS transistor 631. The gate terminal of the first PMOS transistor 632 is in electrical communication with the source terminal of the second PMOS transistor 634, the drain terminal of the second NMOS transistor 633, the gate terminal of first capacitor connected PMOS transistor 635, and the gate terminal of the second capacitor connected PMOS transistor 636. The source terminal of the first PMOS transistor 632 is in electrical communication with a power supply, a voltage source, a driver circuit, or other device that supplies the system voltage VDD. The drain terminal of the second NMOS transistor 633 is in electrical communication with the source terminal of the second PMOS transistor 634, the gate terminal of the first PMOS transistor 632, the gate terminal of the first capacitor connected PMOS transistor 635, and the gate terminal of the second capacitor connected PMOS transistor 636. The gate terminal of the second NMOS transistor 633 is in electrical communication with control logic, such as a processor, a controller, and a microcontroller, to receive the initialization signal INIT. The source terminal of the second NMOS transistor 633 is in electrical communication with the drain terminal of the second PMOS transistor 634, the drain terminal of the first PMOS transistor 632, the second load device 640, the first voltage swing limiter 610, the power control device 660, the second voltage swing limiter 620, the first coupling canceller 680, and the drain terminal of the first NMOS transistor 631. The drain terminal of the second PMOS transistor 634 is in electrical communication with the source terminal of the second NMOS transistor 633, the drain terminal of the first PMOS transistor 632, the second load device 640 the first voltage swing limiter 610, the power control device 660, the second voltage swing limiter 620, the first coupling canceller 680, and the drain terminal of the first NMOS transistor 631. The gate terminal of the second PMOS transistor 634 is in electrical communication with control logic, such as a processor, a controller, and a microcontroller, to receive the complementary initialization signal INITB. The source terminal of the second PMOS transistor 634 is in electrical communication with the gate terminal of the first PMOS transistor 632, the drain terminal of the second NMOS transistor 633, the gate terminal of the first capacitor connected PMOS transistor 635, and the gate terminal of the second capacitor connected PMOS transistor 636. The drain terminal and the source terminal of the first capacitor connected PMOS transistor 635 are in electrical communication and the drain terminal and the source terminal are in electrical communication with the second load device 640. The gate terminal of the first capacitor connected PMOS transistor 635 is in electrical communication with the drain terminal of the second NMOS transistor 633, the source terminal of the second PMOS transistor 634, the gate terminal of the first PMOS transistor 632, and the gate terminal of the second capacitor connected PMOS transistor 636. The drain terminal and the source terminal of the second capacitor connected PMOS transistor 636 are in electrical communication and the drain terminal and the source terminal are in electrical communication with a power supply, a voltage source, a driver circuit, or other device that supplies the system voltage VDD. The gate terminal of the second capacitor connected PMOS transistor 636 is in electrical communication with the gate terminal of the first PMOS transistor 632, the source terminal of the second PMOS transistor 634, the drain terminal of the second NMOS transistor 633, and the gate terminal of the first capacitor connected PMOS transistor 635.

The second load device 640 includes a first NMOS transistor 641 having a drain terminal, a gate terminal, and a source terminal, a first PMOS transistor 642 having a drain terminal, a gate terminal, and a source terminal, a second NMOS transistor 643 having a drain terminal, a gate terminal, and a source terminal, a second PMOS transistor 644 having a drain terminal, a gate terminal, and a source terminal, a first capacitor connected PMOS transistor 645 having a drain terminal, a gate terminal, and a source terminal, and a second capacitor connected PMOS transistor 646 having a drain terminal, a gate terminal, and a source terminal. The drain terminal of the first NMOS transistor 641 is in electrical communication with the second coupling canceller 690, the first voltage swing limiter 610, the power control device 660, the second voltage swing limiter 620, the first load device 630, the drain terminal of the first PMOS transistor 642, the drain terminal of the second PMOS transistor 644, and the source terminal of the second NMOS transistor 643. The gate terminal of the first NMOS transistor 641 is in electrical communication with the second input device 520. The source terminal of the first NMOS transistor 641 is in electrical communication with the current source 650 and the first load device 630. The drain terminal of the first PMOS transistor 642 is in electrical communication with the drain terminal of the second PMOS transistor 644, the source terminal of the second NMOS transistor 643, the first load device 630, the second voltage swing limiter 620, the power control device 660, the first voltage swing limiter 610, the second coupling canceller 690, and the drain terminal of the first NMOS transistor 641. The gate terminal of the first PMOS transistor 642 is in electrical communication with the source terminal of the second PMOS transistor 644, the drain terminal of the second NMOS transistor 643, the gate terminal of the first capacitor connected PMOS transistor 645, and the gate terminal of the second capacitor connected PMOS transistor 646. The source terminal of the first PMOS transistor 642 is in electrical communication with a power supply, a voltage source, a driver circuit, or other device that supplies the system voltage VDD. The drain terminal of the second NMOS transistor 643 is in electrical communication with the source terminal of the second PMOS transistor 644, the gate terminal of the first PMOS transistor 642, the gate terminal of the first capacitor connected PMOS transistor 645, and the gate terminal of the second capacitor connected PMOS transistor 646. The gate terminal of the second NMOS transistor 643 is in electrical communication with control logic, such as a processor, a controller, and a microcontroller, to receive the initialization signal INIT. The source terminal of the second NMOS transistor 643 is in electrical communication with the drain terminal of the second PMOS transistor 644, the drain terminal of the first PMOS transistor 642, the first load device 630, the second voltage swing limiter 620, the power control device 660, the first voltage swing limiter 610, the second coupling canceller 690, and the drain terminal of the first NMOS transistor 641. The drain terminal of the second PMOS transistor 644 is in electrical communication with the source terminal of the second NMOS transistor 643, the drain terminal of the first PMOS transistor 642, the first load device 630, the second voltage swing limiter 620, the power control device 660, the first voltage swing limiter 610, the second coupling canceller 690, and the drain terminal of the first NMOS transistor 641. The gate terminal of the second PMOS transistor 644 is in electrical communication with control logic, such as a processor, a controller, and a microcontroller, to receive the complementary initialization signal INITB. The source terminal of the second PMOS transistor 644 is in electrical communication with the gate terminal of the first PMOS transistor 642, the drain terminal of the second NMOS transistor 643, the gate terminal of the first capacitor connected PMOS transistor 645, and the gate terminal of the second capacitor connected PMOS transistor 646. The drain terminal and the source terminal of the first capacitor connected PMOS transistor 645 are in electrical communication and the drain terminal and the source terminal are in electrical communication with the first load device 630. The gate terminal of the first capacitor connected PMOS transistor 645 is in electrical communication with the drain terminal of the second NMOS transistor 643, the source terminal of the second PMOS transistor 644, the gate terminal of the first PMOS transistor 642, and the gate terminal of the second capacitor connected PMOS transistor 646. The drain terminal and the source terminal of the second capacitor connected PMOS transistor 646 are in electrical communication and the drain terminal and the source terminal are in electrical communication with a power supply, a voltage source, a driver circuit, or other device that supplies the system voltage VDD. The gate terminal of the second capacitor connected PMOS transistor 646 is in electrical communication with the gate terminal of the first PMOS transistor 642, the source terminal of the second PMOS transistor 644, the drain terminal of the second NMOS transistor 643, and the gate terminal of the first capacitor connected PMOS transistor 645.

The current source 650 includes a first NMOS transistor 652 have a drain terminal, a gate terminal, and a source terminal and a second NMOS transistor 654 having a drain terminal, a gate terminal, and a source terminal. The drain terminal of the first NMOS transistor 652 is in electrical communication with the first load device 630 and the second load device 640. The gate terminal of the first NMOS transistor 652 is in electrical communication with control logic, such as a processor, a controller, and a microcontroller, to receive the sense amplifier enable signal SAEN. The source terminal of the first NMOS transistor 652 is in electrical communication with the drain terminal of the second NMOS transistor 654. The drain terminal of the second NMOS transistor 654 is in electrical communication with the source terminal of the first NMOS transistor 652. The gate terminal of the second NMOS transistor 654 is in electrical communication with control logic, such as a processor, a controller, and a microcontroller, to receive the bias current signal BIAS. The source terminal of the second NMOS transistor 654 is in electrical communication with a power supply, a voltage source, a driver circuit, or other device that supplies 0 volts or ground.

The first coupling canceller 680 includes a capacitor connected NMOS transistor 681 having a drain terminal, a gate terminal, and a source terminal. The drain terminal and the source terminal of the capacitor connected NMOS transistor 681 are in electrical communication and the drain terminal and the source terminal are in electrical communication with the second input device 520 and the second load device 640. The gate terminal of the first capacitor connected NMOS transistor 681 is in electrical communication with the first load device 630. The second coupling canceller 690 includes a capacitor connected NMOS transistor 691 having a drain terminal, a gate terminal, and a source terminal. The drain terminal and the source terminal of the capacitor connected NMOS transistor 691 are in electrical communication and the drain terminal and the source terminal are in electrical communication with the first input device 510 and the first load device 630. The gate terminal of the capacitor connected NMOS transistor 691 is in electrical communication with the second load device 640.

The power control device 660 includes a PMOS transistor 662 having a drain terminal, a gate terminal, and a source terminal, a first NMOS transistor 664 having a drain terminal, a gate terminal, and a source terminal, a second NMOS transistor 667 having a drain terminal, a gate terminal, and a source terminal, and a third NMOS transistor 668 having a drain terminal, a gate terminal, and a source terminal. The drain terminal of the PMOS transistor 662 is in electrical communication with the latch device 670. The gate terminal of the PMOS transistor 662 is in electrical communication with control logic, such as a processor, a controller, and a microcontroller, to receive the first power on signal PONB. The source terminal of the PMOS transistor 662 is in electrical communication with a power supply, a voltage source, a driver circuit, or other device that supplies the system voltage VDD. The drain terminal of the first NMOS transistor 664 is in electrical communication with the latch device 670. The gate terminal of the first NMOS transistor 664 is in electrical communication control logic, such as a processor, a controller, and a microcontroller, to receive the second power on signal NON. The source terminal of the first NMOS transistor 664 is in electrical communication with a power supply, a voltage source, a driver circuit, or other device that supplies 0 volts or ground. The drain terminal of the second NMOS transistor 667 is in electrical communication with the latch device 670. The gate terminal of the second NMOS transistor 667 is in electrical communication with control logic, such as a processor, a controller, and a microcontroller, to receive the first power on signal PONB. The source terminal of the second NMOS transistor 667 is in electrical communication with the first load device 630. The drain terminal of the third NMOS transistor 668 is in electrical communication with the second load device 640. The gate terminal of the third NMOS transistor 668 is in electrical communication with control logic, such as a processor, a controller, and a microcontroller, to receive the first power on signal PONB. The source terminal of the third NMOS transistor 668 is in electrical communication with the latch device 670. Alternatively, each of the second NMOS transistor 667 and the third NMOS transistor 668 may be replaced with a NMOS transistor and a PMOS transistor in electrical communication in parallel, with each of the NMOS transistors having a drain terminal, a gate terminal, and a source terminal, each of the PMOS transistors having a drain terminal, a gate terminal, and a source terminal, the gate terminals of both NMOS transistors in electrical communication with a circuit to receive a signal to turn on and turn off both NMOS transistors, the gate terminals of both PMOS transistors in electrical communication with a circuit to receive a signal to turn on and turn off both PMOS transistors, and the signals being coordinated such that both NMOS transistors and both PMOS transistors are turned on and turned off at generally the same time.

The latch device 670 includes a first PMOS transistor 672 having a drain terminal, a gate terminal, and a source terminal, a first NMOS transistor 674 having a drain terminal, a gate terminal, and a source terminal, a second PMOS transistor 676 having a drain terminal, a gate terminal, and a source terminal, and a second NMOS transistor 678 having a drain terminal, a gate terminal, and a source terminal. The drain terminal of the first PMOS transistor 672 is in electrical communication with the gate terminal of the second PMOS transistor 676, the gate terminal of the second NMOS transistor 678, the power control device 660, and the drain terminal of the first NMOS transistor 674. The gate terminal of the first PMOS transistor 672 is in electrical communication with the drain terminal of the second PMOS transistor 676, the drain terminal of the second NMOS transistor 678, the power control device 660, and the gate terminal of the first NMOS transistor 674. The source terminal of the first PMOS transistor 672 is in electrical communication with the power control device 660 and the source terminal of the second PMOS transistor 676. The drain terminal of the first NMOS transistor 674 is in electrical communication with the power control device 660, the gate terminal of the second PMOS transistor 676, the gate terminal of the second NMOS transistor 678, and the drain terminal of the first PMOS transistor 672. The gate terminal of the first NMOS transistor 674 is in electrical communication with the drain terminal of the second PMOS transistor 676, the drain terminal of the second NMOS transistor 678, the power control device 660, and the gate terminal of the first PMOS transistor 672. The source terminal of the first NMOS transistor 674 is in electrical communication with the power control device 660 and the source terminal of the second NMOS transistor 678. The drain terminal of the second PMOS transistor 676 is in electrical communication with the power control device 660, the gate terminal of the first PMOS transistor 672, the gate terminal of the first NMOS transistor 674, and the drain terminal of the second NMOS transistor 678. The gate terminal of the second PMOS transistor 676 is in electrical communication with the drain terminal of the first PMOS transistor 672, the drain terminal of the first NMOS transistor 674, the power control device 660, and the gate terminal of the second NMOS transistor 678. The source terminal of the second PMOS transistor 676 is in electrical communication with the power control device 660 and the source terminal of the first PMOS transistor 672. The drain terminal of the second NMOS transistor 678 is in electrical communication with the power control device 660, the gate terminal of the first PMOS transistor 672, the gate terminal of the first NMOS transistor 674, and the drain terminal of the second PMOS transistor 676. The gate terminal of the second NMOS transistor 678 is in electrical communication with the drain terminal of the first PMOS transistor 672, the drain terminal of the first NMOS transistor 674, the power control device 660, and the gate terminal of the second PMOS transistor 676. The source terminal of the second NMOS transistor 678 is in electrical communication with the power control device 660 and the source terminal of the first NMOS transistor 674.

Referring to the simplified schematic diagram of the second sense amplifier 600 shown in FIG. 6, the first load device 630 receives the voltage V510 provided by the first input device 510, the initialization signal INIT, and the complementary initialization signal INITB. The second load device 640 receives the voltage V520 provided by the second input device 520, the initialization signal INIT, and the complementary initialization signal INITB. The current source 650 receives the sense amplifier enable signal SAEN and the bias current signal BIAS. The power control device 660 receives the first power on signal PONB and the second power on signal NON. Control logic, such as a processor, a controller, and a microcontroller, supplies the initialization signal INIT, the complementary initialization signal INITB, the sense amplifier enable signal SAEN, the bias current signal BIAS, the first power on signal PONB, and the second power on signal NON to the second sense amplifier 600. Exemplary voltage waveforms for the initialization signal INIT, the complementary initialization signal INITB, the sense amplifier enable signal SAEN, the first power on signal PONB, and the second power on signal NON for describing operation of the second sense amplifier 600 for READ operations of resistive change element O01 are shown in FIG. 2B. Additionally, although an exemplary voltage waveform for the bias current signal BIAS is not shown in FIG. 2B, the control logic supplies the bias current signal BIAS. The control logic supplies the sense amplifier enable signal SAEN to enable and disable the current source 650 and the bias current signal BIAS to set the amount of current sunk by the current source 650. Also, exemplary voltage waveforms for the signal YD0, the signal SSELo, the signal KEEPe, the voltage VW(1) on the word line W(1), the voltage on the reference line RL5 labeled as the voltage REF, and the voltage VGB5(0) on the global bit line GB5(0) labeled as the voltage VGB for describing operation of the second sense amplifier 600 for READ operations of resistive change element O01 are shown in FIG. 2B. Further, FIG. 2B shows two exemplary voltage waveforms for the voltage VGB, a voltage waveform for when the resistive change element O01 has a low resistive state and a voltage waveform for when the resistive change element O01 has a high resistive state.

The second sense amplifier 600 is in an initializing configuration when the initialization signal INIT has a high level and the complementary initialization signal INITB has a low level and the second sense amplifier 600 is in a comparing configuration when the initialization signal INIT has a low level and the complementary initialization signal INITB has a high level. When the second sense amplifier 600 is in an initializing configuration the first PMOS transistor 632 of the first load device 630 is electrically connected to function as a diode and the first PMOS transistor 642 of the second load device 640 is electrically connected to function as a diode. When the second sense amplifier 600 is in a comparing configuration the first PMOS transistor 632 is electrically connected to function as a resistor and the first PMOS transistor 642 is electrically connected to function as a resistor with the operating points of the first PMOS transistor 632 and the second PMOS transistor 642 set to compensate for performance differences between the first load device 630 and the second load device 640 by keeping the gate voltage of the first PMOS transistor 632 at a bias voltage VB632 and the gate voltage of the first PMOS transistor 642 at a bias voltage VB642. Additionally, when the initialization signal INIT has a high level and the complementary initialization signal INITB has a low level the first input device 510 provides the inhibit voltage VINH to the first load device 630 and the second input device 520 provides the inhibit voltage VINH to the second load device 640. Further, when the initialization signal INIT has a low level and the complementary initialization signal INITB has a high level the first input device 510 provides the voltage VGB5(0) on the global bit line GB5(0) to the first load device 630 and the second input device 520 provides the voltage on the reference line RL5 to the second load device 640.

The second sense amplifier 600 is initialized to generate the bias voltage VB632 for setting the operating point of the first PMOS transistor 632 and the bias voltage VB642 for setting the operating point of the first PMOS transistor 642 before comparing the voltage VGB5(0) on the global bit line GB5(0) with the voltage on the reference line RL5. As shown in FIG. 2B, at the start of initializing the second sense amplifier 600, the second sense amplifier 600 is in the initializing configuration, the initialization signal INIT has a high level, the complementary initialization signal INITB has a low level, the sense amplifier enable signal SAEN transitions to a high level, the first power on signal PONB transitions to a high level, and the second power on signal NON transitions to a low level. During initializing the second sense amplifier 600, the bias voltage VB632 for setting the operating point for the first PMOS transistor 632 of the first load device 630 is generated and the bias voltage VB642 for setting the operating point for the first PMOS transistor 642 of the second load device 640 is generated.

The bias voltage VB632 is generated on the first line L637 and the second line L638 of the first load device 630 and the bias voltage VB642 is generated on the first line L647 and the second line L648 of the second load device 640. The voltage on the first line L637 and the voltage on the second line L638 of the first load device 630 are generally the same voltage because turning on the second NMOS transistor 633 and the second PMOS transistor 634 electrically connects the first PMOS transistor 632 to function as a as diode by electrically connecting the first line L637 and the second line L638. The voltage on the first line L647 and the voltage on the second line L648 of the second load device 640 are generally the same voltage because turning on the second NMOS transistor 643 and the second PMOS transistor 644 electrically connects the first PMOS transistor 642 as to function as a diode by electrically connecting the first line L647 and the second line L648. The bias voltage VB632 is based on an amount of current flowing through the first load device 630 and the bias voltage VB642 is based on an amount of current flowing through the second load device 640. The sum of the amount of current flowing through the first load device 630 and the amount of current flowing through the second load device 640 is equal to an amount of current sunk by the current source 650.

A current path through the first load device 630 is created by electrically connecting the first PMOS transistor 632 to function as a diode and providing the inhibit voltage VINH to the gate terminal of the first NMOS transistor 631. The first PMOS transistor 632 is electrically connected to function as a diode by turning on the second NMOS transistor 633 and the second PMOS transistor 634. The inhibit voltage VINH is provided to the gate terminal of the first NMOS transistor 631 of the first load device 630 by turning off the first PMOS transistor 512 of the first input device 510 and turning on the second PMOS transistor 514 of the first input device 510. The second NMOS transistor 633 of the first load device 630 is turned on and the first PMOS transistor 512 of the first input device 510 is turned off because the initialization signal INIT has a high level. The second PMOS transistor 634 of the first load device 630 and the second PMOS transistor 514 of the first input device 510 are turned on because the complementary initialization signal INITB has a low level.

A current path through the second load device 640 is created by electrically connecting the first PMOS transistor 642 to function as a diode and providing the inhibit voltage VINH to the gate terminal of the first NMOS transistor 641. The first PMOS transistor 642 is electrically connected to function as a diode by turning on the second NMOS transistor 643 and the second PMOS transistor 644. The inhibit voltage VINH is provided to the gate terminal of the first NMOS transistor 641 of the second load device 640 by turning off the first PMOS transistor 522 of the second input device 520 and turning on the second PMOS transistor 524 of the second input device 510. The second NMOS transistor 643 of the second load device 640 is turned on and the first PMOS transistor 522 of the second input device 520 is turned off because the initialization signal INIT has a high level. The second PMOS transistor 644 of the second load device 640 and the second PMOS transistor 524 of the second input device 520 are turned on because the complementary initialization signal INITB has a low level.

The first voltage swing limiter 610 and the second voltage swing limiter 620 limit the voltage difference between the bias voltage VB632 and the bias voltage VB642. The first voltage swing limiter 610 receives the bias voltage VB632 from the first load device 630 and outputs a voltage based on the bias voltage VB632 to the second load device 640. The voltage output by the first voltage swing limiter 610 generally increases when the bias voltage VB632 increases and generally decreases when the bias voltage VB632 decreases. The second voltage swing limiter 620 receives the bias voltage VB642 from the second load device 640 and outputs a voltage based on the bias voltage VB642 to the first load device 630. The voltage output by the second voltage swing limiter 620 generally increases when the bias voltage VB642 increases and generally decreases when the bias voltage VB642 decreases.

The first capacitor connected PMOS transistor 635 and the second capacitor connected PMOS transistor 636 of the first load device 630 are charged to the bias voltage VB632 because the first capacitor connected PMOS transistor 635 and the second capacitor connected PMOS transistor 636 are electrically connected to the second line L638. The bias voltage VB632 on the first line L637 and the second line L638 is approximately equal to the voltage on the drain terminal of the first PMOS transistor 632. The first capacitor connected PMOS transistor 645 and the second capacitor connected PMOS transistor 646 of the second load device 640 are charged to the bias voltage VB642 because the first capacitor connected PMOS transistor 645 and the second capacitor connected PMOS transistor 646 are electrically connected to the second line L648. The bias voltage VB642 on the first line L647 and the second line L648 is approximately equal to the voltage on the drain terminal of the first PMOS transistor 642.

The impact of noise and voltage offsets on the bias voltage VB632 and the bias voltage VB642 are reduced because the first capacitor connected PMOS transistor 635 of the first load device 630 and the first capacitor connected PMOS transistor 645 of the second load device 640 are cross coupled so that noise and voltage offsets on line L637 and line L638 of the first load device 630 are similar to noise and voltage offsets on line L647 and line L648 of the second load device 640. Additionally, the impact of noise and voltage offsets on the bias voltage VB632 and the bias voltage VB642 are reduced because the first coupling canceller 680 and the second coupling canceller 690 are cross coupled so that noise and voltage offsets on line L637 and line L638 of the first load device 630 are similar to noise and voltage offsets on line L647 and line L648 of the second load device 640.

The impact of voltage transients on the bias voltage VB632 and the bias voltage VB642 are reduced by the voltage levels of the initialization signal INIT and the complementary initialization signal INITB being offset. Voltage transients introduced through gate to channel capacitance of the second NMOS transistor 633 by turning on and off the second NMOS transistor 633 and voltage transients introduced through gate to channel capacitance of the second PMOS transistor 634 by turning on and off the second PMOS transistor 634 are offset because the voltage levels of the initialization signal INIT and the complementary initialization signal INITB are offset. Thus, voltage transients introduced through gate to channel capacitance of the second NMOS transistor 633 by turning on and off the second NMOS transistor 633 and voltage transients introduced through gate to channel capacitance of the second PMOS transistor 634 by turning on and off the second PMOS transistor 634 at least partially cancel each other because the voltage transients are offset. Voltage transients introduced through gate to channel capacitance of the second NMOS transistor 643 by turning on and off the second NMOS transistor 643 and voltage transients introduced through gate to channel capacitance of the second PMOS transistor 644 by turning on and off the second PMOS transistor 644 are offset because the voltage levels of the initialization signal INIT and the complementary initialization signal INITB are offset. Thus, voltage transients introduced through gate to channel capacitance of the second NMOS transistor 643 by turning on and off the second NMOS transistor 643 and voltage transients introduced through gate to channel capacitance of the second PMOS transistor 644 by turning on and off the second PMOS transistor 644 at least partially cancel each other because the voltage transients are offset.

After initializing the second sense amplifier 600 to generate the bias voltage VB632 and the bias voltage VB642, the second sense amplifier 600 compares the voltage VGB5(0) on the global bit line GB5(0) with the voltage on the reference line RL5. The first PMOS transistor 632 is electrically connected to function as a resistor with the gate voltage of the first PMOS transistor 632 kept at the bias voltage VB632 and the first PMOS transistor 642 is electrically connected to function as a resistor with the gate voltage of the first PMOS transistor 642 kept at the bias voltage VB642. Keeping the gate voltage of the first PMOS transistor 632 at the bias voltage VB632 and the gate voltage of the first PMOS transistor 642 at the bias voltage VB642 increases the accuracy of comparing the voltage VGB5(0) on the global bit line GB5(0) with the voltage on the reference line RL5 because keeping the gate voltage of the first PMOS transistor 632 at the bias voltage VB632 and the gate voltage of the first PMOS transistor 642 at the bias voltage VB642 compensates for performance differences between the first load device 630 and the second load device 640.

As shown in FIG. 2B, at the start of comparing the voltage VGB5(0) on the global bit line GB5(0) with the voltage on the reference line RL5, the initialization signal INIT transitions to a low level, the complementary initialization signal INITB transitions to a high level, the sense amplifier enable signal SAEN has high level, the first power on signal PONB has a high level, and the second power on signal NON has a low level. As discussed above, when the initialization signal INIT has a low level and the complementary initialization signal INITB has a high level, the second sense amplifier 600 is in a comparing configuration, the first input device 510 provides the voltage VGB5(0) on the global bit line GB5(0) to the first load device 630, and the second input device 520 provides the voltage on the reference line RL5 to the second load device 640. During comparing the voltage VGB5(0) on the global bit line GB5(0) with the voltage on the reference line RL5, a voltage VS637 is generated on the first line L637 of the first load device 630 and a voltage VS647 is generated on the first line L647 of the second load device 640 with the voltage VS637 and the voltage VS647 being indicative of a difference between the voltage VGB5(0) on the global bit line GB5(0) and the voltage on the reference line RL5. The voltage VS637 is based on an amount of current flowing through the first load device 630 and the voltage VS647 is based on an amount of current flowing through the second load device 640. The sum of the amount of current flowing through the first load device 630 and the amount of current flowing through the second load device 640 is equal to an amount of current sunk by the current source 650.

A current path through the first load device 630 is created by keeping the gate voltage of first PMOS transistor 632 at the bias voltage VB632 and providing the voltage VGB5(0) on the global bit line GB5(0) to the gate terminal of the first NMOS transistor 631. The gate voltage of the first PMOS transistor 632 is kept at the bias voltage VB632 by disconnecting the first line L637 from the second line L638 with the first capacitor connected PMOS transistor 635 and the second capacitor connected PMOS transistor 636 charged to the bias voltage VB632. After disconnecting the first line L637 from the second line L638 the voltage on the second line L638 and the gate voltage of the first PMOS transistor 632 are kept at the bias voltage VB632 by the first capacitor connected PMOS transistor 635 and the second capacitor connected PMOS transistor 636. The first line L637 is disconnected from the second line L638 by turning off the second NMOS transistor 633 and the second PMOS transistor 634. The voltage VGB5(0) on the global bit line GB5(0) is provided to the gate terminal of the first NMOS transistor 631 by turning on the first PMOS transistor 512 of the first input device 510 and turning off the second PMOS transistor 514 of the first input device 510. The voltage VGB5(0) on the global bit line GB5(0) is driven to a voltage indicative of a resistive state of the resistive change element O01 as discussed above with respect to generating a voltage indicative of a resistive state of the resistive change element O01. The second NMOS transistor 633 of the first load device 630 is turned off and the first PMOS transistor 512 of the first input device 510 is turned on because the initialization signal INIT has a low level. The second PMOS transistor 634 of the first load device 630 and the second PMOS transistor 514 of the first input device 510 are turned off because the complementary initialization signal INITB has a high level.

A current path through the second load device 640 is created by keeping the gate voltage of first PMOS transistor 642 at the bias voltage VB642 and providing the voltage on the reference line RL5 to the gate terminal of the first NMOS transistor 641. The gate voltage of the first PMOS transistor 642 is kept at the bias voltage VB642 by disconnecting the first line L647 from the second line L648 with the first capacitor connected PMOS transistor 645 and the second capacitor connected PMOS transistor 646 charged to the bias voltage VB642. After disconnecting the first line L647 from the second line L648 the voltage on the second line L648 and the gate voltage of the first PMOS transistor 642 are kept at the bias voltage VB642 by the first capacitor connected PMOS transistor 645 and the second capacitor connected PMOS transistor 646. The first line L647 is disconnected from the second line L648 by turning off the second NMOS transistor 643 and the second PMOS transistor 644. The voltage on the reference line RL5 is provided to the gate terminal of the first NMOS transistor 641 of the second load device 640 by turning on the first PMOS transistor 522 of the second input device 520 and turning off the second PMOS transistor 524 of the second input device 520. The voltage on the reference line RL5 is driven to the inhibit voltage VINH by turning on the second NMOS transistor 122 in the reference line connection circuit 120 and the second NMOS transistor 122 may be turned on as part of preparing the exemplary implementation of the second exemplary architecture for determining a resistive state of the resistive change element O01 as discussed above. The second NMOS transistor 643 of the second load device 640 is turned off and the first PMOS transistor 522 of the second input device 510 is turned on because the initialization signal INIT has a low level. The second PMOS transistor 644 of the second load device 640 and the second PMOS transistor 524 of the second input device 520 are turned off because the complementary initialization signal INITB has a high level.

The amount of current flowing through the first load device 630 and the amount of current flowing through the second load device 640 generally change when the voltage VGB5(0) on the global bit line GB5(0) changes because the voltage on the reference line RL5 is the inhibit voltage VINH and the inhibit voltage VINH is generally the same for READ operations. When the voltage VGB5(0) on the global bit line GB5(0) increases, the amount of current flowing through the first load device 630 increases, the amount of current flowing through the second load device 640 decreases, the voltage VS637 on the first line L637 of the first load device 630 decreases, and the voltage VS647 on the first line L647 of the second load device 640 increases. When the voltage VGB5(0) on the global bit line GB5(0) decreases, the amount of current flowing through first load device 630 decreases, the amount of current flowing through the second load device 640 increases, the voltage VS637 on the first line L637 of the first load device 630 increases, and the voltage VS647 on the first line L647 of the second load device 640 decreases.

The difference between the voltage VS637 on the first line L637 in the first load device 630 and the voltage VS647 on the first line L647 in the second load device 640 is indicative of a resistive state of the resistive change element O01. When the resistive change element O01 has a low resistive state, the voltage VGB5(0) on the global bit line GB5(0) is greater than the inhibit voltage VINH, the amount of current flowing through the first load device 630 is greater than the amount of current flowing through the second load device 640 and the voltage VS637 on first line L637 of the first load device 630 is less than the voltage VS647 on the first line L647 of the second load device 640. When the resistive change element O01 has a high resistive state, the voltage VGB5(0) on the global bit line GB5(0) is less than the inhibit voltage VINH, the amount of current flowing through the first load device 630 is less than the amount of current flowing through the second load device 640 and the voltage VS637 on first line L637 of the first load device 630 is greater than the voltage VS647 on the first line L647 of the second load device 640.

The first voltage swing limiter 610 and the second voltage swing limiter 620 limit the voltage difference between the voltage VS637 generated on the first line L637 of the first load device 630 and the voltage VS647 generated on the first line L647 of the second load device 640. The first voltage swing limiter 610 receives the voltage VS637 from the first load device 630 and outputs a voltage based on the voltage VS637 to the second load device 640. The voltage output by the first voltage swing limiter 610 generally increases when the voltage VS637 increases and generally decreases when the voltage VS637 decreases. The second voltage swing limiter 620 receives the voltage VS647 from the second load device 640 and outputs a voltage based on the voltage VS647 to the first load device 630. The voltage output by the second voltage swing limiter 620 generally increases when the voltage VS647 increases and generally decreases when the voltage VS647 decreases. Additionally, the impact of noise and voltage offsets on the voltage VS637 and the voltage VS647 are reduced because the first coupling canceller 680 and the second coupling canceller 690 are cross coupled so that noise and voltage offsets on line L637 of the first load device 630 are similar to noise and voltage offsets on line L647 of the second load device 640.

While the first power on signal PONB has a high level, the power control device 660 provides the voltage VS637 to the first output 601, the gate terminal of the second PMOS transistor 676 of the latch device 670, and the gate terminal of the second NMOS transistor 678 of the latch device 670 because the second NMOS transistor 667 of the power control device 660 is turned on. Also, while the first power on signal PONB has a high level, the power control device 660 provides the voltage VS647 to the second output 602, the gate terminal of the first PMOS transistor 672 of the latch device 670, and the gate terminal of the first NMOS transistor 674 of the latch device 670 because the third NMOS transistor 668 of the power control device 660 is turned on. When resistive change element O01 has a low resistive state, the voltage VS637 has a voltage level less than a voltage level of the voltage VS647, the gate voltage of the first PMOS transistor 672 is greater than the gate voltage of the second PMOS transistor 676 and the first PMOS transistor 672 is turned on less than the second PMOS transistor 676. Additionally, when resistive change element O01 has a low resistive state, the gate voltage of the first NMOS transistor 674 is greater than the gate voltage of the second NMOS transistor 678 and the first NMOS transistor 674 is turned on greater than the second NMOS transistor 678. When resistive change element O01 has a high resistive state, the voltage VS637 has a voltage level greater than a voltage level of the voltage VS647, the gate voltage of the first PMOS transistor 672 is less than the gate voltage of the second PMOS transistor 676 and the first PMOS transistor 672 is turned on greater than the second PMOS transistor 676. Additionally, when the resistive change element O01 has a high resistive state, the gate voltage of the first NMOS transistor 674 is less than the gate voltage of the second NMOS transistor 678 and the first NMOS transistor 674 is turned on less than the second NMOS transistor 678. During comparing the voltage VGB5(0) on the global bit line GB5(0) with the voltage on the reference line RL5, current generally does not flow through the latch device 670 because the first PMOS transistor 662 of the power control device 660 and the first NMOS transistor 664 of the power control device 660 are turned off. The first PMOS transistor 662 of the power control device 660 is turned off because the first power on signal PONB has a high level and the first NMOS transistor 664 of the power control device 660 is turned off because the second power on signal NON has a low level.

As shown in FIG. 2B, at the conclusion of comparing the voltage VGB5(0) on the global bit line GB5(0) with the voltage on the reference line RL5, the initialization signal INIT transitions to a low level, the complementary initialization signal INITB transitions to a high level, the sense amplifier enable signal SAEN transitions to a low level, the first power on signal PONB transitions to a low level, and after a small delay the second power on signal NON transitions to a high level. As discussed above, when the initialization signal INIT has a high level and the complementary initialization signal INITB has a low level, the second sense amplifier 600 is in an initializing configuration, the first input device 510 provides the inhibit voltage VINH to the first load device 630, and the second input device 520 provides the inhibit voltage VINH to the second input device 640. Additionally, when the first power on signal PONB has a low level, the latch device 670 is disconnected from the first load device 630 and the second load device 640 and the latch device 670 is in electrical communication with a power supply, a voltage source, a driver circuit, or other device that supplies the system voltage VDD. The latch device 670 is disconnected from the first load device 630 by turning off the second NMOS transistor 667 of the power control device 660 and the latch device 670 is disconnected from the second load device 640 by turning off the third NMOS transistor 668. The latch device 670 is electrically connected to a power supply, a voltage source, a driver circuit, or other device that supplies the system voltage VDD by turning on the PMOS transistor 662 of the power control device 660. The PMOS transistor 662 is turned on, the second NMOS transistor 667 is turned off, and the third NMOS transistor 668 is turned off because the first power on signal PONB has a low level. Further, when the second power on signal NON has a high level, the latch device 670 is in electrical communication with a power supply, a voltage source, a driver circuit, or other device that supplies 0 volts or ground. The latch device 670 is electrically connected to the power supply, the voltage source, the driver circuit, or other device that supplies the 0 volts or ground by turning on the first NMOS transistor 664 of the power control device 660. The first NMOS transistor 664 is turned on because the second power on signal NON has a high level.

When comparing the voltage VGB5(0) on the global bit line GB5(0) with the voltage on the reference line RL5 concludes, the voltage on the first output 601, the voltage on the gate terminal of the second PMOS transistor 676, and the voltage on the gate terminal of the second NMOS transistor 678 are approximately equal to the voltage VS637 and the voltage on the second output 602, the voltage on the gate terminal of the first PMOS transistor 672, and the voltage on the gate terminal of the first NMOS transistor 674 are approximately equal to the voltage VS647. The voltage difference between the voltage VS637 and the voltage VS647 can be increased by having a small delay between the first power on signal PONB transitioning to a low level and the second power on signal NON transitioning to high level. During the small delay, current can flow from the power supply, the voltage source, the driver circuit, or other device that supplies the system voltage VDD through the PMOS transistor 662 of the power control device 660 and the first PMOS transistor 672 of the latch device 670 and pull up the voltages on the first output 601, the gate terminal of the second PMOS transistor 676, and the gate terminal of the second NMOS transistor 678. Also, during the small delay, current can flow from the power supply, the voltage source, the driver circuit, or other device that supplies the system voltage VDD through the PMOS transistor 662 of the power control device 660 and the second PMOS transistor 676 of the latch device 670 and pull up the voltages on the second output 602, the gate terminal of the first PMOS transistor 672, and the gate terminal of the first NMOS transistor 674. When the voltage level of the voltage VS637 is less than the voltage level of the voltage VS647, the first PMOS transistor 672 is turned on less than the second PMOS transistor 676 and the voltages on the first output 601, the gate terminal of the second PMOS transistor 676, and the gate terminal of the second NMOS transistor 678 are pulled up less than the voltages on the second output 602, the gate terminal of the first PMOS transistor 672, and the gate terminal of the first NMOS transistor 674 because an amount of current flowing through the first PMOS transistor 672 is less than an amount of current flowing through the second PMOS transistor 676. When the voltage level of the voltage VS637 is greater than the voltage level of the voltage VS647, the first PMOS transistor 672 is turned on greater than the second PMOS transistor 676 and the voltages on the first output 601, the gate terminal of the second PMOS transistor 676, and the gate terminal of the second NMOS transistor 678 are pulled up greater than the voltages on the second output 602, the gate terminal of the first PMOS transistor 672, and the gate terminal of the first NMOS transistor 674 because an amount of current flowing through the first PMOS transistor 672 is greater than an amount of current flowing through the second PMOS transistor 676. Alternatively, the first power on signal PONB transitioning to a low level and the second power on signal NON transitioning to a high level can occur at approximately the same time.

After the first power on signal PONB has a low level and the second power on signal NON has a high level, the voltages on the first output 601, the gate terminal of the second PMOS transistor 676, and the gate terminal of the second NMOS transistor 678 transition to the system voltage VDD or 0 volts or ground and the voltages on the second output 602, the gate terminal of the first PMOS transistor 672, and the gate terminal of the first NMOS transistor 674 transition to the system voltage VDD or 0 volts or ground. When the resistive change element O01 has a low resistive state the voltage on the first output 601, the gate terminal of the second PMOS transistor 676, and the gate terminal of the second NMOS transistor 678 transition to 0 volts or ground and the voltages on the second output 602, the gate terminal of the first PMOS transistor 672, and the gate terminal of the first NMOS transistor 674 transition to the system voltage VDD because the first PMOS transistor 672 is turned on less than the second PMOS transistor 676 and the first NMOS transistor 674 is turned on greater than the second NMOS transistor 678. The voltage on the first output 601 being 0 volts or ground and the voltage on the second output 602 being the system voltage VDD is stored in the latch device 670 by the first PMOS transistor 672 being turned off, the first NMOS transistor 674 being turned on, the second PMOS transistor 676 being turned on, and the second NMOS transistor 678 being turned off. Additionally, the voltage on the first output 601 is generally kept at 0 volts or ground and the voltage on the second output 602 is generally kept at the system voltage VDD by the first PMOS transistor 672 being turned off, the first NMOS transistor 674 being turned on, the second PMOS transistor 676 being turned on, and the second NMOS transistor 678 being turned off. Therefore, when resistive change element O01 has a low resistive state the second sense amplifier 600 outputs 0 volts or ground on the first output 601 and the system voltage VDD on the second output 602.

When the resistive change element O01 has a high resistive state the voltage on the first output 601, the gate terminal of the second PMOS transistor 676, and the gate terminal of the second NMOS transistor 678 transition to the system voltage VDD and the voltages on the second output 602, the gate terminal of the first PMOS transistor 672, and the gate terminal of the first NMOS transistor 674 transition to 0 volts or ground because the first PMOS transistor 672 is turned on greater than the second PMOS transistor 676 and the first NMOS transistor 674 is turned on less than the second NMOS transistor 678. The voltage on the first output 601 being the system voltage VDD and the voltage on the second output 602 being 0 volts or ground is stored in the latch device 670 by the first PMOS transistor 672 being turned on, the first NMOS transistor 674 being turned off, the second PMOS transistor 676 being turned off, and the second NMOS transistor 678 being turned on. Additionally, the voltage on the first output 601 is generally kept the system voltage VDD and the voltage on the second output 602 is generally kept 0 volts or ground by the first PMOS transistor 672 being turned on, the first NMOS transistor 674 being turned off, the second PMOS transistor 676 being turned off, and the second NMOS transistor 678 being turned on. Therefore, when resistive change element O01 has a high resistive state the second sense amplifier 600 outputs the system voltage VDD on the first output 601 and 0 volts or ground on the second output 602.

Figure 7:
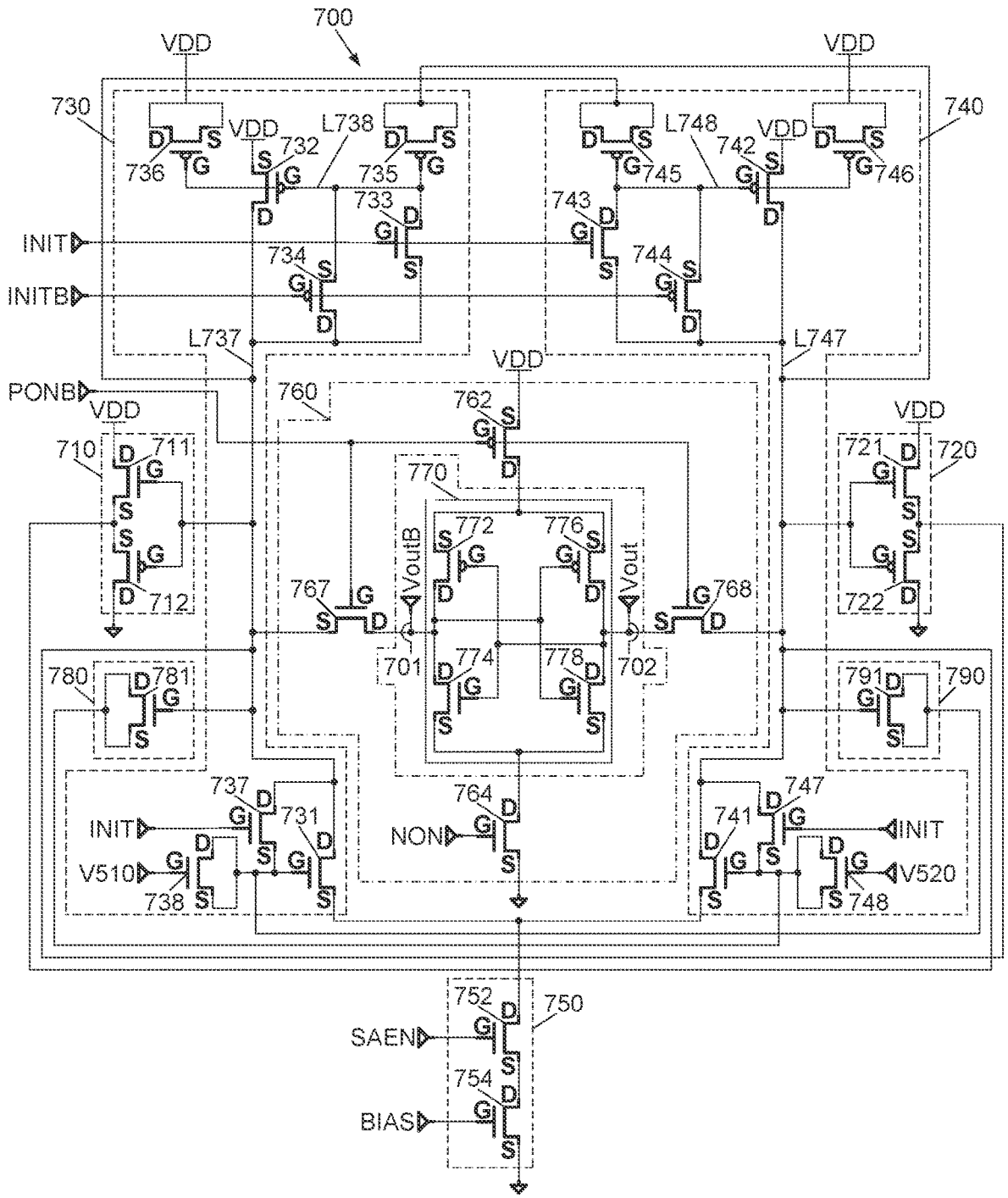
FIG. 7 illustrates a simplified schematic diagram of a third sense amplifier.

Referring now to FIG. 7, the third sense amplifier 700 receives a voltage V510 provided by the first input device 510, a voltage V520 provided by the second input device 520, an initialization signal INIT, a complementary initialization signal INITB, a first power on signal PONB, a second power on signal NON, a sense amplifier enable signal SAEN, and a bias current signal BIAS, and outputs a voltage VoutB and a voltage Vout. The third sense amplifier 700 includes a first voltage swing limiter 710, a second voltage swing limiter 720, a first load device 730, a second load device 740, a current source 750, a first coupling canceller 780, a second coupling canceller 790, a power control device 760, and a latch device 770. The first voltage swing limiter 710 includes a NMOS transistor 711 having a drain terminal, a gate terminal, and a source terminal and a PMOS transistor 712 having a drain terminal, a gate terminal, and a source terminal. The drain terminal of the NMOS transistor 711 is in electrical communication with a power supply, a voltage source, a driver circuit, or other device that supplies the system voltage VDD. The gate terminal of the NMOS transistor 711 is in electrical communication with the first load device 730 and the gate terminal of the PMOS transistor 712. The source terminal of the NMOS transistor 711 is in electrical communication with the second load device 740 and the source terminal of the PMOS transistor 712. The drain terminal of the PMOS transistor 712 is in electrical communication with a power supply, a voltage source, a driver circuit, or other device that supplies 0 volts or ground. The gate terminal of the PMOS transistor 712 is in electrical communication with the first load device 730 and the gate terminal of the NMOS transistor 711. The source terminal of the PMOS transistor 712 is in electrical communication with the second load device 740 and the source terminal of the NMOS transistor 711.

The second voltage swing limiter 720 includes a NMOS transistor 721 having a drain terminal, a gate terminal, and a source terminal and a PMOS transistor 722 having a drain terminal, a gate terminal, and a source terminal. The drain terminal of the NMOS transistor 721 is in electrical communication with a power supply, a voltage source, a driver circuit, or other device that supplies the system voltage VDD. The gate terminal of the NMOS transistor 721 is in electrical communication with the second load device 740 and the gate terminal of the PMOS transistor 722. The source terminal of the NMOS transistor 721 is in electrical communication with the first load device 730 and the source terminal of the PMOS transistor 622. The drain terminal of the PMOS transistor 722 is in electrical communication with a power supply, a voltage source, a driver circuit, or other device that supplies 0 volts or ground. The gate terminal of the PMOS transistor 722 is in electrical communication with the second load device 740 and the gate terminal of the NMOS transistor 721. The source terminal of the PMOS transistor 722 is in electrical communication with the first load device 730 and the source terminal of the NMOS transistor 721.

The first load device 730 includes a first NMOS transistor 731 having a drain terminal, a gate terminal, and a source terminal, a first PMOS transistor 732 having a drain terminal, a gate terminal, and a source terminal, a second NMOS transistor 733 having a drain terminal, a gate terminal, and a source terminal, a second PMOS transistor 734 having a drain terminal, a gate terminal, and a source terminal, a first capacitor connected PMOS transistor 735 having a drain terminal, a gate terminal, and a source terminal, and a second capacitor connected PMOS transistor 736 having a drain terminal, a gate terminal, and a source terminal, a third NMOS transistor 737 having a drain terminal, a gate terminal, and a source terminal, and a capacitor connected NMOS transistor 738 having a drain terminal, a gate terminal, and a source terminal. The drain terminal of the first NMOS transistor 731 is in electrical communication with the drain terminal of the third NMOS transistor 737, the first coupling canceller 780, the second voltage swing limiter 720, the power control device 760, the first voltage swing limiter 710, the second load device 740, the drain terminal of the first PMOS transistor 732, the drain terminal of the second PMOS transistor 734, and the source terminal of the second NMOS transistor 733. The gate terminal of the first NMOS transistor 731 is in electrical communication with the source terminal of the third NMOS transistor 737, the second coupling canceller 790, and the drain terminal and the source terminal of the capacitor connected NMOS transistor 738. The source terminal of the first NMOS transistor 731 is in electrical communication with the current source 750 and the second load device 740. The drain terminal of the first PMOS transistor 732 is in electrical communication with the drain terminal of the second PMOS transistor 734, the source terminal of the second NMOS transistor 733, the second load device 740, the first voltage swing limiter 710, the power control device 760, the second voltage swing limiter 720, the first coupling canceller 780, and the drain terminal of the first NMOS transistor 731. The gate terminal of the first PMOS transistor 732 is in electrical communication with the source terminal of the second PMOS transistor 734, the drain terminal of the second NMOS transistor 733, the gate terminal of first capacitor connected PMOS transistor 735, and the gate terminal of the second capacitor connected PMOS transistor 736. The source terminal of the first PMOS transistor 732 is in electrical communication with a power supply, a voltage source, a driver circuit, or other device that supplies the system voltage VDD. The drain terminal of the second NMOS transistor 733 is in electrical communication with the source terminal of the second PMOS transistor 734, the gate terminal of the first PMOS transistor 632, the gate terminal of the first capacitor connected PMOS transistor 735, and the gate terminal of the second capacitor connected PMOS transistor 736. The gate terminal of the second NMOS transistor 733 is in electrical communication with control logic, such as a processor, a controller, and a microcontroller, to receive the initialization signal INIT. The source terminal of the second NMOS transistor 733 is in electrical communication with the drain terminal of the second PMOS transistor 734, the drain terminal of the first PMOS transistor 732, the second load device 740, the first voltage swing limiter 710, the power control device 760, the second voltage swing limiter 720, the first coupling canceller 780, the drain terminal of the third NMOS transistor 737, and the drain terminal of the first NMOS transistor 731. The drain terminal of the second PMOS transistor 734 is in electrical communication with the source terminal of the second NMOS transistor 733, the drain terminal of the first PMOS transistor 732, the second load device 740, the first voltage swing limiter 710, the power control device 760, the second voltage swing limiter 720, the first coupling canceller 780, the drain terminal of the third NMOS transistor 737, and the drain terminal of the first NMOS transistor 731. The gate terminal of the second PMOS transistor 734 is in electrical communication with control logic, such as a processor, a controller, and a microcontroller, to receive the complementary initialization signal INITB. The source terminal of the second PMOS transistor 734 is in electrical communication with the gate terminal of the first PMOS transistor 732, the drain terminal of the second NMOS transistor 733, the gate terminal of the first capacitor connected PMOS transistor 735, and the gate terminal of the second capacitor connected PMOS transistor 736. The drain terminal and the source terminal of the first capacitor connected PMOS transistor 735 are in electrical communication and the drain terminal and the source terminal are in electrical communication with the second load device 740. The gate terminal of the first capacitor connected PMOS transistor 735 is in electrical communication with the drain terminal of the second NMOS transistor 733, the source terminal of the second PMOS transistor 734, the gate terminal of the first PMOS transistor 732, and the gate terminal of the second capacitor connected PMOS transistor 736. The drain terminal and the source terminal of the second capacitor connected PMOS transistor 736 are in electrical communication and the drain terminal and the source terminal are in electrical communication with a power supply, a voltage source, a driver circuit, or other device that supplies the system voltage VDD. The gate terminal of the second capacitor connected PMOS transistor 736 is in electrical communication with the gate terminal of the first PMOS transistor 732, the source terminal of the second PMOS transistor 734, the drain terminal of the second NMOS transistor 733, and the gate terminal of the first capacitor connected PMOS transistor 735. The drain terminal of the third NMOS transistor 737 is in electrical communication with the drain terminal of the first NMOS transistor 731, the first coupling canceller 780, the second voltage swing limiter 720, the power control device 760, the first voltage swing limiter 710, the second load device 740, the drain terminal of the first PMOS transistor 732, the drain terminal of the second PMOS transistor 734, and the source terminal of the second NMOS transistor 733. The gate terminal of the third NMOS transistor 737 is in electrical communication with control logic, such as a processor, a controller, and a microcontroller, to receive the initialization signal INIT. The source terminal of the third NMOS transistor 737 is in electrical communication with the gate terminal of the first NMOS transistor 731, the second coupling canceller 790, and the drain terminal and the source terminal of the capacitor connected NMOS transistor 738. The drain terminal and the source terminal of the capacitor connected NMOS transistor 738 are in electrical communication and the drain terminal and the source terminal are in electrical communication with the second coupling canceller 790, the source terminal of the third NMOS transistor 738, and the gate terminal of the first NMOS transistor 731. The gate terminal of the capacitor connected NMOS transistor 738 is in electrical communication with the first input device 510.

The second load device 740 includes a first NMOS transistor 741 having a drain terminal, a gate terminal, and a source terminal, a first PMOS transistor 742 having a drain terminal, a gate terminal, and a source terminal, a second NMOS transistor 743 having a drain terminal, a gate terminal, and a source terminal, a second PMOS transistor 744 having a drain terminal, a gate terminal, and a source terminal, a first capacitor connected PMOS transistor 745 having a drain terminal, a gate terminal, and a source terminal, and a second capacitor connected PMOS transistor 746 having a drain terminal, a gate terminal, and a source terminal, a third NMOS transistor 747 having a drain terminal, a gate terminal, and a source terminal, and a capacitor connected NMOS transistor 748 having a drain terminal, a gate terminal, and a source terminal. The drain terminal of the first NMOS transistor 741 is in electrical communication with the drain terminal of the third NMOS transistor 747, the second coupling canceller 790, the first voltage swing limiter 710, the power control device 760, the second voltage swing limiter 720, the first load device 730, the drain terminal of the first PMOS transistor 742, the drain terminal of the second PMOS transistor 744, and the source terminal of the second NMOS transistor 743. The gate terminal of the first NMOS transistor 741 is in electrical communication with the source terminal of the third NMOS transistor 737, the first coupling canceller 780, and the drain terminal and the source terminal of the capacitor connected NMOS transistor 748. The source terminal of the first NMOS transistor 741 is in electrical communication with the current source 750 and the first load device 730. The drain terminal of the first PMOS transistor 742 is in electrical communication with the drain terminal of the second PMOS transistor 744, the source terminal of the second NMOS transistor 743, the first load device 730, the second voltage swing limiter 720, the power control device 760, the first voltage swing limiter 710, the second coupling canceller 790, the drain terminal of the third NMOS transistor 747, and the drain terminal of the first NMOS transistor 741. The gate terminal of the first PMOS transistor 742 is in electrical communication with the source terminal of the second PMOS transistor 744, the drain terminal of the second NMOS transistor 743, the gate terminal of the first capacitor connected PMOS transistor 745, and the gate terminal of the second capacitor connected PMOS transistor 746. The source terminal of the first PMOS transistor 742 is in electrical communication with a power supply, a voltage source, a driver circuit, or other device that supplies the system voltage VDD. The drain terminal of the second NMOS transistor 743 is in electrical communication with the source terminal of the second PMOS transistor 744, the gate terminal of the first PMOS transistor 742, the gate terminal of the first capacitor connected PMOS transistor 745, and the gate terminal of the second capacitor connected PMOS transistor 746. The gate terminal of the second NMOS transistor 743 is in electrical communication with control logic, such as a processor, a controller, and a microcontroller, to receive the initialization signal INIT. The source terminal of the second NMOS transistor 743 is in electrical communication with the drain terminal of the second PMOS transistor 744, the drain terminal of the first PMOS transistor 742, the first load device 730, the second voltage swing limiter 720, the power control device 760, the first voltage swing limiter 710, the second coupling canceller 790, the drain terminal of the third NMOS transistor 737, and the drain terminal of the first NMOS transistor 741. The drain terminal of the second PMOS transistor 744 is in electrical communication with the source terminal of the second NMOS transistor 743, the drain terminal of the first PMOS transistor 742, the first load device 730, the second voltage swing limiter 720, the power control device 760, the first voltage swing limiter 710, the second coupling canceller 790, the drain terminal of the third NMOS transistor 747, and the drain terminal of the first NMOS transistor 741. The gate terminal of the second PMOS transistor 744 is in electrical communication with control logic, such as a processor, a controller, and a microcontroller, to receive the complementary initialization signal INITB. The source terminal of the second PMOS transistor 744 is in electrical communication with the gate terminal of the first PMOS transistor 742, the drain terminal of the second NMOS transistor 743, the gate terminal of the first capacitor connected PMOS transistor 745, and the gate terminal of the second capacitor connected PMOS transistor 746. The drain terminal and the source terminal of the first capacitor connected PMOS transistor 745 are in electrical communication and the drain terminal and the source terminal are in electrical communication with the first load device 730. The gate terminal of the first capacitor connected PMOS transistor 745 is in electrical communication with the drain terminal of the second NMOS transistor 743, the source terminal of the second PMOS transistor 744, the gate terminal of the first PMOS transistor 742, and the gate terminal of the second capacitor connected PMOS transistor 746. The drain terminal and the source terminal of the second capacitor connected PMOS transistor 746 are in electrical communication and the drain terminal and the source terminal are in electrical communication with a power supply, a voltage source, a driver circuit, or other device that supplies the system voltage VDD. The gate terminal of the second capacitor connected PMOS transistor 746 is in electrical communication with the gate terminal of the first PMOS transistor 742, the source terminal of the second PMOS transistor 744, the drain terminal of the second NMOS transistor 743, and the gate terminal of the first capacitor connected PMOS transistor 745. The drain terminal of the third NMOS transistor 747 is in electrical communication with the drain terminal of the first NMOS transistor 741, the second coupling canceller 790, the first voltage swing limiter 710, the power control device 760, the second voltage swing limiter 720, the drain terminal of the first PMOS transistor 742, the drain terminal of the second PMOS transistor 744, and the source terminal of the second NMOS transistor 743. The gate terminal of the third NMOS transistor 747 is in electrical communication with control logic, such as a processor, a controller, and a microcontroller, to receive the initialization signal INIT. The source terminal of the third NMOS transistor 747 is in electrical communication with the gate terminal of the first NMOS transistor 741, the first coupling canceller 780, and the drain terminal and the source terminal of the capacitor connected NMOS transistor 748. The drain terminal and the source terminal of the capacitor connected NMOS transistor 748 are in electrical communication and the drain terminal and the source terminal are in electrical communication with the first coupling canceller 780, the source terminal of the third NMOS transistor 747, and the gate terminal of the first NMOS transistor 741. The gate terminal of the capacitor connected NMOS transistor 748 is in electrical communication with the second input device 520.

The current source 750 includes a first NMOS transistor 752 have a drain terminal, a gate terminal, and a source terminal and a second NMOS transistor 754 having a drain terminal, a gate terminal, and a source terminal. The drain terminal of the first NMOS transistor 752 is in electrical communication with the first load device 730 and the second load device 740. The gate terminal of the first NMOS transistor 752 is in electrical communication with control logic, such as a processor, a controller, and a microcontroller, to receive the sense amplifier enable signal SAEN. The source terminal of the first NMOS transistor 752 is in electrical communication with the drain terminal of the second NMOS transistor 754. The drain terminal of the second NMOS transistor 754 is in electrical communication with the source terminal of the first NMOS transistor 752. The gate terminal of the second NMOS transistor 754 is in electrical communication with control logic, such as a processor, a controller, and a microcontroller, to receive the bias current signal BIAS. The source terminal of the second NMOS transistor 754 is in electrical communication with a power supply, a voltage source, a driver circuit, or other device that supplies 0 volts or ground.

The first coupling canceller 780 includes a capacitor connected NMOS transistor 781 having a drain terminal, a gate terminal, and a source terminal. The drain terminal and the source terminal of the capacitor connected NMOS transistor 781 are in electrical communication and the drain terminal and the source terminal are in electrical communication with the second input device 520 and the second load device 740. The gate terminal of the first capacitor connected NMOS transistor 781 is in electrical communication with the first load device 730. The second coupling canceller 790 includes a capacitor connected NMOS transistor 791 having a drain terminal, a gate terminal, and a source terminal. The drain terminal and the source terminal of the capacitor connected NMOS transistor 791 are in electrical communication and the drain terminal and the source terminal are in electrical communication with the first input device 510 and the first load device 730. The gate terminal of the capacitor connected NMOS transistor 791 is in electrical communication with the second load device 740.

The power control device 760 includes a PMOS transistor 762 having a drain terminal, a gate terminal, and a source terminal, a first NMOS transistor 764 having a drain terminal, a gate terminal, and a source terminal, a second NMOS transistor 767 having a drain terminal, a gate terminal, and a source terminal, and a third NMOS transistor 768 having a drain terminal, a gate terminal, and a source terminal. The drain terminal of the PMOS transistor 762 is in electrical communication with the latch device 770. The gate terminal of the PMOS transistor 762 is in electrical communication with control logic, such as a processor, a controller, and a microcontroller, to receive the first power on signal PONB. The source terminal of the PMOS transistor 762 is in electrical communication with a power supply, a voltage source, a driver circuit, or other device that supplies the system voltage VDD. The drain terminal of the first NMOS transistor 764 is in electrical communication with the latch device 770. The gate terminal of the first NMOS transistor 764 is in electrical communication control logic, such as a processor, a controller, and a microcontroller, to receive the second power on signal NON. The source terminal of the first NMOS transistor 764 is in electrical communication with a power supply, a voltage source, a driver circuit, or other device that supplies 0 volts or ground. The drain terminal of the second NMOS transistor 767 is in electrical communication with the latch device 770. The gate terminal of the second NMOS transistor 767 is in electrical communication with control logic, such as a processor, a controller, and a microcontroller, to receive the first power on signal PONB. The source terminal of the second NMOS transistor 767 is in electrical communication with the first load device 730. The drain terminal of the third NMOS transistor 768 is in electrical communication with the second load device 740. The gate terminal of the third NMOS transistor 768 is in electrical communication with control logic, such as a processor, a controller, and a microcontroller, to receive the first power on signal PONB. The source terminal of the third NMOS transistor 768 is in electrical communication with the latch device 770. Alternatively, each of the second NMOS transistor 767 and the third NMOS transistor 768 may be replaced with a NMOS transistor and a PMOS transistor in electrical communication in parallel, with each of the NMOS transistors having a drain terminal, a gate terminal, and a source terminal, each of the PMOS transistors having a drain terminal, a gate terminal, and a source terminal, the gate terminals of both NMOS transistors in electrical communication with a circuit to receive a signal to turn on and turn off both NMOS transistors, the gate terminals of both PMOS transistors in electrical communication with a circuit to receive a signal to turn on and turn off both PMOS transistors, and the signals being coordinated such that both NMOS transistors and both PMOS transistors are turned on and turned off at generally the same time.

The latch device 770 includes a first PMOS transistor 772 having a drain terminal, a gate terminal, and a source terminal, a first NMOS transistor 774 having a drain terminal, a gate terminal, and a source terminal, a second PMOS transistor 776 having a drain terminal, a gate terminal, and a source terminal, and a second NMOS transistor 778 having a drain terminal, a gate terminal, and a source terminal. The drain terminal of the first PMOS transistor 772 is in electrical communication with the gate terminal of the second PMOS transistor 776, the gate terminal of the second NMOS transistor 778, the power control device 760, and the drain terminal of the first NMOS transistor 774. The gate terminal of the first PMOS transistor 772 is in electrical communication with the drain terminal of the second PMOS transistor 776, the drain terminal of the second NMOS transistor 778, the power control device 760, and the gate terminal of the first NMOS transistor 774. The source terminal of the first PMOS transistor 772 is in electrical communication with the power control device 760 and the source terminal of the second PMOS transistor 776. The drain terminal of the first NMOS transistor 774 is in electrical communication with the power control device 760, the gate terminal of the second PMOS transistor 776, the gate terminal of the second NMOS transistor 778, and the drain terminal of the first PMOS transistor 772. The gate terminal of the first NMOS transistor 774 is in electrical communication with the drain terminal of the second PMOS transistor 776, the drain terminal of the second NMOS transistor 778, the power control device 760, and the gate terminal of the first PMOS transistor 772. The source terminal of the first NMOS transistor 774 is in electrical communication with the power control device 760 and the source terminal of the second NMOS transistor 778. The drain terminal of the second PMOS transistor 776 is in electrical communication with the power control device 760, the gate terminal of the first PMOS transistor 772, the gate terminal of the first NMOS transistor 774, and the drain terminal of the second NMOS transistor 778. The gate terminal of the second PMOS transistor 776 is in electrical communication with the drain terminal of the first PMOS transistor 772, the drain terminal of the first NMOS transistor 774, the power control device 760, and the gate terminal of the second NMOS transistor 778. The source terminal of the second PMOS transistor 776 is in electrical communication with the power control device 760 and the source terminal of the first PMOS transistor 772. The drain terminal of the second NMOS transistor 778 is in electrical communication with the power control device 760, the gate terminal of the first PMOS transistor 772, the gate terminal of the first NMOS transistor 774, and the drain terminal of the second PMOS transistor 776. The gate terminal of the second NMOS transistor 778 is in electrical communication with the drain terminal of the first PMOS transistor 772, the drain terminal of the first NMOS transistor 774, the power control device 760, and the gate terminal of the second PMOS transistor 776. The source terminal of the second NMOS transistor 778 is in electrical communication with the power control device 760 and the source terminal of the first NMOS transistor 774.

Referring to the simplified schematic diagram of the third sense amplifier 700 shown in FIG. 7, the first load device 730 receives the voltage V510 provided by the first input device 510, the initialization signal INIT, and the complementary initialization signal INITB. The second load device 740 receives the voltage V520 provided by the second input device 520, the initialization signal INIT, and the complementary initialization signal INITB. The current source 750 receives the sense amplifier enable signal SAEN and the bias current signal BIAS. The power control device 760 receives the first power on signal PONB and the second power on signal NON. Control logic, such as a processor, a controller, and a microcontroller, supplies the initialization signal INIT, the complementary initialization signal INITB, the sense amplifier enable signal SAEN, the bias current signal BIAS, the first power on signal PONB, and the second power on signal NON to the third sense amplifier 700. Exemplary voltage waveforms for the initialization signal INIT, the complementary initialization signal INITB, the sense amplifier enable signal SAEN, the first power on signal PONB, and the second power on signal NON for describing operation of the third sense amplifier 700 for READ operations of resistive change element O01 are shown in FIG. 2B. Additionally, although an exemplary voltage waveform for the bias current signal BIAS is not shown in FIG. 2B, the control logic supplies the bias current signal BIAS. The control logic supplies the sense amplifier enable signal SAEN to enable and disable the current source 750 and the bias current signal BIAS to set the amount of current sunk by the current source 750. Also, exemplary voltage waveforms for the signal YD0, the signal SSELo, the signal KEEPe, the voltage VW(1) on the word line W(1), the voltage on the reference line RL5 labeled as the voltage REF, and the voltage VGB5(0) on the global bit line GB5(0) labeled as the voltage VGB for describing operation of the third sense amplifier 700 for READ operations of resistive change element O01 are shown in FIG. 2B. Further, FIG. 2B shows two exemplary voltage waveforms for the voltage VGB, a voltage waveform for when the resistive change element O01 has a low resistive state and a voltage waveform for when the resistive change element O01 has a high resistive state.

The third sense amplifier 700 is in an initializing configuration when the initialization signal INIT has a high level and the complementary initialization signal INITB has a low level and the third sense amplifier 700 is in a comparing configuration when the initialization signal INIT has a low level and the complementary initialization signal INITB has a high level. When the third sense amplifier 700 is in an initializing configuration the first PMOS transistor 732 and the third NMOS transistor 737 of the first load device 730 are electrically connected to function as diodes and the first PMOS transistor 742 and the third NMOS transistor 747 of the second load device 740 are electrically connected to function as diodes. When the third sense amplifier 700 is in a comparing configuration the first PMOS transistor 732 is electrically connected to function as a resistor and the first PMOS transistor 742 is electrically connected to function as a resistor with the operating points of the first PMOS transistor 732 and the second PMOS transistor 742 set to compensate for performance differences between the first load device 730 and the second load device 740 by keeping the gate voltage of the first PMOS transistor 732 at a bias voltage VB732 and the gate voltage of the first PMOS transistor 742 at a bias voltage VB742. Additionally, when the initialization signal INIT has a high level and the complementary initialization signal INITB has a low level the first input device 510 provides the inhibit voltage VINH to the first load device 730 and the second input device 520 provides the inhibit voltage VINH to the second load device 740. Further, when the initialization signal INIT has a low level and the complementary initialization signal INITB has a high level the first input device 510 provides the voltage VGB5(0) on the global bit line GB5(0) to the first load device 730 and the second input device 520 provides the voltage on the reference line RL5 to the second load device 740.

The third sense amplifier 700 is initialized to generate the bias voltage VB732 for setting the operating point of the first PMOS transistor 732 and the bias voltage VB742 for setting the operating point of the first PMOS transistor 742 before comparing the voltage VGB5(0) on the global bit line GB5(0) with the voltage on the reference line RL5. As shown in FIG. 2B, at the start of initializing the third sense amplifier 700, the third sense amplifier 700 is in the initializing configuration, the initialization signal INIT has a high level, the complementary initialization signal INITB has a low level, the sense amplifier enable signal SAEN transitions to a high level, the first power on signal PONB transitions to a high level, and the second power on signal NON transitions to a low level. During initializing the third sense amplifier 700, the bias voltage VB732 for setting the operating point for the first PMOS transistor 732 of the first load device 730 is generated and the bias voltage VB742 for setting the operating point for the first PMOS transistor 742 of the second load device 740 is generated.

The bias voltage VB732 is generated on the first line L737 and the second line L738 of the first load device 730 and the bias voltage VB742 is generated on the first line L747 and the second line L748 of the second load device 740. The voltage on the first line L737 and the voltage on the second line L738 of the first load device 730 are generally the same voltage because turning on the second NMOS transistor 733 and the second PMOS transistor 734 electrically connects the first PMOS transistor 732 to function as a diode by electrically connecting the first line L737 and the second line L738. The voltage on the first line L747 and the voltage on the second line L748 of the second load device 740 are generally the same voltage because turning on the second NMOS transistor 743 and the second PMOS transistor 744 electrically connects the first PMOS transistor 742 as to function as a diode by electrically connecting the first line L747 and the second line L748. The bias voltage VB732 is based on an amount of current flowing through the first load device 730 and the bias voltage VB742 is based on an amount of current flowing through the second load device 740. The sum of the amount of current flowing through the first load device 730 and the amount of current flowing through the second load device 740 is equal to an amount of current sunk by the current source 750.

A current path through the first load device 730 is created by electrically connecting the first NMOS transistor 731 and the first PMOS transistor 732 to function as diodes. The first NMOS transistor 731 is electrically connected to function as a diode by turning on the third NMOS transistor 737. The first PMOS transistor 732 is electrically connected to function as a diode by turning on the second NMOS transistor 733 and the second PMOS transistor 734. The second NMOS transistor 733 and the third NMOS transistor 737 are turned on because the initialization signal INIT has a high level. The second PMOS transistor 734 is turned on because the complementary initialization signal INITB has a low level. Additionally, the voltage on the first line L737 is provided to the drain terminal and the source terminal of the capacitor connected NMOS transistor 738 by turning on the third NMOS transistor 737 and the inhibit voltage VINH is provided to the gate terminal of the capacitor connected NMOS transistor 738 by turning off the first PMOS transistor 512 of the first input device 510 and turning on the second PMOS transistor 514 of the first input device 510. The first PMOS transistor 512 is turned off because the initialization signal INIT has a high level and the second PMOS transistor 514 is turned on because the complementary initialization signal INITB has a low level.

A current path through the second load device 740 is created by electrically connecting the first NMOS transistor 741 and the first PMOS transistor 742 to function as diodes. The first NMOS transistor 741 is electrically connected to function as a diode by turning on the third NMOS transistor 747. The first PMOS transistor 742 is electrically connected to function as a diode by turning on the second NMOS transistor 743 and the second PMOS transistor 744. The second NMOS transistor 743 and the third NMOS transistor 747 are turned on because the initialization signal INIT has a high level. The second PMOS transistor 744 is turned on because the complementary initialization signal INITB has a low level. Additionally, the voltage on the first line L747 is provided to the drain terminal and the source terminal of the capacitor connected NMOS transistor 748 by turning on the third NMOS transistor 747 and the inhibit voltage VINH is provided to the gate terminal of the capacitor connected NMOS transistor 748 by turning off the first PMOS transistor 522 of the second input device 520 and turning on the second PMOS transistor 524 of the second input device 520. The first PMOS transistor 522 is turned off because the initialization signal INIT has a high level and the second PMOS transistor 524 is turned on because the complementary initialization signal INITB has a low level.

The first voltage swing limiter 710 and the second voltage swing limiter 720 limit the voltage difference between the bias voltage VB732 and the bias voltage VB742. The first voltage swing limiter 710 receives the bias voltage VB732 from the first load device 730 and outputs a voltage based on the bias voltage VB732 to the second load device 740. The voltage output by the first voltage swing limiter 710 generally increases when the bias voltage VB732 increases and generally decreases when the bias voltage VB732 decreases. The second voltage swing limiter 720 receives the bias voltage VB742 from the second load device 740 and outputs a voltage based on the bias voltage VB742 to the first load device 730. The voltage output by the second voltage swing limiter 720 generally increases when the bias voltage VB742 increases and generally decreases when the bias voltage VB742 decreases.

The first capacitor connected PMOS transistor 735 and the second capacitor connected PMOS transistor 736 of the first load device 730 are charged to the bias voltage VB732 because the first capacitor connected PMOS transistor 735 and the second capacitor connected PMOS transistor 736 are electrically connected to the second line L738. The bias voltage VB732 on the first line L737 and the second line L738 is approximately equal to the voltage on the drain terminal of the first PMOS transistor 732. The first capacitor connected PMOS transistor 745 and the second capacitor connected PMOS transistor 746 of the second load device 740 are charged to the bias voltage VB742 because the first capacitor connected PMOS transistor 745 and the second capacitor connected PMOS transistor 746 are electrically connected to the second line L748. The bias voltage VB742 on the first line L747 and the second line L748 is approximately equal to the voltage on the drain terminal of the first PMOS transistor 742.

The impact of noise and voltage offsets on the bias voltage VB732 and the bias voltage VB742 are reduced because the first capacitor connected PMOS transistor 735 of the first load device 730 and the first capacitor connected PMOS transistor 745 of the second load device 740 are cross coupled so that noise and voltage offsets on line L737 and line L738 of the first load device 730 are similar to noise and voltage offsets on line L747 and line L748 of the second load device 740. Additionally, the impact of noise and voltage offsets on the bias voltage VB732 and the bias voltage VB742 are reduced because the first coupling canceller 780 and the second coupling canceller 790 are cross coupled so that noise and voltage offsets on line L737 and line L738 of the first load device 730 are similar to noise and voltage offsets on line L747 and line L748 of the second load device 740.

The impact of voltage transients on the bias voltage VB732 and the bias voltage VB742 are reduced by the voltage levels of the initialization signal INIT and the complementary initialization signal INITB being offset. Voltage transients introduced through gate to channel capacitance of the second NMOS transistor 733 by turning on and off the second NMOS transistor 733 and voltage transients introduced through gate to channel capacitance of the second PMOS transistor 734 by turning on and off the second PMOS transistor 734 are offset because the voltage levels of the initialization signal INIT and the complementary initialization signal INITB are offset. Thus, voltage transients introduced through gate to channel capacitance of the second NMOS transistor 733 by turning on and off the second NMOS transistor 733 and voltage transients introduced through gate to channel capacitance of the second PMOS transistor 734 by turning on and off the second PMOS transistor 734 at least partially cancel each other because the voltage transients are offset. Voltage transients introduced through gate to channel capacitance of the second NMOS transistor 743 by turning on and off the second NMOS transistor 743 and voltage transients introduced through gate to channel capacitance of the second PMOS transistor 744 by turning on and off the second PMOS transistor 744 are offset because the voltage levels of the initialization signal INIT and the complementary initialization signal INITB are offset. Thus, voltage transients introduced through gate to channel capacitance of the second NMOS transistor 743 by turning on and off the second NMOS transistor 743 and voltage transients introduced through gate to channel capacitance of the second PMOS transistor 744 by turning on and off the second PMOS transistor 744 at least partially cancel each other because the voltage transients are offset.

After initializing the third sense amplifier 700 to generate the bias voltage VB732 and the bias voltage VB742, the third sense amplifier 700 compares the voltage VGB5(0) on the global bit line GB5(0) with the voltage on the reference line RL5. The first PMOS transistor 732 is electrically connected to function as a resistor with the gate voltage of the first PMOS transistor 732 kept at the bias voltage VB732 and the first PMOS transistor 742 is electrically connected to function as a resistor with the gate voltage of the first PMOS transistor 742 kept at the bias voltage VB742. Keeping the gate voltage of the first PMOS transistor 732 at the bias voltage VB732 and the gate voltage of the first PMOS transistor 742 at the bias voltage VB742 increases the accuracy of comparing the voltage VGB5(0) on the global bit line GB5(0) with the voltage on the reference line RL5 because keeping the gate voltage of the first PMOS transistor 732 at the bias voltage VB732 and the gate voltage of the first PMOS transistor 742 at the bias voltage VB742 compensates for performance differences between the first load device 730 and the second load device 740.

As shown in FIG. 2B, at the start of comparing the voltage VGB5(0) on the global bit line GB5(0) with the voltage on the reference line RL5, the initialization signal INIT transitions to a low level, the complementary initialization signal INITB transitions to a high level, the sense amplifier enable signal SAEN has high level, the first power on signal PONB has a high level, and the second power on signal NON has a low level. As discussed above, when the initialization signal INIT has a low level and the complementary initialization signal INITB has a high level, the third sense amplifier 700 is in a comparing configuration, the first input device 510 provides the voltage VGB5(0) on the global bit line GB5(0) to the first load device 730, and the second input device 520 provides the voltage on the reference line RL5 to the second load device 740. During comparing the voltage VGB5(0) on the global bit line GB5(0) with the voltage on the reference line RL5, a voltage VS737 is generated on the first line L737 of the first load device 730 and a voltage VS747 is generated on the first line L747 of the second load device 740 with the voltage VS737 and the voltage VS747 being indicative of a difference between the voltage VGB5(0) on the global bit line GB5(0) and the voltage on the reference line RL5. The voltage VS737 is based on an amount of current flowing through the first load device 730 and the voltage VS747 is based on an amount of current flowing through the second load device 740. The sum of the amount of current flowing through the first load device 730 and the amount of current flowing through the second load device 740 is equal to an amount of current sunk by the current source 750.

A current path through the first load device 730 is created by keeping the gate voltage of first PMOS transistor 732 at the bias voltage VB732 and providing the voltage VGB5(0) on the global bit line GB5(0) to the gate terminal of the capacitor connected NMOS transistor 738 so that a differential signal indicative of a resistive state of resistive change element O01 is passed to the gate terminal of the first NMOS transistor 731. The differential signal is the voltage on the global bit line GB5(0) minus the bias voltage VB732 stored voltage on the capacitor connected NMOS transistor 738. The gate voltage of the first PMOS transistor 732 is kept at the bias voltage VB732 by disconnecting the first line L737 from the second line L738 with the first capacitor connected PMOS transistor 735 and the second capacitor connected PMOS transistor 736 charged to the bias voltage VB732. After disconnecting the first line L737 from the second line L738 the voltage on the second line L738 and the gate voltage of the first PMOS transistor 732 are kept at the bias voltage VB732 by the first capacitor connected PMOS transistor 735 and the second capacitor connected PMOS transistor 736. The first line L737 is disconnected from the second line L738 by turning off the second NMOS transistor 733 and the second PMOS transistor 734. The voltage VGB5(0) on the global bit line GB5(0) is provided to the gate terminal of the capacitor connected NMOS transistor 738 by turning on the first PMOS transistor 512 of the first input device 510 and turning off the second PMOS transistor 514 of the first input device 510. The voltage VGB5(0) on the global bit line GB5(0) is driven to a voltage indicative of a resistive state of the resistive change element O01 as discussed above with respect to generating a voltage indicative of a resistive state of the resistive change element O01. The second NMOS transistor 733 of the first load device 730 is turned off and the first PMOS transistor 512 of the first input device 510 is turned on because the initialization signal INIT has a low level. The second PMOS transistor 734 of the first load device 730 and the second PMOS transistor 514 of the first input device 510 are turned off because the complementary initialization signal INITB has a high level.

A current path through the second load device 740 is created by keeping the gate voltage of first PMOS transistor 742 at the bias voltage VB742 and providing the voltage reference line RL5 to the gate terminal of the capacitor connected NMOS transistor 748 so that voltage on the gate terminal of the first NMOS transistor 741 is the inhibit voltage minus bias voltage stored on the capacitor connected NMOS transistor 748. The gate voltage of the first PMOS transistor 742 is kept at the bias voltage VB742 by disconnecting the first line L747 from the second line L748 with the first capacitor connected PMOS transistor 745 and the second capacitor connected PMOS transistor 746 charged to the bias voltage VB742. After disconnecting the first line L747 from the second line L748 the voltage on the second line L748 and the gate voltage of the first PMOS transistor 742 are kept at the bias voltage VB742 by the first capacitor connected PMOS transistor 745 and the second capacitor connected PMOS transistor 746. The first line L747 is disconnected from the second line L748 by turning off the second NMOS transistor 743 and the second PMOS transistor 744. The voltage on the reference line RL5 is provided to the gate terminal of the capacitor connected NMOS transistor 748 of the second load device 740 by turning on the first PMOS transistor 522 of the second input device 520 and turning off the second PMOS transistor 524 of the second input device 520. The voltage on the reference line RL5 is driven to the inhibit voltage VINH by turning on the second NMOS transistor 122 in the reference line connection circuit 120 and the second NMOS transistor 122 may be turned on as part of preparing the exemplary implementation of the second exemplary architecture for determining a resistive state of the resistive change element O01 as discussed above. The second NMOS transistor 743 of the second load device 740 is turned off and the first PMOS transistor 522 of the second input device 510 is turned on because the initialization signal INIT has a low level. The second PMOS transistor 744 of the second load device 740 and the second PMOS transistor 524 of the second input device 520 are turned off because the complementary initialization signal INITB has a high level.

The amount of current flowing through the first load device 730 and the amount of current flowing through the second load device 740 generally change when the voltage VGB5(0) on the global bit line GB5(0) changes because the voltage on the reference line RL5 is the inhibit voltage VINH and the inhibit voltage VINH is generally the same for READ operations. When the voltage VGB5(0) on the global bit line GB5(0) increases, the amount of current flowing through the first load device 730 increases, the amount of current flowing through the second load device 740 decreases, the voltage VS737 on the first line L737 of the first load device 730 decreases, and the voltage VS747 on the first line L747 of the second load device 740 increases. When the voltage VGB5(0) on the global bit line GB5(0) decreases, the amount of current flowing through first load device 730 decreases, the amount of current flowing through the second load device 740 increases, the voltage VS737 on the first line L737 of the first load device 730 increases, and the voltage VS747 on the first line L747 of the second load device 740 decreases.

The difference between the voltage VS737 on the first line L737 in the first load device 730 and the voltage VS747 on the first line L747 in the second load device 740 is indicative of a resistive state of the resistive change element O01. When the resistive change element O01 has a low resistive state, the voltage VGB5(0) on the global bit line GB5(0) is greater than the inhibit voltage VINH, the amount of current flowing through the first load device 730 is greater than the amount of current flowing through the second load device 740 and the voltage VS737 on first line L737 of the first load device 730 is less than the voltage VS747 on the first line L747 of the second load device 740. When the resistive change element O01 has a high resistive state, the voltage VGB5(0) on the global bit line GB5(0) is less than the inhibit voltage VINH, the amount of current flowing through the first load device 730 is less than the amount of current flowing through the second load device 740 and the voltage VS737 on first line L737 of the first load device 730 is greater than the voltage VS747 on the first line L747 of the second load device 740.

The first voltage swing limiter 710 and the second voltage swing limiter 720 limit the voltage difference between the voltage VS737 generated on the first line L737 of the first load device 730 and the voltage VS747 generated on the first line L747 of the second load device 740. The first voltage swing limiter 710 receives the voltage VS737 from the first load device 730 and outputs a voltage based on the voltage VS737 to the second load device 740. The voltage output by the first voltage swing limiter 710 generally increases when the voltage VS737 increases and generally decreases when the voltage VS737 decreases. The second voltage swing limiter 720 receives the voltage VS747 from the second load device 740 and outputs a voltage based on the voltage VS747 to the first load device 730. The voltage output by the second voltage swing limiter 720 generally increases when the voltage VS747 increases and generally decreases when the voltage VS747 decreases. Additionally, the impact of noise and voltage offsets on the voltage VS737 and the voltage VS747 are reduced because the first coupling canceller 780 and the second coupling canceller 790 are cross coupled so that noise and voltage offsets on line L737 of the first load device 730 are similar to noise and voltage offsets on line L747 of the second load device 740.

While the first power on signal PONB has a high level, the power control device 760 provides the voltage VS737 to the first output 701, the gate terminal of the second PMOS transistor 776 of the latch device 770, and the gate terminal of the second NMOS transistor 778 of the latch device 770 because the second NMOS transistor 767 of the power control device 760 is turned on. Also, while the first power on signal PONB has a high level, the power control device 760 provides the voltage VS747 to the second output 702, the gate terminal of the first PMOS transistor 772 of the latch device 770, and the gate terminal of the first NMOS transistor 774 of the latch device 770 because the third NMOS transistor 768 of the power control device 760 is turned on. When resistive change element O01 has a low resistive state, the voltage VS737 has a voltage level less than a voltage level of the voltage VS747, the gate voltage of the first PMOS transistor 772 is greater than the gate voltage of the second PMOS transistor 776 and the first PMOS transistor 772 is turned on less than the second PMOS transistor 776. Additionally, when resistive change element O01 has a low resistive state, the gate voltage of the first NMOS transistor 774 is greater than the gate voltage of the second NMOS transistor 778 and the first NMOS transistor 774 is turned on greater than the second NMOS transistor 778. When resistive change element O01 has a high resistive state, the voltage VS737 has a voltage level greater than a voltage level of the voltage VS747, the gate voltage of the first PMOS transistor 772 is less than the gate voltage of the second PMOS transistor 776 and the first PMOS transistor 772 is turned on greater than the second PMOS transistor 776. Additionally, when the resistive change element O01 has a high resistive state, the gate voltage of the first NMOS transistor 774 is less than the gate voltage of the second NMOS transistor 778 and the first NMOS transistor 774 is turned on less than the second NMOS transistor 778. During comparing the voltage VGB5(0) on the global bit line GB5(0) with the voltage on the reference line RL5, current generally does not flow through the latch device 770 because the first PMOS transistor 762 of the power control device 760 and the first NMOS transistor 764 of the power control device 760 are turned off. The first PMOS transistor 762 of the power control device 760 is turned off because the first power on signal PONB has a high level and the first NMOS transistor 764 of the power control device 760 is turned off because the second power on signal NON has a low level.

As shown in FIG. 2B, at the conclusion of comparing the voltage VGB5(0) on the global bit line GB5(0) with the voltage on the reference line RL5, the initialization signal INIT transitions to a low level, the complementary initialization signal INITB transitions to a high level, the sense amplifier enable signal SAEN transitions to a low level, the first power on signal PONB transitions to a low level, and after a small delay the second power on signal NON transitions to a high level. As discussed above, when the initialization signal INIT has a high level and the complementary initialization signal INITB has a low level, the third sense amplifier 700 is in an initializing configuration, the first input device 510 provides the inhibit voltage VINH to the first load device 630, and the second input device 520 provides the inhibit voltage VINH to the second input device 640. Additionally, when the first power on signal PONB has a low level, the latch device 770 is disconnected from the first load device 730 and the second load device 740 and the latch device 770 is in electrical communication with a power supply, a voltage source, a driver circuit, or other device that supplies the system voltage VDD. The latch device 770 is disconnected from the first load device 730 by turning off the second NMOS transistor 767 of the power control device 760 and the latch device 770 is disconnected from the second load device 740 by turning off the third NMOS transistor 768. The latch device 770 is electrically connected to a power supply, a voltage source, a driver circuit, or other device that supplies the system voltage VDD by turning on the PMOS transistor 762 of the power control device 760. The PMOS transistor 762 is turned on, the second NMOS transistor 667 is turned off, and the third NMOS transistor 768 is turned off because the first power on signal PONB has a low level. Further, when the second power on signal NON has a high level, the latch device 770 is in electrical communication with a power supply, a voltage source, a driver circuit, or other device that supplies 0 volts or ground. The latch device 770 is electrically connected to the power supply, the voltage source, the driver circuit, or other device that supplies the 0 volts or ground by turning on the first NMOS transistor 764 of the power control device 760. The first NMOS transistor 764 is turned on because the second power on signal NON has a high level.

When comparing the voltage VGB5(0) on the global bit line GB5(0) with the voltage on the reference line RL5 concludes, the voltage on the first output 701, the voltage on the gate terminal of the second PMOS transistor 776, and the voltage on the gate terminal of the second NMOS transistor 778 are approximately equal to the voltage VS737 and the voltage on the second output 702, the voltage on the gate terminal of the first PMOS transistor 772, and the voltage on the gate terminal of the first NMOS transistor 774 are approximately equal to the voltage VS747. The voltage difference between the voltage VS737 and the voltage VS747 can be increased by having a small delay between the first power on signal PONB transitioning to a low level and the second power on signal NON transitioning to high level. During the small delay, current can flow from the power supply, the voltage source, the driver circuit, or other device that supplies the system voltage VDD through the PMOS transistor 762 of the power control device 760 and the first PMOS transistor 772 of the latch device 770 and pull up the voltages on the first output 701, the gate terminal of the second PMOS transistor 776, and the gate terminal of the second NMOS transistor 778. Also, during the small delay, current can flow from the power supply, the voltage source, the driver circuit, or other device that supplies the system voltage VDD through the PMOS transistor 762 of the power control device 760 and the second PMOS transistor 776 of the latch device 770 and pull up the voltages on the second output 702, the gate terminal of the first PMOS transistor 772, and the gate terminal of the first NMOS transistor 774. When the voltage level of the voltage VS737 is less than the voltage level of the voltage VS747, the first PMOS transistor 772 is turned on less than the second PMOS transistor 776 and the voltages on the first output 701, the gate terminal of the second PMOS transistor 776, and the gate terminal of the second NMOS transistor 778 are pulled up less than the voltages on the second output 702, the gate terminal of the first PMOS transistor 772, and the gate terminal of the first NMOS transistor 774 because an amount of current flowing through the first PMOS transistor 772 is less than an amount of current flowing through the second PMOS transistor 776.

When the voltage level of the voltage VS737 is greater than the voltage level of the voltage VS747, the first PMOS transistor 772 is turned on greater than the second PMOS transistor 776 and the voltages on the first output 701, the gate terminal of the second PMOS transistor 776, and the gate terminal of the second NMOS transistor 778 are pulled up greater than the voltages on the second output 702, the gate terminal of the first PMOS transistor 772, and the gate terminal of the first NMOS transistor 774 because an amount of current flowing through the first PMOS transistor 772 is greater than an amount of current flowing through the second PMOS transistor 776. Alternatively, the first power on signal PONB transitioning to a low level and the second power on signal NON transitioning to a high level can occur at approximately the same time.

After the first power on signal PONB has a low level and the second power on signal NON has a high level, the voltages on the first output 701, the gate terminal of the second PMOS transistor 776, and the gate terminal of the second NMOS transistor 778 transition to the system voltage VDD or 0 volts or ground and the voltages on the second output 702, the gate terminal of the first PMOS transistor 772, and the gate terminal of the first NMOS transistor 774 transition to the system voltage VDD or 0 volts or ground. When the resistive change element O01 has a low resistive state the voltage on the first output 701, the gate terminal of the second PMOS transistor 776, and the gate terminal of the second NMOS transistor 778 transition to 0 volts or ground and the voltages on the second output 702, the gate terminal of the first PMOS transistor 772, and the gate terminal of the first NMOS transistor 774 transition to the system voltage VDD because the first PMOS transistor 772 is turned on less than the second PMOS transistor 776 and the first NMOS transistor 774 is turned on greater than the second NMOS transistor 778. The voltage on the first output 701 being 0 volts or ground and the voltage on the second output 702 being the system voltage VDD is stored in the latch device 770 by the first PMOS transistor 772 being turned off, the first NMOS transistor 774 being turned on, the second PMOS transistor 776 being turned on, and the second NMOS transistor 778 being turned off. Additionally, the voltage on the first output 701 is generally kept at 0 volts or ground and the voltage on the second output 702 is generally kept at the system voltage VDD by the first PMOS transistor 772 being turned off, the first NMOS transistor 774 being turned on, the second PMOS transistor 776 being turned on, and the second NMOS transistor 778 being turned off. Therefore, when resistive change element O01 has a low resistive state the third sense amplifier 700 outputs 0 volts or ground on the first output 701 and the system voltage VDD on the second output 702.

When the resistive change element O01 has a high resistive state the voltage on the first output 701, the gate terminal of the second PMOS transistor 776, and the gate terminal of the second NMOS transistor 778 transition to the system voltage VDD and the voltages on the second output 702, the gate terminal of the first PMOS transistor 772, and the gate terminal of the first NMOS transistor 774 transition to 0 volts or ground because the first PMOS transistor 772 is turned on greater than the second PMOS transistor 776 and the first NMOS transistor 774 is turned on less than the second NMOS transistor 778. The voltage on the first output 701 being the system voltage VDD and the voltage on the second output 702 being 0 volts or ground is stored in the latch device 770 by the first PMOS transistor 772 being turned on, the first NMOS transistor 774 being turned off, the second PMOS transistor 776 being turned off, and the second NMOS transistor 778 being turned on. Additionally, the voltage on the first output 701 is generally kept the system voltage VDD and the voltage on the second output 702 is generally kept 0 volts or ground by the first PMOS transistor 772 being turned on, the first NMOS transistor 774 being turned off, the second PMOS transistor 776 being turned off, and the second NMOS transistor 778 being turned on. Therefore, when resistive change element O01 has a high resistive state the third sense amplifier 700 outputs the system voltage VDD on the first output 701 and 0 volts or ground on the second output 702.

Referring now to FIGS. 5F-1, 5F-2, 5F-3, and 5F-4, an exemplary DDR compatible implementation of the second exemplary architecture for programming and accessing resistive change elements is illustrated in a simplified schematic diagram. The exemplary DDR compatible implementation of the second exemplary architecture includes a plurality of global bit lines GB6(0)-GB6(x), a resistive change element array 101 having a plurality of sections Section A-Section Z, word line driver circuitry 110a-110z for each section, a reference line RL6, a reference line connection circuit 120a-120z for each section, a plurality of bus lines BL60-BL6x, a keeper circuit 130, a resistor 530, a global bit line connection circuit 590, a plurality of write buffer circuits 1500-150x, a plurality of current sources 1600-160x, a capacitor 580, a plurality of first input devices 5100-510x, a second input device 5200, and a plurality of sense amplifiers 6000-600x. The resistive change element array 101 having a plurality of sections Section A-Section Z, the word line driver circuitry 110a-110z for each section, the reference line connection circuit 120a-120z for each section, the keeper circuit 130, the plurality of write buffer circuits 1500-150x, and the plurality of current sources 1600-160x have a similar structure to the resistive change element array 101 having a plurality of sections Section A-Section Z, the word line driver circuitry 110a-110z for each section, the reference line connection circuit 120a-120z for each section, the keeper circuit 130, the plurality of write buffer circuits 1500-150x, and the plurality of current sources 1600-160x discussed above with respect to the exemplary DDR compatible implementation of first exemplary architecture. Therefore, the resistive change element array 101 having a plurality of sections Section A-Section Z, the word line driver circuitry 110a-110z for each section, the reference line connection circuit 120a-120z for each section, the keeper circuit 130, the plurality of write buffer circuits 1500-150x, and the plurality of current sources 1600-160x are not discussed in detail with respect to the exemplary DDR compatible implementation of the second exemplary architecture. Additionally, the resistor 530 and the capacitor 580 have a similar structure to the resistor 530 and the capacitor 580 discussed above with respect to the exemplary implementation of the second exemplary architecture. Therefore, the resistor 530 and the capacitor 580 are not discussed in detail with respect to the exemplary DDR compatible implementation of the second exemplary architecture.

The global bit line connection circuit 590 includes a PMOS transistor 590r having a drain terminal, a gate terminal, and a source terminal and a plurality of PMOS transistors 590g-59xg having drain terminals, gate terminals, and source terminals. The numbering convention for the plurality of PMOS transistors 590g-59xg includes a column number as the next to last reference character, the numbering convention for the plurality of bus lines BL60-BL6x includes a column number as the last reference character, and the numbering convention for the plurality of global bit lines GB6(0)-GB6(x) begins with letters and number GB6 indicating the line is a global bit line followed by a column number in parentheses. The drain terminal of the PMOS transistor 590r is in electrical communication with the second input device 5200. The gate terminal of the PMOS transistor 590r is in electrical communication with control logic, such as a processor, a controller, and a microcontroller. The source terminal of the PMOS transistor 590r is in electrical communication with the reference line RL6 through the resistor 530. The drain terminals of the plurality of PMOS transistors 590g-59xg are in electrical communication with bus lines BL60-BL6x having the same column numbers. The gate terminals of the plurality of PMOS transistors 590g-59xg are in electrical communication with control logic, such as a processor, a controller, and a microcontroller. The source terminals of the plurality of PMOS transistors 590g-59xg are in electrical communication with global bit lines GB6(0)-GB6(x) having the same column number. Alternatively, the plurality of PMOS transistors 590g-59xg can be other types of field effect transistors, such as carbon nanotube field effect transistors (CNTFETs), SiGE FETs, fully-depleted silicon-on-insulator FETs, or multiple gate field effect transistors such as FinFETs, and/or the PMOS transistor 590r can be other types of field effect transistors, such as carbon nanotube field effect transistors (CNTFETs), SiGE FETs, fully-depleted silicon-on-insulator FETs, or multiple gate field effect transistors such as FinFETs. It is noted that when field effect transistors that do not require a semiconductor substrate are used this enables the field effect transistors to be fabricated on insulator material, and additionally, enables the field effect transistors to be stacked to reduce the amount of chip area consumed by the plurality of PMOS transistors 590g-59xg and/or the PMOS transistor 590r.

The global bit line connection circuit 590 includes the PMOS transistor 590r in electrical communication with the reference line RL6 and the second input device 5200 so that the noise behavior of a voltage on the reference line RL6 received by the second input device 5200 is similar to the noise behaviors of voltages on the bus lines BL60-BL6x received by the first input devices 5100-510x. The PMOS transistor 590r and plurality of PMOS transistors 590g-59xg receive a signal CD0 for controlling current flow through the PMOS transistor 590r and the plurality of PMOS transistors 590g-59xg. The control logic supplies the signal CD0.

Each of the first input devices of the plurality of first input devices 5100-510x has the same structure as the first input device 5100, and thus, the discussion below of the first input device 5100 is applicable to each of the first input devices of the plurality of first input devices 5100-510x. The numbering convention for the plurality of first input devices 5100-510x includes a column number as the last reference character and a first input device corresponds with a global bit line having the same column number.

The first input device 5100 includes a first PMOS transistor 5120 having a drain terminal, a gate terminal, and a source terminal and a second PMOS transistor 5140 having a drain terminal, a gate terminal, and a source terminal. The drain terminal of the first PMOS transistor 5120 is in electrical communication with a first input terminal of the sense amplifier 5500 having the same column number as the first input device 5100, the gate terminal of the first PMOS transistor 5120 is in electrical communication with control logic, such as a processor, a controller, and a microcontroller, to receive an initialization signal INIT, and the source terminal of the first PMOS transistor 5120 is in electrical communication with the bus line BL60 having the same column number as the first input device 5100. The drain terminal of the second PMOS transistor 5140 is in electrical communication with a first input terminal of sense amplifier 5500 having the same column number the first input device 5100, the gate terminal of the second PMOS transistor 5140 is in electrical communication with control logic, such as a processor, a controller, and a microcontroller, to receive a complementary initialization signal INITB, and the source terminal of the second PMOS transistor 5140 is in electrical communication with a power supply, a voltage source, a driver circuit, or other device that supplies an inhibit voltage VINH.

The second input device 5200 includes a first PMOS transistor 5220 having a drain terminal, a gate terminal, and a source terminal and a second PMOS transistor 5240 having a drain terminal, a gate terminal, and a source terminal. The drain terminal of the first PMOS transistor 5220 is in electrical communication with second input terminals of the sense amplifiers 5500-550x and the capacitor 580, the gate terminal of the first PMOS transistor 5220 is in electrical communication with control logic, such as a processor, a controller, and a microcontroller, to receive an initialization signal INIT, and the source terminal of the first PMOS transistor 5220 is in electrical communication with the global bit line connection circuit 590. The drain terminal of the second PMOS transistor 5240 is in electrical communication with second input terminals of sense amplifiers 5500-550x and the capacitor 580, the gate terminal of the second PMOS transistor 5240 is in electrical communication with control logic, such as a processor, a controller, and a microcontroller, to receive a complementary initialization signal INITB, and the source terminal of the second PMOS transistor 5240 is in electrical communication with a power supply, a voltage source, a driver circuit, or other device that supplies an inhibit voltage VINH.

Each sense amplifier of the plurality of sense amplifiers 5500-550x has a first input terminal, a second input terminal, and two output terminals. The numbering convention for the plurality of sense amplifiers 5500-550x includes a column number as the last reference character and a sense amplifier corresponds with a global bit line having the same column number. The first input terminal of each sense amplifier of the plurality of sense amplifiers 5500-550x is in electrical communication with the first input device having the same column number as that sense amplifier. The second input terminal of each sense amplifier of the plurality of sense amplifiers 5500-550x is in electrical communication with the second input device 5200 and the capacitor 580. The two output terminals of each sense amplifier of the plurality of sense amplifiers 5500-550x can be in electrical communication with a bus, a buffer, a level shift circuit, a test circuit, or control logic such as a processor, a controller, and a microcontroller. Each sense amplifier of the plurality of sense amplifiers 5500-550x can be a second sense amplifier 600 discussed above with respect to FIG. 6 or a third sense amplifier 700 discussed above with respect to FIG. 7.

The exemplary DDR compatible implementation of the second exemplary architecture shown in FIGS. 5F-1, 5F-2, 5F-3, and 5F-4 provides for PROGRAMMING operations of multiple resistive change elements to the same resistive state at the same time and READ operations, SET VERIFY operations, and RESET VERIFY operations of multiple resistive change elements at the same time. For example, PROGRAMMING operations to adjust resistive states of even resistive change elements in electrical communication with a word line in a section of the resistive change element array 101 can be performed at the same time. For example, PROGRAMMING operations to adjust resistive states of NUM even resistive change elements in electrical communication with a word line in a section of the resistive change element array 101 can be performed at the same time, where NUM is a number of resistive change elements greater than one and less than the total number of even resistive change elements in electrical communication with the word line. For example, PROGRAMMING operations to adjust resistive states of odd resistive change elements in electrical communication with a word line in a section of the resistive change element array 101 can be performed at the same time. For example, PROGRAMMING operations to adjust resistive states of NUM odd resistive change elements in electrical communication with a word line in a section of the resistive change element array 101 can be performed at the same time, where NUM is a number of resistive change elements greater than one and less than the total number of odd resistive change elements in electrical communication with the word line. For example, READ operations, SET VERIFY operations, and RESET VERIFY operations of even resistive change elements in electrical communication with a word line in a section of the resistive change element array 101 can be performed at the same time. For example, READ operations, SET VERIFY operations, and RESET VERIFY operations of NUM even resistive change elements in electrical communication with a word line in a section of the resistive change element array 101 can be performed at the same time, where NUM is a number of resistive change elements greater than one and less than the total number of even resistive change elements in electrical communication with the word line. For example, READ operations, SET VERIFY operations, and RESET VERIFY operations of odd resistive change elements in electrical communication with a word line in a section of the resistive change element array 101 can be performed at the same time. For example, READ operations, SET VERIFY operations, and RESET VERIFY operations of NUM odd resistive change elements in electrical communication with a word line in a section of the resistive change element array 101 can be performed at the same time, where NUM is a number of resistive change elements greater than one and less than the total number of odd resistive change elements in electrical communication with the word line.

Additionally, the exemplary DDR compatible implementation of the second exemplary architecture shown in FIGS. 5F-1, 5F-2, 5F-3, and 5F-4 provides for PROGRAMMING operations, READ operations, SET VERIFY operations, and RESET VERIFY operations of one resistive change element at a time. For example, PROGRAMMING operations, READ operations, SET VERIFY operations, and RESET VERIFY operations of one resistive change element at a time may be performed in a test mode of the exemplary DDR compatible implementation of the second exemplary architecture. PROGRAMMING operations, READ operations, SET VERIFY operations, and RESET VERIFY operations of one resistive change element at a time in the exemplary DDR compatible implementation of the second exemplary architecture can be performed in a similar manner to PROGRAMMING operations, READ operations, SET VERIFY operations, and RESET VERIFY operations of resistive change elements in the exemplary implementation of the second exemplary architecture shown in FIGS. 5B-1 and 5B-2 and discussed above. Therefore, PROGRAMMING operations, READ operations, SET VERIFY operations, and RESET VERIFY operations of one resistive change element at a time in the exemplary DDR compatible implementation of the second exemplary architecture are not discussed in detail below. It is noted that the exemplary DDR compatible implementation of the second exemplary architecture may be used with interface circuitry tailored for other SRAM interfaces so that the exemplary DDR compatible implementation of the second exemplary architecture is compatible with other SRAM interfaces.

PROGRAMMING operations of resistive change elements in the exemplary DDR compatible implementation of the second exemplary architecture shown in FIGS. 5F-1, 5F-2, 5F-3, and 5F-4 are performed in a similar manner to PROGRAMMING operations of resistive change elements in the exemplary DDR compatible implementation of the first exemplary architecture. PROGRAMMING operations of resistive change elements in the exemplary DDR compatible implementation of the first exemplary architecture are discussed above. Therefore, PROGRAMMING operations of resistive change elements in the exemplary DDR compatible implementation of the second exemplary architecture shown in FIGS. 5F-1, 5F-2, 5F-3, and 5F-4 are not discussed in detail below. READ operations, SET VERIFY operations, and RESET VERIFY operations of odd resistive change elements in electrical communication with a word line in a section of the resistive change element array 101 are discussed below with respect to FIGS. 5G-1, 5G-2, 5G-3, and 5G-4 that show current flow during a READ operation of odd resistive change elements in electrical communication with word line Wa(1). It is additionally noted that READ operations, SET VERIFY operations, and RESET VERIFY operations of odd resistive change elements in electrical communication with a word line in a section of resistive change element array 101 and READ operations, SET VERIFY operations, and RESET VERIFY operations of even resistive change elements in electrical communication with a word line in a section of resistive change element array 101 can be performed in a similar manner to the READ operations, SET VERIFY operations, and RESET VERIFY operations of odd resistive change elements in electrical communication with word line Wa(1).

Referring now to FIGS. 5G-1, 5G-2, 5G-3, and 5G-4, a READ operation of odd resistive change elements in electrical communication with word line Wa(1) starts, as similarly discussed above in step 402 of the flow chart 400, by providing neutral voltage conditions for the plurality of resistive change elements E00a-Oxya in Section A and the plurality of resistive change elements E00z-Oxyz in Section Z. The neutral voltage conditions are provided for the plurality of resistive change elements E00a-Oxya in section A by floating the plurality of even bit lines Bea(0)-Bea(x) and the plurality of odd bit lines Boa(0)-Boa(x) and applying the inhibit voltage VINH to the plurality of word lines Wa(0)-Wa(y) with the plurality of even bit lines Bea(0)-Bea(x) and the plurality of odd bit lines Boa(0)-Boa(x) floating so that voltages approximately equal to the inhibit voltage VINH are applied to the top electrodes and the bottom electrodes of the resistive change elements in the plurality of resistive change elements E00a-Oxya. Floating a line refers to electrically connecting the line such that a voltage on the line exists due to a line capacitance of the line. The plurality of even bit lines Bea(0)-Bea(x) are floated by disconnecting the plurality of even bit lines Bea(0)-Bea(x) from the plurality of global bit lines GB6(0)-GB6(x) by turning off the plurality of even selection devices Nea0-Neax in Section A. The plurality of even selection devices Nea0-Neax are turned off by control logic, such as a processor, a controller, and a microcontroller, supplying a signal SSELea having a low level. The plurality of odd bit lines Boa(0)-Boa(x) are floated by disconnecting the plurality of odd bit lines Boa(0)-Boa(x) from the plurality of global bit lines GB6(0)-

GB6(x) by turning off the plurality of odd selection devices Noa0-Noax in Section A. The plurality of odd selection devices Noa0-Noax are turned off by control logic, such as a processor, a controller, and a microcontroller, supplying a signal SSELoa having a low level. It is noted that control logic, such as a processor, a controller, and a microcontroller, supplying a signal SSELea having a low level and a signal SSELoa having a low level also turns off the first NMOS transistor 121a and the second NMOS transistor 122a of the reference line connection circuit 120a for Section A.

The inhibit voltage VINH is applied to the plurality of word lines Wa(0)-Wa(y) by the word line driver circuitry 110a for Section A driving voltages on the plurality of word lines Wa(0)-Wa(y) to the inhibit voltage VINH. The plurality of word line driver circuits 110da-11yda receive the system voltage VDD on the first power terminals because the first NMOS transistor 110pa is turned on by control logic, such as a processor, a controller, and a microcontroller, supplying the signal S0a having a high level and receive the inhibit voltage VINH on the second power terminals because the second NMOS transistor 111pa is turned on by the control logic supplying the signal S1a having a high level. The plurality of word line driver circuits 110da-11yda supply the inhibit voltage VINH based on the plurality of signals ITE0a-ITEya supplied by control logic, such as a processor, a controller, and a microcontroller. The plurality of sink transistors 110sa-11ysa are turned off because control logic, such as a processor, a controller, and a microcontroller, supplies the plurality of signals SK0a-SKya have low levels.

Driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating causes voltages on the plurality of word lines Wa(0)-Wa(y), voltages on the plurality of even bit lines Bea(0)-Bea(x), and voltages on the plurality of odd bit lines Boa(0)-Boa(x) to be approximately equal to the inhibit voltage VINH. Voltages on the plurality of even bit lines Bea(0)-Bea(x) and voltages on the plurality of odd bit lines Boa(0)-Boa(x) are approximately equal to the inhibit voltage VINH because currents flow from the plurality of word lines Wa(0)-Wa(y) through the plurality of resistive change elements E00a-Oxya into the plurality of even bit lines Bea(0)-Bea(x) and the plurality of odd bit lines Boa(0)-Boa(x). The inhibit voltage VINH exists on the plurality of even bit lines Bea(0)-Bea(x) and the plurality of odd bit lines Boa(0)-Boa(x) due to line capacitances because the plurality of even bit lines Bea(0)-Bea(x) and the plurality of odd bit lines Boa(0)-Boa(x) are floating. Thus, driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating results in application of voltages approximately equal to the inhibit voltage VINH to the top electrodes and the bottom electrodes of the resistive change elements in the plurality of resistive change elements E00a-Oxya. Additionally, driving voltages on the plurality of word lines Wa(0)-Wa(y) to the inhibit voltage VINH with the plurality of even bit lines Bea(0)-Bea(x) and the plurality of odd bit lines Boa(0)-Boa(x) floating causes the voltages across resistive change elements in the plurality of resistive change elements E00a-Oxya to be approximately 0 volts.

The neutral voltage conditions are provided for the plurality of resistive change elements E00z-Oxyz in section Z by floating the plurality of even bit lines Bez(0)-Bez(x) and the plurality of odd bit lines Boz(0)-Boz(x) and applying the inhibit voltage VINH to the plurality of word lines Wz(0)-Wz(y) with the plurality of even bit lines Bez(0)-Bez(x) and the plurality of odd bit lines Boz(0)-Boz(x) floating so that voltages approximately equal to the inhibit voltage VINH are applied to the top electrodes and the bottom electrodes of the resistive change elements in the plurality of resistive change elements E00z-Oxyz. Floating a line refers to electrically connecting the line such that a voltage on the line exists due to a line capacitance of the line. The plurality of even bit lines Bez(0)-Bez(x) are floated by disconnecting the plurality of even bit lines Bez(0)-Bez(x) from the plurality of global bit lines GB6(0)-GB6(x) by turning off the plurality of even selection devices Nez0-Nezx in Section Z. The plurality of even selection devices Nez0-Nezx are turned off by control logic, such as a processor, a controller, and a microcontroller, supplying a signal SSELez having a low level. The plurality of odd bit lines Boz(0)-Boz(x) are floated by disconnecting the plurality of odd bit lines Boz(0)-Boz(x) from the plurality of global bit lines GB6(0)-GB6(x) by turning off the plurality of odd selection devices Noz0-Nozx in Section Z. The plurality of odd selection devices Noz0-Nozx are turned off by control logic, such as a processor, a controller, and a microcontroller, supplying a signal SSELoz having a low level. It is noted that control logic, such as a processor, a controller, and a microcontroller, supplying a signal SSELez having a low level and a signal SSELoz having a low level also turns off the first NMOS transistor 121z and the second NMOS transistor 122z of the reference line connection circuit 120z for Section Z.

The inhibit voltage VINH is applied to the plurality of word lines Wz(0)-Wz(y) by the word line driver circuitry 110z for Section Z driving voltages on the plurality of word lines Wz(0)-Wz(y) to the inhibit voltage VINH. The plurality of word line driver circuits 110dz-11ydz receive the system voltage VDD on the first power terminals because the first NMOS transistor 110pz is turned on by control logic, such as a processor, a controller, and a microcontroller, supplying the signal S0z having a high level and receive the inhibit voltage VINH on the second power terminals because the second NMOS transistor 111pz is turned on by the control logic supplying the signal S1z having a high level. The plurality of word line driver circuits 110dz-11ydz supply the inhibit voltage VINH based on the plurality of signals ITE0z-ITEyz supplied by control logic, such as a processor, a controller, and a microcontroller. The plurality of sink transistors 110sz-11ysz are turned off because control logic, such as a processor, a controller, and a microcontroller, supplies the plurality of signals SK0z-SKyz have low levels.

Driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating causes voltages on the plurality of word lines Wz(0)-Wz(y), voltages on the plurality of even bit lines Bez(0)-Bez(x), and voltages on the plurality of odd bit lines Boz(0)-Boz(x) to be approximately equal to the inhibit voltage VINH. Voltages on the plurality of even bit lines Bez(0)-Bez(x) and voltages on the plurality of odd bit lines Boz(0)-Boz(x) are approximately equal to the inhibit voltage VINH because currents flow from the plurality of word lines Wz(0)-Wz(y) through the plurality of resistive change elements E00z-Oxyz into the plurality of even bit lines Bez(0)-Bez(x) and the plurality of odd bit lines Boz(0)-Boz(x). The inhibit voltage VINH exists on the plurality of even bit lines Bez(0)-Bez(x) and the plurality of odd bit lines Boz(0)-Boz(x) due to line capacitances because the plurality of even bit lines Bez(0)-Bez(x) and the plurality of odd bit lines Boz(0)-Boz(x) are floating. Thus, driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating results in application of voltages approximately equal to the inhibit voltage VINH to the top electrodes and the bottom electrodes of the resistive change elements in the plurality of resistive change elements E00z-Oxyz. Additionally, driving voltages on the plurality of word lines Wz(0)-Wz(y) to the inhibit voltage VINH with the plurality of even bit lines Bez(0)-Bez(x) and the plurality of odd bit lines Boz(0)-Boz(x) floating causes the voltages across resistive change elements in the plurality of resistive change elements E00z-Oxyz to be approximately 0 volts.

The READ operation of odd resistive change elements in electrical communication with word line Wa(1) in Section A continues, as similarly discussed above in step 404 of the flow chart 400, by biasing the plurality of global bit lines GB6(0)-GB6($x$). The plurality of global bit lines GB6(0)-GB6($x$) are biased to the inhibit voltage VINH by floating the plurality of global bit lines GB6(0)-GB6($x$) and applying the inhibit voltage VINH to the plurality of global bit lines GB6(0)-GB6($x$). The plurality of global bit lines GB6(0)-GB6($x$) are floated by disconnecting the plurality of global bit lines GB6(0)-GB6($x$) from the plurality of even bit lines Bea(0)-Bea(x) and the plurality of odd bit lines Boa(0)-Boa(x) in Section A, the plurality of even bit lines Bez(0)-Bez(x) and the plurality of odd bit lines Boz(0)-Boz(x) in Section Z, and the plurality of bus lines BL60-BL6$x$. The plurality of global bit lines GB6(0)-GB6($x$) may be disconnected from the plurality of even bit lines Bea(0)-Bea(x) and the plurality of odd bit lines Boa(0)-Boa(x) in Section A as part of providing neutral voltage conditions for the plurality of resistive change elements E00a-Oxya in Section A as discussed above. The plurality of global bit lines GB6(0)-GB6($x$) may be disconnected from the plurality of even bit lines Bez(0)-Bez(x) and the plurality of odd bit lines Boz(0)-Boz(x) in Section Z as part of providing neutral voltage conditions for the plurality of resistive change elements E00z-Oxyz in Section Z as discussed above. The plurality of global bit lines GB6(0)-GB6($x$) are disconnected from the plurality of bus lines BL60-BL6$x$ by turning off the plurality of PMOS transistors 590$g$-59$xg$ in the global bit line connection circuit 590. The plurality of PMOS transistors 590$g$-59$xg$ are turned off by control logic, such as a processor, a controller, and a microcontroller, supplying a signal CD0 having a high level. The inhibit voltage VINH is applied to the plurality of global bit lines GB6(0)-GB6($x$) by electrically connecting the plurality of global bit lines GB6(0)-GB6($x$) to a power supply, a voltage source, a driver circuit, or other device that supplies the inhibit voltage VINH by turning on the plurality of NMOS transistors 130$k$-13$xk$ in the keeper circuit 130. The plurality of NMOS transistors 130$k$-13$xk$ are turned on by control logic, such as a processor, a controller, and a microcontroller, supplying a signal KEEPe having a high level and a signal KEEPo having a high level. It is noted that control logic, such as a processor, a controller, and a microcontroller, supplying a signal CD0 having a high level also turns off the PMOS transistor 590$r$ in the global bit line connection circuit 590. It is further noted that the reference line RL6 floats because the PMOS transistor 590$r$, the first NMOS transistor 121$a$ and the second NMOS transistor 122$a$ of the reference line connection circuit 120$a$ for Section A, and the first NMOS transistor 121$z$ and the second NMOS transistor 122$z$ of the reference line connection circuit 120$z$ for Section Z are turned off.

The READ operation of odd resistive change elements in electrical communication with word line Wa(1) in Section A proceeds, as similarly discussed above in step 406 of the flow chart 400, by selecting the odd resistive change elements O01$a$, Ox1$a$ in electrical communication with word line Wa(1) in Section A from the plurality of resistive change elements E00$a$-Oxya in Section A and the plurality of resistive change elements E00$z$-Oxyz in Section Z. The odd resistive change elements O01$a$, Ox1$a$ in electrical communication with word line Wa(1) in Section A are selected from the plurality of resistive change elements E00$a$-Oxya in Section A and the plurality of resistive change elements E00$z$-Oxyz in Section Z by control logic, such as a processor, a controller, and a microcontroller. The resistive change elements E00$a$-Ox0$a$, E01$a$, Ex1$a$, and E0$y a$-Oxya in the plurality of resistive change elements E00$a$-Oxya in Section A and the plurality of resistive change elements E00$z$-Oxyz in Section Z that are not selected are referred to as unselected resistive change elements.

The READ operation of odd resistive change elements in electrical communication with word line Wa(1) in Section A continues, as similarly discussed above in step 408 of the flow chart 400, by preparing the exemplary DDR compatible implementation of the second exemplary architecture for determining resistive states of the odd resistive change elements O01$a$, Ox1$a$. The exemplary DDR compatible implementation of the second exemplary architecture is prepared for determining resistive states of the odd resistive change elements O01$a$, Ox1$a$ by changing electrical connections of the reference line RL6, driving the voltage on the reference line RL6 to the inhibit voltage VINH, changing electrical connections of the plurality of odd bit lines Boa(0)-Boa(x), changing electrical connections of the plurality of global bit lines GB6(0)-GB6(0), and disconnecting a power supply, a voltage source, a driver circuit, or the device that supplies the inhibit voltage VINH from the plurality of global bit lines GB6(0)-GB6($x$). The electrical connections of the reference line RL6 are changed so that the reference line RL6 is in electrical communication with the second input device 5200. The reference line RL6 is electrically connected to the second input device 5200 by turning on the PMOS transistor 590$r$. The PMOS transistor 590$r$ is turned on by control logic, such as a processor, a controller, and a microcontroller, supplying a signal CD0 having a low level. The voltage on the reference line RL6 is driven to the inhibit voltage VINH by electrically connecting the reference line RL6 through the second NMOS transistor 122$a$ of the reference line connection circuit 120$a$ and the second NMOS transistor 111$pa$ of the word line driver circuit 110$a$ to a power supply, a voltage source, a driver circuit, or other device that supplies the inhibit voltage VINH. The second NMOS transistor 122$a$ is turned on by control logic, such as a processor, a controller, and a microcontroller, supplying a signal SSELoa having a high level and, as discussed above with respect to providing neutral voltage conditions for the plurality of resistive change elements E00$a$-Oxya in Section A and the plurality of resistive change elements E00$z$-Oxyz in Section Z, the second NMOS transistor 111$pa$ of the word line driver circuit 110$a$ is turned on.

The electrical connections of the plurality of odd bit lines Boa(0)-Boa(x) and the electrical connections of the plurality of global bit lines GB6(0)-GB6($x$) are changed and a power supply, a voltage source, a driver circuit, or other device that supplies the inhibit voltage VINH is disconnected from the plurality of global bit lines GB6(0)-GB6($x$) so that voltages indicative of the resistive states of the odd resistive change elements O01$a$, Ox1$a$ can be generated on the plurality of odd bit lines Boa(0)-Boa(x), the plurality of global bit lines GB6(0)-GB6(x), and the plurality of bus lines BL60-BL6x. The electrical connections of the plurality of odd bit lines Boa(0)-Boa(x) are changed so that the plurality of odd bit lines Boa(0)-Boa(x) are in electrical communication with the plurality of global bit lines GB6(0)-GB6(x). The plurality of odd bit lines Boa(0)-Boa(x) are electrically connected to the plurality of global bit lines GB6(0)-GB6(x) by turning on the plurality of odd selection devices Noa0-Noax. The plurality of odd selection devices Noa0-Noax are turned on by control logic, such as a processor, a controller, and a microcontroller, supplying a signal SSELo having a high level. The plurality of odd bit lines Boa(0)-Boa(x) may be electrically connected to the plurality of global bit lines GB6(0)-GB6(x) as part of driving the voltage on the reference line RL6 to the inhibit voltage VINH as discussed above.

The electrical connections of the plurality of global bit lines GB6(0)-GB6(x) are changed so that the plurality of global bit lines GB6(0)-GB6(x) are in electrical communication with the plurality of odd bit lines Boa(0)-Boa(x) and the plurality of bus lines BL60-BL6x. The plurality of global bit lines GB6(0)-GB6(x) are electrically connected to the plurality of odd bit lines Boa(0)-Boa(x) by turning on the plurality of odd selection devices Noa0-Noax as discussed above and the plurality of global bit lines GB6(0)-GB6(x) may be electrically connected to the plurality of odd bit lines Boa(0)-Boa(x) as part of driving the voltage on the reference line RL6 to the inhibit voltage VINH as discussed above. The plurality of global bit lines GB6(0)-GB6(x) are electrically connected to the plurality of bus lines BL60-BL6x by turning on the plurality of PMOS transistors 590g-59xg. The plurality of PMOS transistors 590g-59xg are turned on by control logic, such as a processor, a controller, and a microcontroller, supplying a signal CD0 having a low level. The plurality of global bit lines GB6(0)-GB6(x) may be electrically connected to the plurality of bus lines BL60-BL6x as part of electrically connecting the reference line RL6 to the second input device 5200 as discussed above. A power supply, a voltage source, a driver circuit, or other device that supplies the inhibit voltage VINH is disconnected from the plurality of global bit lines GB6(0)-GB6(x) by turning off the plurality of NMOS transistors 130k-13xk. The plurality of NMOS transistors 130k-13xk are turned off by control logic, such as a processor, a controller, and a microcontroller, supplying a signal KEEPe having a low level and a signal KEEPo having a low level.

The READ operation of odd resistive change elements in electrical communication with word line Wa(1) in Section A continues, as similarly discussed above in step 410 of the flow chart 400, by generating voltages indicative of resistive states of the odd resistive change elements O01a, Ox1a. Voltages indicative of resistive states of the odd resistive change elements O01a, Ox1a are generated on the plurality of odd bit lines Boa(0)-Boa(x), the plurality of global bit lines GB6(0)-GB6(x), and the plurality of bus lines BL60-BL6x by driving the voltage on the word line Wa(1) to the system voltage VDD and sinking an amount of current for a READ operation from each bus line of the plurality the bus lines BL60-BL6x. As discussed above, providing neutral voltage conditions for the plurality of resistive change elements E00a-Oxya causes voltages on the plurality of word lines Wa(0)-Wa(y), voltages on the plurality of even bit lines Bea(0)-Bea(x), and voltages on the plurality of odd bit lines Boa(0)-Boa(x) to be approximately equal to the inhibit voltage VINH. Also, as discussed above, the plurality of global bit lines GB6(0)-GB6(x) are biased to the inhibit voltage VINH. Thus, for generating voltages indicative of resistive states of the odd resistive change elements O01a, Ox1a, a voltage on the word line Wa(1) transitions from the inhibit voltage VINH to the system voltage VDD and the voltages on the plurality of odd bit lines Boa(0)-Boa(x) and the plurality of global bit lines GB6(0)-GB6(x) transition from the inhibit voltage VINH to voltages indicative of resistive states of the odd resistive change elements O01a, Ox1a.

The voltage transition of the voltage on the word line Wa(1) generally corresponds with the voltage transition of the voltage on the top electrodes TE of the odd resistive change elements O01a, Ox1a because the voltage on the word line Wa(1) generally corresponds with the voltage on the top electrodes TE of the odd resistive change elements O01a, Ox1a. The voltage transitions of the voltages on the plurality of odd bit lines Boa(0)-Boa(x) generally corresponds with the voltage transitions of the voltages on the bottom electrodes BE of the odd resistive change elements O01a, Ox1a because the voltages on the plurality of odd bit lines Boa(0)-Boa(x) generally corresponds with the voltages on the bottom electrodes BE of the odd resistive change elements O01a, Ox1a. The magnitude of the voltage transition to place the top electrodes TE of the odd resistive change elements O01a, Ox1a at the system voltage VDD for generating voltages indicative of resistive states of the odd resistive change elements O01a, Ox1a is reduced because the voltage applied to the top electrodes TE of the odd resistive change elements O01a, Ox1a is not required to transition by the magnitude of the system voltage VDD. A voltage transition of the system voltage VDD minus the inhibit voltage VINH is required to place the top electrodes at the system voltage VDD. For example, when the inhibit voltage VINH is VDD/2 (half of the system voltage VDD) a voltage transition of VDD−VDD/2=VDD/2 is required to place the top electrodes at the system voltage VDD. Further, the number of voltage transitions for generating voltages indicative of resistive states of the odd resistive change elements O01a, Ox1a is reduced because only voltages on the word line Wa(1), the plurality of global bit lines GB6(0)-GB6(x), and the plurality of odd bit lines Boa(0)-Boa(x) are adjusted for generating voltages indicative of resistive states of the odd resistive change elements O01a, Ox1a. It is noted that applying the inhibit voltage VINH to a top electrode, a bottom electrode, or both a top electrode and a bottom electrode of a resistive change element limits a voltage applied across a resistive change element to a voltage less than a voltage limit for disturbing a resistive state of a resistive change element while generating voltages indicative of resistive states of the odd resistive change elements O01a, Ox1a.

The voltage on the word line Wa(1) is driven from the inhibit voltage VINH to the system voltage VDD by changing the voltage supplied by the word line driver circuit 111da from the inhibit voltage VINH to the system voltage VDD. The word line driver circuit 111da changes from supplying the inhibit voltage VINH to the system voltage VDD based on a signal ITE1a supplied by control logic, such as a processor, a controller, and a microcontroller. The plurality of write buffer circuits 1500-150x do not supply voltages based on the write set signals WR00-WR0x and the write reset signals WR10-WR1x supplied by control logic, such as a processor, a controller, and a microcontroller. The amount of current for a READ operation is sunk from each bus line of the plurality of bus lines BL60-BL6x by the current source in electrical communication with that bus line. The amount of current for a READ operation is based on the amount of current that would flow through a resistor having an intermediate resistance and having the system voltage VDD applied to one terminal of the resistor and the inhibit voltage VINH applied to the other terminal of the resistor. The amount of current that would flow through a resistor having an intermediate resistance and having the system voltage VDD applied to one terminal of the resistor and the inhibit voltage VINH applied to the other terminal of the resistor can be approximated by the following equation, I=(VDD−VINH)/Intermediate Resistance. For example, when the intermediate resistance=5.5 MΩ, the system voltage VDD=2V, and the inhibit voltage VINH=1V, each current source of the plurality of current sources 1600-160$x$ is configured to sink an amount of current that can be approximated as I=(2V−1V)/5.5 MΩ=0.18 µA. It is noted that, ignoring leakage currents, the amount of current for the READ operation flows through each odd resistive change element O01$a$,Ox1$a$ in electrical communication with word line Wa(1), each odd bit line of the plurality of odd bit lines Boa(0)-Boa(x), each global bit line of the plurality of global bit lines GB6(0)-GB6($x$), and each bus line of the plurality of bus lines BL60-BL6$x$ to each current source of the plurality of current sources 1600-160$x$.

The intermediate resistance sets a boundary for resistance values that correspond with a low resistive state during READ operations and resistance values that correspond with a high resistive state during READ operations. The intermediate resistance is a design variable that can be selected by a circuit designer and the circuit designer typically selects an intermediate resistance greater than a model resistance for a low resistive state of a resistive change element and less than a model resistance for a high resistive state of a resistive change element. For example, when a model resistance for a low resistive state of a resistive change element is 1 MΩ and a model resistance for a high resistive state of a resistive change elements is 10 MΩ, a circuit designer can select an intermediate resistance of 5.5 MΩ so that resistive change elements having a resistance less than approximately 5.5 MΩ are determined to have a low resistive state during READ operations and resistive change elements having a resistance greater than approximately 5.5 MΩ are determined to have a high resistive state during READ operations. It is noted that the intermediate resistance is not limited to a resistance at the exact midpoint between a model resistance for a low resistive state of a resistive change element and a model resistance for a high resistive state of a resistive change element, but rather the intermediate resistance can be closer the model resistance for the low resistive state or the model resistance for the high resistive state.

Figures 1, 5G:
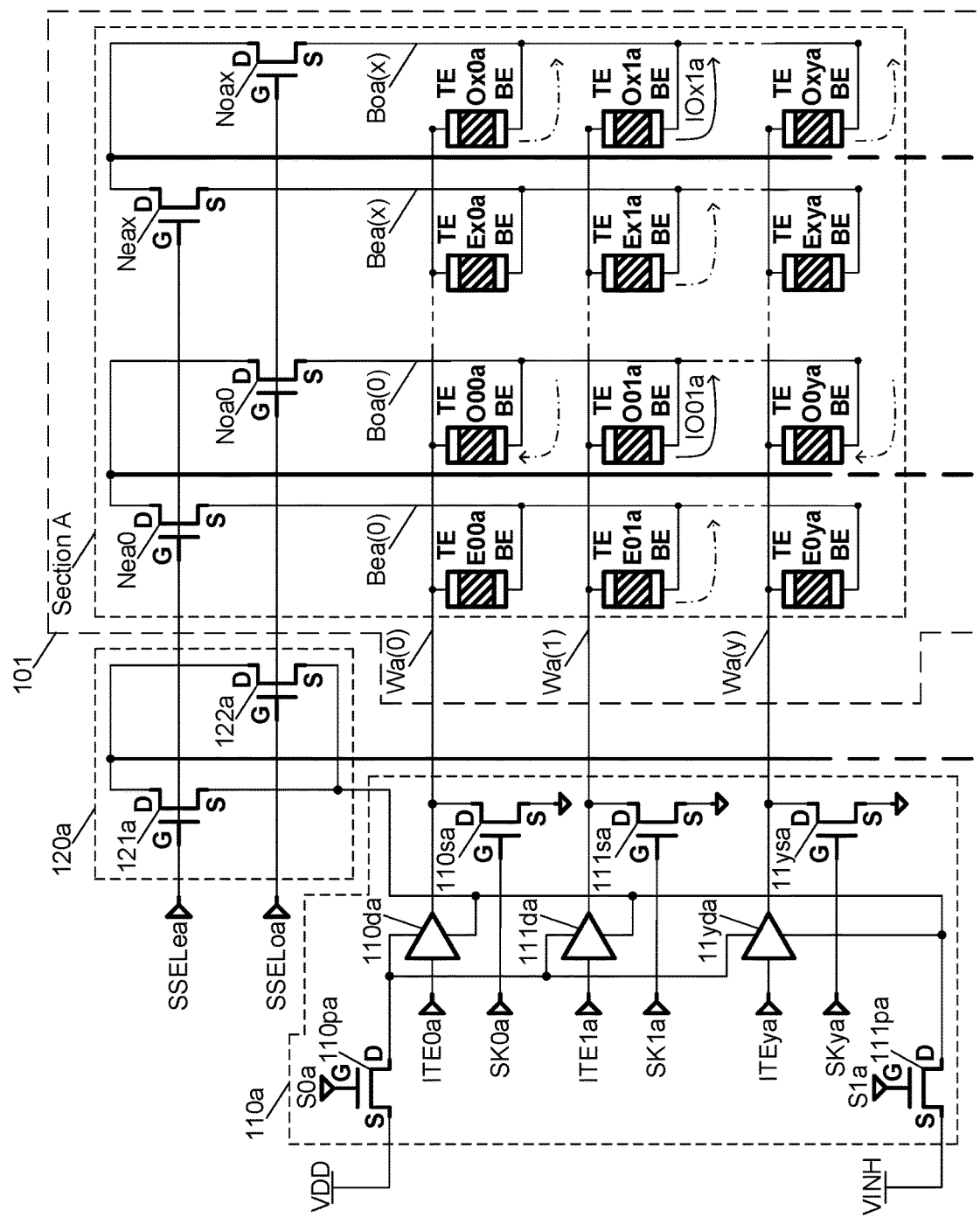
Figures 2, 5G:
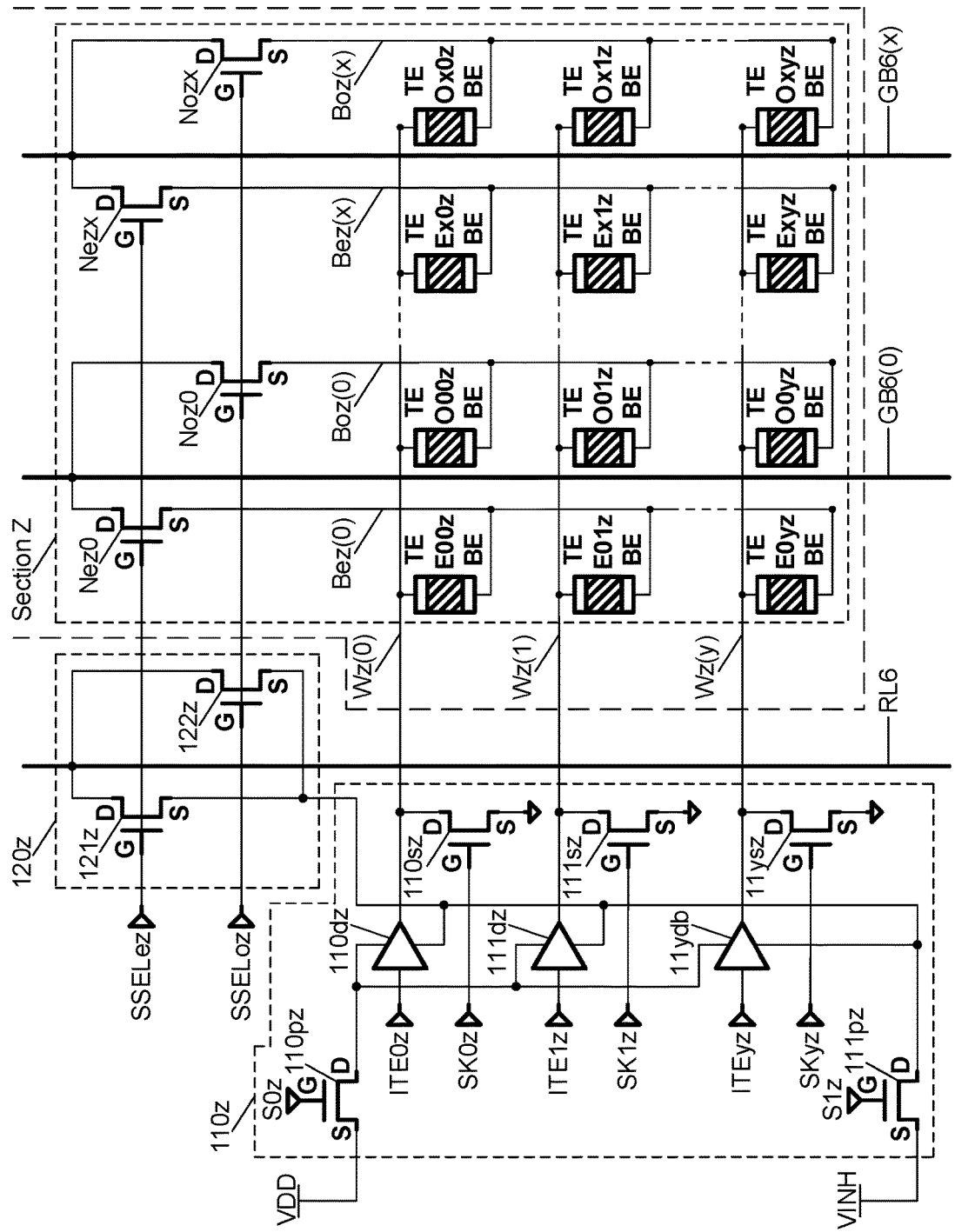
Figures 3, 5G:
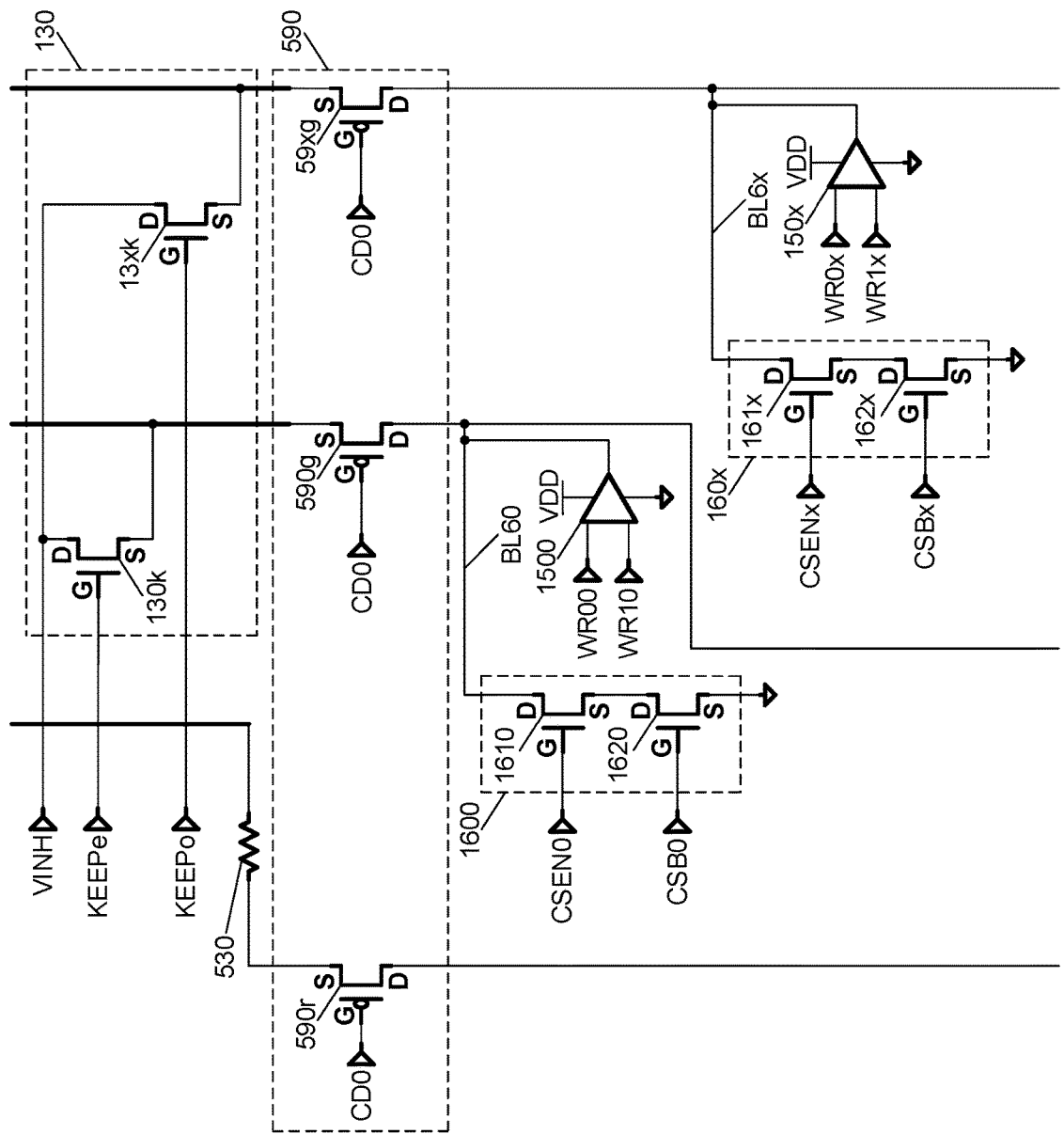
Figures 4, 5G:
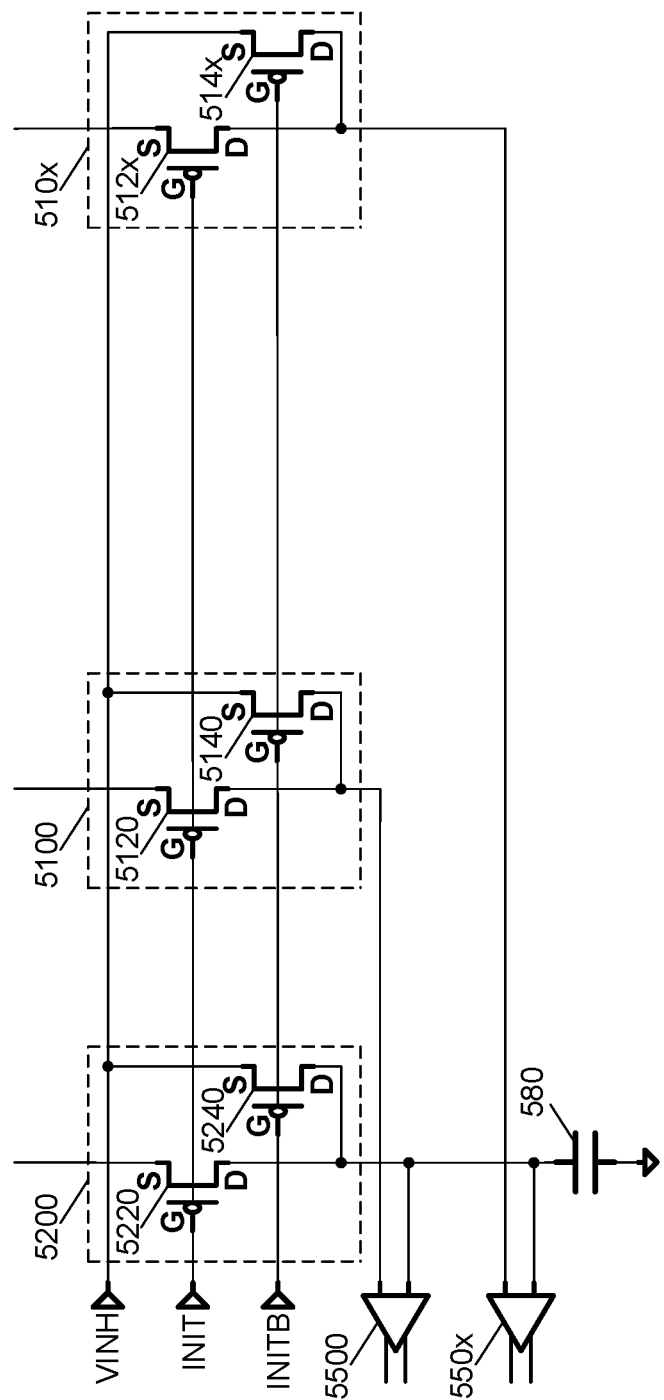

FIG. 5G-1 shows a current IO01$a$ flowing through the resistive change element O01$a$ from the top electrode TE to the bottom electrode BE because the top electrode TE is at the system voltage VDD and the bottom electrode BE is at a voltage indicative of a resistive state of the resistive change element O01$a$. FIG. 5G-1 also shows a current IOx1$a$ flowing through the resistive change element Ox1$a$ from the top electrode TE to the bottom electrode BE because the top electrode TE is at the system voltage VDD and the bottom electrode BE is at a voltage indicative of a resistive state of the resistive change element Ox1$a$. While, ignoring leakage currents, the amount of the current flowing through the resistive change element O01$a$, the odd bit line Boa(0), the global bit line GB6(0), and the bus line BL60 are the same amount of current (the amount of current for the READ operation) and the amount of the current flowing through the resistive change element Ox1$a$, the odd bit line Boa(x), the global bit line GB6($x$), and the bus line BL6$x$ are the same amount of current (the amount of current for the READ operation). Additionally, ignoring leakage currents, routing parasitics, and an on resistance of an odd selection device of the plurality of odd selection devices Noa0-Noax, the voltage on an odd bit line in the plurality of odd bit lines Boa(0)-Boa(x), the voltage on a global bit line in the plurality of global bit lines GB6(0)-GB6($x$), and the voltage on a bus line in the plurality of bus lines BL60-BL6$x$ having the same column number are generally the same voltage and the voltage on an odd bit line in the plurality of odd bit lines Boa(0)-Boa(x), the voltage on a global bit line in the plurality of global bit lines GB6(0)-GB6($x$), and the voltage on a bus line in the plurality of bus lines BL60-BL6$x$ having the same column number are indicative of a resistive state of an odd resistive change element in the odd resistive change elements O01$a$, Ox1$a$ having the same column number. It is noted that the voltage indicative of a resistive state of the resistive change element O01$a$ is discussed below with respect to the voltage VGB6(0) on the global bit line GB6(0) and the voltage indicative of a resistive state of the resistive change element Ox1$a$ is discussed below with respect to the voltage VGB6($x$) on the global bit line GB6($x$).

The voltage VGB6(0) on the global bit line GB6(0), ignoring leakage currents, routing parasitics, and on resistance of the odd selection device Noa0, can be approximated by subtracting the voltage drop across the resistive change element O01$a$ from the voltage VWa(1) on the word line Wa(1). The voltage drop across the resistive change element O01$a$ can be approximated using Ohm's Law. Thus, the voltage VGB6(0) on the global bit line GB6(0) can be approximated by the following equation VGB6(0)=VWa(1)−(IO01$a$×RO01$a$), where VWa(1) is the voltage on the word line Wa(1), the current IO01$a$ is the current flowing through resistive change element O01$a$, and RO01$a$ is the resistance of the resistive change element O01$a$. As shown by this equation, the voltage VGB6(0) on the global bit line GB6(0) changes when the resistance of the resistive change element O01$a$ changes because the voltage VWa(1) on the word line Wa(1) and the current IO01$a$ flowing through the resistive change element O01$a$ are generally the same for READ operations. For example, when VWa(1)=2 volts, IO01$a$=1/5.5 microamps, and RO01$a$=5.5 MΩ, the voltage VGB6(0)=2V−(1/5.5 µA×5.5 MΩ)=1V. For example, when VWa(1)=2 volts, IO01$a$=1/5.5 microamps, and RO01$a$=1 MΩ, the voltage VGB6(0)=2V−(1/5.5 µA×1 MΩ)=1.82V. For example, when VWa(1)=2 volts, IO01$a$=1/5.5 microamps, and RO01$a$=10 MΩ, the voltage VGB3(0)=2V−(1/5.5 µA×10 MΩ)=0.182V.

The voltage VGB6($x$) on the global bit line GB6($x$), ignoring leakage currents, routing parasitics, and on resistance of the odd selection device Noax, can be approximated by subtracting the voltage drop across the resistive change element Ox1$a$ from the voltage VWa(1) on the word line Wa(1). The voltage drop across the resistive change element Ox1$a$ can be approximated using Ohm's Law. Thus, the voltage VGB6($x$) on the global bit line GB6($x$) can be approximated by the following equation VGB6($x$)=VWa(1)−(IOx1$a$×ROx1$a$), where VWa(1) is the voltage on the word line Wa(1), the current IOx1$a$ is the current flowing through resistive change element Ox1$a$, and ROx1$a$ is the resistance of the resistive change element Ox1$a$. As shown by this equation, the voltage VGB6($x$) on the global bit line GB6($x$) changes when the resistance of the resistive change element Ox1$a$ changes because the voltage VWa(1) on the word line Wa(1) and the current IOx1$a$ flowing through the resistive change element Ox1$a$ are generally the same for READ operations. For example, when VWa(1)=2 volts, IOx1a=1/5.5 microamps, and ROx1a=5.5 MΩ, the voltage VGB6(x)=2V−(1/5.5 μA×5.5 MΩ)=1V. For example, when VWa(1)=2 volts, IOx1a=1/5.5 microamps, and ROx1a=1 MΩ, the voltage VGB6(x)=2V−(1/5.5 μA×1 MΩ)=1.82V. For example, when VWa(1)=2 volts, IOx1a=1/5.5 microamps, and ROx1a=10 MΩ, the voltage VGB6(x)=2V−(1/5.5 μA×10 MΩ)=0.182V.

FIG. 5G-1 also shows leakage currents flowing through the resistive change elements O00a, O0ya in electrical communication with the odd bit line Boa(0), leakage currents flowing through the resistive change elements Ox0a, Oxya in electrical communication with the odd bit line Boa(x), and leakage currents flowing through the resistive change elements E01a, Ex1a in electrical communication with the word line Wa(1). The leakage currents are shown using dashed lines in FIG. 5G-1. Leakage currents flow through the resistive change elements O00a, O0ya because the bottom electrodes of the resistive change elements O00a, O0ya are at a voltage indicative of a resistive state of the resistive change element O01a and the top electrodes of the resistive change elements O00a, O0ya are the inhibit voltage VINH. Leakage currents flow through the resistive change elements Ox0a, Oxya because the bottom electrodes of the resistive change elements Ox0a, Oxya are at a voltage indicative of a resistive state of the resistive change element Ox1a and the top electrodes of the resistive change elements Ox0a, Oxya are the inhibit voltage VINH. Leakage currents flow through resistive change elements E01a, Ex1a because the bottom electrodes of the resistive change elements E01a, Ex1a are at the inhibit voltage VINH and the top electrodes of the resistive change elements E01a, Ex1a are at the system voltage VDD. It is noted that leakage currents may flow through resistive change elements other than the resistive change elements in electrical communication with the odd bit line Boa(0), the resistive change elements in electrical communication with the odd bit line Boa(x), and the resistive change elements in electrical communication with the word line Wa(1) because voltages on other lines may be impacted by generating voltages indicative of resistive states of the odd resistive change elements O01a, Ox1a. It is also noted that leakage currents generally do not flow through the plurality of resistive change elements E00z-Oxyz in Section Z because the bottom electrodes of the plurality of resistive change elements E00z-Oxyz are at the inhibit voltage VINH and the top electrodes of the plurality of resistive change elements E00z-Oxyz are at the inhibit voltage VINH. It is additionally noted that leakage currents do not prevent the READ operation of the odd resistive change elements O01a, Ox1a when the leakage currents are much less than the amounts of the current IO01a and the current IOx1a. It is further noted that the voltage differences across the resistive change elements that cause the leakage currents do not disturb the resistive states of the resistive change elements because the voltage differences are less than a voltage limit for disturbing a resistive state of a resistive change element.

FIG. 5G-1 shows leakage currents flowing through the resistive change elements O00a, O0ya from the odd bit line Boa(0) because the resistive change element O01a has a low resistive state and a voltage indicative of a low resistive state of resistive change element O01a is greater than the inhibit voltage VINH. FIG. 5G-1 shows leakage currents flowing through the resistive change elements Ox0a, Oxya into the odd bit line Boa(x) because the resistive change element Ox1a has a high resistive state and a voltage indicative of a high resistive state of resistive change element Ox1a is greater than the inhibit voltage VINH. It is noted that when the voltage VBoa(0) on the odd bit line Boa(0) is less than the inhibit voltage VINH and the word lines Wa(0), Wa(y) in electrical communication with the other resistive change elements O00a, O0ya on the odd bit line Boa(0) are driven to the inhibit voltage VINH, leakage currents flow into the odd bit line Boa(0) through the other resistive change elements O00a, O0ya and pull up the voltage VBoa(0) on the odd bit line Boa(0). It is also noted that when the voltage VBoa(0) on the odd bit line Boa(0) is greater than the inhibit voltage VINH and the word lines Wa(0), Wa(y) in electrical communication with the other resistive change elements O00a, O0ya on the odd bit line Boa(0) are driven to the inhibit voltage VINH, leakage currents flow from the odd bit line Boa(0) through the other resistive change elements O00a, O0ya and pull down the voltage VBoa(0) on the bit line Boa(0). It is noted that when the voltage VBoa(x) on the odd bit line Boa(x) is less than the inhibit voltage VINH and the word lines Wa(0), Wa(y) in electrical communication with the other resistive change elements Ox0a, Oxya on the odd bit line Boa(x) are driven to the inhibit voltage VINH, leakage currents flow into the odd bit line Boa(x) through the other resistive change elements Ox0a, Oxya and pull up the voltage VBoa(x) on the odd bit line Boa(x). It is also noted that when the voltage VBoa(x) on the odd bit line Boa(x) is greater than the inhibit voltage VINH and the word lines Wa(0), Wa(y) in electrical communication with the other resistive change elements Ox0a, Oxya on the odd bit line Boa(x) are driven to the inhibit voltage VINH, leakage currents flow from the odd bit line Boa(x) through the other resistive change elements Ox0a, Oxya and pull down the voltage VBoa(x) on the bit line Boa(x). It is further noted that when voltages on the plurality of odd bit lines Boa(0)-Boa(x) are pulled up by leakage currents flowing into the plurality of odd bit lines Boa(0)-Boa(x), when voltages on the plurality of odd bit lines Boa(0)-Boa(a) are pulled down by leakage currents flowing from the plurality of bit lines Boa(0)-Boa(x), and when a voltage on at least one odd bit line of the plurality of odd bit lines Boa(0)-Boa(x) is pulled up by leakage currents flowing into the at least one odd bit line and a voltage on at least one other odd bit line of the plurality of odd bit lines Boa(0)-Boa(x) is pulled down by leakage currents flowing from the at least one other odd bit line, the number of the word lines Wa(0), Wa(y) should be small enough to allow a margin to determine resistive states of the odd resistive change elements O01a, Ox1a.

The READ operation of odd resistive change elements in electrical communication with word line Wa(1) in Section A proceeds, as similarly discussed above in step 412 of the flow chart 400, by determining the resistive states of the odd resistive change elements O01a, Ox1a based on the voltages VGB6(0)-VGB6(x) on the plurality of global bit lines GB6(0)-GB6(x). As discussed above, a voltage indicative of a resistive state of an odd resistive change element in the odd resistive change elements O01a, Ox1a is generated on a global bit line in the plurality of global bit lines GB6(0)-GB6(x) having the same column number as the odd resistive change element. The resistive state of the resistive change element O01a is determined by comparing the voltage VGB6(0) on with global bit line GB6(0) with the inhibit voltage VINH on the reference line RL6 and the resistive state of the resistive change element Ox1a is determined by comparing the voltage VGB6(x) on with global bit line GB6(x) with the inhibit voltage VINH on the reference line RL6. For READ operations the inhibit voltage VINH is indicative of the intermediate resistance because the inhibit voltage VINH is equal to the system voltage VDD minus a voltage calculated by multiplying the amount of current for a READ operation and the intermediate resistance of 5.5 MΩ. For example, when the system voltage VDD=2V, the inhibit voltage VINH=1V, the amount of current for READ operations=1/5.5 μA, and the intermediate resistance=5.5 MΩ, VINH=2V−(1/5.5 μA×5.5 MΩ)=1V.

When the voltage VGB6(0) on the global bit line GB6(0) is greater than the inhibit voltage (i.e. the voltage VGB6(0) on the global bit line GB6(0)>VINH) the resistance of the resistive change element O01a is less than the intermediate resistance (i.e. RO01a<intermediate resistance, where RO01a is the resistance of the resistive change element O01a) and the resistive state of the resistive change element O01a is determined to be a low resistive state. When the voltage VGB6(0) on the global bit line GB6(0) is less than the inhibit voltage VINH (i.e. the voltage VGB6(0) on the global bit line GB6(0)<VINH) the resistance of the resistive change element O01a is greater than the intermediate resistance (i.e. RO01a>intermediate resistance, where RO01a is the resistance of the resistive change element O01a) and the resistive state of resistive change element O01a is determined to be a high resistive state.

When the voltage VGB6(x) on the global bit line GB6(x) is greater than the inhibit voltage (i.e. the voltage VGB6(x) on the global bit line GB6(x)>VINH) the resistance of the resistive change element Ox1a is less than the intermediate resistance (i.e. ROx1a<intermediate resistance, where ROx1a is the resistance of the resistive change element Ox1a) and the resistive state of the resistive change element Ox1a is determined to be a low resistive state. When the voltage VGB6(x) on the global bit line GB6(x) is less than the inhibit voltage VINH (i.e. the voltage VGB6(x) on the global bit line GB6(x)<VINH) the resistance of the resistive change element Ox1a is greater than the intermediate resistance (i.e. ROx1a>intermediate resistance, where ROx1a is the resistance of the resistive change element Ox1a) and the resistive state of resistive change element Ox1a is determined to be a high resistive state.

As shown in FIG. 5G-4, the first input device 5100 receives the voltage VGB6(0) on the global bit line GB6(0), the inhibit voltage VINH from a power supply, a voltage source, a driver circuit, or other device that supplies the inhibit voltage VINH, the initialization signal INIT, and the complementary initialization signal INITB. The first input device 510x receives the voltage VGB6(x) on the global bit line GB6(x), the inhibit voltage VINH from a power supply, a voltage source, a driver circuit, or other device that supplies the inhibit voltage VINH, the initialization signal INIT, and the complementary initialization signal INITB. The second input device 5200 receives the inhibit voltage VINH on the reference line RL6, the inhibit voltage VINH from a power supply, a voltage source, a driver circuit, or other device that supplies the inhibit voltage VINH, the initialization signal INIT, and the complementary initialization signal INITB. When the initialization signal INIT has a low level and the complementary initialization signal INITB has a high level, the first input device 5100 supplies the voltage VGB6(0) on the global bit line GB6(0) to the sense amplifier 5500, the first input device 510x supplies the voltage VGB6(x) on the global bit line GB6(x) to the sense amplifier 550x, and the second input device 5200 supplies the inhibit voltage VINH on the reference line RL6 to the sense amplifier 5500 and the sense amplifier 550x. When the initialization signal INIT has a high level and the complementary initialization signal INITB has a low level, the first input device 5100 supplies the inhibit voltage VINH from a power supply, a voltage source, a driver circuit, or other device that supplies the inhibit voltage VINH to the sense amplifier 5500, the first input device 510x supplies the inhibit voltage VINH from a power supply, a voltage source, a driver circuit, or other device that supplies the inhibit voltage VINH to the sense amplifier 550x, and the second input device 5200 supplies the inhibit voltage VINH from a power supply, a voltage source, a driver circuit, or other device that supplies the inhibit voltage VINH to the sense amplifier 5500 and the sense amplifier 550x.

When the initialization signal INIT has a low level and the complementary initialization signal INITB has a high level the sense amplifier 5500 receives the voltage VGB6(0) on the global bit line GB6(0) and the inhibit voltage VINH on the reference line RL6. The sense amplifier 5500 determines the resistive state of the resistive change element O01a by comparing the inhibit voltage VINH on the reference line RL6 with the voltage VGB6(0) on the global bit line GB6(0). The sense amplifier 5500 outputs signals indicative of the resistive state of the resistive change element O01a on two outputs. When the voltage VGB6(0) on the global bit line GB6(0) is greater than the inhibit voltage VINH, the sense amplifier 5500 outputs signals indicating the resistive change element O01a has a low resistive state. When the voltage VGB6(0) on the global bit line GB6(0) is less than the inhibit voltage VINH, the sense amplifier 5500 outputs signals indicating the resistive change element O01a has a high resistive state. When the sense amplifier 5500 is a second sense amplifier, the sense amplifier 6000 operates in the same manner as the second sense amplifier 600 discussed above. When the sense amplifier 5500 is a third sense amplifier, the sense amplifier 5500 operates in the same manner as the third sense amplifier 700 discussed above. It is noted that providing the inhibit voltage VINH on the reference line RL6 to the sense amplifier 5500 can increase the accuracy of determining the resistive state of the resistive change element O01a because the inhibit voltage VINH on the reference line RL6 and the voltage VGB6(0) on the global bit line GB6(0) are subject to similar conditions.

When the initialization signal INIT has a low level and the complementary initialization signal INITB has a high level the sense amplifier 550x receives the voltage VGB6(x) on the global bit line GB6(x) and the inhibit voltage VINH on the reference line RL6. The sense amplifier 550x determines the resistive state of the resistive change element Ox1a by comparing the inhibit voltage VINH on the reference line RL6 with the voltage VGB6(x) on the global bit line GB6(x). The sense amplifier 550x outputs signals indicative of the resistive state of the resistive change element Ox1a on two outputs. When the voltage VGB6(x) on the global bit line GB6(x) is greater than the inhibit voltage VINH, the sense amplifier 550x outputs signals indicating the resistive change element Ox1a has a low resistive state. When the voltage VGB6(x) on the global bit line GB6(x) is less than the inhibit voltage VINH, the sense amplifier 550x outputs signals indicating the resistive change element Ox1a has a high resistive state. When the sense amplifier 550x is a second sense amplifier, the sense amplifier 550x operates in the same manner as the second sense amplifier 600 discussed above. When the sense amplifier 550x is a third sense amplifier, the sense amplifier 550x operates in the same manner as the third sense amplifier 700 discussed above. It is noted that providing the inhibit voltage VINH on the reference line RL6 to the sense amplifier 550x can increase the accuracy of determining the resistive state of the resistive change element Ox1a because the inhibit voltage VINH on the reference line RL6 and the voltage VGB6(x) on the global bit line GB6(x) are subject to similar conditions.

The READ operation of odd resistive change elements in electrical communication with word line Wa(1) in Section A proceeds, as similarly discussed above in step 414 of the flow chart 400, by restoring neutral voltage conditions for resistive change elements impacted by generating voltages indicative of resistive states of the odd resistive change elements O01a, Ox1a. Neutral voltage conditions are restored for resistive change elements impacted by generating voltages indicative of resistive states of the odd resistive change elements O01a, Ox1a by floating the plurality of odd bit lines Boa(0)-Boa(x) and applying the inhibit voltage VINH to the word line Wa(1). The plurality of even bit lines Bea(0)-Bea(x) are already floating because the plurality of even selection devices Nea0-Neax are turned off. The inhibit voltage VINH is already applied to the word lines Wa(0), Wa(y) because the word line driver circuits 110da, 11yda are already supplying the inhibit voltage VINH. The plurality of odd bit lines Boa(0)-Boa(x) are floated by disconnecting the plurality of odd bit lines Boa (0)-Boa(x) from the plurality of global bit lines GB6(0)-GB6(x) by turning off the plurality of odd selection devices Noa0-Noax. The plurality of odd selection devices Noa0-Noax are turned off by control logic, such as a processor, a controller, and a microcontroller, supplying a signal SSELo having a low level. The inhibit voltage VINH is applied to the word line Wa(1) by the word line driver circuit 111da driving the voltage on the word line Wa(1) to the inhibit voltage VINH. The word line driver circuit 111da supplies the inhibit voltage VINH based on the signal ITE1a supplied by control logic, such as a processor, a controller, and a microcontroller. Thus, the inhibit voltage VINH is applied to the plurality of word lines Wa(0)-Wa(y) with the plurality of even bit lines Bea(0)-Bea(x) and the plurality of odd bit lines Boa(0)-Boa(x) floating so that voltages approximately equal to the inhibit voltage VINH are applied to the top electrodes and the bottom electrodes of the resistive change elements in the plurality of resistive change elements E00a-Oxya.

The READ operation of odd resistive change elements in electrical communication with word line Wa(1) in Section A continues, as similarly discussed above in step 416 of the flow chart 400, by biasing global bit lines impacted by generating voltages indicative of resistive states of the odd resistive change elements O01a, Ox1a. Global bit lines impacted by generating voltages indicative of resistive states of the odd resistive change elements O01a, Ox1a are biased to the inhibit voltage VINH by floating the plurality of global bit lines GB6(0)-GB6(x) and applying the inhibit voltage VINH to the plurality of global bit lines GB6(0)-GB6(x). The plurality of global bit lines GB6(0)-GB6(x) are floated by disconnecting the plurality of global bit lines GB6(0)-GB6(x) from the plurality of odd bit lines Boa(0)-Boa(x) and disconnecting the plurality of global bit lines GB6(0)-GB6(x) from the plurality of bus lines BL60-BL6x. The plurality of global bit lines GB6(0)-GB6(x) are already disconnected from the plurality of even bit lines Bea(0)-Bea (x) because the plurality of even selection devices Nea0-Neax are turned off. The plurality of global bit lines GB6 (0)-GB6(x) may be disconnected from the plurality of odd bit lines Boa(0)-Boa(x) as part of restoring neutral voltage conditions for resistive change elements impacted by generating voltages indicative of resistive states of the odd resistive change elements O01a, Ox1a as discussed above. The plurality of global bit lines GB6(0)-GB6(x) are disconnected from the plurality of bus lines BL60-BL6x by turning off the plurality of PMOS transistors 590g-59xg. The plurality of PMOS transistors 590g-59xg are turned off by control logic, such as a processor, a controller, and a microcontroller, supplying a signal CD0 having a high level. The inhibit voltage VINH is applied to the plurality of global bit lines GB6(0)-GB6(x) by electrically connecting the plurality of global bit lines GB6(0)-GB6(x) to a power supply, a voltage source, a driver circuit, or other device that supplies the inhibit voltage VINH by turning on the plurality of NMOS transistors 130k-13xk. The plurality of NMOS transistors 130k-13xk are turned on by control logic, such as a processor, a controller, and a microcontroller, supplying a signal KEEPe having a high level and a signal KEEPo having a high level. It is noted that control logic, such as a processor, a controller, and a microcontroller, supplying a signal CD0 having a high level also turns off the PMOS transistor 590r in the global bit line connection circuit 590.

SET VERIFY operations of odd resistive change elements in electrical communication with a word line in a section of resistive change element array 101 in the exemplary DDR compatible implementation of the second exemplary architecture and SET VERIFY operations of even resistive change elements in electrical communication with a word line in a section of resistive change element array 101 in the exemplary DDR compatible implementation of the second exemplary architecture can be performed in a similar manner to the READ operations of odd resistive change elements in electrical communication with word line Wa(1) discussed above, but with each current source of the plurality of current sources 1600-160x set to sink an amount of current for a SET VERIFY operation. The amount of current for a SET VERIFY operation is based on the amount of current that would flow through a resistor having a low resistance and having the system voltage VDD applied to one terminal of the resistor and the inhibit voltage VINH applied to the other terminal of the resistor. The amount of current that would flow through a resistor having a low resistance and having the system voltage VDD applied to one terminal of the resistor and the inhibit voltage VINH applied to the other terminal of the resistor can be approximated by the following equation, I=(VDD−VINH)/Low Resistance. For example, when the low resistance is 2 MΩ, the system voltage VDD is 2V, and the inhibit voltage VINH is 1V, each current source of the plurality of current sources 1600-160x is configured to sink an amount of current for a SET VERIFY operation that can be approximated as I=(2V−1V)/2 MΩ=0.5 μA.

The low resistance sets an upper boundary for resistance values that correspond with a low resistive state during SET VERIFY operations. The low resistance is a design variable that can be selected by a circuit designer and the circuit designer typically selects a low resistance greater than a model resistance for a low resistive state of a resistive change element so that resistive change elements can have resistances greater than the model resistance for the low resistive state and be determined to have a low resistive state during SET VERIFY operations. For example, when a model resistance for a low resistive state of a resistive change element is 1 MΩ, a circuit designer can select a low resistance of 2 MΩ so that resistive change elements having a resistance less than approximately 2 MΩ are determined to have a low resistive state during SET VERIFY operations. It is noted that the circuit designer typically selects a low resistance greater than a model resistance for a low resistive state of a resistive change element and less than an intermediate resistance for READ operations.

RESET VERIFY operations of odd resistive change elements in electrical communication with a word line in a section of resistive change element array 101 in the exemplary DDR compatible implementation of the second exemplary architecture and RESET VERIFY operations of even resistive change elements in electrical communication with a word line in a section of resistive change element array 101 in the exemplary DDR compatible implementation of the second exemplary architecture can be performed in a similar manner to the READ operations of odd resistive change elements in electrical communication with word line Wa(1) discussed above, but with each current source of the plurality of current sources 1600-160$x$ set to sink an amount of current for a RESET VERIFY operation. The amount of current for a RESET VERIFY operation is based on the amount of current that would flow through a resistor having a high resistance and having the system voltage VDD applied to one terminal of the resistor and the inhibit voltage VINH applied to the other terminal of the resistor. The amount of current that would flow through a resistor having a high resistance and having the system voltage VDD applied to one terminal of the resistor and the inhibit voltage VINH applied to the other terminal of the resistor can be approximated by the following equation, I=(VDD−VINH)/High Resistance. For example, when the high resistance is 9 MΩ, the system voltage VDD is 2V, and the inhibit voltage VINH is 1V, each current source of the plurality of current sources 1600-160$x$ is configured to sink an amount of current for a RESET VERIFY operation that can be approximated as I=(2V−1V)/9 MΩ=0.11 μA.

The high resistance sets an upper boundary for resistance values that correspond with a high resistive state during RESET VERIFY operations. The high resistance is a design variable that can be selected by a circuit designer and the circuit designer typically selects a high resistance less than a model resistance for a high resistive state of a resistive change element so that resistive change elements can have resistances less than the model resistance for the high resistive state and be determined to have a high resistive state during RESET VERIFY operations. For example, when a model resistance for a high resistive state of a resistive change element is 10 MΩ, a circuit designer can select a high resistance of 9 MΩ so that resistive change elements having a resistance greater than approximately 9 MΩ are determined to have a high resistive state during RESET VERIFY operations. It is noted that the circuit designer typically selects a high resistance less than a model resistance for a high resistive state of a resistive change element and greater than an intermediate resistance for READ operations.

Although the present disclosure has been described in relation to particular embodiments thereof, many other variations and modification and other uses will become apparent to those skilled in the art. It is preferred, therefore, that the present disclosure not be limited by the specific disclosure herein.

What is claimed is:

1. An electrical device comprising:
   a resistive change element array comprising a plurality of resistive change elements;
   a plurality of global bit lines for said resistive change element array;
   a plurality of even bit lines for said resistive change element array, wherein said plurality of even bit lines are parallel to said plurality of global bit lines;
   a plurality of odd bit lines for said resistive change element array;
   a plurality of word lines for said resistive change element array;
   a plurality of first selection devices, wherein each first selection device is in electrical communication with an even bit line of said plurality of even bit lines and a global bit line of said plurality of global bit lines;
   a plurality of second selection devices, wherein each second selection device is in electrical communication with an odd bit line of said plurality of odd bit lines and a global bit line of said plurality of global bit lines;
   driver circuitry in electrical communication with said resistive change element array;
   a reference line;
   a reference line connection circuit comprising a first field effect transistor and a second field effect transistor, wherein said first field effect transistor is in electrical communication with said reference line and said first plurality of selection devices, and wherein said second field effect transistor is in electrical communication with said reference line and said second plurality of selection devices;
   wherein multiple resistive change elements of said plurality of resistive change elements are in electrical communication with said plurality of even bit lines and said plurality of word lines, and wherein plural resistive change elements of said plurality of resistive change elements are in electrical communication with said plurality of odd bit lines and said plurality of word lines; and
   wherein said plurality of first selection devices, said plurality of second selection devices, and said driver circuitry are operable together to provide neutral voltage conditions for said plurality of resistive change elements.

2. The electrical device of claim 1, wherein said driver circuitry is in electrical communication with said plurality of word lines.

3. The electrical device of claim 1, wherein said plurality of first selection devices are field effect transistors and said plurality of second selection devices are field effect transistors.

4. The electrical device of claim 3, wherein said plurality of first selection devices are NMOS transistors and said plurality of second selection devices are NMOS transistors.

5. The electrical device of claim 1, wherein each resistive change element of said plurality of resistive change elements has a first electrode, a second electrode, and a resistive change material between said first electrode and said second electrode.

6. The electrical device of claim 5, wherein said resistive change material comprises a nanotube fabric.

7. The electrical device of claim 1, wherein said plurality of odd bit lines are parallel to said plurality of global bit lines.

8. The electrical device of claim 1, further comprising:
   a keeper circuit in electrical communication with a global bit line of said plurality of global bit lines, wherein said keeper circuit is configured drive a voltage on said global bit line;
   at least one bus line;
   a global bit line connection circuit in electrical communication with a global bit line of said plurality of global bit lines and a bus line of said at least one bus line, wherein said global bit line connection circuit is configured to electrically connect said global bit line and said bus line;
   at least one write buffer circuit in electrical communication with said at least one bus line;
   at least one current source in electrical communication with said at least one bus line; and at least one sense device, wherein each sense device of said at least one sense device is in electrical communication with said reference line and a bus line of said at least one bus line.

9. The electrical device of claim 8, wherein said keeper circuit comprises a plurality of NMOS transistors and wherein each NMOS transistor of said plurality of NMOS transistors is in electrical communication with a global bit line of said plurality of global bit lines.

10. The electrical device of claim 8, wherein said global bit line connection circuit comprises a plurality of PMOS transistors and wherein each PMOS transistor of said plurality of PMOS transistors is in electrical communication with a global bit line of said plurality of global bit lines and a bus line of said at least one bus line.

11. The electrical device of claim 8, wherein each current source of said at least one current source is configurable to sink an amount of current for an operation of a resistive change element of said plurality of resistive change elements.

12. The electrical device of claim 8, wherein each sense device of said at least one sense device is a sense amplifier.

13. The electrical device of claim 1, further comprising:
a keeper circuit in electrical communication with a global bit line of said plurality of global bit lines, wherein said keeper circuit is configured drive a voltage on said global bit line;
at least one bus line;
at least one first input device in electrical communication with said at least one bus line;
a second input device in electrical communication with said reference line;
a global bit line connection circuit in electrical communication with said reference line, a global bit line of said plurality of global bit lines, said second input device, and a bus line of said at least one bus line, wherein said global bit line connection circuit is configured to electrically connect said reference line and said second input device, and wherein said global bit line connection circuit is configured to electrically connect said global bit line and said bus line;
at least one write buffer circuit in electrical communication with said at least one bus line;
at least one current source in electrical communication with said at least one bus line; and
at least one sense device, wherein each sense device of said at least one sense device is in electrical communication with a first input device of said at least one first input device and said second input device.

14. The electrical device of claim 13, wherein said global bit line connection circuit comprises a PMOS transistor in electrical communication with said reference line and said second input device, a plurality of PMOS transistors, and wherein each PMOS transistor of said plurality of PMOS transistors is in electrical communication with a global bit line of said plurality of global bit lines and a bus line of said at least one bus line.

15. The electrical device of claim 13, wherein each sense device of said at least one sense device is a sense amplifier.

16. An electrical device comprising:
a plurality of global bit lines;
a reference line;
a resistive change element array having at least one section;
driver circuitry for each section of said resistive change element array, wherein each section is in electrical communication with driver circuitry for that section;
wherein each section comprises:
a plurality of even bit lines;
a plurality of odd bit lines, wherein said plurality of odd bit lines are parallel to said plurality global bit lines;
a plurality of word lines;
a plurality of first selection devices, wherein each first selection device is in electrical communication with an even bit line of said plurality of even bit lines and a global bit line of said plurality of global bit lines;
a plurality of second selection devices, wherein each second selection device is in electrical communication with an odd bit line of said plurality odd bit lines and a global bit line of said plurality of global bit lines;
a plurality of resistive change elements, wherein multiple resistive change elements of said plurality of resistive change elements are in electrical communication with said plurality of even bit lines and said plurality of word lines, and wherein plural resistive change elements of said plurality of resistive change elements are in electrical communication with said plurality of odd bit lines and said plurality of word lines; and
a reference line connection circuit comprising a first field effect transistor and a second field effect transistor, wherein said first field effect transistor is in electrical communication with said reference line and said first plurality of selection devices, and wherein said second field effect transistor is in electrical communication with said reference line and said second plurality of selection devices; and
wherein said resistive change element array and said driver circuitry for each section are operable together to provide neutral voltage conditions.

17. The electrical device of claim 16, wherein said resistive change element array has two sections.

18. The electrical device of claim 17, wherein said two sections of said resistive change element array have a same number of resistive change elements.

19. The electrical device of claim 17, wherein said two sections of said resistive change element array have different numbers of resistive change elements.

20. The electrical device of claim 16, wherein said resistive change element array has three sections.

21. The electrical device of claim 16, wherein said plurality of word lines of each section are in electrical communication with driver circuitry for that section.

22. The electrical device of claim 16, wherein said plurality of first selection devices are field effect transistors and said plurality of second selection devices are field effect transistors.

23. The electrical device of claim 22, wherein said plurality of first selection devices are NMOS transistors and said plurality of second selection devices are NMOS transistors.

24. The electrical device of claim 16, wherein each resistive change element of said plurality of resistive change elements has a first electrode, a second electrode, and a resistive change material between said first electrode and said second electrode.

25. The electrical device of claim 24, wherein said resistive change material comprises a nanotube fabric.

26. The electrical device of claim 16, wherein said plurality of even bit lines of each section are parallel to said plurality of global bit lines.

27. The electrical device of claim 16, further comprising:
a keeper circuit in electrical communication with a global bit line of said plurality of global bit lines, wherein said keeper circuit is configured drive a voltage on said global bit line;
at least one bus line;
a global bit line connection circuit in electrical communication with a global bit line of said plurality of global bit lines and a bus line of said at least one bus line, wherein said global bit line connection circuit is configured to electrically connect said global bit line and said bus line;
at least one write buffer circuit in electrical communication with said at least one bus line;
at least one current source in electrical communication with said at least one bus line; and
at least one sense device, wherein each sense device of said at least one sense device is in electrical communication with said reference line and a bus line of said at least one bus line.

28. The electrical device of claim 27, wherein said keeper circuit comprises a plurality of NMOS transistors and wherein each NMOS transistor of said plurality of NMOS transistors is in electrical communication with a global bit line of said plurality of global bit lines.

29. The electrical device of claim 27, wherein said global bit line connection circuit comprises a plurality of PMOS transistors and wherein each PMOS transistor of said plurality of PMOS transistors is in electrical communication with a global bit line of said plurality of global bit lines and a bus line of said at least one bus line.

30. The electrical device of claim 27, wherein each current source of said at least one current source is configurable to sink an amount of current for an operation of a resistive change element of said plurality of resistive change elements.

31. The electrical device of claim 27, wherein each sense device of said at least one sense device is a sense amplifier.

32. The electrical device of claim 16, further comprising:
a keeper circuit in electrical communication with a global bit line of said plurality of global bit lines;
at least one bus line;
at least one first input device in electrical communication with said at least one bus line;
a second input device in electrical communication with said reference line;
a global bit line connection circuit in electrical communication with said reference line, a global bit line of said plurality of global bit lines, said second input device, and a bus line of said at least one bus line, wherein said global bit line connection circuit is configured to electrically connect said reference line and said second input device, and wherein said global bit line connection circuit is configured to electrically connect said global bit line and said bus line;
at least one write buffer circuit in electrical communication with said at least one bus line;
at least one current source in electrical communication with said at least one bus line; and
at least one sense device, wherein each sense device of said at least one sense device is in electrical communication with a first input device of said at least one first input device and said second input device.

33. The electrical device of claim 32, wherein said global bit line connection circuit comprises a PMOS transistor in electrical communication with said reference line and said second input device, a plurality of PMOS transistors, and wherein each PMOS transistor of said plurality of PMOS transistors is in electrical communication with a global bit line of said plurality of global bit lines and a bus line of said at least one bus line.

34. The electrical device of claim 32, wherein each sense device of said at least one sense device is a sense amplifier.

35. The electrical device of claim 1, wherein said first field effect transistor is a NMOS transistor and wherein said second field effect transistor is a NMOS transistor.

36. The electrical device of claim 16, wherein said first field effect transistor is a NMOS transistor and wherein said second field effect transistor is a NMOS transistor.

\* \* \* \* \*